United States Patent

Ohtani et al.

[11] Patent Number: 5,835,448
[45] Date of Patent: Nov. 10, 1998

[54] CLOCK SYNCHRONOUS SEMICONDUCTOR MEMORY DEVICE FOR DETERMINING AN OPERATION MODE

[75] Inventors: Jun Ohtani; Akira Yamazaki; Katsumi Dosaka, all of Hyogo, Japan

[73] Assignee: Mitsubishi Denki Kabushiki Kaisha, Tokyo, Japan

[21] Appl. No.: 880,153

[22] Filed: Jun. 20, 1997

Related U.S. Application Data

[62] Division of Ser. No. 647,431, Mar. 14, 1996, Pat. No. 5,708,622, which is a division of Ser. No. 305,522, Sep. 12, 1994, Pat. No. 5,521,878.

[30] Foreign Application Priority Data

Sep. 13, 1993 [JP] Japan ................................. 5-227166
Nov. 30, 1993 [JP] Japan ................................. 5-299968

[51] Int. Cl.⁶ ......................................................... G11C 8/00
[52] U.S. Cl. ................. 365/233; 365/189.05; 365/230.08
[58] Field of Search .............................. 365/233, 189.05, 365/230.09, 191

[56] References Cited

U.S. PATENT DOCUMENTS

| 3,895,360 | 7/1975 | Cricchi et al. .................. 365/230.03 |
| 4,415,994 | 11/1983 | Ive et al. .......................... 365/189.05 |
| 4,577,293 | 3/1986 | Matick et al. .................... 365/189.04 |
| 4,667,313 | 5/1987 | Pinkham et al. ................. 365/189.12 |
| 4,757,473 | 7/1988 | Kurihara et al. .................. 365/189.12 |
| 4,943,947 | 7/1990 | Kobayashi ........................ 365/189.12 |
| 5,068,829 | 11/1991 | Yamaguchi et al. .................... 365/233 |
| 5,083,296 | 1/1992 | Hara et al. ........................ 365/233 X |

FOREIGN PATENT DOCUMENTS

1-146187  6/1989  Japan .
4-137295  5/1992  Japan .

OTHER PUBLICATIONS

"Self-Time RAM:STRAM", Chikai OHNO, Fujitsu Sci. Tech, J. 24, 4 (Dec. 1988), pp. 293–300.

*Primary Examiner*—David C. Nelms
*Assistant Examiner*—Hoai Ho
*Attorney, Agent, or Firm*—McDermott, Will & Emery

[57] ABSTRACT

A signal input buffer attains a through state when an external clock signal Ka is in an inactive state and generates an internal signal in response to an external signal, and attains a latch state when the external clock signal is in an inactive state. Data transfer from a master data register which stores data in an DRAM array through a slave data register is executed in response to a detection of the slave data register of being in use. The slave data register stores data to be transferred to an SRAM array or data to be externally accessed. Thus, a synchronous semiconductor memory device accessible at a high speed and with no wait is provided. In addition, internal clock signal is activated for a predetermined time in response to activation of an external clock signal to secure a precise internal operating timing.

17 Claims, 64 Drawing Sheets

FIG. 3

| | SRAM | | | | | | | DATA TRANSFER BUFFER | | | | | DQ PIN | | | FUNCTION | |
|---|---|---|---|---|---|---|---|---|---|---|---|---|---|---|---|---|---|
| | CS# | CMs# | CC0# | CC1# | WE# | DQC | As | DTBW | | TRANSFER MASK | | DTBR | WRITE MASK | Din | Dout | | |
| | | | | | | | | Tm | DTBW | Tm | MASK | | | | | | |
| NOP | H | × | × | × | × | × | 0-11 | - | - | - | - | - | - | - | Hi-Z | NO OPERATION | |
| SPD | × | L | × | × | × | × | × | - | - | - | - | - | - | - | SUSPEND | SRAM POWER DOWN DATA SUSPEND | |
| DES | L | H | H | H | × | × | × | - | - | - | - | - | - | - | Hi-Z | DESELECT SRAM | |
| SR | L | H | H | L | H | H | 0-11 | - | - | - | - | - | - | - | VALID | SRAM READ | SRAM →DQ |
| SW | L | H | H | L | L | L | 0-11 | - | - | - | - | - | LOAD /USE | VALID | Hi-Z | SRAM WRITE | Din→ →SRAM |
| BRT | L | H | L | H | H | L | 4-11 | - | - | - | - | USE | - | - | Hi-Z | BUFFER READ TRANSFER | DTBR→ SRAM |
| BWT | L | H | L | H | L | L | 4-11 | LOAD | - | ENTIRE MASK RESET | - | - | - | - | Hi-Z | BUFFER WRITE TRANSFER | SRAM→ DTBW |
| BRTR | L | H | L | L | H | H | 0-11 | - | - | - | - | USE | - | - | VALID | BUFFER READ TRANSFER READ | DTBR→ SRAM→DQ |
| BWTW | L | H | L | L | L | L | 0-11 | LOAD | - | ENTIRE MASK RESET | - | - | LOAD /USE | VALID | Hi-Z | BUFFER WRITE TRANSFER WRITE | Din→SRAM →DTBW |
| BR | L | H | L | L | H | H | 0-3 | - | - | - | - | USE | - | - | VALID | BUFFER READ | DTBR →DQ |
| BW | L | H | L | L | L | L | 0-3 | LOAD | - | 1 BIT RESET | - | - | LOAD /USE | VALID | Hi-Z | BUFFER WRITE | Din→ DTBW |

Tm : TEMPORARY REGISTER

FIG. 4

| | DRAM | | | | | Ad(DRAM ADDRESS) | | | Data Transfer Buffer | | | | | FUNCTION |
|---|---|---|---|---|---|---|---|---|---|---|---|---|---|---|
| | CS# | CMd# | RAS# | CAS# | DTD# | 0~11 | 0 | 1 | DTBW Tm | DTBW | MASK Tm | MASK | DTBR | |
| DPD | X | L | X | X | X | X | | | – | – | – | – | – | DRAM POWER DOWN |
| DNOP | L | H | H | H | X | X | | | – | – | – | – | – | DRAM NO OPERATION |
| DRT | L | H | H | H | H | 4-9 (COLUMN BLOCK) | 0 | 1 | – | – | – | – | LOAD | DRAM READ TRANSFER (DRAM→DTBR) |
| DWT1 | L | H | H | L | L | 4-9 (COLUMN BLOCK) | 0 | 0 | – | LOAD/USE | ALL BITS SET | LOAD/USE | – | DRAM WRITE TRANSFER 1 (DTBW→DRAM) |
| DWT1R | L | H | H | L | L | 4-9 (COLUMN BLOCK) | 1 | 0 | – | LOAD/USE | ALL BITS SET | LOAD/USE | LOAD | DRAM WRITE TRANSFER 1 READ (DTBW→DRAM, DRAM→DTBR) |
| DWT2 | L | H | H | L | L | 4-9 (COLUMN BLOCK) | 0 | 1 | – | USE | – | USE | – | DRAM WRITE TRANSFER 2 (DTBW→DRAM) |
| DWT2R | L | H | H | L | L | 4-9 (COLUMN BLOCK) | 1 | 1 | – | USE | – | USE | LOAD | DRAM WRITE TRANSFER 2 READ (DTBW→DRAM, DRAM→DTBR) |
| ACT | L | H | L | H | H | 0-11 (ROW ADDRESS) | | | – | – | – | – | – | DRAM ACTIVATE |
| PCG | L | H | L | H | L | X | | | – | – | – | – | – | DRAM PRECHARGE |
| ARF | L | H | L | L | H | X | | | – | – | – | – | – | AUTO REFRESH |
| SCR | L | H | L | L | L | | | | – | – | – | – | – | SET COMMAND REGISTER |

Tm : TEMPORARY REGISTER

FIG. 42
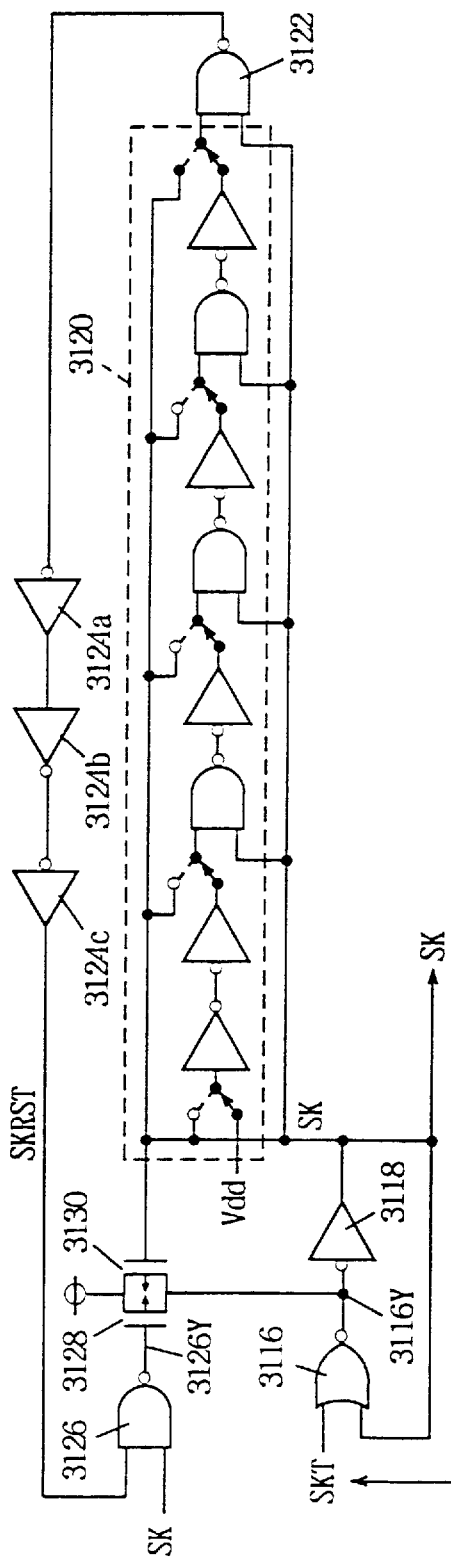
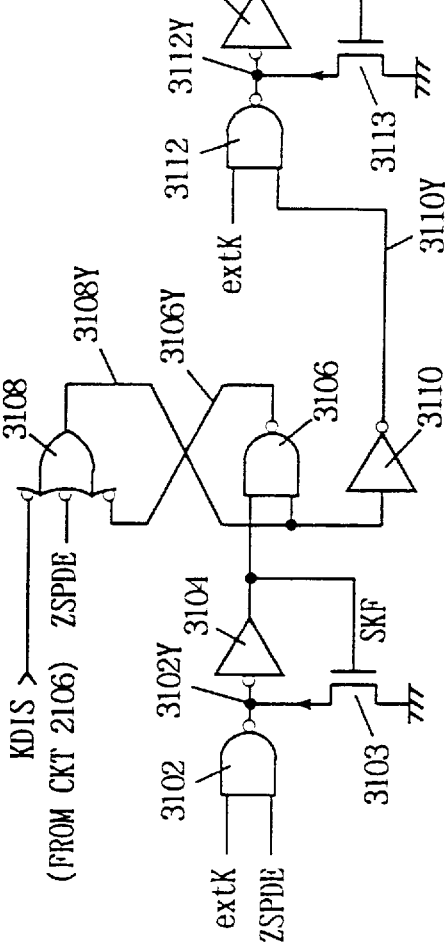

FIG. 46
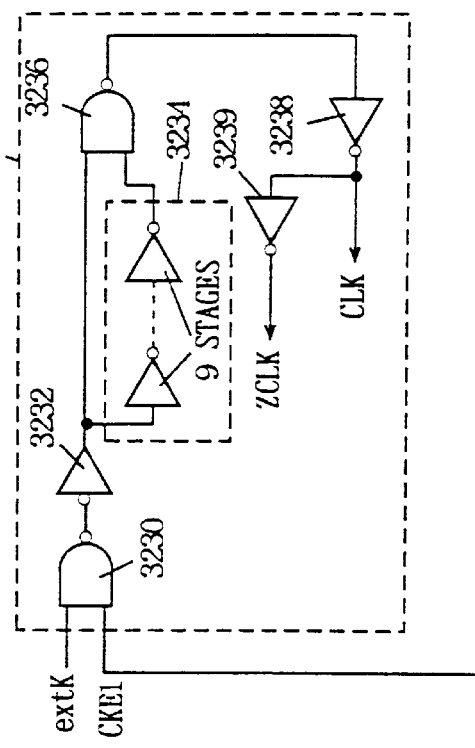
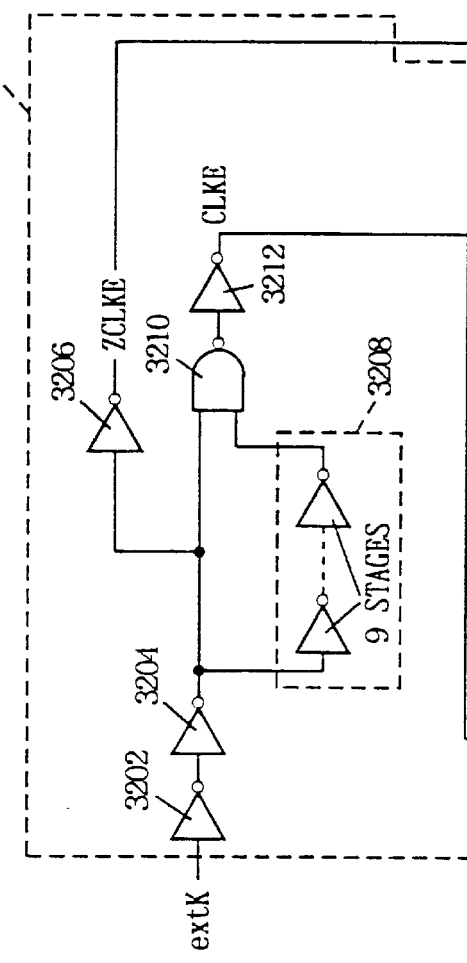
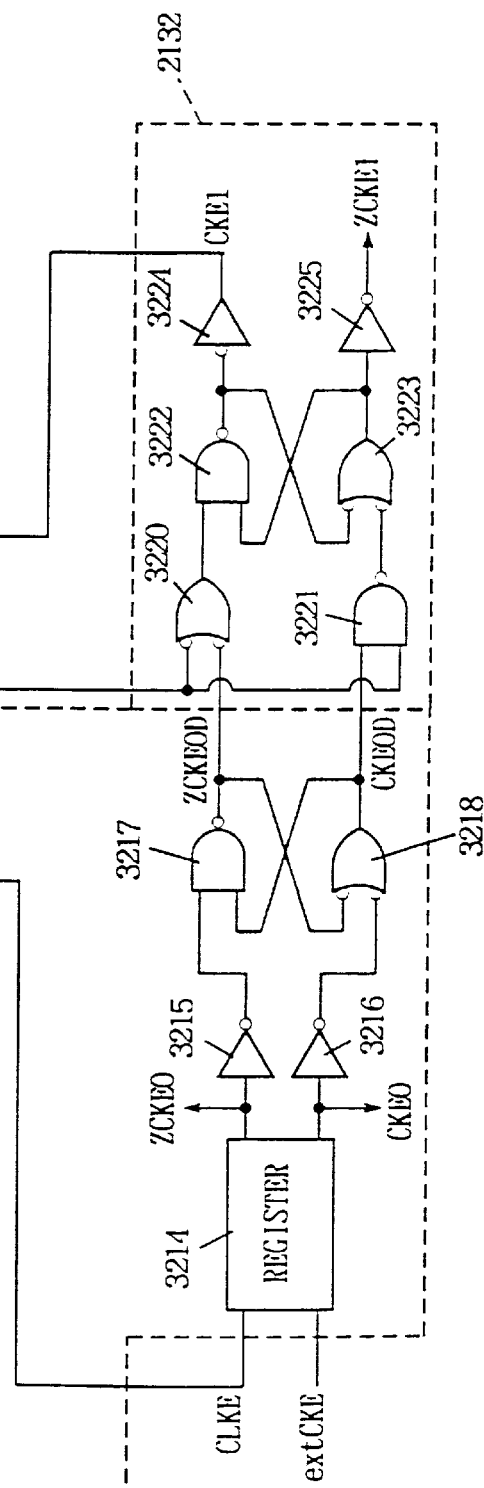

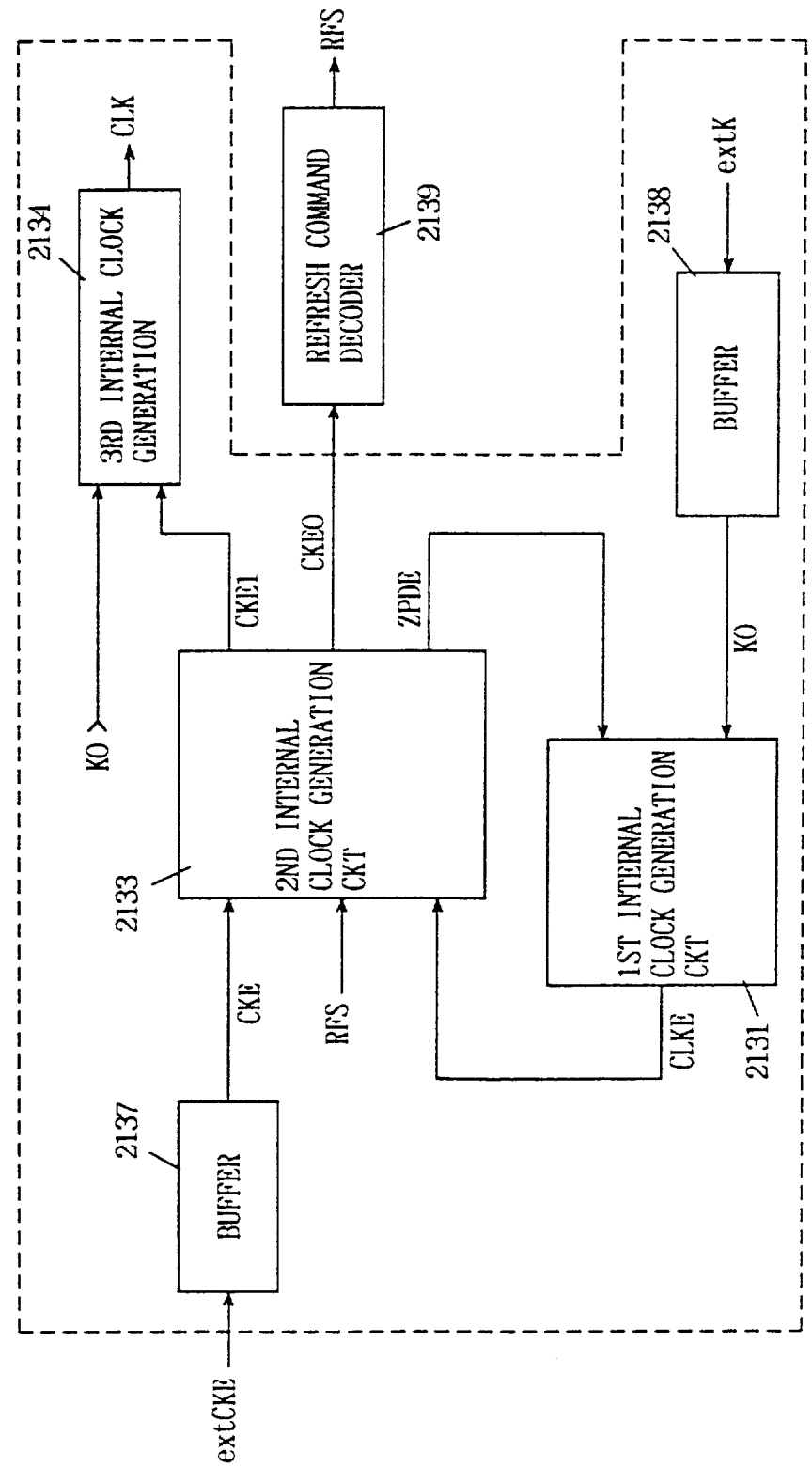
F I G. 4 9

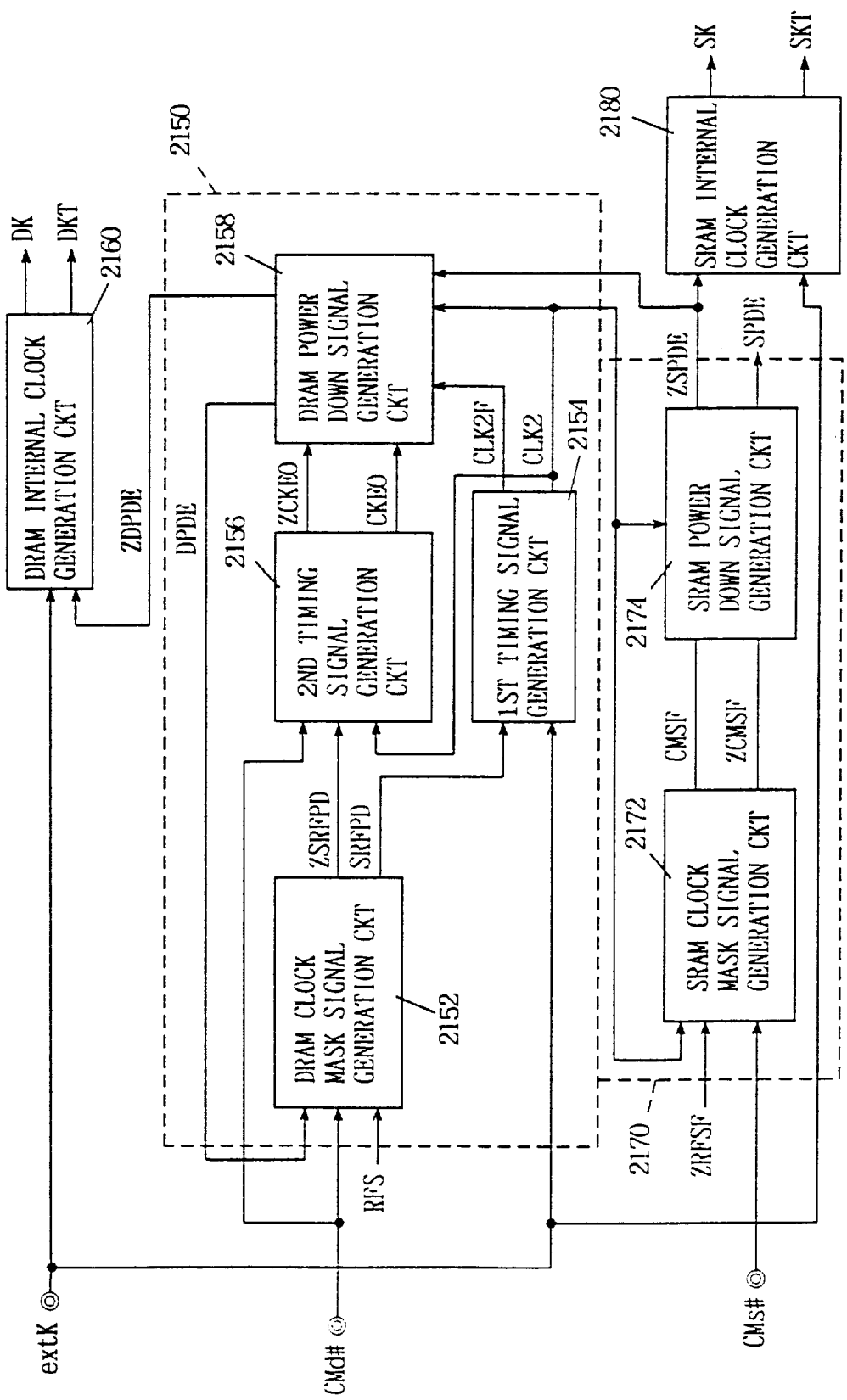
F I G. 55

(BUFFER READ/WRITE)

CLOCK SYNCHRONOUS SEMICONDUCTOR MEMORY DEVICE FOR DETERMINING AN OPERATION MODE

This application is a division of application Ser. No. 08/647,431 filed Mar. 14, 1996, now U.S. Pat. No. 5,708,622, which is a division of application Ser. No. 08/305,522, filed Sep. 12, 1994, now U.S. Pat. No. 5,521,878.

BACKGROUND OF THE INVENTION

1. Field of the Invention

The present invention relates generally to semiconductor memory devices, and more specifically, to clock synchronous semiconductor memory devices which operate in synchronization with an externally applied clock signal. More specifically, the present invention relates to a cache DRAM including a DRAM (Dynamic Random Access Memory) having dynamic memory cells and an SRAM (Static Random Access Memory) array having static memory cells.

2. Description of the Background Art

In recent years, microprocessing units (MPUs) have come to operate at very high speed with operation clock frequency being 25 MHz or higher. In a data processing system, a standard DRAM is often used as a main memory with a large storage capacity for its low cost per bit. Although the standard DRAM has access time reduced it cannot keep pace with development of MPUs in terms of high speed operation. A data processing system using the standard DRAM as a main memory faces a short coming such as increase in wait state. The gap between the operation speeds of a MPU and a standard DRAM is inherent for the following characteristics of the standard DRAM.

(i) A row address signal and a column address signal are time-divisionally multiplexed for application to a common address pin terminal. The row address signal is taken into the device at a falling edge of a row address strobe signal /RAS. The column address signal is taken into the device at a falling edge of a column address strobe signal /CAS.

Row address strobe signal /RAS defines the start of a memory cycle and activates row selecting circuitry. Column address strobe signal /CAS activates column selecting circuitry. A prescribed time period called "RAS-CAS delay time (tRCD)" is necessary between activation of signal /RAS and activation of signal /CAS. This address multiplexing restricts reduction of accessing time.

(ii) Once row address strobe signal /RAS is raised to set a DRAM to a standby state, row address strobe signal /RAS cannot be pulled down once again to an active state or "L" until time called RAS precharge time (tRP) passes. RAS precharge time tRP is necessary for securely precharging various signal lines of the DRAM to prescribed potentials. The presence of RAS precharge time tRP keeps the cycle time of the DRAM from being reduced. Reducing the cycle time of the DRAM increases the number of charge/discharge of signal lines in the DRAM, resulting in increase in current consumption.

(iii) The operation speed of DRAMs can be improved by means of improving circuit techniques and process techniques such as high density integration of circuits and improvement of layouts as well as improvements in terms of applications such as improvement of driving methods. Development of the operating speed of MPUs however, advances much more than that of DRAMs. The operation speed of semiconductor memory is hierarchical such that there are high speed bipolar RAMs using bipolar transistors such as ECLRAM (Emitter Coupled RAM) and static RAMs, and relatively low speed DRAMs using MOS transistors (insulating gate field effect transistors). Speed (cycle time) in the order of several tens ns (nano second) would not be expected in a standard DRAM having a MOS transistor as a component.

One method for solving the above problems and implementing a relatively inexpensive and small scale system is to build a high speed cache memory (SRAM) in a DRAM. More specifically, one chip memory having a hierarchical structure including a DRAM as a main memory and an SRAM as a cache memory can be considered. Such hierarchical one chip memory is referred to as cache DRAM (CDRAM).

In a CDRAM, a DRAM and an SRAM are integrated on a single chip. The SRAM is accessed upon a cache hit, and the DRAM is accessed upon a cache miss. More specifically, the SRAM operating at a high speed is used as a cache memory, while the DRAM having a large storage capacity is used as a main memory.

A so-called block size of cache can be considered as the number of bits whose contents are rewritten through one data transfer in an SRAM. Cache hit rate generally increases as a function of the size of a block. For the same cache memory size, however, since the number of sets decreases in inverse proportion to the block size, the hit rate decreases conversely. For a cache size of 4K bit, for example, the number of sets is 4 for a block size of 1024 bits, while the number of sets is 128 for a block size of 32 bits. Accordingly, the block size must be appropriately set.

A CDRAM having an appropriate block size is for example shown in Japanese Patent Laying-Open No. 1-146187 by Fujishima et al.

In the prior art, a DRAM array is divided into groups of a plurality of columns. A data register is provided for each column. The data register is also divided into groups similarly to the DRAM array. Upon a cache hit, the data register is accessed. Upon a cache miss, only data in a column group in the array of the DRAM is transferred to the data register according to a block address. Data is read out from the data register in parallel with the data transfer.

In the above-described conventional CDRAM, data is transferred from the DRAM array to the data register at the time of cache miss. At the time of transfer, the CDRAM is not accessible. The external processing device must wait until transfer of valid data to the data register is completed. This degrades the performance of the system.

A CDRAM having a DRAM array and an SRAM array integrated on a single chip and a bidirectional transfer gate between the DRAM array and the SRAM array has been suggested. The DRAM array and the SRAM array can be independently addressed. The bidirectional transfer gate includes a data register, which is externally accessible. Thus, a highly functional CDRAM also applicable to graphics processing is implemented. In such a CDRAM, however, access to the data register is prohibited when data is transferred from the DRAM array to the bidirectional transfer gate. Therefore, there is still room for improvement in such a high function CDRAM.

In order to operate a semiconductor memory device at a high speed, the semiconductor memory device is operated in synchronization with an externally applied clock signal such as a system clock signal (see U.S. Pat. No. 5,083,296 to Hara, for example). The prior art provides for a solution to variation in timing caused by distortion in external control signals such as signal /RAS and /CAS. Such a clock synchronous semiconductor memory device establishes the output of an input buffer receiving an external signal when the external clock signal is activated.

Therefore, since an internal signal is established after an external clock signal is activated and then an internal operation is executed, a timing for starting the internal operation is delayed. More specifically, the advantage of high speed operation with an external clock signal is impaired.

It is therefore an object of the present invention to provide a semiconductor memory device which operates at a high speed.

Another object of the present invention is to provide a semiconductor memory device which enables a high speed data processing system to be constructed.

Yet another object of the invention is to provide a synchronous semiconductor memory device capable of establishing an internal clock signal in a timing as early as possible in synchronization with an external clock signal.

A particular object of the invention is to provide a clock synchronous cache built-in semiconductor memory device which permits high speed accessing with no wait.

A semiconductor memory device according to the invention includes a memory cell array having a plurality of memory cells, a first data register for temporarily holding data from a plurality of memory cells simultaneously selected in the memory cell array, a second data register for receiving the data held by the first data register for storage, and transfer means responsive to the absence of access to the second data register and a data transfer instruction for executing data transfer from the first data register to the second data register.

In the semiconductor memory device according to the present invention, data is transferred from the first data register to the second data register when data in the second data register is not used. Therefore, the data transfer operation does not adversely affects accessing to the semiconductor memory device, and high speed operation is implemented.

The external processing device does not enter a wait state due to data transfer within the semiconductor memory device, in other words the device can operate in a "no-wait state", and therefore a high speed data processing system can be constructed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a table showing operation modes and corresponding states of control signals of a DRAM according to one embodiment of the invention;

FIG. 4 is a table showing operation modes and corresponding states of control signals of a CDRAM according to one embodiment of the invention;

FIG. 42 is a diagram specifically showing the configuration of the SRAM clock signal generation circuit shown in FIG. 35;

FIG. 46 is a diagram specifically showing the configuration of the internal clock signal generation circuit shown in FIG. 45;

FIG. 49 is a block diagram schematically showing yet another configuration of the internal clock signal generation circuit according to the present invention;

FIG. 55 is a block diagram showing yet another internal clock signal generation circuit according to the present invention;

DESCRIPTION OF THE PREFERRED EMBODIMENTS

Overall Arrangement

Figure 1:
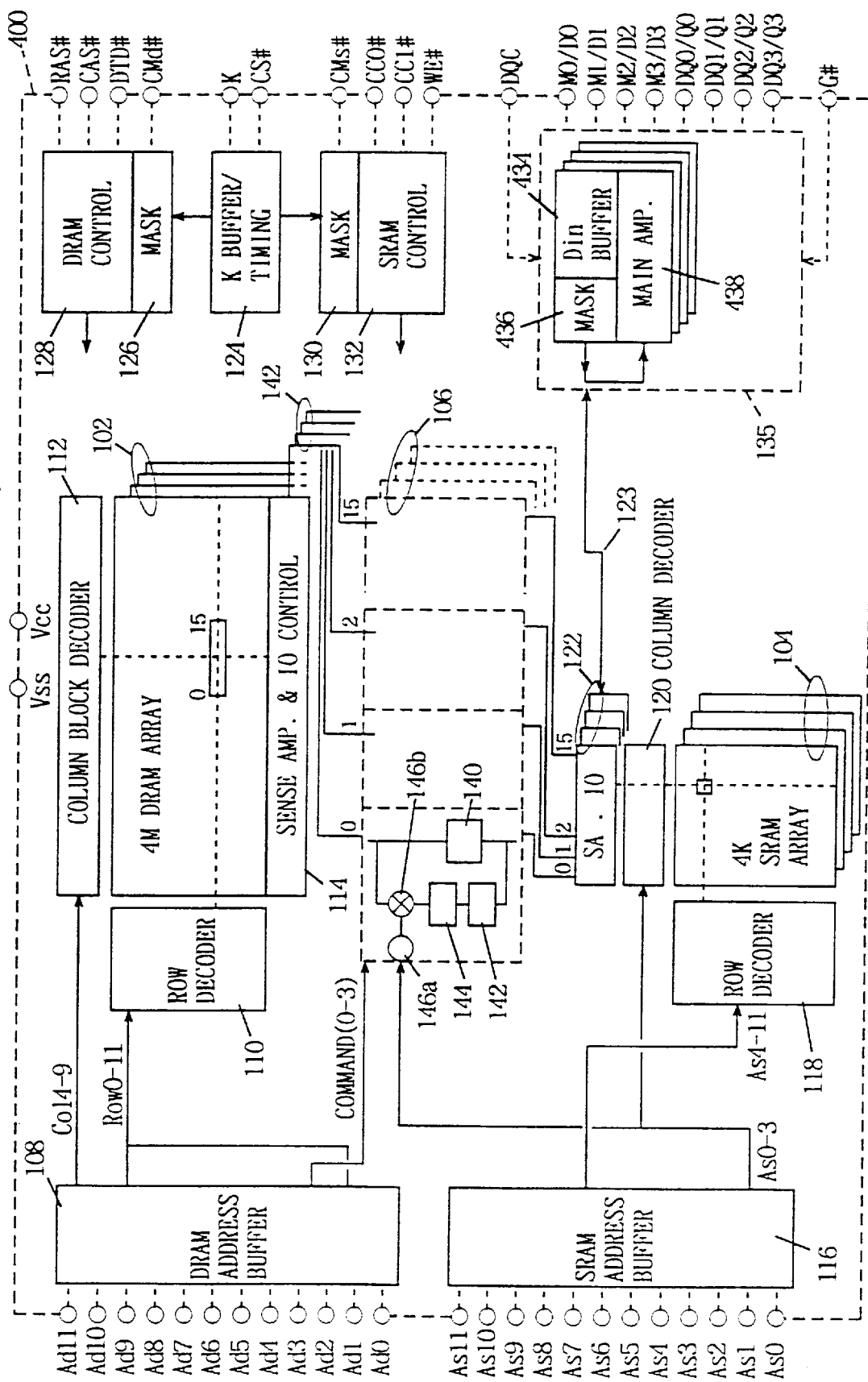
FIG. 1 is a block diagram showing the overall structure of a CDRAM according to one embodiment of the invention.

FIG. 1 is a block diagram showing the overall configuration of a CDRAM according to one embodiment of the invention. In FIG. 1, CDRAM 400 includes a DRAM array 102 including a plurality of dynamic memory cells arranged in a matrix of rows and columns, an SRAM array 104 including a plurality of static memory cells arranged in a matrix of rows and columns, and a data transfer circuit 106 for data transfer between DRAM array 102 and SRAM array 104.

CDRAM 400 has a configuration for data input/output on a 4 bit basis, and therefore DRAM array 102 includes four memory planes. The four memory planes of DRAM array 102 each include a 4M bit storage capacity, and correspond to different data bits input and output at a time.

Similarly, SRAM array 104 includes four memory planes each including a 4K bit storage capacity. Four data transfer circuits 106 are provided in the four memory planes in order to conduct data transfer in every plane of DRAM array 102 and SRAM array 104.

CDRAM 400 includes a DRAM address buffer 108 which receives externally applied DRAM address Ad0 to Ad11 and generates internal address a row decoder 110 which receives internal row address Row0 to Row11 from DRAM address buffer 108 and selects a corresponding row in DRAM array 102, a column block decoder 112 which receives prescribed bits of internal column address from DRAM address buffer 108 or column block address Col4 to Col9 and selects a plurality of columns (16 columns in one memory plane in this embodiment) in DRAM array 102 at a time, sense amplifiers for detecting and amplifying data in the memory cells selected in DRAM array 102, and an IO control for data transfer between the memory cells selected in DRAM array 102 and data transfer circuit 106. Note that in FIG. 1, the sense amplifier and the IO control are shown as a single block 114.

A row address signal and a column address signal are multiplexed for application to DRAM address buffer 108. 4 bits of address signals Ad0 to Ad3 are used as commands for setting a data transfer mode and set/reset of mask data in mask in data transfer circuit 106.

CDRAM 400 further includes an SRAM address buffer 116 which receives externally applied SRAM address signals As0 to As11 and generates internal address signals, a row decoder 118 which decodes address signals As4 to As11 from SRAM address buffer 116 and selects a corresponding row in SRAM array 104, a column decoder 120 which decodes column address signals As0 to As3 from SRAM address buffer 116, selects corresponding columns in SRAM array 104, and selects corresponding transfer gates in data transfer circuit 106, and an IO circuit which detects and amplifies data in the memory cells selected in SRAM array 104 and connects a selected column and a selected transfer gate of SRAM array 104 to an internal data bus 123. The sense amplifier for SRAM and the IO circuit are shown as a block 122.

SRAM array 104 includes 16 bits in a row. In SRAM array 104, memory cells in a selected one row, or memory cells of 16 bits attain a selected state. Transfer circuit 106 includes 16 transfer gates for one memory plane. Thus, data transfer is performed between the memory cells of 16 bits selected in DRAM array 102 and memory cells in the one row selected in SRAM array 104 through data transfer circuit 106 in one memory plane. More specifically, in CDRAM 400, data corresponding to 16 bits is transferred in one memory plane, and data corresponding to 64 bits all together is transferred.

Independently providing address signals Ad0 to Ad11 to DRAM array 102 and address signals As0 to As11 to SRAM array 104 permits data in a memory cell at an arbitrary position in DRAM array 102 to be transferred to SRAM array 104, arbitrary mapping (according to a set associative mapping method, full associative mapping method, or direct mapping method) can be readily implemented depending on an application of a cache memory.

CDRAM 400 further includes a K buffer/timing circuit 124 receiving an external clock signal K such as a system clock and a chip select signal CS#, a clock mask circuit 126 for masking an internal clock signal generated from K buffer/timing circuit 124 according to an externally applied mask control signal CMd, and a DRAM control circuit 128 for taking externally applied control signals RAS#, CAS# and DTD# in synchronization with a clock signal from clock mask circuit 128 for generating necessary control signals based on the state of each signal. The definition of each external control signal will be later described.

CDRAM 400 further includes a mask circuit 130 for masking an internal clock signal from K buffer/timing circuit 124 according to a control signal CMs#, an SRAM control circuit 132 which takes in externally applied control signals CC0#, CC1# and WE# according to an internal clock signal from mask circuit 132 and generates necessary control signals based on a combination of states of control signals, and an input/output circuit 135 for inputting/outputting data in response to signals DQC and G#.

Input/output circuit 135 includes a Din buffer 434 externally applied data DQ0 to DQ3 and mask data M0 to M3 (or write data D0 to D3), a mask circuit 436 for masking write data applied from Din buffer 434 according to mask data M0 to M3, a main amplifier circuit 438 for outputting data to terminals DQ0 to DQ3 (or Q0 to Q3). Input/output circuit 135 is connected to block 122 through internal data bus 123. Block 122 selects one transfer gate (for one memory plane) or 1 bit SRAM memory cell (for one memory plane) from transfer circuit 106 or SRAM array 104 and connects the selected gate or cell to internal data bus 123. Accordingly, CDRAM 400 enables SRAM array 104 to be externally accessed or transfer circuit 106 to be accessed.

DRAM control circuit 128 and SRAM control circuit 132 operate independently from each other. Accordingly, SRAM array 104 can be externally accessed at the time of data transfer between the DRAM array and data transfer circuit 106.

CDRAM 400 can change how data is input/output. The possible arrangements are DQ separation arrangement in which input data (write data) D and output data Q are transferred through separate pin terminals, and a mask write mode in which write data D and read data (output data) Q are transferred through the same pin terminal. Write data can be masked in the mask write mode in which data input and data output are performed through the same pin terminal. Pin terminals receiving write data D0 to D3 in the DQ separation arrangement are used as a pin terminal for receiving mask data M0 to M3 in the mask write mode. Setting of the pin terminal is conducted by a command register which is not shown.

Definition of External Control Signals

CDRAM 400 takes in data and external control signals all in synchronization with externally applied clock signal K. Any external control signal is applied in pulse. An operation mode to be performed is determined by a combination of state of external control signals at a rising edge of external clock signal K. Only external clock signal G# is input asynchronously with external clock signal K. Now, each external control signal will be described.

External Clock Signal K:

External clock signal K determines a basic timing for CDRAM 400, in other words a timing for taking in an input signal and an operation clock frequency. Timing parameters of external signals (except for signal G# which will be described later) are defined based on a rising edge or a falling edge of external clock signal K.

Clock Mask CMd for DRAM:

Clock mask CMd for DRAM controls transfer of an internal DRAM clock signal generated from K buffer/timing circuit 124. If DRAM clock mask CMd is in an active state at a rising edge of external clock signal K, generation of an internal clock signal for DRAM in the next clock cycle is stopped. In this state, an operation of taking in a control signal is not conducted in the DRAM portion in the next cycle. This reduces power consumption in the DRAM portion.

Row Address Strobe Signal RAS#:

Row address strobe signal RAS# is used together with external clock signal K (depending upon the states of other signals CMd, CAS#, and DTD# at the time) and activates the DRAM portion. More specifically, row address strobe signal RAS# is used for latching DRAM row address signals Ad0 to Ad11, selection of a row in DRAM array 102, initiation of a precharge cycle to set the DRAM portion to an initial state, data transfer between DRAM array 102 and data transfer circuit 106, initiation of an auto refresh cycle, generation of DRAM NOP cycle and power down of the DRAM portion. Row address strobe signal RAS# therefore determines a basic operation cycle in the DRAM portion.

Column Address Strobe Signal CAS#:

Column address strobe signal CAS# is used together with external clock signal K for latching a DRAM column address signal. If row address strobe signal RAS# is previously applied in a DRAM access cycle, data transfer from data transfer circuit 106 to DRAM array 102 or data transfer from DRAM array 102 to data transfer circuit 106 is performed with column address strobe signal CAS# applied next, in which direction data transfer is conducted is determined by control signal DTD#.

Data Transfer Instruction Signal DTD#:

Data transfer instruction signal DTD# determines data transfer and redirection thereof between DRAM array 102 and data transfer circuit 106. When row address strobe signal RAS# is in a low level in the previous cycle, and column address strobe signal CAS# and data transfer instruction signal DTD# are both in a low level at a rising edge of external clock signal K, a DRAM write transfer cycle for data transfer from data transfer circuit 106 to DRAM array 102 is performed.

If data transfer instruction signal DTD# is in a high level, a DRAM read transfer cycle for data transfer from DRAM array to data transfer circuit 106 is performed. If data transfer instruction signal DTD# is pulled to a low level in synchronization with row address strobe signal RAS#, the DRAM portion enters a precharge mode. Any access operation to the DRAM portion is prohibited until the precharge cycle is completed.

Address Signals for DRAM Ad0 to Ad11:

DRAM array 102 includes four memory planes each including a 4M bit storage capacity. One DRAM memory plane has an arrangement of 4K rows×64 columns×16 blocks. One block includes 64 columns. DRAM address signals Ad0 to Ad11, DRAM row address signals and DRAM column address signals are multiplexed for application. When row address strobe signal RAS# is in a low level and data transfer instruction signal DTD# is in a high level on a rising edge of external clock signal K, DRAM address signals Ad0 to Ad11 are taken in as row address signal, and internal row address signals designating a corresponding row in DRAM array 102 are generated.

When column address strobe signal CAS# is in a low level on a rising edge of external clock signal K, DRAM address signals Ad0 to Ad9 are used as a block address for designating memory cells corresponding to 16 bits (1 bit from each of 16 blocks; in FIG. 1 memory cells 0 to 15) in DRAM array 102.

SRAM Clock Mask Signal CMs:

SRAM clock mask signal CMs controls transfer of internal SRAM clock signal (generated from K buffer/timing circuit 124). When SRAM clock mask signal CMs is in an active state on a rising edge of external clock signal K, generation of an internal SRAM clock signal is stopped in the next cycle, and the SRAM portion maintains the state in the previous cycle. SRAM clock mask signal CMs is also used for continuously maintain the same input/output data over a plurality of clock cycles.

Chip Select Signal CS#

Chip select signal CS# controls activation/deactivation of DRAM control circuit 128 and SRAM control circuit 132. More specifically, external control signals RAS#, CAS#, DTD#, CC0#, CC1# and WE# are all taken inside in response to external clock signal K and chip select signal CS#. When chip select signal CS# is in a high level corresponding to an inactive state, the CDRAM is in a nonselect state, and internal operation is not performed.

Write Enable Signal WE#:

Write enable signal WE# controls writing/reading operation of data to/from SRAM portion and data transfer circuit 106. With chip select signal CS# being in a low level active state on a rising edge of external clock signal K, data reading from data transfer circuit 106, data reading from SRAM array 104, or data transfer from data transfer circuit 106 to SRAM array 104 are conducted with write enable signal WE# in a high level (depending upon the states of control signals CC0# and CC1# described below).

When write enable signal WE# is in a low level, data writing to data transfer circuit 106, data writing to a selected memory cell in SRAM array 104, or data transfer from SRAM array 104 to data transfer circuit 106 is performed (depending upon control signals CC0# and CC1#).

Control Clock Signals CC0#, CC1#:

These control signals CC0# and CC1# controls access to SRAM portion and data transfer circuit 106. With chip select signal CS# being in a low level active state on a rising edge of external clock signal K, an operation mode to be executed is determined depending upon the states of control clock signals CC0# and CC1#.

SRAM Address Signals As0 to As11:

SRAM array 104 has four memory planes each including memory cells arranged in 256 rows and 16 columns. When SRAM array 104 is used as a cache memory, the block size of cache is 16×4 (IO corresponds to 4 bits). SRAM address signals As0 to As3 are used as a block address for selecting 1 bit in one cache block (one row), while SRAM address signals As4 to As11 are used as row address signals for selecting a row in SRAM array 104.

Output Enable Signal G#:

Output enable signal G# controls data output. Output enable signal G# is applied asynchronously with external clock signal K. When output enable signal G# is in a high level, in either the DQ separated or common DQ pin arrangement, the output attains a high impedance state. Data can be output when output enable signal G# is in a low level.

Input/Output DQ0 to DQ3:

Input/output DQ0 to DQ3 become data for CDRAM when a common DQ mode (masked write mode) is selected. The state of external output data bit is controlled with output enable signal G#. Data is output in one of transparent mode, latch mode and registered mode. In the transparent output mode, data on internal data bus 123 is directly transferred to main amplifier 438. When chip select signal CS# is in a high level on a rising edge of external clock signal K, a de-select mode is attained, resulting in an output high impedance state. Similarly, when output enable signal G# is in a high level, the output high impedance state is attained. If data can be output, data reading is performed in the cycle in response to a rising of external clock signal K.

In the registered output mode, data is delayed by 1 cycle for output. In this mode, an output register is provided between internal data bus 123 and main amplifier 438. In the latch output mode, an output latch circuit is provided between internal data bus 123 and the main amplifier 438. In this arrangement, read data is latched in the latch circuit and output through main amplifier 438. Even during the period in which invalid data appears on internal data bus 123, valid data is externally output. Accordingly, a sufficient time period can be secured for an external processing apparatus such as CPU to take in output data.

The above-described output modes are implemented by setting command data in a command register (not shown).

Inputs D0 to D3:

Inputs D0 to D3 indicate input data when the DQ separation mode is designated. In data writing such as in a write buffer cycle for writing data to data transfer circuit 10 or in a write SRAM mode for writing data to SRAM array 104, input data D0 to D3 are latched on a rising edge of external clock signal K.

Mask Enable Signals M0 to M3:

Mask enable signals M0 to M3 are enabled when the common DQ mode is designated. Mask enable signals M0 to M3 correspond to input/output data DQ0 to DQ3, and it is determined whether or not to mask a corresponding DQ bit. Settings for mask data are determined based on the states of mask enable signals M0 to M3 on a rising edge of external clock signal K. With mask enable signals M0 to M3, desired input data can be masked in a cycle for writing data to the SRAM array or the transfer circuit.

As can be clearly seen from above description of control signals, in CDRAM 400, operations related to the DRAM portion and operations related to the SRAM portion are separately performed. Data can be directly written/read to/from data transfer circuit 106. Thus, independently driving the DRAM portion and the SRAM portion facilitates control, so that data transfer using a high speed mode such as a DRAM page mode can be implemented, access time at the time of cache miss can be reduced and a burst mode can be implemented.

Since data transfer circuit 106 can be externally and directly accessed, data stored in DRAM array 104 is not adversely affected in such an external direct access to data transfer circuit 106, graphic data and cache data (data used by the external processing unit, CPU) can be both stored in DRAM array 102.

Note that in FIG. 1 data transfer circuit 106 includes 16 transfer gates. The transfer gates each includes a read transfer buffer 140 for transferring data from DRAM array 102 to SRAM array 104 or input/output circuit 135, a temporary register 142 for storing write data for SRAM 104 or on internal data bus 132, a write transfer buffer 144 for transferring data stored in temporary register 142 to DRAM array 102, and a mask register 146 for masking data transfer from write transfer buffer 144 to DRAM array 102. A read transfer buffer 140 the structure of which will be described in detail later a master transfer buffer and a slave transfer buffer.

Figure 2:
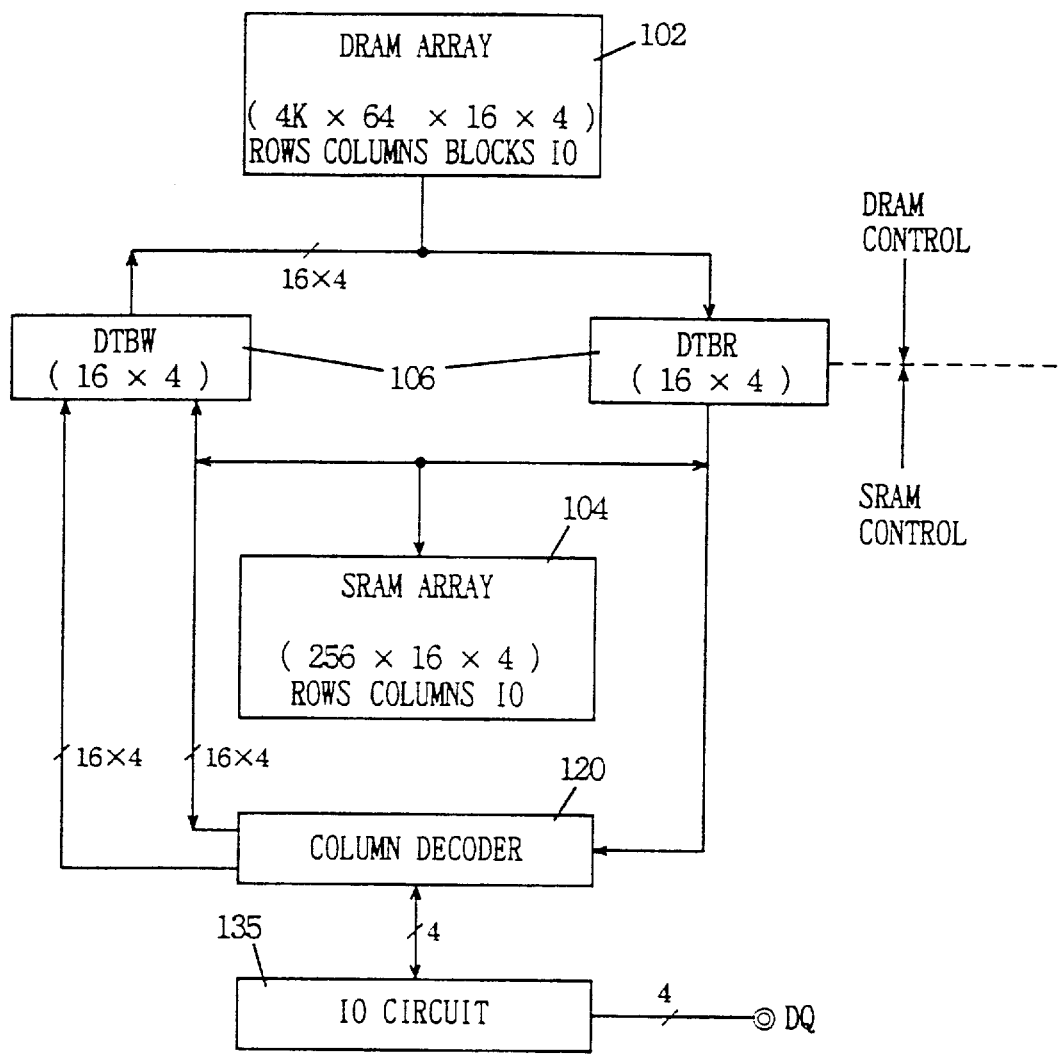
FIG. 2 is a diagram showing functionally the structure of a CDRAM according to one embodiment of the invention.

FIG. 2 is a diagram showing the functional configuration of the CDRAM shown in FIG. 1. In FIG. 2, DRAM array 102 includes an arrangement of 4K rows×64 columns×16 blocks×4 (IO). DRAM bit line pairs of 64 columns are arranged in one block, of which one column is selected.

SRAM array 104 has an arrangement of 256 rows×16 columns×4 (IO) bits. One row in SRAM array 104 (4 rows in total) is selected, data transfer can be performed at a time between 16 bit memory cells in the selected one row and 16 bits selected in DRAM array 102 (one bit from each block).

Data transfer circuit 106 includes a read data transfer buffer DTBR (16 bits×4 (IO)) for receiving data from DRAM array 102 and transferring the data to SRAM array 104 or IO (input/output) circuit 135, and a write data transfer buffer DTBW (16 bits×4 (IO)) for receiving data from SRAM array 104 or input/output circuit 135 and transferring the received data to DRAM array 102. The specific configurations of write data transfer buffer DTBW and read data transfer buffer DTBR will be described later in detail.

In FIG. 2, data is shown to be transferred from read data transfer buffer DTBR to write data transfer buffer DTBW through column decoder 120. This corresponds to an operation mode for directly transferring 16×4 bits data stored in read data transfer buffer DTBR to write data transfer buffer DTBW as will be described later.

Column decoder 120 selects 4 bits (1 bit per 16 bits) from read data transfer buffer DTBR (16 bits×4 (IO)), and transfers the selected 4 bit data to data input/output pins DQ through input/output circuit 135. In FIG. 2, data input/output terminal DQ is shown as a common DQ arrangement for inputting/outputting both write data and read data. Column decoder 120 selects memory cells of 4 bits in SRAM array 104 in an operation mode for writing/reading data to/from SRAM array 104. Column decoder 120 also selects four transfer gates from write data transfer buffer DTBW at the time of directly writing externally applied data to transfer circuit 106 and connects the selected transfer gates with input/output circuit 135.

With DRAM control circuit 128 (see FIG. 1) controls data transfer from DRAM array 102 to read data transfer buffer DTBR and data transfer from write data transfer buffer DTBW to DRAM array 102.

SRAM control circuit 132 (see FIG. 1) controls data writing from SRAM array 104 to data input/output terminal DQ, data writing from data input/output terminal DQ to SRAM array 104, data transfer from read data transfer buffer DTBR to SRAM array 104, data transfer from SRAM array 104 to write data transfer buffer DTBW, data writing from write data transfer buffer DTBW to data input/output terminal DQ, data reading from read data transfer buffer DTBR to data input/output terminal DQ, and writing of data applied to data input/output terminal DQ to SRAM array 104 and write data transfer buffer DTBW.

Logic of External Control Signals

FIG. 3 is a table showing operations executed corresponding to states of external control signals for an SRAM control circuit in a CDRAM according to one embodiment of the invention.

No Operation

When chip select signal CS# is at a high level, an output attains a high impedance state, and the SRAM portion attains a no operation mode NOP. In the no operation mode NOP, the SRAM portion maintains the previous state. The SRAM portion which operates for each clock cycle maintains a precharge state, or a nonselect state.

SRAM Power Down Mode

When SRAM clock mask signal CMs# is at a low level, an SRAM power down mode SPD is designated. In this mode, clock signal transfer in the SRAM is prohibited, and the SRAM portion maintains the previous cycle state. Therefore, in the data output portion, the previous cycle state is maintained, and if output data is output in the previous cycle, the data continuously to be output, in other words "data suspended state" is attained.

De-select SRAM Mode

When control clock signals CC0# and CC1# are both at a high level, a de-select SRAM mode DES is designated, and the output attains a high impedance state. Internal operations are conducted. In this state, the state of DQ control signal DQC for controlling the output impedance is arbitrary. Note that chip select signal CS# and clock mask signal CMs# are set to a low level and a high level, respectively. In the following description, this state is satisfied unless otherwise specified.

SRAM Read Mode

If control clock signal CC1# is set to a low level, and control clock signal CC0# and write enable signal WE# are set to a high level, the SRAM read mode SR is designated. A memory cell is selected in the SRAM array, and data in the selected memory cell is designated for reading. When DQ control signal DQC is at a high level, data read out from the selected memory cell in the SRAM array is output as output data Dout. If DQ control signal DQC is at a low level, main amplifier circuit 438 does not operate, and the same state as de-select SRAM mode is attained.

SRAM Write Mode

If control clock signal CC0# is set to a high level, and control clock signals CC1# and write enable signal WE# are set to a low level, SRAM write mode SW is designated. If DQ control signal DQC is at a high level, external data applied at that time is taken in and internal write data is produced. The produced internal write data is written into memory cells in SRAM array 104 selected based on SRAM address As0 to As11 applied at the time. Output Dout attains a high impedance state during the operation in this SRAM write mode SW depending upon a result of designation of a write mode, rather than control by DQ control signal DQC.

Buffer Read Transfer Mode

If control clock signal CC0# and DQ control signal DQC are both set to a low level with control clock signal CC1# and write enable signal WE# being set to a high level, a buffer read transfer mode BRT is designated. DQ control signal DQC is set to a low level for setting an output high impedance state in order to prevent erroneous output of data transferred to SRAM array from read data transfer buffer circuit DTBR.

In the buffer read transfer mode ERT, data latch in read data transfer buffer circuit DTBR is transferred to the SRAM array at a time. During the transfer operation, SRAM address signals As4 to As11 are used as SRAM row address signals for executing a row selecting operation.

Herein, "use" in FIG. 2 indicates use of data latch therein. "Load/use" indicates that the data is loaded and used.

Buffer Write Transfer Mode

If control clock signal CC17 is set to a high level, control clock signal CC0#, write enable signal WE# and DQ control signal DQC are set to a low level, the buffer read transfer mode BRT is designated. In this mode, data is transferred from the SRAM array 104 to write data transfer buffer circuit DTBW. Write data transfer buffer circuit DTBW and mask register circuit (146a) both include a temporary latch circuit having an arrangement of two stages of latches. In the buffer write transfer mode BWT, the temporary latches included in write data transfer buffer circuit store data from SRAM array 104. Concurrently in the mask register circuit, the mask data of the temporary mask register is all reset in order to transfer all the data transferred from SRAM array 104 to the DRAM array.

When SRAM address signals As4 to As11 are taken in as SRAM row address signals and a row selection operation in SRAM array 104 is executed. Data in memory cells of 16 bits in one row thus selected is transferred to write data transfer buffer circuit DTBW.

Buffer Read Transfer and Read Modes

If control clock signal CC0# is set to a low level, and clock signals CC1#, write enable signal WE# and DQ control signal DQC are set to a high level, a buffer read transfer and read mode BRTR is designated. In this mode, data stored in read data transfer buffer circuit DTBR is transferred to the SRAM array and data is externally output. Data is transferred from read data transfer buffer circuit DTBR to memory cells in the SRAM array. One transfer gate is selected from 16 transfer gates (for one memory plane or one input/output terminal DQ) in read data transfer buffer circuit DTBR, and data in the selected transfer gate is output. Accordingly, in this operation mode, SRAM address signals As0 to As11 are all used.

Buffer read transfer mode BRT and buffer read transfer and read mode BRTR are different simply in the state of DQ control signal DQC.

Buffer Write Transfer and Write Mode

If control clock signal CC0# and write enable signal WE# are both set to a low level, and control clock signals CC1# and DQ control signals DQC are set to a high level, a buffer write transfer and write mode BWTW is designated. In the mode BWTW, externally applied write data is written in a corresponding memory cell in the SRAM array, and data in memory cells in one row including the memory cell which has been subjected to the data writing is transferred to write data transfer buffer circuit DTBW. Mask data in the mask register is all reset.

During operation in the buffer write transfer and write mode BWTW, setting DQ control signal DQC to a low level provides only a buffer write transfer operation.

Buffer Read Mode

If control clock signal CC0# and CC1# are both set to a low level, and write enable signal WE# and DQ control signal DQC are set to a high level, a buffer read mode BR is designated. During the operation in buffer read mode BR, one transfer gate (for one data input/output terminal) is selected in read data transfer buffer circuit DTBR based on SRAM address As0 to As3, and data latched by the selected transfer gate is output. In this operation mode, setting DQ control signal DQC to a low level provides a de-select SRAM mode operation without data reading.

Buffer Write Mode

If control clock signals CC0# and CC1# and write enable signal WE are set to a low level, and DQ control signal DQC is set to a high level, a buffer write mode BW is designated. In this case, a transfer gate (date register) in write data transfer buffer circuit DTBW is selected based on SRAM address signals As0 to As3, and externally applied data is written to the selected data register. In this operation mode, in write data transfer buffer circuit DTBW, only mask data corresponding to the register which has been subjected to the data writing is reset.

In the table set forth in FIG. 3, the states of control signals and DRAM addresses related to the operation of the DRAM array are not shown. Driving of the SRAM portion and driving of the DRAM portion independently executed. Accordingly, in the table shown in FIG. 3, the states of control signals and DRAM address signals associated with the operation of the DRAM array are arbitrary.

FIG. 4 is a table showing the states of control signals applied to the DRAM portion and operation modes implemented corresponding thereto. In FIG. 4, the operation of the DRAM portion is irrelevant to the operation of the SRAM array portion and data input/output. More specifically, the states of control signals CC0#, CC1#, WE# and DQC related to the SRAM portion are arbitrary, and therefore states of these control signals are not shown.

DRAM Power Down Mode

If DRAM clock mask signal CMd# is at a low level in the previous cycle, the DRAM array enters a DRAM power down mode DPD. In this mode, the state designated in the previous cycle is maintained (because an internal clock signal is not transferred). Chip select signal CS# is used to prevent the SRAM portion and DRAM portion from being set to a new operation state (mode). With chip select signal CS# being set to a high level, in active state, the DRAM will not make any new operation. As for chip select signal CS#, such a configuration may be employed that chip select signal CS# in a high level at inactive state is not applied to both DRAM control circuit 128 and SRAM control circuit 132. In this state, the DRAM portion and SRAM portion maintain the states in the previous cycle. Such a configuration may alternatively be employed that with chip select signal CS# being at a high level, the SRAM portion is reset and attains an output high impedance state, while the DRAM portion continues to execute an operation designated in the previous cycle.

DRAM No Operation Mode

If chip select signal CS# is at a low level (the following description of operation follows this condition), in the previous clock cycle mask signal CMd is at a high level (this condition also applies to the following description) for address strobe signal RAS#, column address strobe signal CAS# are both at a high level, DRAM no operation mode (DNOP) is designated. In this mode, the DRAM array maintains the previous cycle state and does not enter a new operation mode. DRAM no operation mode DNOP is used for preventing the DRAM portion from entering a new operation mode. If a certain operation mode is designated in the previous cycle, and DRAM no operation mode DNOP is designated, the operation designated in the previous cycle continues to be executed inside.

DRAM Read Transfer Mode

If row address strobe signal RAS# and data transfer instruction signal DTD# are both set to a high level, and column address strobe signal CAS# is set to a low level, DRAM read transfer mode DRT is designated. In DRAM read transfer mode DRT, in DRAM array 102, a memory cell block (memory cells of 16 bits) is selected by block decoder 112, and data in the selected column block (memory cells of 16 bits) is transferred to read data transfer buffer circuit DTBR.

DRAM Activate Mode

If row address strobe signal RAS# is set to a low level, and column address strobe signal CAS# and data transfer instruction signal DTD# are both set to a high level, DRAM activate mode ACT is designated. In this mode, address signals Ad0 to Ad11 applied at the time are taken in as DRAM row address signals, and a row selecting operation is performed in DRAM array 102 based on the row address signals. If DRAM activate mode ACT is designated, the row selecting state is maintained until a DRAM precharge mode is designated which will be described later. Effective use of DRAM activate mode ACT permits the sense amplifiers of the DRAM to attain a data latch state, and data transfer utilizing a page mode is implemented.

DRAM Precharge Mode

If row address strobe signal RAS# and data transfer instruction signal DTD# are both set to a low level, and column address strobe signal CAS# is set to a high level, DRAM precharge mode PCG is designated. In this mode, a select word line in the DRAM array transits to a nonselect state, and the DRAM returns to the initial state (standby state). When a different row is to be selected in the DRAM array, execution of DRAM precharge mode PCG is requested between DRAM activate mode ACT and the next DRAM activate mode ACT.

Auto Refresh Mode

If address strobe signals RAS# and CAS# are both set to a low level, and data transfer instruction signal DTD# is set to a high level, the DRAM portion enters an auto refresh mode ARF. In this mode, an address counter (not shown in FIG. 1) provided inside the CDRAM generates a refresh address, based on which data in the memory cells are refreshed. In order to complete the auto refresh mode, DRAM precharge mode PCG must be performed.

Data Transfer Operation Mode From Write Data Transfer Buffer Circuit to DRAM Array There are four kinds of data transfer modes from write data transfer buffer circuit DTBW to the DRAM array. A data transfer operation from write data transfer buffer circuit DTBW to the DRAM array is designated by setting row address strobe signal RAS# to a high level, and column address strobe signal CAS# and data transfer instruction signal DTD both to a low level. In this state, address signals Ad4 to Ad9 applied concurrently are applied to block decoder 112 (see FIG. 1) and data corresponding to a column block (memory cells of 16 bits) selected in the DRAM array is transferred. Which one of the four data transfer modes is to be performed is determined in response to address signals Ad0 to Ad3 applied when column address strobe signal CAS# is at a low level, in other words, when the write data transfer mode is designated. Address signals Ad4 to Ad11 are necessary at the time of data transfer. The remaining less significant address signals Ad0 to As3 are not used for memory cell selection, and therefore these non-use address signals are used as commands for designating the write transfer mode.

DRAM Write Transfer 1 Mode

Mode DWT1 is designated by setting a DRAM write data transfer command (setting signal RAS# to a high level, and signals CAS# and signal DTD# to a low level) and address signals Ad0 and Ad1 applied concurrently to "0". In mode DWT1, data from a temporary registers is loaded to write data transfer buffer DTBW, and the loaded data is transferred to the DRAM array. In synchronization with data transfer from the temporary register (Tm) in write data transfer buffer circuit DTBW to the data transfer buffer DTBW, mask data from the temporary register (Tm) is transferred to mask register in the transfer mask circuit, and the transfer is masked. In this mode DWT1, after data transfer is completed, mask data in the temporary register attains a set state (state for masking data transfer: this is for resetting the mask and writing only necessary data in the DRAM array, when data is written in the buffer write mode).

DRAM Write Transfer 1/Read Mode

Mode DWT1R is designated by setting address signals Ad0 and Ad1 applied simultaneously with a write data transfer command to "1" and "0", respectively. In mode DWT1R, data in write data transfer buffer circuit DTBW is transferred to a selected column block (memory cells of 16 bits), and data in the memory cells in the selected column block is transferred to read data transfer buffer circuit DTBR. Thus, during a cache miss write operation, if the same column block is designated next, data reading can be performed from read data transfer buffer circuit, and the content in SRAM 104 which has been missed of access can be rewritten by writing data in SRAM array 104 from read data transfer buffer circuit DTBR, thereby reducing penalties at the time of cache miss.

DRAM Write Transfer 2/Read Mode

Mode DWT2 is designated by setting column address signals Ad0 and Ad1 to "0" and "1", respectively. In operation mode DWT2, data is transferred from write data transfer buffer circuit DTBW to a selected column block in the DRAM array. In this case, in write data transfer circuit BTBW, data is not transferred from a temporary register to write data transfer buffer. This also applies to the mask register.

In write data transfer buffer circuit DTBW, the temporary register and the buffer register portion which actually transfer data to the DRAM array are separated. Repeatedly performing DRAM write transfer 2 mode DTW2 transfers the same data to the DRAM array. In DRAM array 102, if a column block is selected in a page mode, the content in the DRAM array can be rewritten with the same data at a high speed. More specifically, so-called "region filling (painting out)" in graphic processing applications can be achieved at a high speed.

DRAM Write Transfer 2/Read Mode

Mode DWT2R is designated by setting address signals Ad0 and Ad1 applied simultaneously with the write transfer command to "1". In transfer operation mode DWT2R, in addition to the operation in DRAM write transfer 2 mode, data in a column block selected in the DRAM array is transferred to read data transfer buffer circuit DTBR. In this operation mode DWT2R, "region filling" can be implemented at a high speed.

Control Circuit

Figure 5:
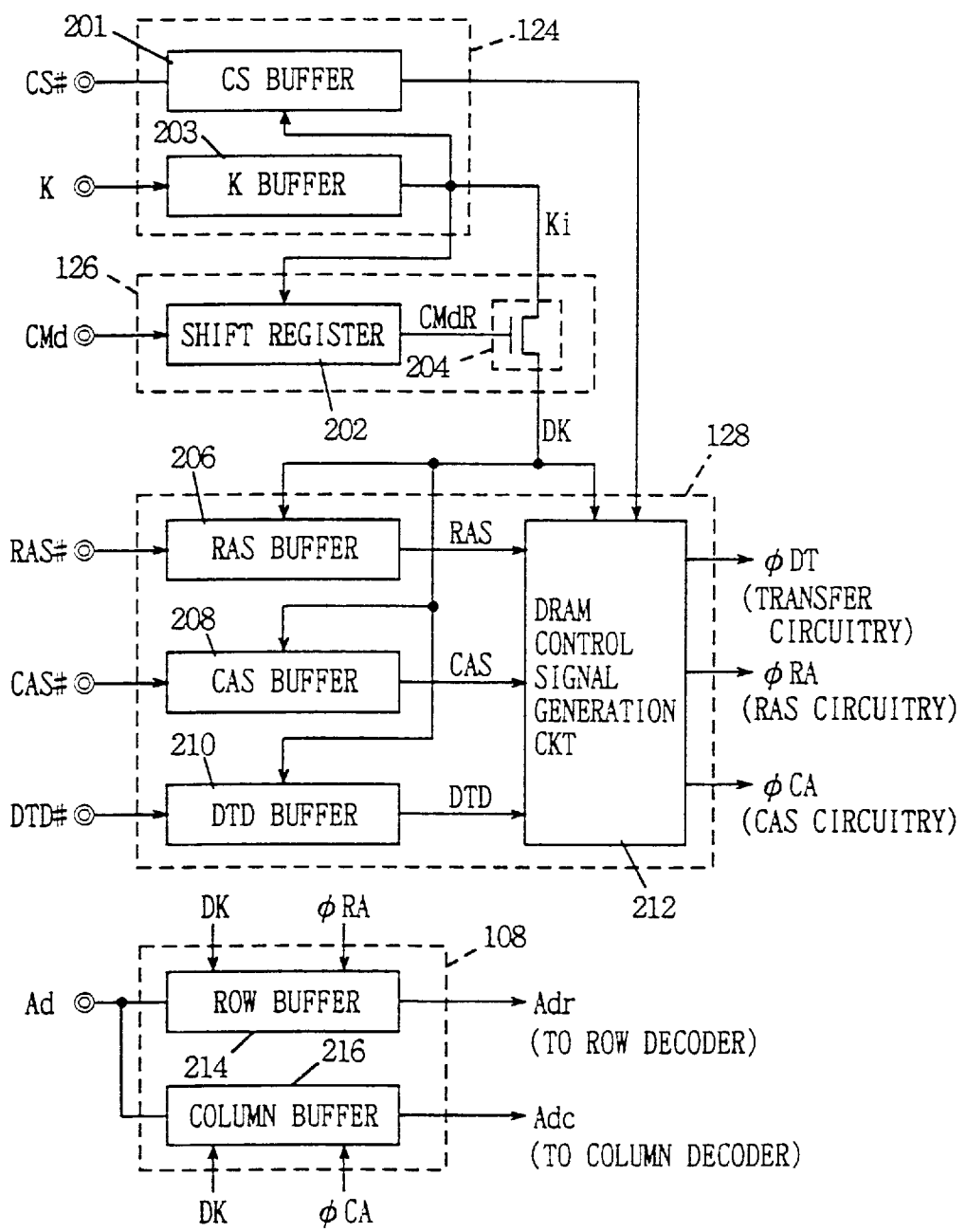
FIG. 5 is a diagram schematically showing the structure of the DRAM control circuit shown in FIG. 1.

FIG. 5 is a diagram schematically showing the configuration of the DRAM control circuit and mask circuit shown in FIG. 1. The configuration will be described later in detail. In FIG. 5, K buffer/timing circuit 124 includes a K buffer 203 which receives external clock signal K and generates internal clock signal Ki, and a CS buffer 201 which takes in chip select signal CS# and generates internal chip select signal CS in synchronization with internal clock signal Ki.

K buffer/timing circuit 124 may be configured to operate asynchronously with external clock signal Ki output from K buffer 203, and to transfer internal clock signal Ki output from K buffer 203 when chip select signal CS# is at an active level (low level).

Mask circuit 126 includes a shift register 202 for delaying DRAM clock mask signal CMd by one clock cycle of internal clock signal Ki from K buffer 203, and a gate circuit 204 for passing internal clock signal Ki based on delayed clock mask signal CMdR. For gate circuits 204 configuration formed of an n channel MOS (insulating gate type field effect) transistor is shown by way of illustration. In a clock cycle, if clock mask signal CMd is set to a low level inactive state, transfer of internal clock signal Ki is prohibited in the next clock cycle, and therefore generation of DRAM clock signal DK is stopped.

DRAM control circuit 128 operates in synchronization with clock signal DK transferred from gate circuit 204. DRAM control circuit 128 includes an RAS buffer 206 which generates an internal row address strobe signal RAS from a row address strobe signal RAS#, a CAS buffer 208 which generates an internal column address strobe signal CAS from a column address strobe signal CAS#, a DTD buffer 210 which generates an internal transfer instruction signal DTD from a data transfer instruction signal DTD#, and a DRAM control signal generation circuit 212 which determines an operation mode designated by a combination of states of signals RAS, CAS and DTD from buffers 206, 208 at the rising edge of DRAM clock signal DK and generates a control signal based on the result of determination. DRAM control signal generation circuit 212 is activated in response to chip select signal CS# from CS buffer 201. When chip select signal CS# is in a high level inactive state, DRAM control signal generation circuit 212 does not determine an operation mode and attains a state the same as the no operation mode.

Buffers 206, 208 and 210 take in and latch a signal applied on a rising edge of clock signal DK and generate internal control signals.

DRAM control signal generation circuit 212 also monitors a period of latency necessary at the time of data transfer according to DRAM clock signal DK. DRAM control signal generation circuit 212 generates various control signals necessary for driving the DRAM array portion and data transfer between the data transfer circuit (read data transfer buffer circuit and write data transfer buffer circuit) and the DRAM array. Shown as examples of such signals are a transfer control signal φDT for controlling the operation of transfer circuitry, an RAS circuit control signal φRA controlling the operation of circuitry related signal RAS such as a row selection operation in the DRAM array, and a control signal φCA for controlling the operation of the circuit portion related to the operation of CAS circuitry (column selection).

Address buffer 108 includes a row buffer 214 which latches external DRAM address signal Ad (Ad0 to Ad11) in response to DRAM clock signal DK and RAS circuit control signal φRA and generates DRAM row address signal Adr, and a column buffer 216 which latches DRAM address signal Ad and generates DRAM column address signal Adc in response to DRAM clock signal DK and CAS circuit control signal φCA. Row address signal Adr is applied to row decoder 110 shown in FIG. 1, and more significant bits (Ad4 to Ad9) of column address signal Adc from column buffer 216 are applied to column block decoder 112 shown in FIG. 1.

Figure 6:
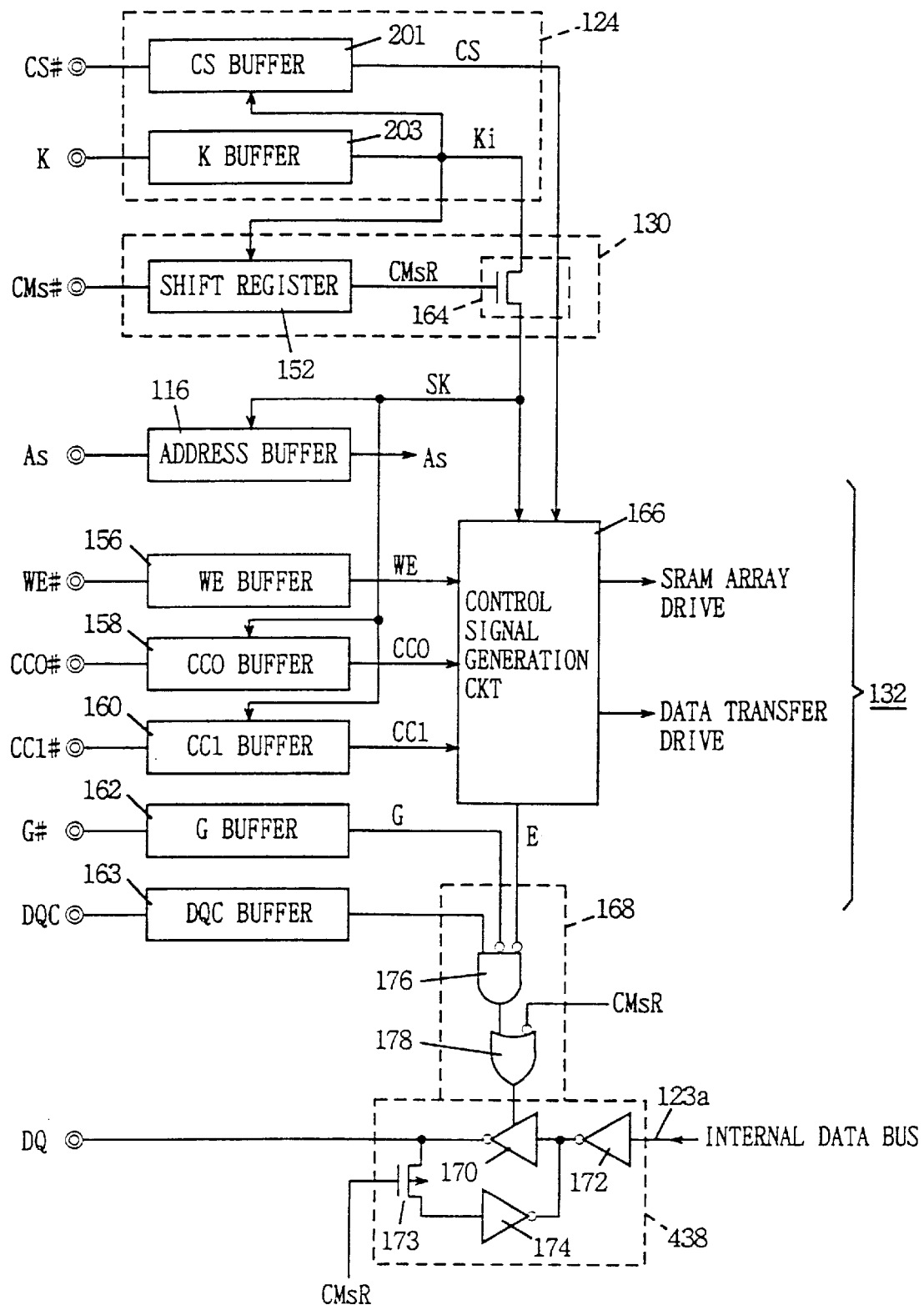
FIG. 6 is a diagram schematically showing the structure of the SRAM control circuit shown in FIG. 1.

FIG. 6 is a diagram showing the configuration of an SRAM control circuit portion. FIG. 6 shows only the portion of main amplifier 438 out of input/output circuit 135. The configuration of Din buffer and mask circuit 436 is not shown.

Mask circuit 130 includes a shift register 152 which operates in synchronization with internal clock signal Ki from K buffer/timing circuit 124, a shift register 152 which delays SRAM clock mask signal CMs by the period of 1 clock cycle, and a gate circuit 164 passing internal clock signal Ki based on the output CMsR of shift register 152. Gate circuit 164 is formed of a transfer gate of an n channel MOS transistor, for example. When clock mask signal CMs is at a low level, gate circuit 164 prohibits transfer of internal clock signal Ki. Gate circuit 164 may be formed using a logic gate. An SRAM clock signal SK is generated from mask circuit 130.

SRAM control circuit 132 includes WE buffer 156 latches write enable signal WE# in response to SRAM clock signal SK, and buffers 158 and 160 which latch control signals CC0# and CC1# in response to SRAM clock signal SK. These buffers 156, 158 and 160 latch external clock signals applied thereto in synchronization with a rising edge of internal clock signal SK.

SRAM control circuit 132 further includes a control signal generation circuit 166 which is activated in response to chip select signal CS from CS buffer 201, receives control signals WE, CC0, and CC1 applied from buffers 156, 158 and 160 in a timing defined by SRAM mask clock signal SK, determines an operation mode designated by a combination of their states, and generates a necessary control signal based on the result of determination.

Control signal generation circuit 166 generates a data transfer control signal for driving the data transfer circuit and an SRAM driving control signal for driving SRAM array 104. During data transfer between the SRAM array and the data transfer circuit, the period of transfer is defined by SRAM clock signal SK, in order to securely transfer data.

A G buffer 162 which receives output enable signal G# also operates asynchronously with clock signal SK. DQC buffer 163 receiving DQ control signal DQC is also shown as operating asynchronously with clock signal CK.

SRAM control circuit 132 further includes a gate circuit which receives an output admission signal E from control signal generation circuit 166, output enable signal G from G buffer 162, and output signal DQC from DQC buffer 163, and a gate circuit 178 which receives the output of gate circuit 176 and clock mask signal CMsR. Gate circuit 178 outputs a signal at a high level when output admission signal E and output enable signal G are both at a low level, and DQ control signal DQC is at a high level. Gate circuit 178 outputs a signal at a high level when mask signal CmsR is at a low level and the output of gate circuit 176 is at a high level.

Main amplifier circuit 438 includes an inverter which inverts a signal from internal data bus 123a (a data bus dedicated for reading is shown: the bus may be also used for write data bus), a tristate inverter buffer 170 which inverts the output of inverter circuit 172, a p channel MOS transistor 173 which conducts in response to mask signal CMsR, and an inverter circuit 174 which inverts the output of transistor 173 for transfer to the output of inverter 172 (the input of inverter 170). With tristate inverter buffer 170 being in enable state, inverter buffer 170 and inverter circuit 174 constitute a latch circuit if transistor 173 is in a conduction state. The operation will be briefly described.

One clock cycle delayed clock mask signal MsR is output from shift register 152. Gate circuit 164 passes internal clock signal Ki based on this one clock cycle delayed clock mask signal CMsR. Therefore, if SRAM clock mask signal CMs# is generated externally, transfer of SRAM clock signal SK to SRAM control circuit 132 is prohibited in the next clock cycle. Control signal generation circuit 166 has its operation timing defined by SRAM clock signal SK, and generates a necessary internal control signal. Buffers 156, 158 and 160 latch applied data based on clock signal SK. If SRAM clock signal SK is not applied, buffers 156, 158 and 160 continue to latch signals which has been latched previously.

If chip select signal CS from CS buffer 201 indicates a non-select state at a high level, control signal generation circuit 166 is reset and does not operate. In this case, output admission signal E from control signal generation circuit 168 is set to a high level, inactive state responsively. This output admission signal E is also generated based on a combination of states of control signals WE, CC0 and CC1 from buffers 156, 158 and 160 (when data reading operation is indicated: if buffer read mode BR, SRAM read mode SR or the like is designated).

SRAM clock signal SK is masked by clock mask signal CMsR in a clock cycle next to the cycle in which mask clock signal CMs# is generated. Accordingly, if SRAM clock mask signal CMs# is externally applied, internal chip select signal CS and SRAM clock signal SK are generated in that cycle, and therefore an operation according to a control signal applied at that time is performed. An internal clock signal is not generated in the next cycle, and control signal generation circuit 166 maintains the previous cycle state.

If clock mask signal CMsR is at a low level, the output of gate circuit 178 attains a high level, tristate inverter buffer 170 attains an operation state, and connection gate 173 (p channel MOS transistor) conducts. Thus, inverter buffer 170 and inverter circuit 174 constitute a latch circuit. While the output G of G buffer 162 is in an active state (low level), output data DQ holds the same data state by the function of inverter circuits 170 and 174. When chip select signal CS# is at a high level, control signal generation circuit 166 is reset, output admission signal E attains a high level inactive state, and the output of gate circuit 176 attains a low level. If clock mask signal CMsR attains a high level, the output of gate circuit 178 is determined by the output of gate circuit 176.

Output enable signal G from G buffer 162 is at a high level, the output of gate circuit 176 attains a low level. Therefore, even if the output admission signal E is generated, tristate inverter buffer 170 attains an output high impedance state. In addition, even if output admission signal E and output enable signal G are both at a low level instructing data reading, with signal DQC from DQC buffer 163 being at a low level, the output of gate circuit 176 attains a low level and tristate inverter buffer 170 attains an output impedance state. As described above, the impedance state of the output can be set with clock mask signal CMsR and chip select signal CS# and output enable signal G and DQ control signal DQC.

Input Buffer

An input buffer which takes in external signals operates in synchronization with clock signals. For the input buffer, a tristate inverter buffer which attains an output high impedance state with a clock signal at an inactive level (low level) can be used. In such an output high impedance state, however, the output is unstable, and erroneous operations may result. Thus, a dynamic latch may be used for the input buffer as a circuit which operates in synchronization with a clock signal and whose output is not unstable.

Figure 7:
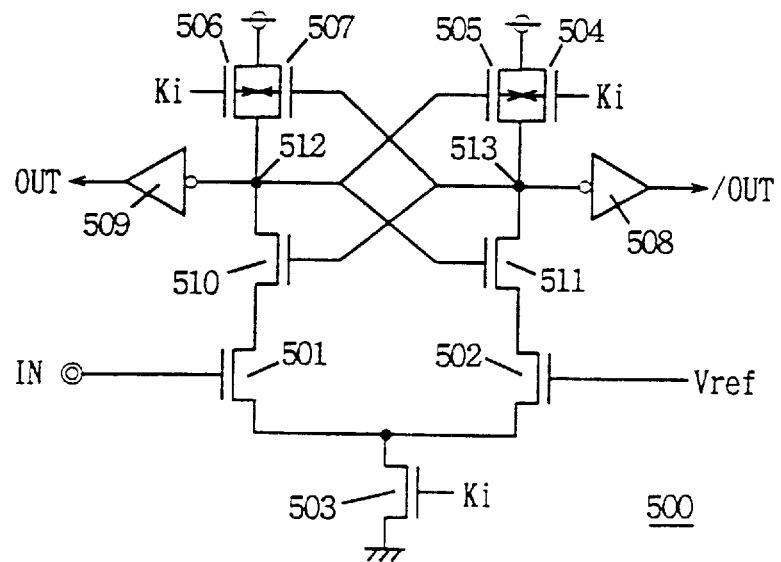
FIG. 7 is a diagram showing an example of input buffer structure.

FIG. 7 is a diagram showing the configuration of an input buffer including a dynamic latch. In FIG. 7, the dynamic latch includes an n channel MOS transistor 501 which receives an external signal IN at its gate, an n channel MOS transistor 504 which receives reference voltage Vref at its gate, and an n channel MOS transistor 503 which receives clock signal Ki at its gate and provides a current path for transistors 501 and 502. One conduction terminal (source) of each of transistors 501 and 502 is connected to the other conduction terminal (drain) of transistor 503. One conductive terminal (source) of transistor 503 is connected to receive a ground potential.

Dynamic latch 500 further includes a p channel MOS transistor 504 which receives clock signal Ki (corresponding to DK or SK) at a gate, a p channel MOS transistor 505 connected in parallel to transistor 504, a p channel MOS transistor 506 which receives clock signal Ki at its gate, a p channel MOS transistor 507 connected in parallel to transistor 506, an n channel MOS transistor 511 provided between transistors 504 and 505 and transistor 502, and an n channel MOS transistor 510 provided between transistors 506 and 507 and transistor 501.

Transistors 504 and 505 are provided between a power supply potential supply node and internal node 513, and transistors 506 and 507 are provided between operation power supply potential supply node and internal node 512. Transistors 505 and 511 have their gates connected to internal node 512, and transistors 507 and 510 have their gates connected to internal node 513.

Figure 8:
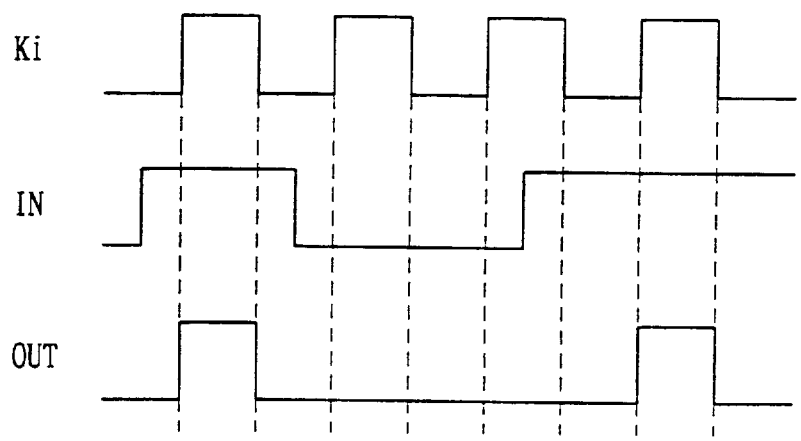
FIG. 8 is a signal waveform chart showing the operation of the input buffer shown in FIG. 7.

Dynamic latch 500 further includes an inverter circuit 508 for inverting a signal on node 513 for output, and inverter circuit 509 for inverting a signal potential on internal node 512 for output. An output OUT is output from inverter circuit 509, and an inverted output signal /OUT is output from inverter circuit 508. The operation of latch 500 will be briefly described in conjunction with FIG. 8.

When internal clock signal Ki is at a low level, transistors 506 and 504 are both turned on, internal nodes 512 and 513 are charged to the level of operation power supply potential, and outputs OUT and /OUT both attain a low level state. Transistor 503 is in an off state at the time.

When internal clock signal Ki rises to a high level, transistors 504 and 506 are both turned off, and transistor 503 is turned on. If input signal (externally applied signal) IN is at a level higher than reference voltage Vref, the conductance of transistor 501 becomes larger than the conductance of transistor 502, and current is passed through transistors 506, 510, 501 and 503. Transistor 501 operates in a source follower state. Accordingly, as transistor 501 conducts, another conduction terminal of transistor 503 attains a potential level produced by subtracting the threshold voltage of transistor 501 from the level of input signal IN, transistor 501 substantially attains an off state, and little current is passed through transistor 502. Internal node 512 is discharged by the conduction of transistor 501 and its potential level is lowered. Transistor 505 is turned on, and the potential of internal node 513 is raised. According to the potential rising of internal node 513, transistor 507 transits to an off state and the potential of internal node 512 is lowered at a high speed. According to the potential decrease of internal node 512, transistor 511 is turned off, and the potential of internal node 513 further increases. According to the series of these operations, the potential level of internal node 513 attains a high level, the potential level of internal node 512 attains a low level, and the output OUT of inverter circuit 510 attains a high level.

When internal clock signal Ki falls to a low level, transistors 504 and 506 are turned on, nodes 512 and 513 are once again charged to the power supply potential level, and output OUT falls to a low level (because transistor 503 is turned off and the current path is cut off). When internal clock signal Ki shifts to a high level, and internal signal IN is at a low level, output signal OUT attains a low level and complementary output /OUT attains a high level as opposed to the foregoing description.

With such dynamic latch 500, when internal clock signal Ki is in a high level active state, a signal corresponding to the level of input signal IN can be output, and when clock signal Ki is at a low level, output signals OUT and /OUT can be both set to a low level. Thus an output high impedance state is avoided, and erroneous operations by noises or the like will hardly occur.

If the dynamic latch as described above is used, however, the state of output signal OUT, i.e. the internal control signal is determined only after clock signal Ki attains a high level active state. Clock signal Ki attains a high level for determining the internal control signal, then the state of the internal control signal is determined, and internal operations are executed based on the result of determination. Delays in operation start timings and their effects upon accessing time cannot be ignored in the case of high speed clock signal. In addition, whether or not to select CDRAM is determined with chip select signal CS#, and a determination timing for chip select signal CS# is preferably advanced as much as possible.

Configuration of Preferably Input Buffer

Figure 9:
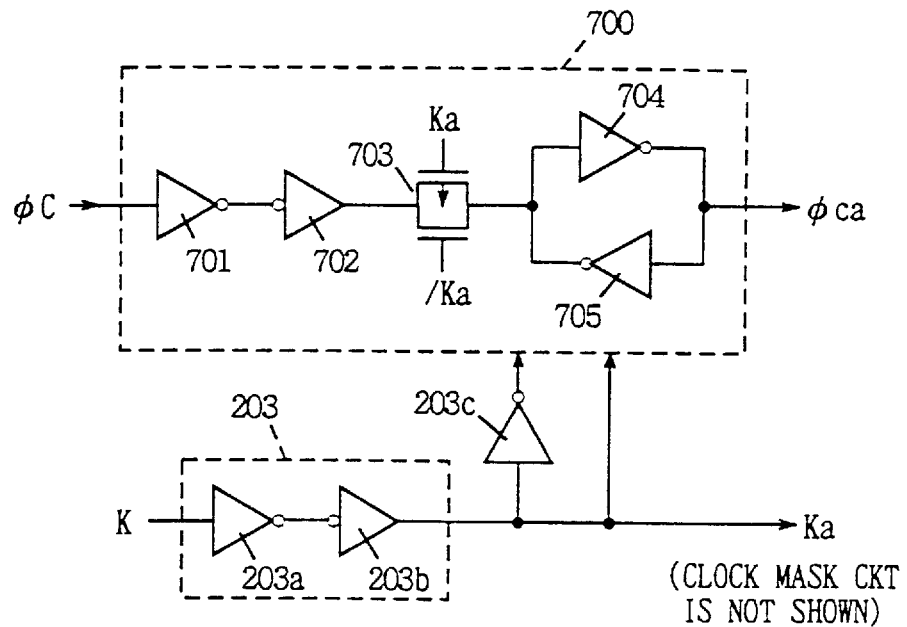
FIG. 9 is a diagram showing the basic structure of an input buffer formed according to the present invention.

FIG. 9 is a diagram showing a preferable configuration of an input buffer. In FIG. 9, input buffer 700 attains a non-conduction state and an output latched state (hereinafter referred to as "latch state") when an internal clock signal Ka from clock buffer 203 is at an active state (high level), and conducts to attain a state to pass an external signal therethrough (hereinafter referred to as "through state") when clock signal Ka is at an inactive level (low level).

Clock buffer 203 includes cascaded inverter circuits 203a and 203b. Internal clock signal Ka from clock buffer 203 and complementary clock signal /Ka produced by inverting internal clock signal Ka at inverter circuit 203c are used as clock signals for driving input buffer.

Input buffer 700 includes an inverter circuit 701 receiving an external signal φc, an inverter circuit 702 receiving the output of inverter circuit 701, a transmission gate selectively passing the output of inverter circuit 702 in response to clock signals Ka and /Ka, inverter circuits 704 and 705 for latching the output of transmission gate 703.

Transmission gate 703 attains a conduction state when clock signal Ka is at a low level and a non-conduction state when clock signal Ka is at a high level.

Inverter circuit 704 produces internal signal φca by inverting the output of transmission gate 703. Inverter circuit 705 inverts the output of inverter 704 for transmission to the input portion of inverter circuit 704. The operation of the input buffer shown in FIG. 9 will be described in conjunction with FIG. 10, which is waveform chart for the operation thereof.

At the time t1, external signal φc attains a low level active state. At the time, clock signal K (i.e. internal clock signal Ka) is at a low level, transmission gate 703 is in a conduction state, and input buffer 700 is in a through state. Therefore, internal signal φca rises to a high level in response to a falling of external clock signal φc to a low level.

At the time t2, in response to a rising of clock signal K, transmission gate 703 attains a non-conduction state and input buffer 700 attains a latch state. In the latch state, the state of internal signal φca does not change even if external clock signal φc rises to a high level. At the time t3, in response to a falling of clock signal K to a low level, input buffer 700 attains a through state, and internal signal φca changes based on the state of external signal φc (falls to a low level).

Figure 10:
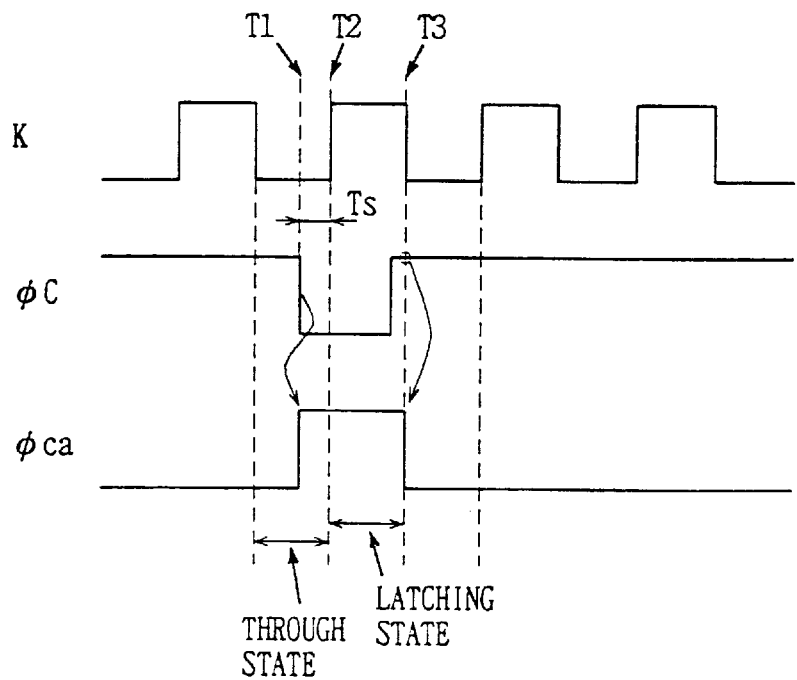
FIG. 10 is a signal waveform chart showing the operation of the input buffer shown in FIG. 9.

As illustrated in FIG. 10, internal signal φc is generated (activated) during set up time Ts for external signal φc. Therefore, during this set up time Ts the internal circuit can be operated, and the execution start timing for the operation based on external signal φc can be advanced.

Figure 11:
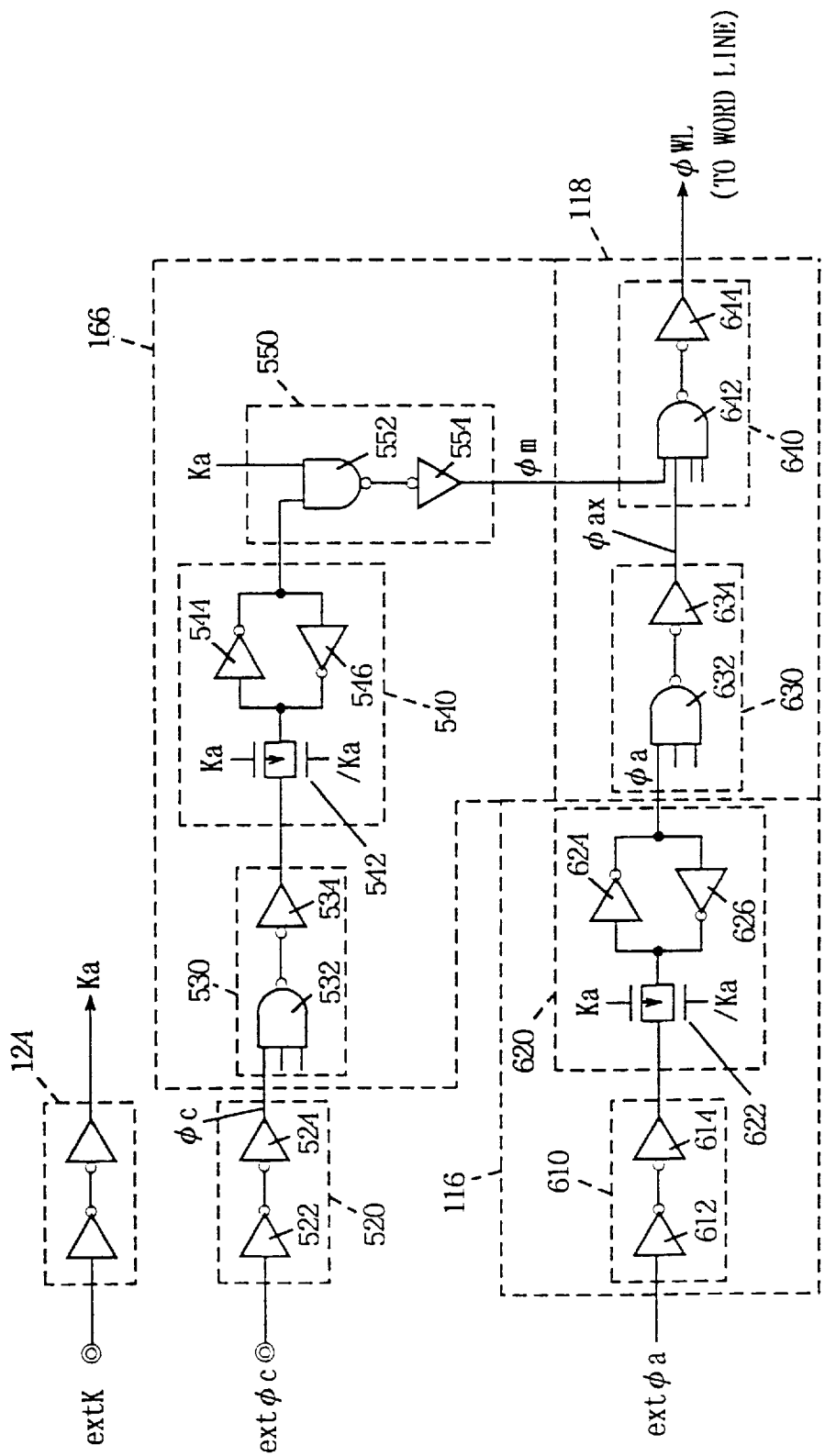
FIG. 11 is a diagram showing an example of SRAM word line selecting circuitry formed according to the present invention.

FIG. 11 is a diagram specifically showing a part of the configuration of an SRAM control circuit portion shown in FIG. 6. In the configuration shown in FIG. 6, a CS buffer 201 latches external chip select signal CS# in response to internal clock signal Ki from clock buffer 203. The configuration shown in FIG. 9 may be employed for such CS buffer 201.

In the configuration shown in FIG. 11, CS buffers, WE buffers, CC0 buffers, and CC1 buffers are all identically configured. Determination of selection/non-selection of a chip (CDPAM) with chip select signal CS# is executed in control circuit 166 in the FIG. 11. As will be described, signal CS# can be used for controlling acceptance of an external control signal.

In FIG. 11, all external control signals are represented by extφc.

In FIG. 11, external control signal input buffer 520 includes cascaded two stages of inverter circuits 522 and 524. Internal control signal φc asynchronous with clock signal Ka is generated from input buffer 520.

Control signal generation circuit 166 includes a determination circuit 530 for determining a designated operation mode based on the states of the internal control signals and generating a control signal corresponding to the determined operation mode, a latch circuit 540 for latching the output of determination circuit 530 in response to internal clock signal Ka and /Ka, and an operation mode designation signal generation circuit 550 for generating an operation mode designation signal φm in response to the output of latch circuit 540 and internal clock signal Ka.

Determination circuit 530 includes an NAND decode circuit 532 for decoding an internal control signal applied from control signal input buffer 520, and an inverter circuit 534 for inverting the output of NAND decode circuit 532. Decode circuit 532 specifically receives chip select signal CS, write enable signal WE, control signal CC0 and CC1 and executes a decoding operation. When a prescribed operation mode is designated, the output of NAND decode circuit 532 attains a high level.

Latch circuit 540 includes a transmission gate 542 which is selectively turned on/off in response to clock signal Ka, and inverter circuits 544 and 546 for latching the output of transmission gate 542. The output of inverter circuit 544 is transferred to the input of inverter circuit 544 through inverter circuit 546. Transmission gate 542 attains a conduction state when internal clock signal Ka is at a low level, and attains a non-conduction state when clock signal Ka is at a high level. Latch circuit 540 attains a through state when external clock signal Ka is in a low level inactive state, and a latch state when clock signal Ka is in a high level active state.

Operation mode designation signal generation circuits 500 includes 2-input NAND circuit 552 receiving the output of latch circuit 540 and internal clock signal Ka, and an inverter circuit 554 for inverting the output of NAND circuit 552. NAND circuit 552 outputs a high level signal when internal clock signal Ka is at a low level, and functions as an inverter when internal clock signal Ka attains a high level. How an operation mode to select an SRAM word line is designated by operation mode designation signal φm generated from operation mode designation signal generation circuit 500 is illustrated by way of example. An SRAM access mode excluding a buffer read mode BR and a buffer write BW as illustrated in FIG. 3 is an operation mode in which SRAM word line is selected. In buffer read mode BR and buffer write mode BW, since accessing to a transfer gate included in the transfer circuit is made, the column decoder of SRAM (see column decoder 120 in FIG. 1) operates, but an SRAM row decoder does not operate. Operation mode designation signal φm generated from operation mode designation signal generation circuit 500 attains an inactive state in response to internal clock signal Ka in an inactive state, because the SRAM access cycle is completed in one clock cycle. Applying internal clock signal Ka to operation mode designation signal generation circuit 500 determines a generation (activation) timing for operation mode designating signal φm according to an activation timing for internal clock signal Ka.

Operation mode designation signal (SRAM word line select signal in the embodiment shown in FIG. 11) φm is applied to SRAM row decoder 118.

Address buffer 116 includes a buffer circuit 610 receiving external address signal extφa, and a latch circuit 620 for selectively passing the output of buffer circuit 610 in response to clock signals Ka and /Ka. Buffer circuit 610 includes cascaded two stages of inverter circuits 612 and 614. Latch circuit 620 includes a transmission gate 622 which is turned on when clock signal Ka is at a low level, and turned off when clock signal Ka is at a high level, and inverter circuits 624 and 626 for latching the output of transmission gate 622. The output of inverter circuit 624 is applied to row decoder 118, and transferred to the input portion of inverter circuit 624 through inverter 626. Note that FIG. 11 also shows the configuration of an address buffer for 1 bit address extφa.

Row decoder 118 includes a predecode circuit 630 for predecoding an output from an address buffer 116, and a row decode circuit 640 activated in response to operation mode designation signal φm for decoding the output of predecode circuit 630 and generating a word line drive signal φWL to bring a corresponding word line to a select state. Word line drive signal φWL may be a signal directly transferred on a select word line, or a signal making a word line drive circuit provided corresponding to each word line attain an operation state so that a select word line attains a select state through the word line drive circuit.

Predecode circuit 630 includes an NAND decode circuit 632 for decoding a prescribed combination of internal address signals, and an inverter circuit 634 for inverting the output of NAND decode circuit 632. NAND decode circuit 632 attains a select state to output a low level signal when the prescribed combination of address signals being at a high level is applied.

Figure 12:
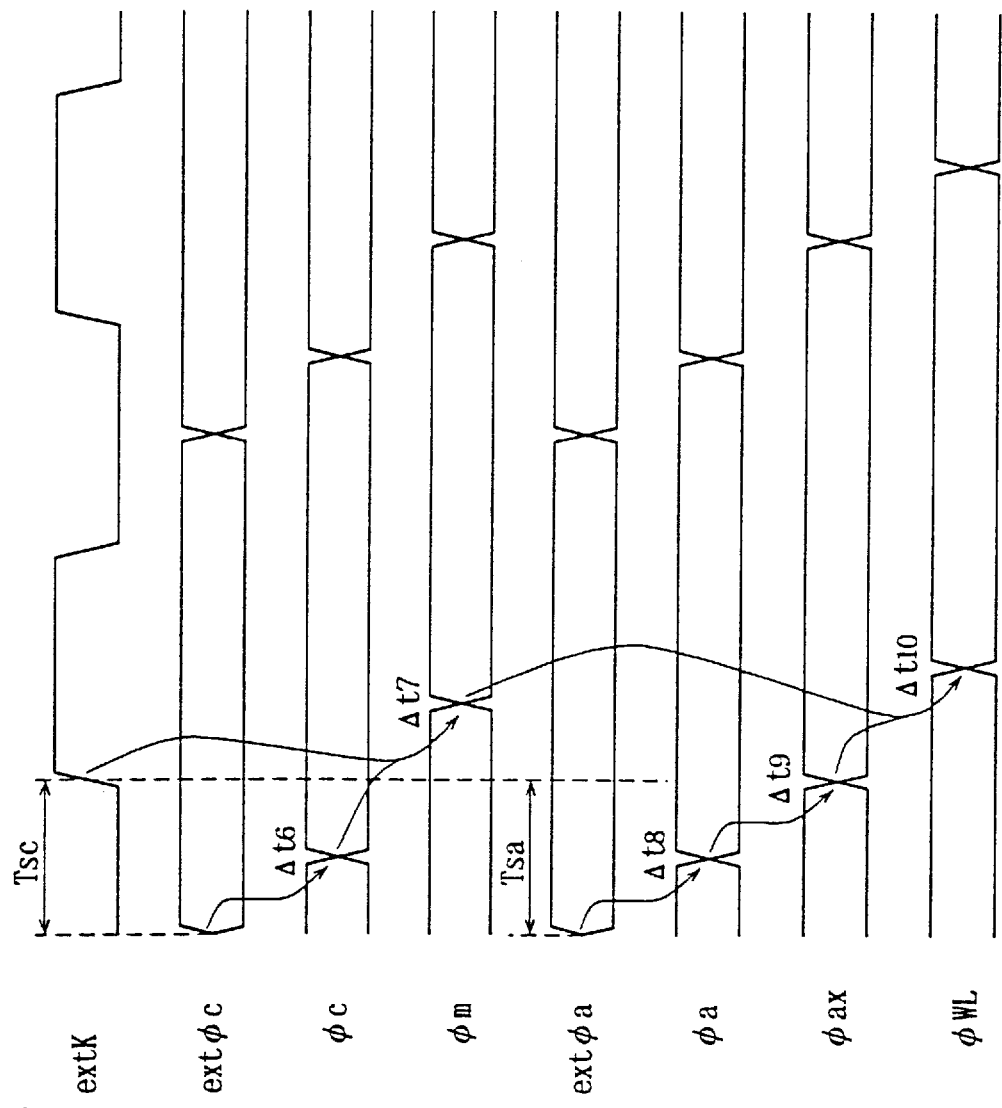
FIG. 12 is a signal waveform chart showing the operation of the circuit shown in FIG. 11.

Row decode circuit 640 includes an NAND decode circuit 642 receiving a prescribed set of outputs from predecode circuit 630 and operation mode designation signal φm, and an inverter circuit 644 inverting the output of NAND decode circuit 642. NAND decode circuit 642 is enabled when operation mode designation level φm is in an active state, and outputs a low level signal when predecode circuit 630 attains a select state with the prescribed set of outputs of latch circuits 620. The operation of SRAM word line drive circuit shown in FIG. 11 will be described in conjunction with its operation waveform chart, FIG. 12.

The states of external control signals extφc and external address signal extφa are determined prior to a rising of external clock signal extK. At the time, external clock signal extK is at a low level. Control signal input buffer 520 produces internal control signal φc from external control signal extφc for application to determination circuit 530. Time required for producing internal control signal φc from external control signal extφc is a delay time Δt6 in control input buffer 520.

Determination circuit 530 determines a designated operation mode based on the state of internal control signal φc applied from control signal input buffer 520. The determination operation is executed asynchronously with external clock signal extK (internal clock signal Ka). The output of determination circuit 530 therefore changes according to the change in the state of external control signal φc. Since clock signal Ka is at a low level, the output of determination circuit 530 is applied to operation mode designation signal generation circuit 550 through latch circuit 540. When clock signal Ka rises to a high level, latch circuit 540 attains a latch state, and latches the previously applied output of determination circuit 530.

Operation mode signal generation circuit 550 is activated in response to the rising of internal clock signal Ka to a high level, and brings operation mode designation signal φm in an active state based on a signal applied from latch circuit 540. Since the output of latch circuit 540 is determined before the rising of clock signal Ka to a high level, after the elapse of time Δt7 from the rising of internal clock signal Ka, operation mode designation signal φm attains a determined state. During setup time Tsc for external control signal extφc, a determination operation is executed in determination circuit 530, and therefore operation mode designation signal φm can be activated after the elapse of time Δt7 since a rising of external clock signal extk to a high level, thus advancing the operation mode start timing.

Meanwhile, in address buffer 116, when external clock signal extK is at a low level, latch circuit 620 is in a through state. Therefore, when external address signal extφa is determined, internal address signal φa is immediately generated (delay time in address buffer 116 equals Δt8). Internal address signal φa is applied to predecode circuit 630 for predecoding. Even if external clock signal extK rises to a high level at the time, only latch circuit 620 attains a latch state, predecode circuit 630 has already executed a predecoding operation, and therefore row predecode signal φax is determined after internal address signal φa is determined. Row decode circuit 640 decodes predecode signal φax from decode circuit 630 when operation designation mode φa is activated (a high level in the embodiment shown). Since the state of predecode signal φax has already been determined until that time, word line drive signal φWL is activated after the elapse of time Δt10 after operation mode designation signal φm is applied. Also in this case, during setup time Tsa for external address signal extφa, predecoding operation is executed, and a predecode timing for a row address can be advanced, thus advancing a select timing for a word line accordingly.

Note that in the configuration shown in FIG. 11, the output of determination circuit 530 is established before internal clock signal Ka attains a high level active state. Since determination circuit 530 determines the states of only a small number of control signals, delay time in determination circuit 530 can be kept sufficiently short. That circuit 540 may be provided between control signal input buffer 520 and determination circuit 530.

When chip select signal CS# is at a high level, the SRAM portion is inactivated. Determination of the state of chip select signal CS# is executed in determination circuit 530. In order to reduce the number of signals to be applied to determination circuit 530 and to reduce time required for determination operation, chip select signal CS may be generated from the input buffer shown in FIG. 9 and applied to the NAND circuit 552 of operation mode designation signal generation circuit 550 as internal chip select signal CS.

Note that the configuration shown in FIG. 11 corresponds to the circuit portion related to the word line drive portion of the SRAM. The same configuration is employed for the portion related to the operation of column decoder 120 in FIG. 1. The SRAM column decoder executes a selection of a transfer gate in the transfer circuit, an operation mode designation signal is applied to the SRAM column decoder whenever the SRAM portion is accessed. Accordingly, in the circuit portion related to the column decoder, an operation mode designation signal for driving the column decoder is generated based on the state of chip select signal CS#.

Figure 13:
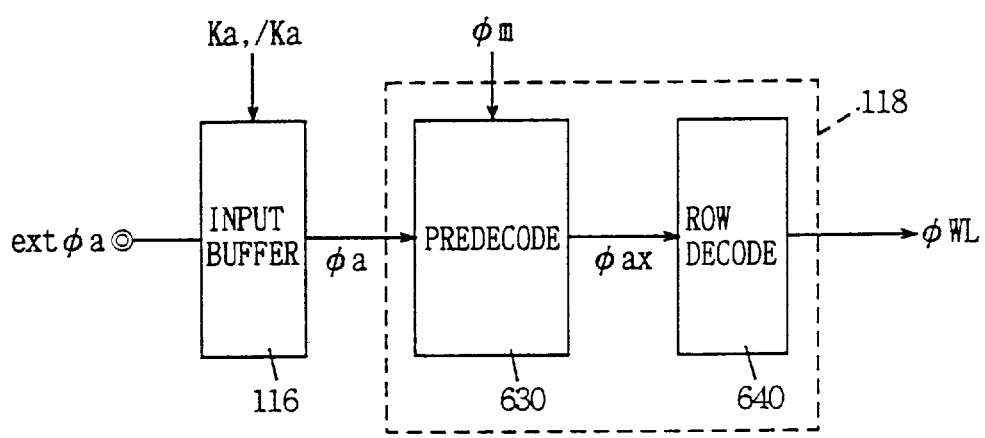
FIG. 13 is a diagram showing a variation of the circuit shown in FIG. 11.

FIG. 13 is a diagram showing another configuration for generating a row select signal. In the configuration in FIG. 13, predecode circuit 630 is provided with operation mode designation signal φm. Row decode circuit 640 decodes predecode signal φax generated from predecode circuit 630 and generates a word line drive signal φWL. Input buffer 116, predecode circuit 630 and row decode circuit 640 are configured substantially identical to those in FIG. 11. The NAND circuit 632 of predecode circuit 630 is also provided with operation mode designation signal φm, and NAND circuit 642 in row decode circuit 640 is not provided with operation mode designation signal φm.

Figure 14:
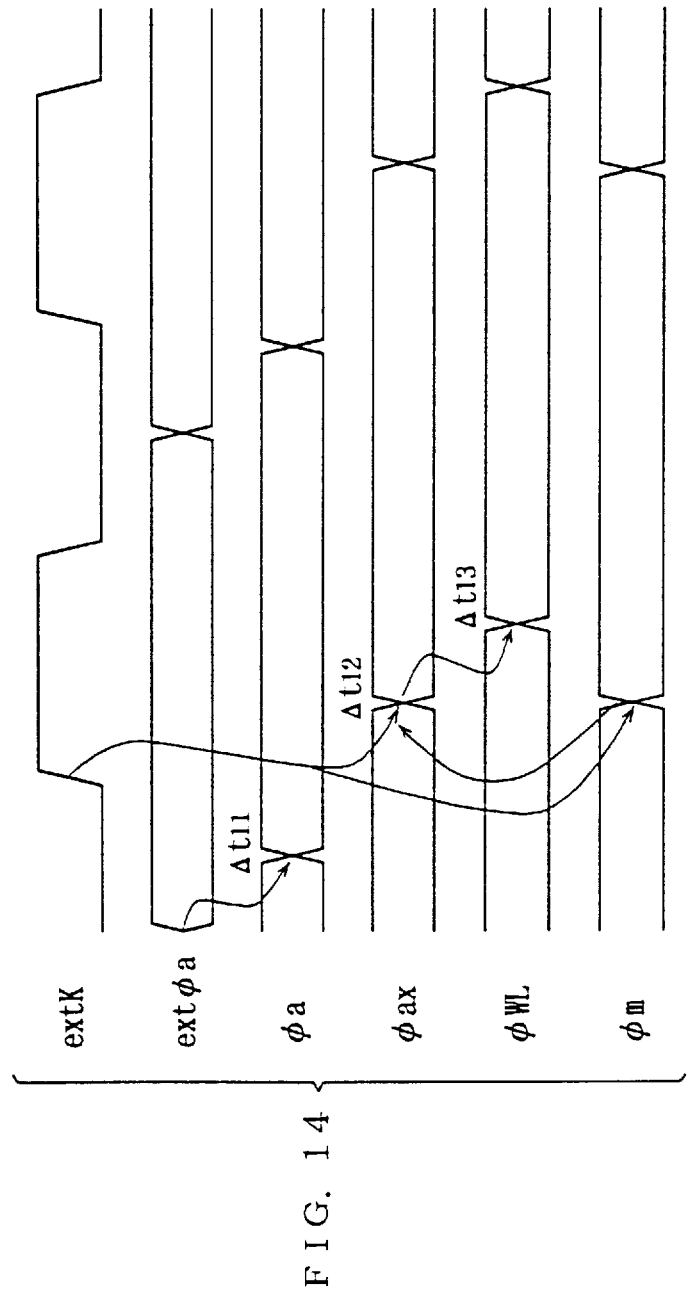
FIG. 14 is a signal waveform chart showing the operation of the circuit shown in FIG. 13.

In the configuration shown in FIG. 13, since predecode signal φax becomes valid after operation mode designation signal φm is established as illustrated in the operation waveform chart of FIG. 14, the predecode start timing is slightly delay from that of the configuration shown in FIG. 11. However, internal operations are executed during setup time for external control signal extφc and external address signal extra in this configuration, row selection operation can be conducted at a higher speed than a usual configuration by which an internal signal is established in synchronization with a rising of a clock signal.

Figure 15:
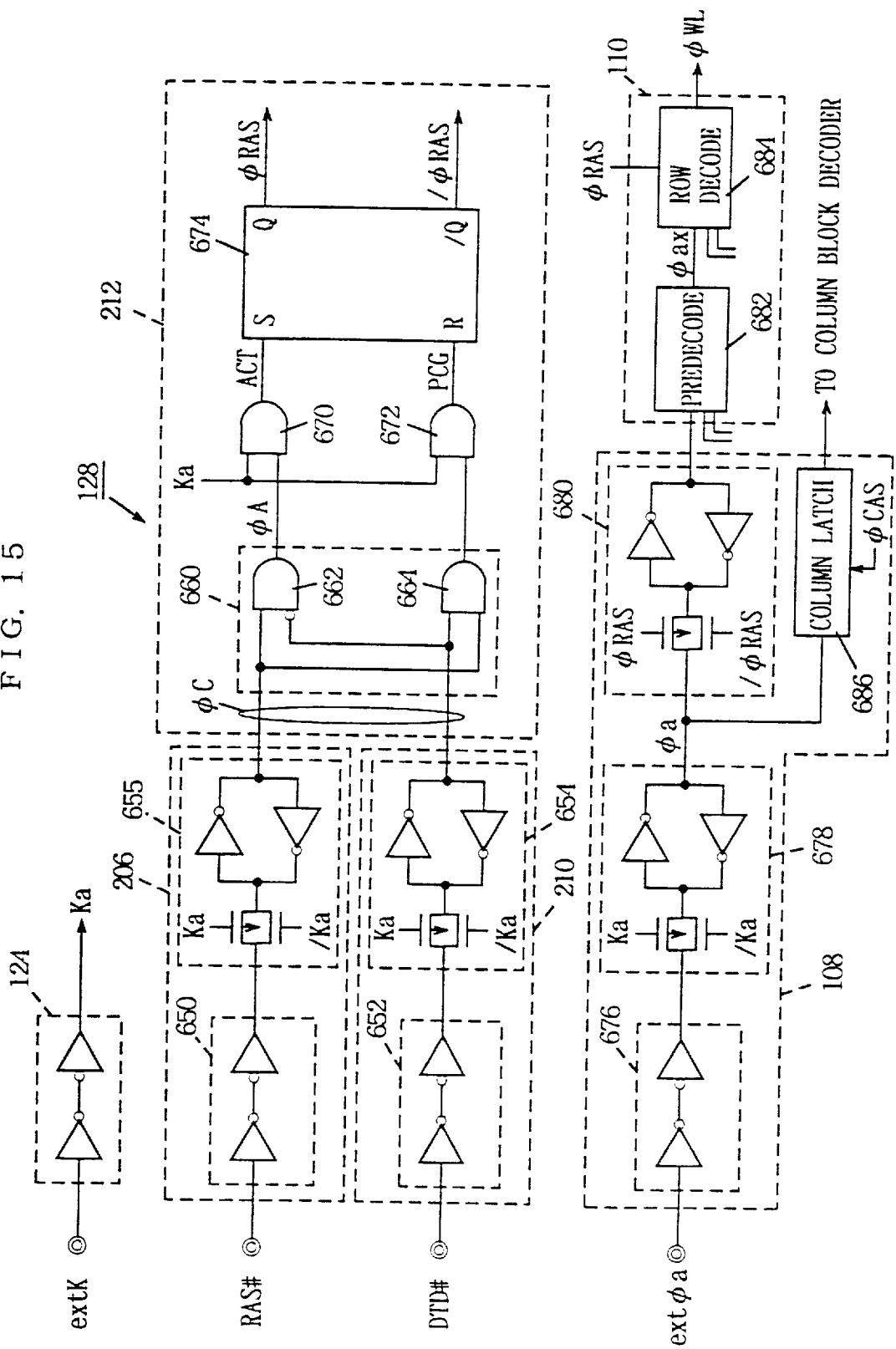
FIG. 15 is a diagram showing an example of DRAM word line driving circuitry formed according to the present invention.

FIG. 15 is a diagram showing the configuration of a circuit portion related to DRAM row selection. The configuration shown in FIG. 15 corresponds to the configuration of the portion related to internal RAS signal (signal for controlling circuitry related to DRAM row selection) for DRAM control circuit 128 and the configuration of row buffer 214 shown in FIG. 5.

In FIG. 15, a clock buffer/timing circuit 124 buffers external clock signal extK and generates an internal clock signal Ka. In FIG. 15, internal clock signal Ka generated from clock buffer 124 is generated through a clock mask circuit 126. The clock mask circuit is not shown for the purpose of simplification. Internal clock signal Ka therefore corresponds to internal clock signal DK in FIG. 5.

RAS buffer 206 includes a buffer circuit 650 for buffering external row address strobe signal RAS# for passage, and a latch circuit 655 for selectively passing the output of buffer circuit 650 in response to internal clock signal Ka. Latch circuit 655 attains a through state when internal clock signal Ka is in a low level in active state, and a latch state when internal clock signal Ka is at a high level.

DTD buffer 210 includes a buffer circuit 652 and a latch circuit 654 as well. RAS buffer 206 and DTD buffer 210 output internal control signal which have already been established before internal clock signal Ka attains an active state. Accordingly, the internal control signals can be generated during setup time for external control signals RAS# and DTD#.

DRAM control signal generation circuit 212 includes a determination circuit 660 determining whether or not an accessing to DRAM portion is designated based on the outputs of RAS buffer 206 and DTD buffer 210, gate circuits 670 and 672 for passing the output of determination circuit 660 in response to internal clock signal Ka, and a flipflop 674 for generating internal RAS signal $\phi$RAS for driving the DRAM array in response to the outputs of gate circuits 670 and 672.

For determination circuit 660, only the circuit configuration used to determine a DRAM activate mode ACT and a DRAM precharge mode PCG is shown. Determination circuit 660 includes a gate circuit 662 for detecting DRAM activate mode ACT and a gate circuit 664 for detecting a DRAM precharge mode PCG. Gate circuit 662 outputs a high level signal when the output of latch circuit 654 is at a low level and the output of latch circuit 655 is at a high level. More specifically, gate circuit 662 generates a signal in an active state (high level) when external row address strobe signal RAS# is at a low level and external data transfer instruction signal DTD# is at a high level. Gate circuit 664 outputs a high level signal when the outputs of latch circuits 654 and 655 both attain a high level. More specifically, gate circuits 654 outputs a high level signal when signals RAS# and DTD# are both at a low level.

Gate circuits 670 is enabled and functions as a buffer when internal clock signal Ka is at a high level. Gate circuit 670 is also enabled when internal clock signal Ka is at a high level and operates as a buffer. Gate circuits 670 and 672 set their outputs to a low level inactive state when internal clock signal Ka is at a low level. The output of gate circuit 670 attains a high level when the output of gate circuit 662 is at a high level and internal clock signal Ka is at a high level. Gate circuit 670 therefore pulls its output signal to a high level in synchronization with a rising of internal clock signal Ka when DRAM activate mode ACT is designated. Gate circuit 672 outputs a signal rising to a high level in synchronization with the output of internal clock signal Ka when the DRAM precharge mode is designated.

Flipflop circuit 674 receives the output of gate circuit 670 at a set input S, and the output of gate circuit 672 at a reset input R. Flipflop 674 is set when DRAM activate mode ACT is designated, and sets internal RAS signal $\phi$RAS from its Q output to a high level active state. When DRAM precharge mode PCG is designated, flipflop 674 is reset, thus pulling internal RAS signal $\phi$RAS to a low level inactive state. In response to internal RAS signal $\phi$RAS, operation such as row selection and sensing are executed in the DRAM portion.

Address buffer 108 includes a buffer circuit 676 formed of two stages of cascaded inverters for buffering external address signal ext$\phi$a, and a latch circuit 678 for selectively passing the output of buffer circuit 678 in response to internal clock signal Ka. Latch circuit 678 attains a through state when internal clock signal Ka is in a low level inactive state, and a latch state when internal clock signal is at a high level. Thus, an internal address signal can be generated during address setup time.

Row address buffer 214 (see FIG. 5) includes a latch circuit 680 for latching the output of latch circuit 678 in response to internal RAS signal $\phi$RAS. Latch circuit 680 attains a through state when internal RAS signal $\phi$RAS is at a low level, and a latch state when internal RAS signal $\phi$RAS is at a high level. Therefore, an internal address signal is generated from latch circuit 680 immediately when internal RAS signal $\phi$RAS is at an inactive state. A column latch circuit 686 is provided in parallel with a row latch circuit 680. Column latch circuit 686 conducts a latch operation in response to internal CAS signal $\phi$CAS. The internal CAS signal $\phi$CAS is generated in an operation mode to select a column block (memory cells of 16 bits) in the DRAM array. By contrast with FIG. 5, buffer circuit 676 and latch circuits 678 and 680 constitute row address buffer 214, while buffer circuits 676 and 678, and column latch circuit 786 constitute column address buffer 216.

Row decoder 110 includes a predecode circuit 682 for predecoding the output of latch circuit 680, and a row decode circuit 684 for further decoding the output of predecode circuit 682 and generating a signal $\phi$WL to select a word line in the DRAM array. Row decode circuit 684 is activated in response to internal RAS signal $\phi$RAS and executes a decoding operation. Predecode circuit 682 is provided with a prescribed set of output signals from a plurality of latch circuits 680. A plurality of predecode circuits 682 are provided and row decode circuit 684 receives the outputs of a prescribed set of predecode circuits among the plurality of predecode circuits.

Figure 16A:
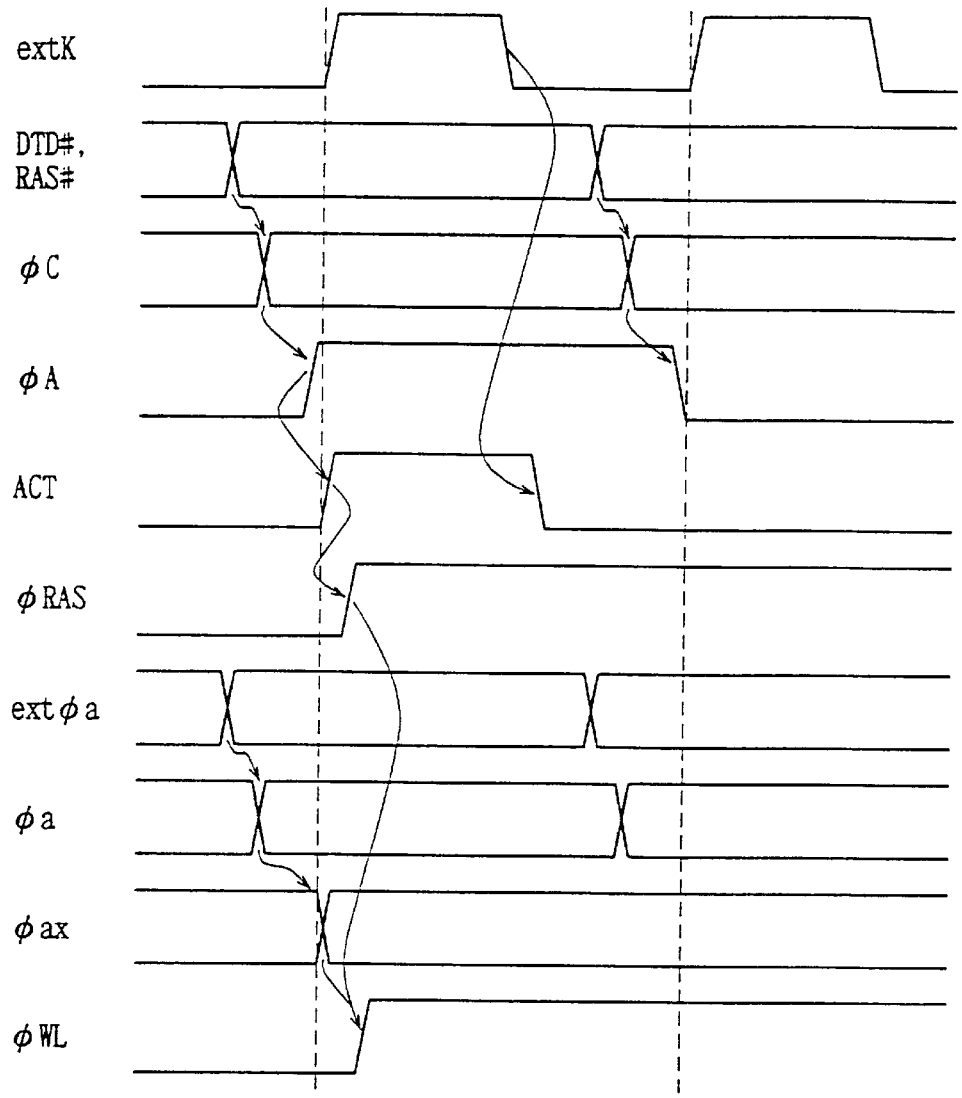
FIGS. 16A and 16B are signal waveform chart showing the operation of the circuit shown in FIG. 15.

FIG. 16A is a signal waveform chart for use in illustration of the operation of the circuit shown in FIG. 15 when the DRAM activate mode is designated. The operation of the circuit shown in FIG. 15 will be described in conjunction with FIG. 16A.

When the states of external control signals RAS# and DTD# are established, the outputs of RAS buffers 206 and DTD buffers 210 are changed and established accordingly. External clock signal extK is at a low level, and buffers 206 and 210 are in a through state. In FIG. 16A, internal signals RAS and DTD are represented by signal $\phi$c.

In response to internal signal $\phi$c, determination circuit 660 executes a determination operation, and pulls up activate mode instruction signal $\phi$a to a high level in an active state.

In response to a rising of clock signal extK to a high level, internal clock signal Ka rises to a high level, activate mode enable signal ACT output from gate circuit 670 rises to a high level, and flipflop 674 is set. Thus, internal RAS signal $\phi$RAS is generated.

When internal clock signal Ka falls to a low level, the output of gate circuits 670 rises to a low level. The output $\phi$RAS of flipflop 674, however, maintains a high level in an active state.

Meanwhile, in address buffer 108, when external address signal ext$\phi$a is applied and external clock signal extK is at a low level, internal address signal $\phi$a is changed accordingly. When internal address signal $\phi$a changes, latch circuit 680 attains a through state (internal RAS signal $\phi$RAS is not yet generated and in a low level). Predecode circuit 682 therefore executes a predecoding operation before internal RAS signal $\phi$RAS rises to an established high level, thus generating predecode signal $\phi$ax.

Row decode circuit 684 is activated when internal RAS signal φRAS is pulled to a high level, decodes predecode signal φax and generates word line drive signal φWL.

The timing in which word line drive signal φWL is generated is therefore advanced, because the predecoding operation is executed when clock signal Ka (or extK) is at a low level.

Word line drive signal φWL maintains its high level of an active state until DRAM precharge mode PCG is designated (for internal RAS signal φRAS to maintain a high level).

Note that when chip select signal CS# attains a high level inactive state, the DRAM portion is brought in a no operation mode or in a power down mode. In this case, the DRAM portion may be provided with a gate circuit for controlling selective passage of internal clock signal Ka in response to the internal chip select signal.

As described above, forming the input buffer with the latch circuit attaining a latch state and through state permits internal operations to be initiated in advanced timings when the internal clock signal is activated, and a CDRAM operating at a high speed results.

Figure 16B:
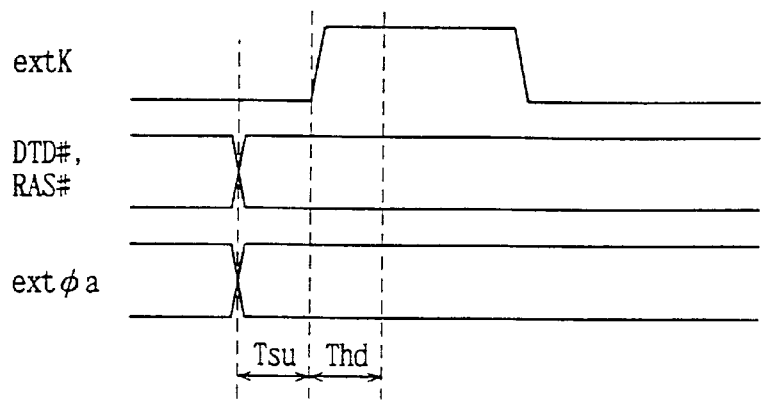

The configuration shown in FIG. 15 provides the following advantages as well. More specifically, external control signals RAS# and DTD# are latched in latch circuits 654 and 655 in response to internal clock signal Ka, and external address signal extφa is latched in synchronization with clock signal Ka. More specifically, external control signals RAS# and DTD# and external address signal extφa are latched in the same timing. Therefore, as illustrated in FIG. 16B, set up time Tscu and hold time Thd for external address signal extφa and external control signals DTD# and RAS# can be made equal. Thus, the advantage that external signals can be made in the form of one shot pulse, in other words, the readiness of forming external signals can further be improved, thus the external apparatus is able to generate control signals and address signals under the same parameter conditions, and therefore a synchronous semiconductor memory device providing great usability to the external apparatus can be implemented.

Note that the configuration of the input buffer is not limited to CDRAMs, and is generally applicable to and in a synchronous semiconductor memory device operating in synchronization with external clock signals.

Data Transfer Circuit

Figure 17:
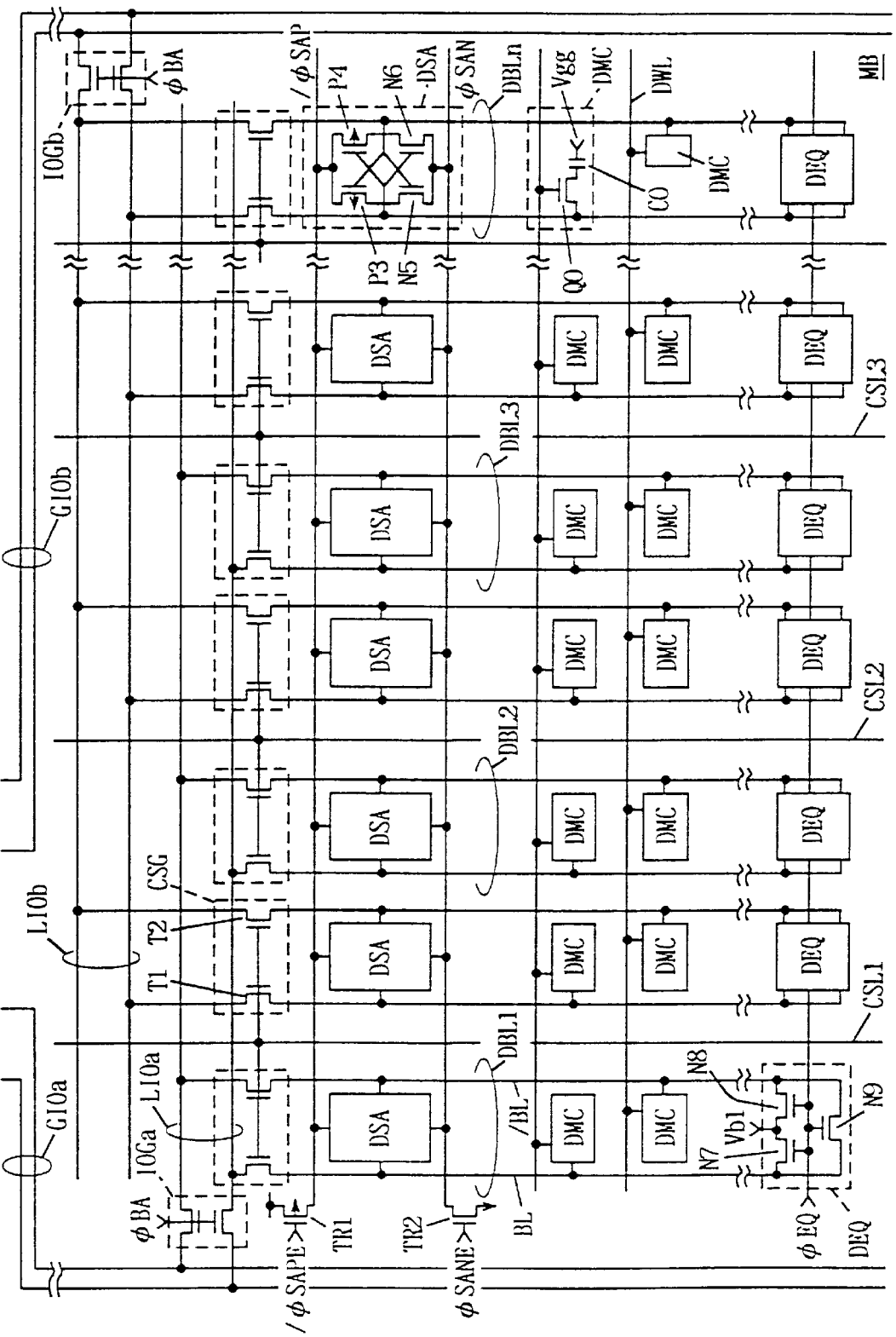
FIG. 17 is a diagram showing the structure of the DRAM array in the CDRAM shown in FIG. 1.

FIG. 17 is a diagram showing an arrangement in a DRAM array. Memory cells of 2 bits are selected at a time in the memory array block shown in FIG. 17.

DRAM memory array block MB includes a plurality of dynamic memory cells DMC arranged in a matrix of rows and columns. Dynamic memory cell DMC includes one memory transistor Q0 and one memory capacitor C0. One electrode (cell plate) of memory capacitor C0 is provided with constant voltage Vgg (usually intermediate potential Vcc/2).

Memory block MB includes a DRAM word line DWL each connected to a row DRAM cells (dynamic memory cells DMC and a DRAM bit line pair DBL each connected to a column of DRAM cells DMC. DRAM bit line pair DBL includes complementary bit lines BL and /BL. DRAM cells DMC are arranged at crossings of DRAM word lines DWL and DRAM bit line pairs DBL.

Each DRAM bit line pair DBL is provided with a DRAM sense amplifier DSA for sensing and amplifying a potential difference on a corresponding bit line pair. DRAM sense amplifier DSA includes a p channel sense amplifier portion including cross-coupled p channel MOS transistors P3 and P4, and an n channel sense amplifier portion including cross-coupled n channel MOS transistors N5 and N6.

DRAM sense amplifier DSA has its operation controlled with sense amplifier drive signals /φSAP and φSAN generated from P channel MOS transistor TR1 and n channel MOS transistor TR2 in response to sense amplifier activation signals /φSAPE and φSANE.

The p channel sense amplifier portion increases the potential of a high potential bit line to the operation power supply potential Vcc level in response to sense amplifier drive signal /φSAP. The n channel sense amplifier portion discharges the potential of a low potential bit line to potential Vss, the ground potential level, for example, in response to sense amplifier drive signal φSAN.

p channel MOS transistor PR1 generates a high level sense amplifier drive signal /φSAP when sense amplifier activation signal /φSAP attains a low level and transmits the generated signal to one power supply node of DRAM sense amplifier DSA. n channel MOS transistor TR2 transmits sense amplifier drive signal φSAN at ground potential level to another power supply node of the DRAM sense amplifier DSA when sense amplifier activation signal φSANE attains a high level. Sense amplifier drive signals φSAN and /φSAT are precharged to intermediate potential Vcc/2 in a stand-by mode. For the purpose of simplification, a circuit for precharging the sense amplifier drive signal line is not shown in the FIG. 17.

For each DRAM bit line pair DBL, a precharge/equalize circuit DEQ activated in response to a precharge/equalize signal for precharging each bit line of a corresponding bit line pair to a prescribed potential VB1 and equalizing the precharged potentials of corresponding bit line pair is provided. Precharge/equalize circuit DEQ includes n channel MOS transistors N7 and N8 for transmitting precharge potential VB1 to bit lines BL and /BL, respectively, and an n channel MOS transistor N2 for equalizing the potentials of bit lines BL and /BL.

DRAM memory block MB further includes a DRAM column select gate CSG provided to each DRAM line pair DBL and conducting in response to a signal potential on a column select line CSL and connecting a corresponding DRAM bit line pair DBL to a local IO line pair LIO.

A column select signal is transmitted on column select line CSL from column block decoder 112 shown in FIG. 1. Column select line CSL is provided in common to two pairs of DRAM bit lines. Therefore, two DRAM bit line pairs DBL are selected at a time and connected to local IO line pairs LIOa and LIOb. Local IO line pairs LIOa and LIOb are provided with precharge/equalize circuit, but the circuit are not shown for the purpose of simplification.

DRAM memory block MB further includes DRAM IO gates IOGa and IOGb for connecting local IO line pairs LIOa and LIOb to global IO line pairs DIOa and DIOb, respectively in response to a block activation signal φBA. In the CDRAM, only a memory array block including a selected row (word line) is brought in a selected state, only in the selected block, DRAM IO gates IOGa and IOG conduct in response to block activation signal φBA. Block activation signal φBA is therefore generated by decoding the most significant 4 bits of a DRAM row address signals used for selecting a word line, for example (in such a case, that only one row block of 16 row blocks is brought into a selected state). Local IO line pairs LIOa and LIOb are provided only for memory block MB. Global IO line pairs GIOa and GIOb are provided commonly to memory blocks present in the direction in which bits lines extend in the FIG. 17. One memory block (row block) is selected, and connected to global IO line pairs GIOa and GIOb through local IO line pairs LIOa and LIOb. Providing global IO line pairs GIOa and GIOb in a word line shunt region enables transfer of 16-bit memory cells data in parallel without increasing the chip area.

Figure 18:
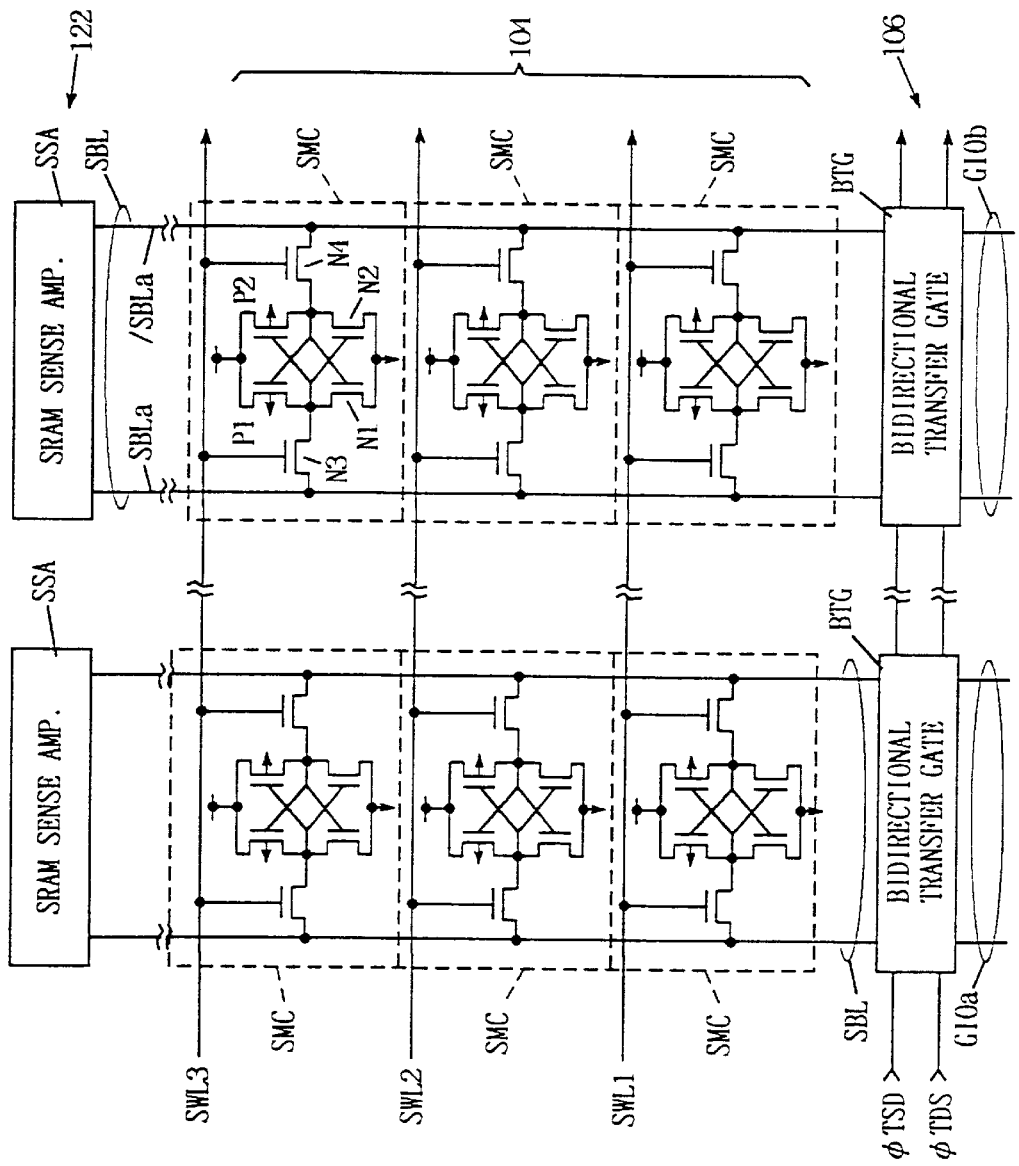
FIG. 18 is a diagram showing the specific structure of the SRAM array in FIG. 1.

FIG. 18 is a diagram showing the configuration of an SRAM array. In FIG. 18, the configuration of only one SRAM memory plane is shown.

In FIG. 18, SRAM array 104 includes static memory cells SMC arranged in a matrix of rows and columns. Static memory cell SMC includes cross-coupled p channel MOS transistors P1 and P2, and cross-coupled n channel MOS transistors N1 and N2. p channel MOS transistors P1 and P2 are high-resistance load transistors, and have a function of pulling up the potential of storage node of a memory cell.

Static memory cell SMC further includes an n channel MOS transistor N3 to connect a connection node of transistors P1 and N1 to SRAM bit line SBLa in response to a signal potential on SRAM word line SWL, and an n channel MOS transistor N4 to connect a connection node of transistors P2 and N2 to SRAM bit line /SBLa in response to a signal potential on SRAM word line SWL.

One SRAM word line WL is connected to one row of static memory cells SMC, and one SRAM bit line pair SBL is connected to static memory cells SMC arranged in one column. In FIG. 18, three SRAM word lines SWI1 to SWL3 are shown by way of illustration.

An SRAM sense amplifier SSA and a bidirectional transfer gate DTG are provided for each SRAM bit line pair SBL. Bidirectional transfer gate BTG executes data transfer between a selected memory cell in the SRAM array and a selected memory cell in the DRAM array based on transfer control signals φTSD and φTDS, and its configuration will be described in detail later. Herein, transfer control signals φTSD and φTDS each are denoted as a generic control signal for the purpose of simplification.

Bidirectional transfer gate BTG executes data transfer between SRAM bit line pair SBL and global IO line pair GIO (GIOa and GIOb). The number of global IO line pairs GIOa and GIOb provided is 16 all together. 16SRAM bit line pairs SBL are provided. Therefore, simultaneous transfer of memory cells of 16 bits is implemented.

Figure 19:
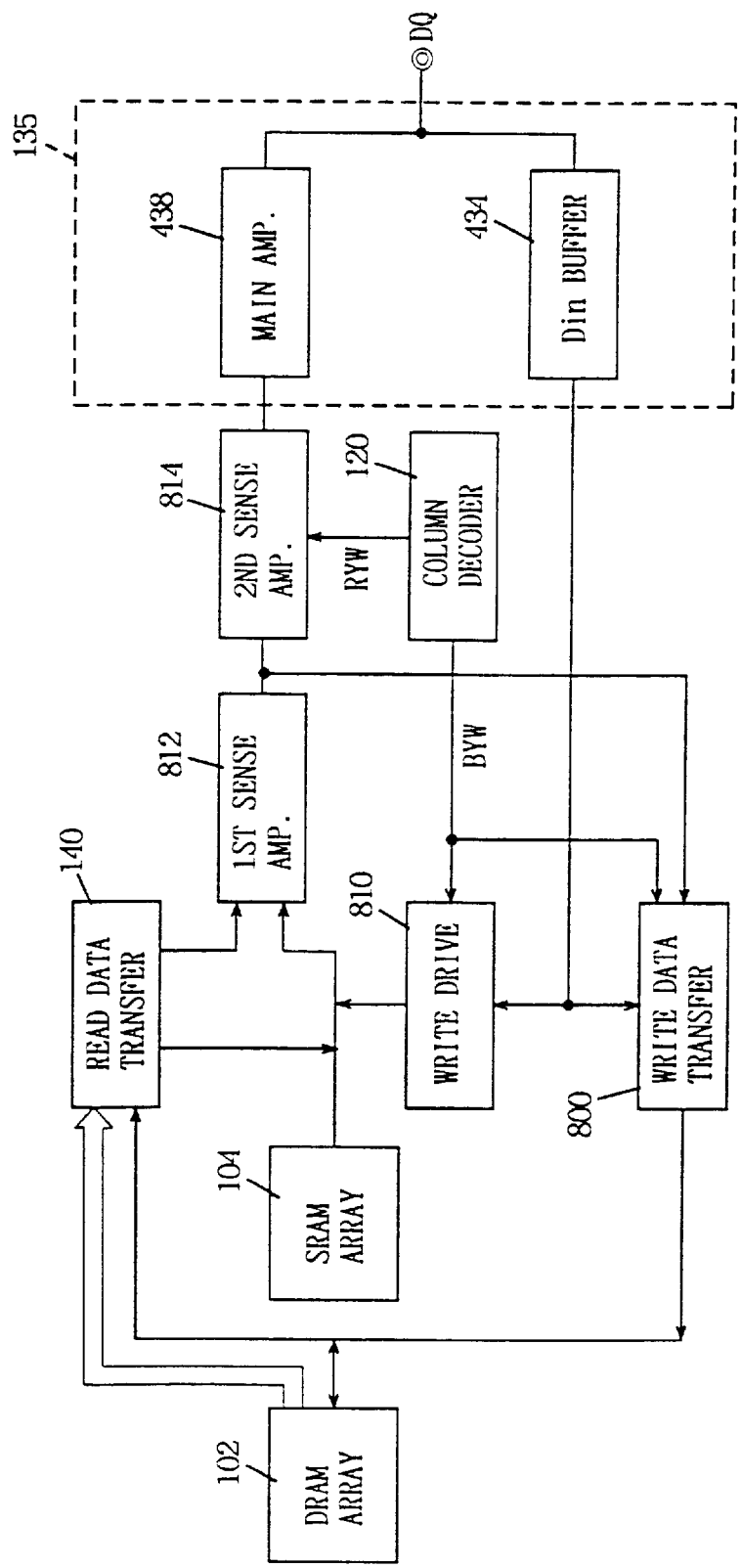
FIG. 19 is a functional block diagram showing the structure of the column decoder and sense amplifier portion shown in FIG. 1.

FIG. 19 is a diagram showing in detail the configuration of data transfer circuit 106 in FIG. 1. In FIG. 19, the flow of data when DRAM read transfer mode DRT is designated is also shown. In FIG. 19, temporary register 142 temporarily storing write data a write data transfer buffer 144 storing data from temporary register 142, mask register 146a storing mask data, and mask circuit 106 for masking write transfer data from write data transfer buffer 114 based on mask data from mask register 146a as shown in FIG. 1 are represented generally as a write data transfer circuit 800.

In FIG. 19, the transfer circuit access control circuitry includes a first sense amplifier 812 for amplifying either data read out from the SRAM array or data transferred from read data transfer circuit 140, a second sense amplifier 814 for further amplifying data output from first sense amplifier 812, and a write drive circuit 810 for writing write data in a selected memory cell in SRAM array 104. The write data from Din buffer 434 is also applied to write data transfer circuit 800. Thus, data of 16 bits can be transferred to read data transfer circuit 140 and write data transfer circuit 800 in parallel. Accordingly, write drive circuit 810, first sense amplifier 812 and second sense amplifier 814 each have a capacity of 16 bits.

First sense amplifier 812 selects data from SRAM array 104 for amplification when data reading from SRAM array 104 is designated. When accessing to read data transfer circuit 106 is designated, first sense amplifier 812 selects data from read data transfer circuit 104.

Column decoder 120 decodes address signals As0 to As3 of 4 bits, and selects a 1-bit sense amplifier of second sense amplifier 114 including the capacity of 16 bits. Similarly, column decoder 120 selects a 1-bit drive circuit from write drive circuit 810 including the capacity of 16 bits. The output of second sense amplifier circuit 814 is applied to main amplifier 438.

When DRAM read transfer mode DRT is designated, one row of memory cells are selected in DRAM array 102, then memory cells of 16 bits are selected, and the data of the selected memory cells are transferred to read data transfer circuit 140. The data latched by read data transfer circuit 140 is transferred to write data transfer circuit 800 through first sense amplifier 812. When DRAM read transfer mode DRT is designated and then buffer read mode BRE is designated, the data latched by read data transfer circuit 140 can be read out through first sense amplifier 812, second sense amplifier 814 and main amplifier 438.

At the time of data writing, internal write data from Din buffer 434 can be written in a selected memory cell in SRAM array 104 through write drive circuit 810. When buffer write mode BW is designated, external write data from Din buffer 434 can be written in write data transfer circuit 800. One register in write data transfer circuit 800 is selected by column decoder 120.

Figure 20:
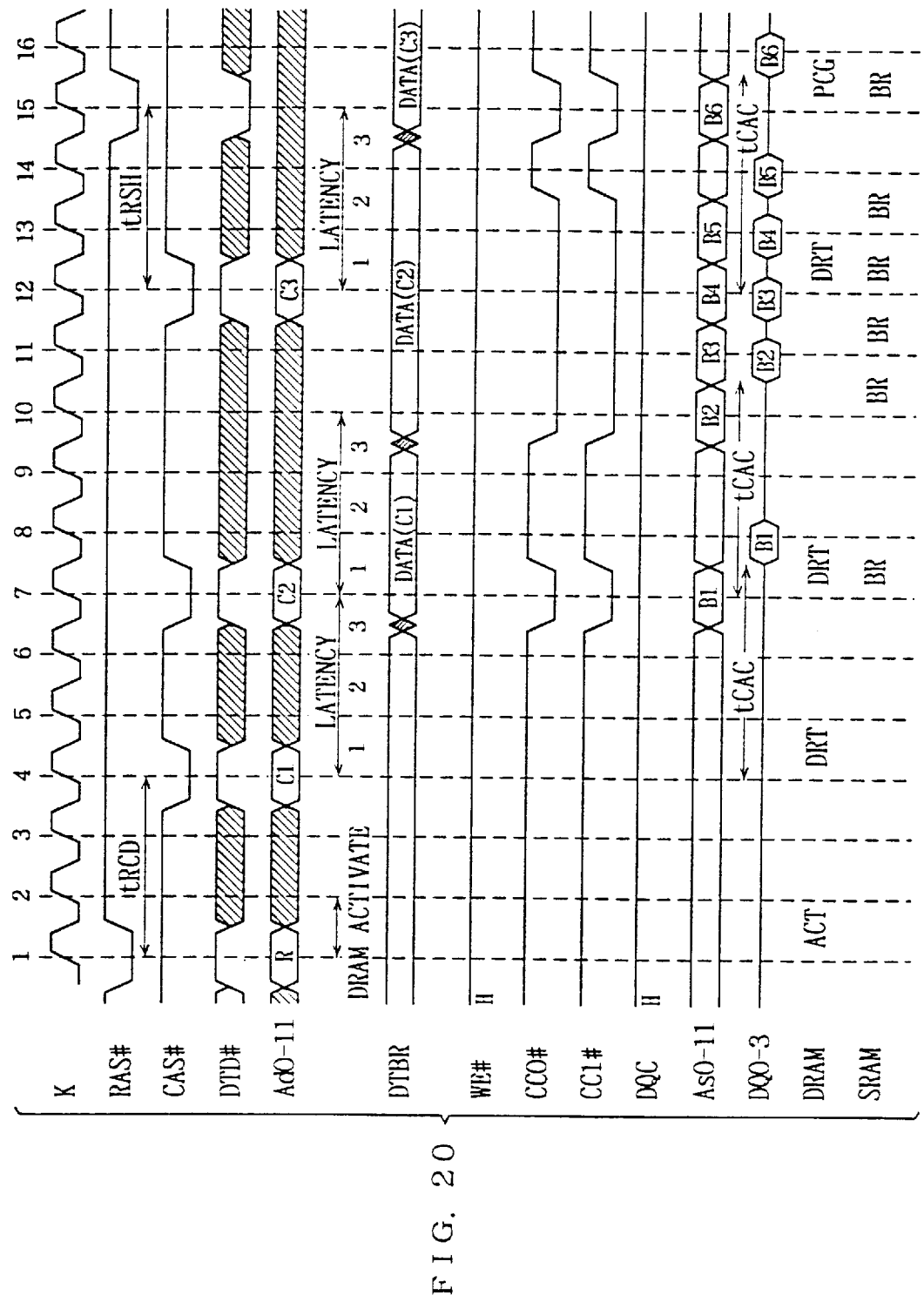
FIG. 20 is a timing chart showing the operation of the CDRAM shown in FIG. 1.

FIG. 20 is a waveform chart showing the sequence of data transfer operation from the DRAM array to the read data transfer buffer circuit. A data transfer operation from the DRAM array to the read data transfer buffer circuit will be described in conjunction with FIG. 20.

In a first cycle of external clock signal K, row address strobe signal RAS# is set to a low level, column address strobe signals CAS# and data transfer instruction signal DTD# are set to a high level, and DRAM activate mode ACT is designated as a result. In the DRAM portion, address signals Ad0 to Ad11 applied at the time are used as row address (R) for a row selection operation.

In a cycle after the elapse of RAS-CAS delay time tRCD, in other words in the fourth cycle of external clock signal K, when column address strobe signal CAS# is set to a low level and row address strobe signal RAS# and data transfer instruction signal DTD# are set to a high level, DRAM read transfer mode DRT is designated. In DRAM array 102, address signals Ad4 to Ad9 are used as a column block address signal C1 for selecting a column block (memory cells of 16 bits in one memory plane). The data of the selected column block is transferred to read data transfer buffer circuit 140. The data transfer timing from the DRAM array to read data transfer buffer circuit 140 is determined with external clock signal K. Now, three clock cycles are assumed for latency. More specifically, when three clock cycles elapse after DRAM read transfer mode DRT is designated, valid data is stored in read data transfer buffer circuit 140.

The latency corresponds to the number of clock cycles necessary until the new valid data is transferred from the DRAM array to the read transfer buffer circuit. In the (n−1)-th cycle at the latency of n clock cycles, data transfer from DRAM array to read transfer buffer circuit 140 is executed. During this period, data in read data transfer buffer circuit 140 attains a "don't care" state and then an established state. In the seventh cycle of external clock signal K, data in the read data transfer buffer circuit once again attains an established state.

In the seventh cycle, DRAM transfer mode DRT is once again designated. Based on the newly designated DRAM read transfer mode DRT, a column block is selected in response to column block address signal C2, and the data of the selected memory cells is transferred to read data transfer buffer circuit (DTBR), and attains an established state in the tenth clock cycle.

Meanwhile, in the SRAM portion, in the seventh cycle of external clock signal K, control clock signals CC0# and CC1# are both set to a low level, and write enable signal WE# is set to a high level. DQ control signal DQC is at a high level, enabling data input/output. In this state, buffer read mode BR is designated, and the column decoder executes a selection operation based on address signals As to As3 applied at the time, and corresponding data among data stored in read data transfer buffer circuit DTBR (140) is read out. In FIG. 20, in the eighth clock cycle, data B1 is read out.

If DRAM read transfer mode DRT is executed, and then buffer read mode DR is executed in a cycle after the elapse of CAS latency, read data can be obtained after the elapse of time tCAC from designation of buffer read transfer mode BR.

In the tenth cycle of external clock signal K, the data of the memory cells selected by column block address (C2) is stored in read data transfer buffer circuit 140. In the cycle, buffer read mode BR is once again designated for execution, and data (B2, B3, B4, B5) stored in read data transfer buffer circuit 140 is sequentially read out for every following clock cycle.

In parallel with this buffer read mode operation, DRAM read transfer mode DRT is once again designated in 12-th cycle of external clock signal K, and the data of read data transfer buffer circuit 140 is rewritten with new data after the elapse of three clock cycles.

In the fifteenth cycle of external clock signal K, buffer read mode BR is once again designated, and data B6 stored in read data transfer buffer circuit 140 is read out.

In the fifteenth cycle of external clock signal K, row address strobe signal RAS# and data transfer instruction signal DTD# are set to a low level, and column address strobe signal CAS# is set to a high level and DRAM precharge mode PCG is designated as a result. Thus, a row selected in the DRAM array goes to a non-selected state.

As described above, use of DRAM read transfer mode DRT and buffer read mode BR in combination permits data in DRAM array to be read out through read transfer buffer circuit 140 without affecting the SRAM array any wise. Since this operation mode can be executed using page mode of the DRAM (the DRAM activate mode operation continues to be maintained until DRAM precharge mode PCG is designated), high speed data reading is achieved.

If buffer read transfer mode BRT is designated instead of the buffer read mode, DRAM page mode is combined with the buffer read transfer mode, and therefore data can be transferred from the DRAM array to the SRAM array using the page mode of the DRAM, thus enabling the content of the SRAM array to be rewritten at a high speed. This configuration also achieves a desired cache block size.

Figure 21:
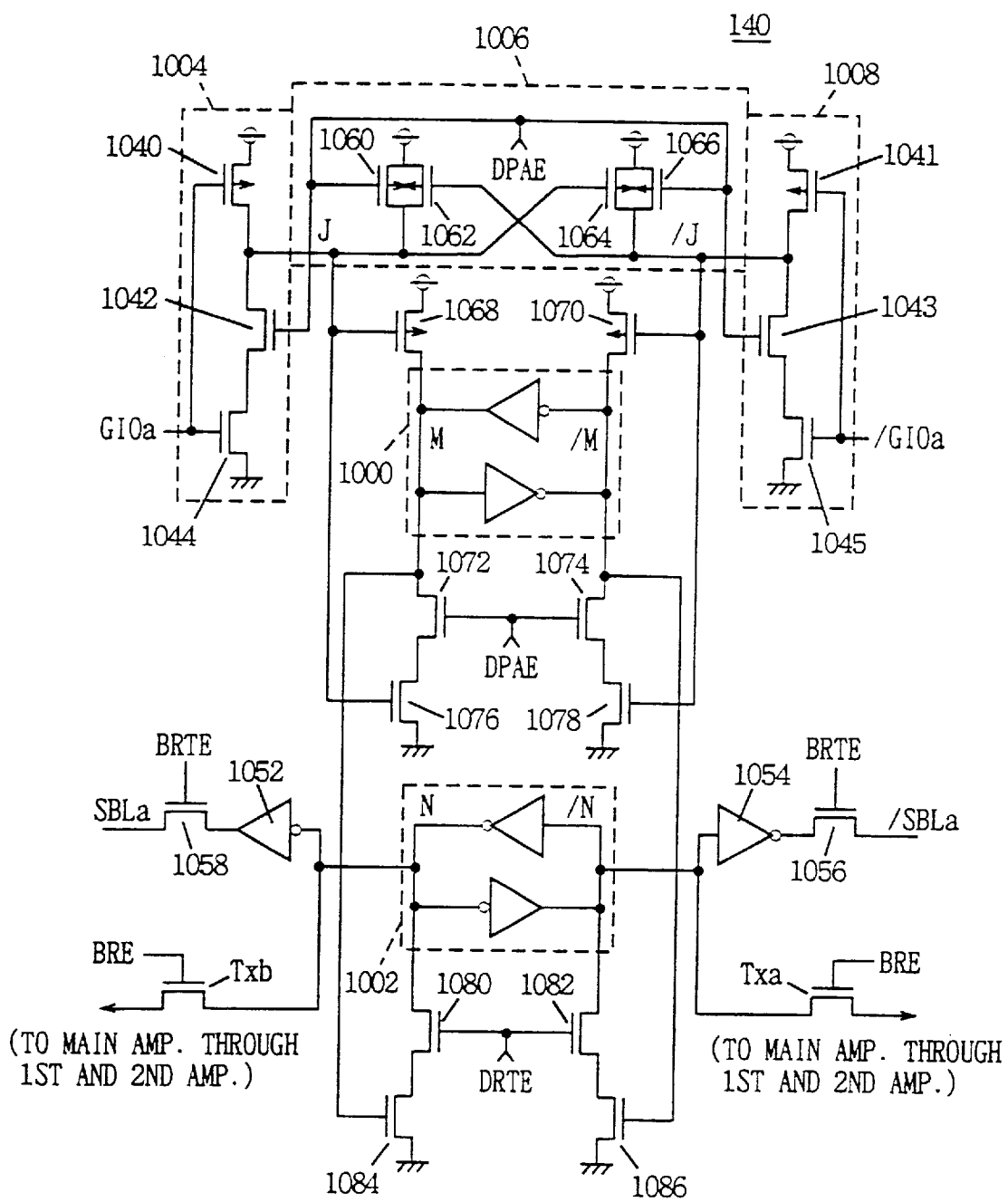
FIG. 21 is a diagram showing the specific structure of the read data transfer buffer circuit shown in FIGS. 1 and 19.

FIG. 21 is a diagram showing the configuration of a read data transfer circuit. In FIG. 21, read data transfer buffer circuit 140 includes read amplifiers 1004 and 1008 for amplifying potentials on global IO lines, GIOa and /GIOa in response to a DRAM preamplifier enable signal DPAE, a preamplifier 1006 for amplifying the data amplified by read amplifiers 1004 and 1008 in response to DRAM preamplifier enable signal DPAE, a master data register 1000 for latching the data amplified by preamplifier 1006, and a slave data register 1002 receiving data stored in master data register 1000 in response to a DRAM read transfer enable signal DRTE.

Read amplifier 10004 includes a p channel MOS transistor 1004 receiving a signal on global IO line GIOa at a gate, an n channel MOS transistor 1004 receiving a signal on global IO line GIOa at its gate, and an n channel MOS transistor 1042 which conducts in response to DRAM preamplifier enable signal DPAE. Transistors 1040, 1042, 1044 are connected in series between the power supply potential node and the ground potential node. An amplified output is obtained from a connection node of transistors 1040 and 1042.

Read amplifier 1008 includes a p channel MOS transistor 1041 and an n channel MOS transistor 1045 receiving a signal on global IO line /GIOa at their gates, respectively, an n channel MOS transistor 1043 which is turned on in response to DRAM preamplifier enable signal DPAE. Transistors 1041, 1043 and 1045 are connected in series between the power supply potential node and the ground potential node. A signal sensed by the amplifying signal on global IO/GIOa is output from a connection node of transistors 1041 and 1043.

Preamplifier 1006 includes p channel MOS transistors 1060 and 1062 connected in parallel between the power supply potential node and a node J, and p channel MOS transistors 1064 and 1066 connected in parallel between the power supply potential node and a node/J. Transistors 1060 and 1066 receive DRAM preamplifier enable signal DPAE at their gates. Transistor 1062 has its gate connected to node/J, and transistor 1064 has its gate connected to node J.

Master data register 1000 is also of an inverter latch configuration. Between the output nodes J and /J of preamplifier 1006 and the latch nodes N and /N of master register 1000, p channel MOS transistors 1068 and 1070 selectively turned on in response to the signal potentials of nodes J and /J, respectively, for transmitting the power supply potential to nodes N and /N are provided.

Master data register 1000 further includes n channel MOS transistors 1072 and 1074 which are turned on in response to DRAM preamplifier enable signal DPAE, and n channel MOS transistors 1076 and 1078 receiving signals on nodes J and /J at their respective gates. Transistors 1072 and 1076 are connected in series between latch node N and the ground potential node. Transistors 1074 and 1078 are connected in series between latch node /N and the ground potential node.

Slave data register 1000 is of an inverter latch configuration. Slave data register 10002 is further provided with n channel MOS transistors 1080 and 1082 which are turned on in response to DRAM read transfer enable signal DRTE, and n channel MOS transistors 1084 and 1086 receiving signals on latch nodes N and /N at their respective gates.

Transistors 1080 and 1084 are connected in series between the latch node N of slave data register 1002 and the ground potential node. Transistors 1082 and 1086 are connected in series between latch node /N and the ground potential node.

Read data transfer buffer circuit 140 further includes inverter circuits 1052 and 1054 which invert and amplify potentials at latch nodes N and /N of slave data register 1002, respectively, and transfer gates 1058 and 1056 which conduct in response to buffer read transfer enable signal BRTE and transfers the outputs of inverter circuits 1052 and 1054 to SRAM bit lines SBLa and /SBLa, respectively.

Signals at latch nodes N and /N of slave data register 1002 are transferred to main amplifier 430 shown in FIG. 19 through gates Txa and Txb. The path provides a path for reading out data from the read data transfer buffer circuit in the buffer read mode operation. Gates Txa and Txb may include the configuration of first and second amplifiers shown in FIG. 1.

Figure 22:
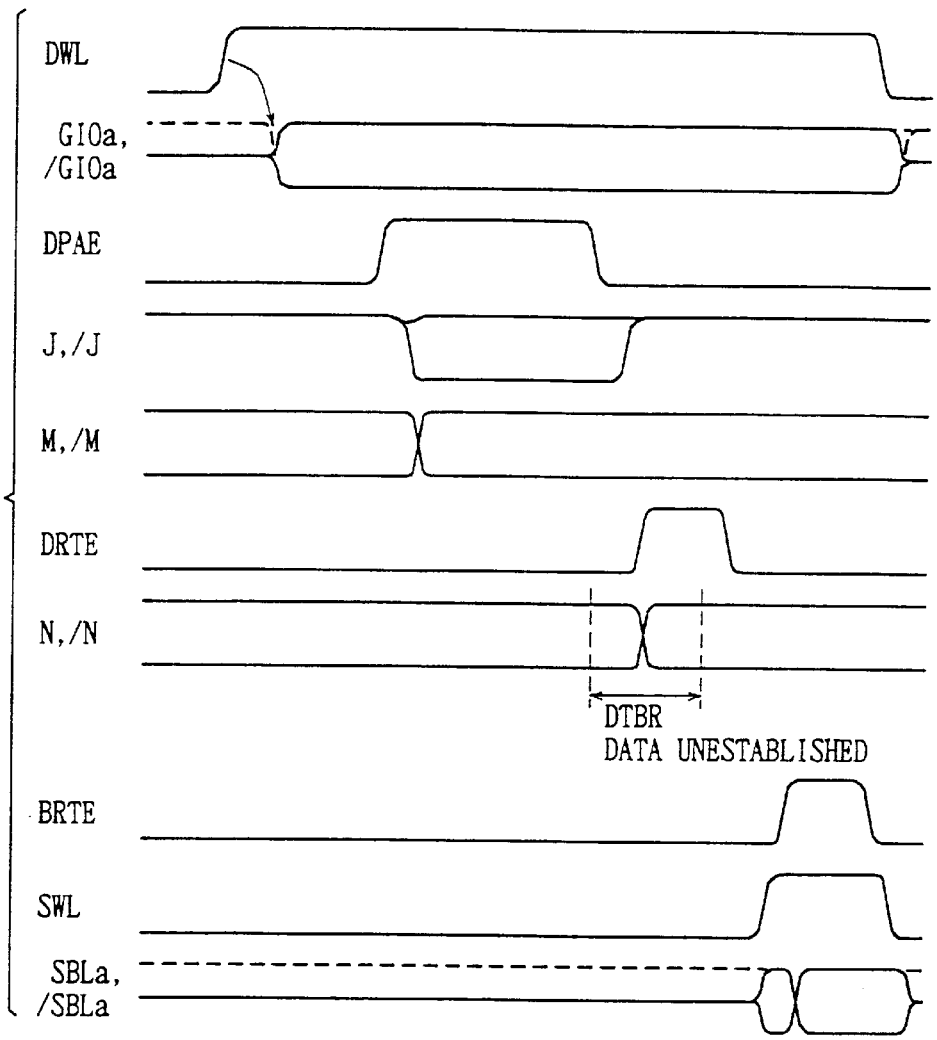
FIG. 22 is a signal waveform chart showing the operation of the read data transfer buffer circuit shown in FIG. 21.

The operation of the read data transfer buffer circuit shown in FIG. 21 will be described in conjunction with FIGS. 22 showing the operation waveforms.

When DRAM read transfer mode DRT is designated, a row and a memory block are selected in the DRAM array, and signal potentials on global IO lines GIOa and /GIOa change based on the data of the read out DRAM memory cells.

Then, when DRAM preamplifier enable signal DPAE is generated, read amplifiers 1004 and 1008, and preamplifier 1006 are activated. Assume that the signal on global IO line GIOa is at a high level, and signal potential on global IO line /GIOa is at a low level. In this case, potentials at node J and /J are at a low level and a high level, respectively. The signal potentials transferred to nodes J and /J are amplified at a high speed by transistors 1062 and 1064. Transistors 1060 and 1066 are turned off in response to DRAM preamplifier enable signal DPAE. Transistors 1060 and 1066 are used for precharging nodes J and /J to the power supply potential. Transistors 1062 and 1064 have a function of maintaining nodes J and /J at the same potential in a precharge state in which DRAM preamplifier enable signal DPAE is at a low level.

The signals transferred to nodes J and /J are transferred to master data register 1000 through transistors 1068, 1070, 1076, 1078, 1072, and 1074. Transistors 1072 and 1074 are turned on in response to DRAM preamplifier enable signal DPAE.

Assume that the potential of node J is at a low level, and the potential of node /J is at a high level. Transistors 1068 and 1078 are in an on state, and transistors 1070 and 1076 are in an off state. Thus, the potentials of latch nodes N and /N in master register 1000 are at a high level and a low level, respectively. Through the series of these operations, the data transfer operation through the master data register 1000 in the read data transfer buffer circuit is completed.

Then, DRAM read transfer enable signal DRTE is generated. Thus, transistors 1080 and 1082 are turned on, and data stored at latch nodes M, /M in master data register 1000 is transferred to latch nodes N, /N in slave data register 1002. Since the potential of latch node M is at a high level, transistor 1084 is in an on state, and transistor 1086 is in an off state. Thus, signal potentials at latch nodes N, and /N attain a low level and a high level, respectively.

Through the series of these operations, storage of data to slave data register 1002 in read data transfer buffer circuit 140 is completed. The signal potential of latch nodes N, /N can be read out through gates Txb, Txa. More specifically, executing a buffer read mode operation after the elapse of latency permits data stored in the read data transfer buffer circuit to be read out at a high speed.

At the time of data transfer to the SRAM array, buffer read transfer enable signal BRTE is generated. Thus, the outputs of inverter circuits 1052 and 1054 are transferred onto SRAM bit lines SBLa and /SBLa through gates 1058 and 1056. In the configuration shown in FIG. 21, inverter circuits 1052 and 1054 may be a tristate inverter circuit which is activated in response to buffer read transfer enable signal BRTE.

In a transfer operation in the read data transfer buffer circuit, DRAM read transfer enable signal DRTE has its generation timing determined in response to the clock signal. DRAM read transfer mode DRTE is designated with a latency of 3, DRAM read transfer enable signal DRTE is generated in the second clock cycle. Thus, timings for data transfer to the read data transfer buffer circuit can be easily controlled for transfer of established data to the read data transfer buffer circuit.

As described above, with two-stage latch circuit configuration of the slave data register and the master register for the read transfer buffer circuit, data transfer can surely be conducted. Latency control can also be readily and securely conducted.

When generation timing of DRAM read transfer enable signal DRTE is determined based on the generation timing of clock signal Ka, the data of slave register 1002 becomes instable at the time of data transfer from master register 1000 to slave register 1002, and therefore slave register 1002 cannot be accessed for data reading. In order to prevent reading of such instable data, accessing to slave register 1002 may be prohibited during a period one clock cycle before latency as "DTBR clock out".

Figure 23:
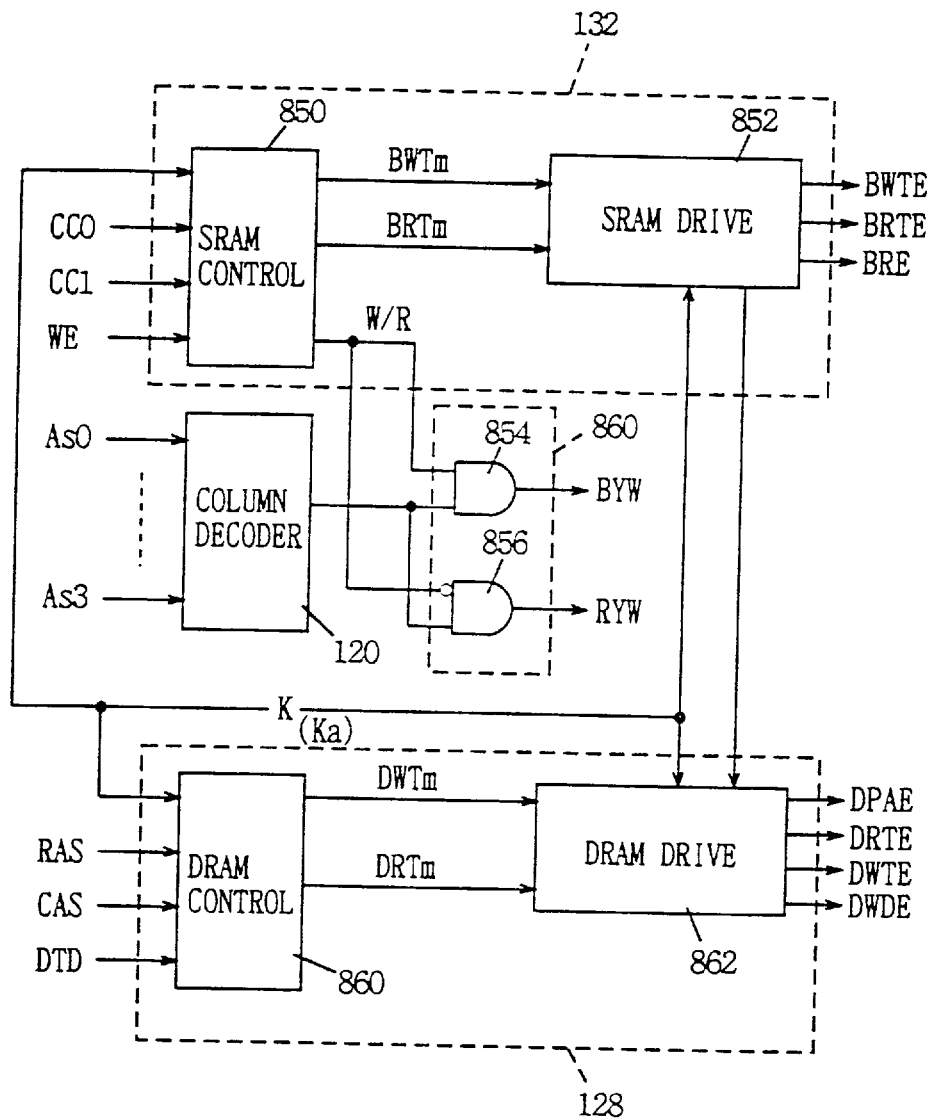
FIG. 23 is a block diagram schematically showing control signal generation circuitry in a data transfer circuit.

FIG. 23 is a diagram schematically a circuit configuration for generating control signals related to data transfer. In FIG. 23, SRAM control circuit 132 includes an SRAM control circuit 850 which generates a signal BWT designating a data writing operation mode to write data transfer buffer circuit, a signal BRT indicating an operation of data reading (data reading to a data input/output pin or the SRAM array) from the read data transfer buffer circuit, in response to internal control clock signals CC0, CC1, and internal write enable signal WE, and also generates a signal W/R indicating one of data writing and data reading, and an SRAM drive circuit 852 which generates signals BWT, BRTE and BRE necessary for data transfer according to signals BWTm and BRTM from SRAM control circuit 850. Signal BWTm specifies one of buffer write mode BW, buffer write transfer mode BWT and buffer write transfer BWTW. Signal BRTM specifies one of buffer read mode BR, buffer read transfer mode BRT and buffer read transfer read mode BRTR. Signal BWTE is a buffer write transfer/buffer write enable signal generated for a writing operation mode in which data is transferred from the SRAM array or the read data transfer buffer circuit into a first-stage register in write data transfer buffer circuit (temporarily write data transfer buffer circuit TDTBW).

Signal BRTE is a buffer read transfer enable signal which is generated at the time of data transfer from the read data transfer circuit to the SRAM array.

Signal BRE is a buffer read enable signal which is generated when data in read data transfer circuit is read out for outputting.

Gate circuit 860 includes a gate circuit 854 receiving write/read signal W/R and the output of column decoder 120, and a gate circuit 856 receiving write/read signal W/R and the output of column decoder 120. Gate circuit 854 functions as a buffer circuit when write/read signal W/R indicates a data write mode, and passes an output from column decoder 120 therethrough and produces a signal BYW. Signal BYW is applied to the temporarily register in write data transfer buffer circuit and SRAM write drive circuit 810 (see FIG. 19). Thus, a 1-bit memory cell of the memory cells of 16 bits or a write data transfer buffer (TDTBW) is selected, and data is written in the selected memory cell or buffer.

Gate circuit 856 passes an output from column decoder 120 when write/read signal W/R indicates a data read mode and generates a signal RYW. Signal RYW is applied to second sense amplifier 814, then one sense amplifier among 16 sense amplifiers is selected, and the output of the selected sense amplifier is read out through the main amplifier circuit.

DRAM control circuit 128 includes a DRAM control circuit 860 which receives internal control signals RAS, CAS and DTD, determines a designated operation mode, and generates signal DWTm and DRTm based on the result of determination, and a DRAM drive circuit 862 which generates signals DPAE, DRTE, DWTE, and DWDE necessary for data transfer according to signals DWTm and DRTm from DRAM control circuit 860.

Signal DWTm is a signal generated at the time of data transfer from the read data transfer buffer circuit to the DRAM array. Signal DRTm is a signal generated when data is transferred from the DRAM array to the read data transfer buffer circuit. When operation modes DWT1R and DWT2R shown in FIG. 4 are designated, signals DWTm and DRTm are both generated. Signal DPAE is a DRAM preamplifier enable signal and signal DRTE is a DRAM read transfer enable signal. In response to signal DRTE, data is latched by a slave register in the read data transfer buffer circuit.

Signal DWDE is a signal generated at the time of data transfer from the temporarily write register to the master register (DTDW). Signal DWDE is a signal generated when data stored in the master register in write data transfer circuit is transferred to DRAM array.

SRAM drive circuit 852 and DRAM drive circuit 862 both received an internal clock signal K (Ka). This is because data transfer timings are defined by the clocks, and the transfer timing is determined by latency. The length of latency is determined based on data set in a command register (not shown).

Figure 24:
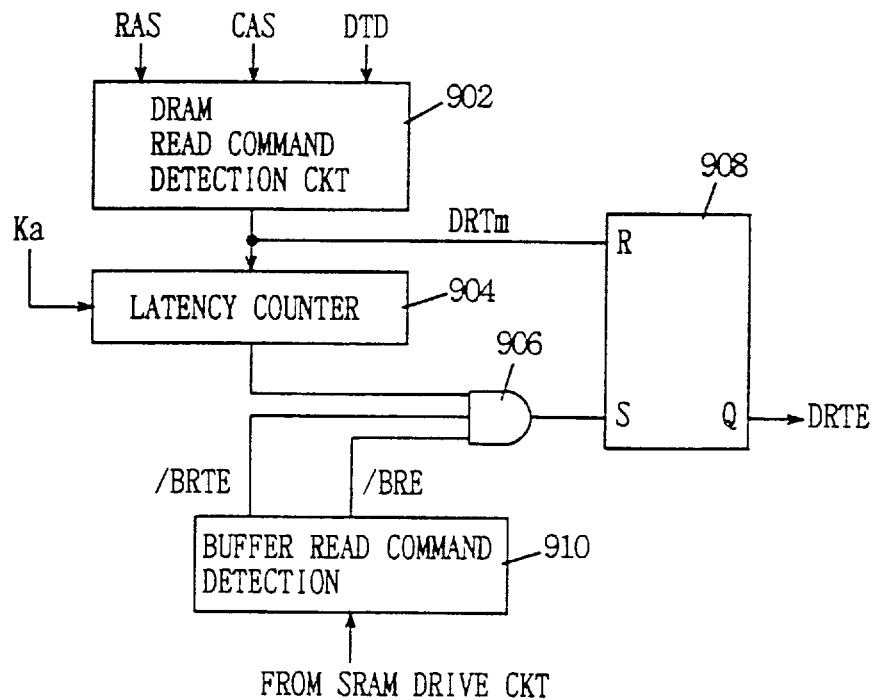
FIG. 24 is a diagram showing an example of the structure of a read data transfer instruction signal generation circuit in a read data transfer buffer circuit.

FIG. 24 is a diagram showing the configuration of a portion for generating transfer instruction signal DRTE in the read data transfer buffer. In FIG. 24, the DRAM data transfer drive circuitry includes a DRAM read command detection circuit 902 for detecting whether or not reading of data in the DRAM array is designated (hereinafter the command is referred to as DRAM read command) in response to signals RAS, CAS and DTD, a latency counter 904 activated in response to the output of DRAM read command detection circuit 902 for counting internal clock signals Ka and generating a count up signal when a prescribed number is counted up, a buffer read command detection circuit 910 for detecting whether or not accessing through the read data transfer buffer circuit is designated in response to signals BRTE and BRE from the SRAM drive circuit (see FIG. 23), a gate circuit 906 for generating a set signal in response to the output of latency counter 904 and the output of buffer read command detection circuit 910, and a flipflop 908 set in response to the output of gate circuit 906 and reset in response to the output of DRAM read command detection circuit 902.

As can be clearly seen from the logic of control signals in FIG. 4, read command detection signal DRTm from DRAM read command detection circuit 902 is generated in DRAM read transfer mode DRT, DRAM write transfer mode DWT1R, and DRAM write transfer 2 read mode DWT2R, namely in operation modes in which data is loaded into the read data transfer buffer circuit. DRAM read command detection circuit 902 is included in DRAM control circuit 860 shown in FIG. 23.

Latency counter 904 counts internal clock signals Ka in response to DRAM read command detection signal DRTm. If the count value is smaller than a preset latency by 1, latency counter 904 generates a count up signal. When the latency is specified as 3, latency counter 904 counts clock signal Ka from the clock cycle provided with DRAM read command detection signal DRTM, and for the count value at 2, generates a count up signal in response to a rising of the next clock signal Ka.

Buffer read command detection circuit 910 includes an inverter buffer for inverting signals BRE and BRT from SRAM drive circuit 852. When signals BRE and BRTE are generated, data transfer from the read data transfer buffer circuit to the SRAM array is in progress, or the slave read data transfer buffer in the read data transfer buffer circuit is being externally accessed.

Gate circuit 906 outputs a signal at a high level when applied signals are all at a high level. When data in the read data transfer buffer circuit is being used, gate circuits 906 does not output a signal at an active (high) level, even if the output signal of counter 904 attains an active state at H.

Flipflop 908 is set in response to the output of gate circuit 906 attaining an active level and activates data transfer instruction signal DRTE generated from its Q output. Flipflop 908 also maintains its set state until read command detection signal DRTm is applied next. Thus, the generation timing for read data transfer instruction signal DRTE can readily be controlled. In addition, by generating read data transfer instruction signal DRTE with flipflop 908, signal DRT in an active state can be immediately generated based on the output of latency counter after the use (transfer) of data in the read data transfer buffer circuit is completed.

Figure 25:
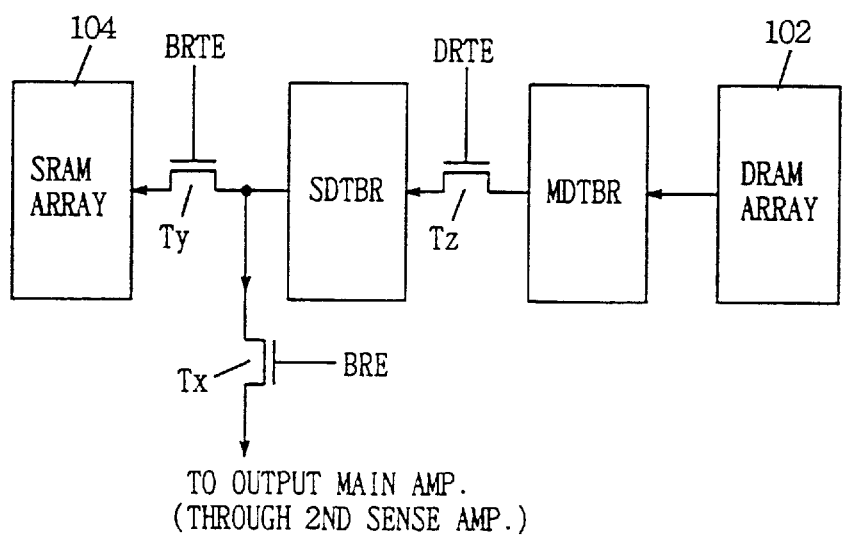
FIG. 25 is a simplified block diagram showing the structure of a read data transfer buffer circuit portion.

FIG. 25 is a diagram showing the configuration of a read data transfer buffer circuit by way of simplification. The read data transfer buffer circuit is shown in detail in FIG. 21 but is represented in a simplified form for the convenience of the following description. The read data transfer buffer circuit includes a master data register MDTBR receiving data from the DRAM array, a slave data register SDTBR storing data from master data register MDTBR, and a transfer gate Tz which conducts in response to data transfer instruction signal DRTE and transfers data from master data register MDTBR to slave data register SDTBR. Master data register MDTBR correspond to circuit blocks 1000, 1004, and 1006, transfer gates 1072, 1074, 1076 and 1078 in FIG. 21. Transfer gate Tz corresponds to gates 1080, 1082, 1084, and 1086 in FIG. 21. Slave data register SDTBR corresponds to circuit block 1002 and inverters 1052 and 1054 in the configuration shown in FIG. 21.

Data held in slave data register SDTBR is applied to SRAM array 1004 through transfer gate Ty or to the main amplifier through a transfer gate Tx. Transfer gate Ty conducts in response to signal BRTE, and transfer gate Tx conducts in response to signal BRE. Transfer gate Tx corresponds to transfer gates Txa and Txb shown in FIG. 21, and transfer gate Ty corresponds to transfer gates 1056 and 1058. The configuration shown in FIG. 21 is a circuit configuration for transfer of 1-bit data, and in the configuration shown in FIG. 25, transfer of 16-bit data is conducted. The operation of the circuit shown in FIG. 24 will be described in conjunction with a waveform chart for the operation, FIG. 26.

Figure 26:
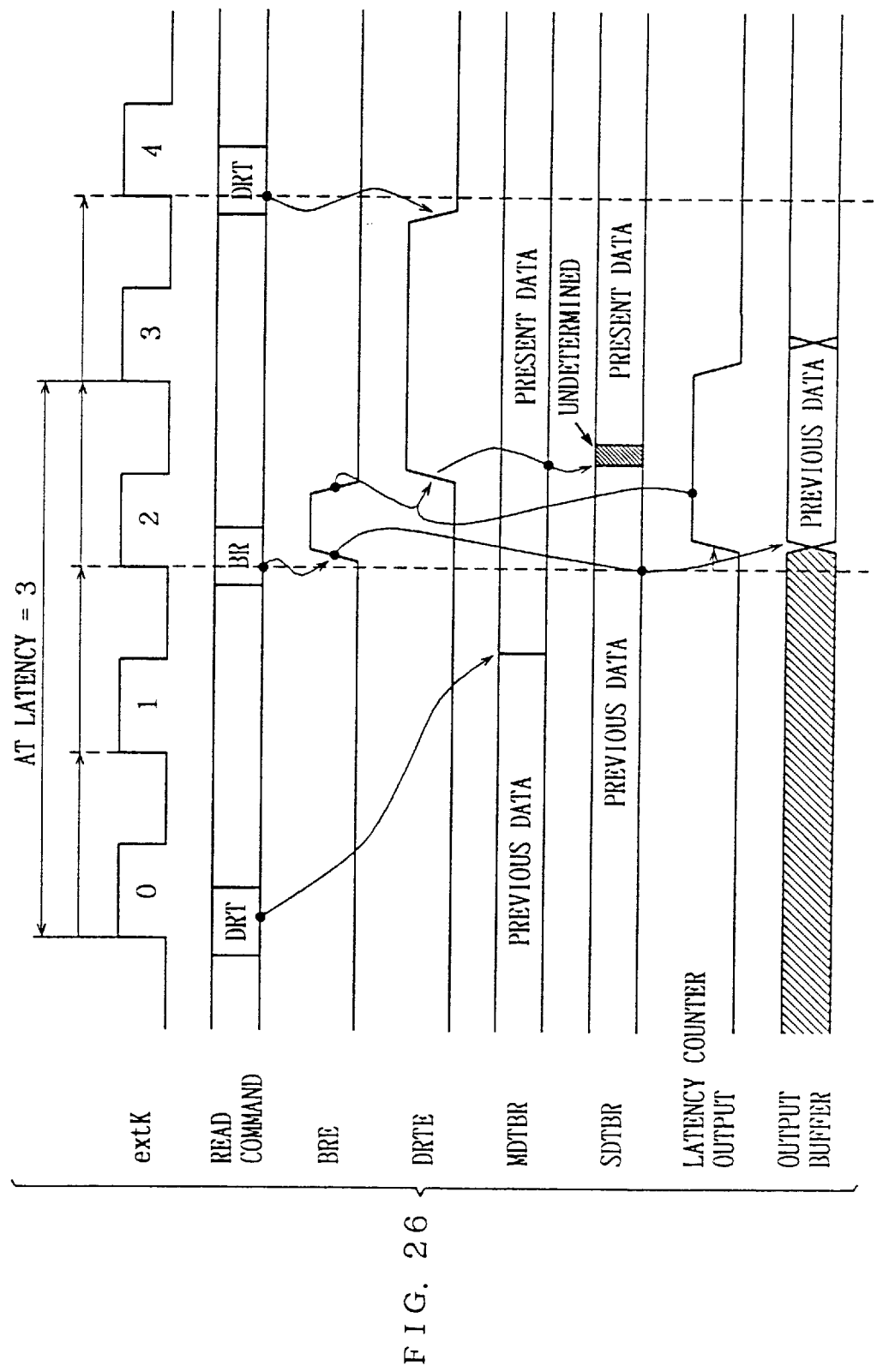
FIG. 26 is a signal waveform chart showing the operation of the circuit shown in FIGS. 24 and 25.

FIG. 26 shows an operation for a latency period of 3.

In the cycle 0 of external clock signal extK, DRAM read transfer mode DRT is specified. In response, among memory cells connected to a selected row in the DRAM array, a column block (memory cells of 16 bits for one memory plane) is selected according to a DRAM column address signal applied at the time and data thereof are transferred to master register MDTBR. The timing for data transfer from DRAM array 102 to master data register MDTBR, in other words the timing of generating preamplifier enable signal DPAE is also usually decided based on the latency, and in clock cycle 1, data transfer from DRAM array to master data register MDTBR is executed. The data which has been stored in master data register MDTBR is thus rewritten with the newly transferred data.

In the second clock cycle 2, buffer read mode BR is specified. This brings buffer read enable signal BRE to an active state (high level) turning on transfer gate Tx. At the time, since the detection signal /BRE from buffer read command detection circuit 910 attains a low level, the output of gate circuit 906 maintains its inactive low level even if the output of latency count 904 attains an active state or high level. Therefore, data transfer from master data register MDTBR to slave data register SDTBR is not executed. This is because DRAM read transfer enable signal DRTE is at an inactive low level, and transfer gate Tz in a non-conduction state.

In buffer read mode BR, all data stored in slave data register SDTBR is read out and transferred to the output main amplifier (a selection operation by the column decoder is performed). In response to a falling of buffer read enable signal BRE to a low level, the output of gate circuit 906 rises to a high level in an active state since the output of latency counter 904 maintains its high level.

In response, flipflop 903 is set, DRAM read data transfer enable signal DRT attains a high level in an active state, and transfer gate Tz conducts. As a result, storage data in master data register MDTBR is transferred to slave data register SDTBR. The storage data of slave data register SDTBR becomes unstable only for a short period of time, and in clock cycle 3, new data stored in slave data register SDTBR can be read out when buffer read mode BR is specified.

Flipflop 908 maintains its set state until DRAM read transfer mode DRT is specified next. The use of flipflop 908 produces transfer enable signal DRTE having a pulse width of a sufficient time period even if the output of gate circuit 906 has a short pulse width for one shot pulse, and data transfer from master data register MDTBR to slave data register SDTBR is secured without any complicated timing designing.

In clock cycle 4, when the mode DRT is specified, flipflop 908 is reset in response to read command detection signal DRTm from DRAM read command detection circuit 902, transfer enable signal DRTE falls to a low level, and master register MDTBR and slave data register SDTBR are separated. From this clock cycle et seq., a new data transfer operation is executed, and after the elapse of two clocks from clock cycle 4, data transfer from the DRAM array to slave data register SDTBR is executed through the master data register.

In FIG. 26, in clock cycle 4, with DRAM read transfer mode DRT being specified, transfer enable signal DRTE falls to a low level in an inactive state before a rising of clock signal extK in clock cycle 4, because in this embodiment, the input buffer as described previously attains a through state for clock signal K at a low level, a read command is detected before clock signal extK proceeds to an active state, and flipflop 908 is reset based on the detection result.

Figure 27:
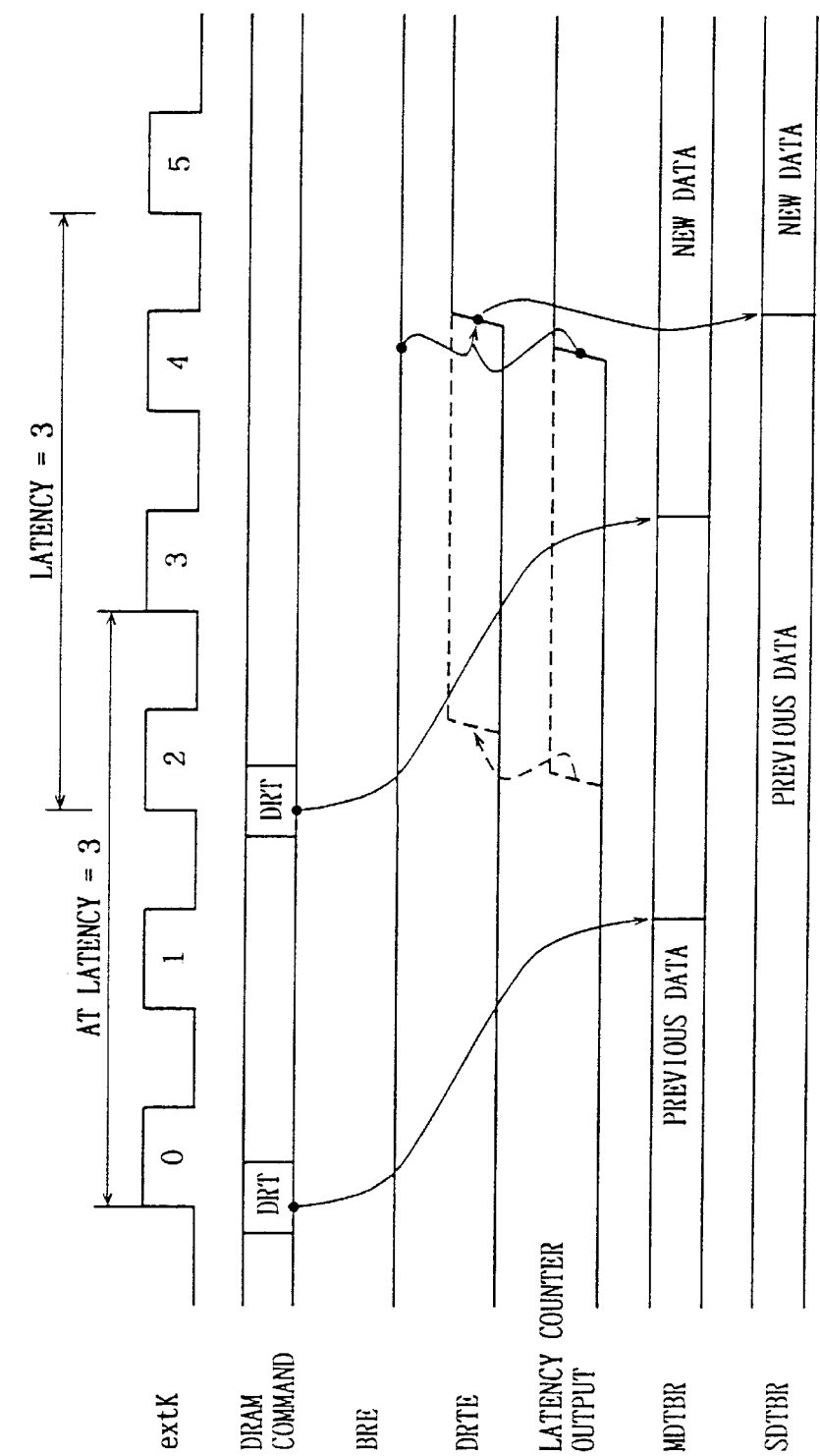
FIG. 27 is a timing chart showing other operation sequences of the circuit shown in FIGS. 24 and 25.

FIG. 27 is a diagram showing another operation sequence for the read data transfer buffer circuit. In the operation sequence in FIG. 27, DRAM read transfer mode DRT is initially specified, then read data transfer mode DRT is newly specified in a data transfer cycle inside the read data transfer buffer circuit. In the operation sequence in FIG. 27, the latency period of 3 is assumed.

In clock cycle 0, DRAM read transfer mode DRT is specified. Based on DRAM read transfer mode DRT, data is transferred from the DRAM array to master data register MDTBR (in clock cycle 1).

In clock cycle 2, DRAM read transfer mode DRT is newly specified. The newly applied DRAM read mode DRT resets the count value of the latency counter to an initial value. Accordingly, the output of the latency counter to be generated in clock cycle 2 (in broken line in FIG. 27) is not generated (does not attain an active state), and therefore DRAM read transfer enable signal DRTE is not activated either. Based on the newly applied DRAM read transfer mode DRT, the data of memory cells selected in the DRAM array are transferred to master register MDTBR (in clock cycle 3). Thus, the data stored in master data register MDTBR by the DRAM read transfer mode DRT specified in clock cycle 0 are rewritten with the data of the memory cells selected by the DRAM read transfer mode DRT applied in clock cycle 2. Based on the newly applied DRAM read transfer mode DRT in clock cycle 2, the latency counter executes a counting operation, the output of the latency counter is activated in clock cycle 4 after the elapse of two clock cycles from clock cycle 2, and data transfer enable signal DRTE attains an active state (buffer read enable signal BRE and buffer read transfer enable DRTE are both at a low level, inactive state). In response to data transfer enable signal DRTE generated in clock cycle 4, transfer gate Tz conducts, and data is transferred from master data register MDTBR to slave data register SDTBR.

In the above operation mode, the DRAM read transfer mode DRT applied in clock cycle 0 is ignored (read cancel). In such an operation mode, data does not become unstable in slave data register SDTBR at the time of transfer, and the slave data register is accessible in any cycle.

Figure 28:
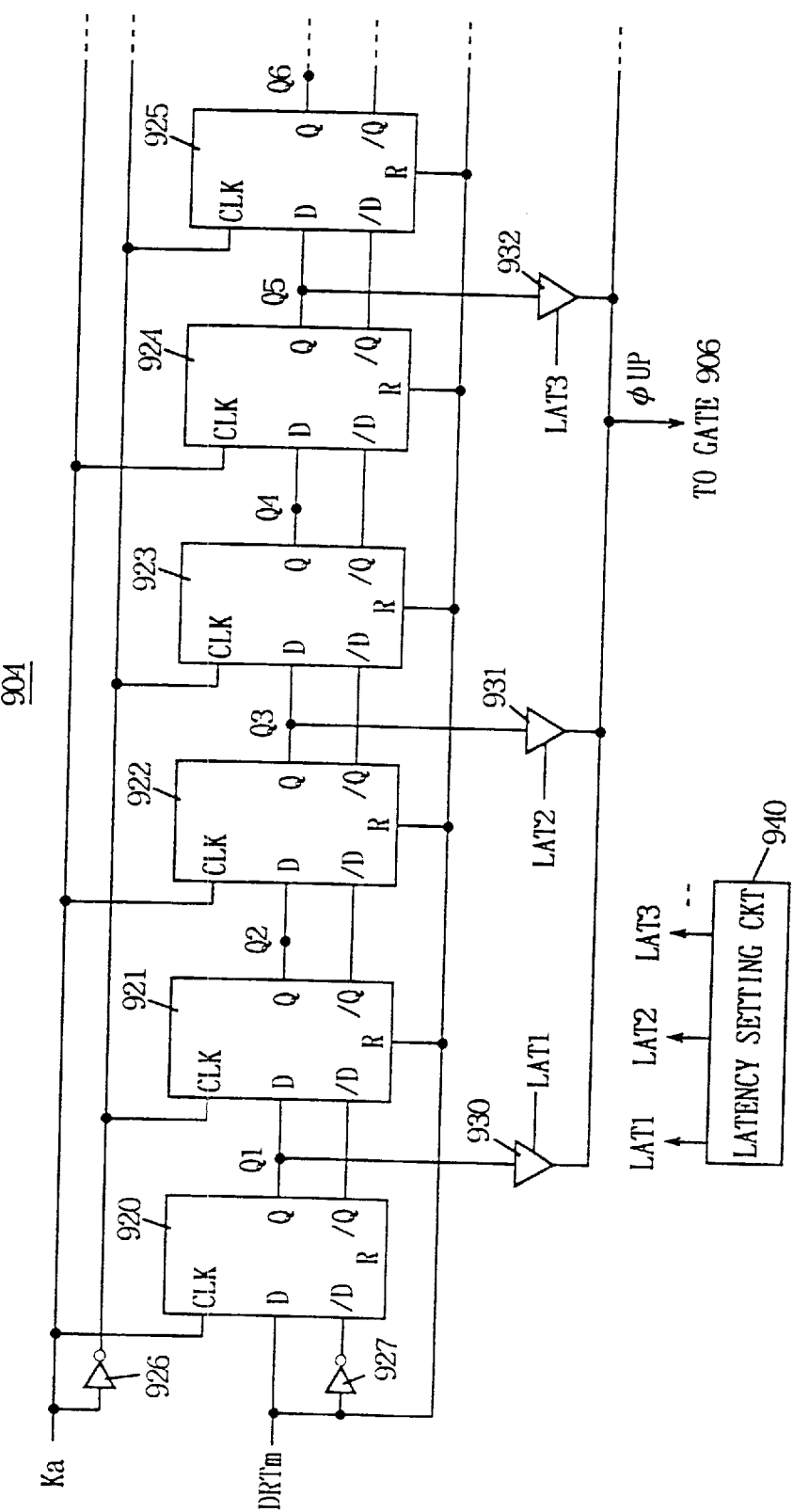
FIG. 28 is a diagram showing an example of the structure of the latency counter shown in FIG. 24.

FIG. 28 is a diagram showing in detail the configuration of the latency counter shown in FIG. 24. In FIG. 28, latency counter 908 includes a plurality of cascade-connected flipflops 920 to 925. Flipflops 921 to 925 each include a clock signal input terminal CLK, signal input terminals D and /D, a reset terminal R, and signal output terminals Q and /Q. The clock input terminals CLK of flipflops 920, 922, and 924 are supplied with an internal clock signal Ka (which corresponds to DRAM internal clock signal DK), and the clock input terminals CLK of flipflop 921, 923, and 925 are supplied with the inverse of internal clock signal Ka through inverter 926. Flipflops 920 to 925 each attain a through state when the clock signal applied to the clock input terminal CLK is at a high level and attain a latch state when the clock signal applied to the clock input terminal CLK is at a low level.

The signal input terminal D of flipflop 920 in the first stage is supplied with a DRAM read command detection signal DRTm, and the signal input terminal /D of first-stage flipflop 920 receives read command detection signal DRTm through inverter 927. For each of flipflops 921 to 925, the outputs Q and /Q of a flipflop in a preceding stage are connected to input terminals D and /D.

Latency counter 904 further includes a tristate buffer circuit 930 passing through the output of flipflop 920 in response to a latency 1 set signal LAT1, a tristate buffer circuit 931 conducting in response to a latency 2 set signal and passing the output Q3 of flipflop 922, and a tristate buffer circuit 932 conducting in response to a latency 3 set signal LAT3 and passing the output Q5 of flipflop 924. The output portions of tristate buffer circuits 930 to 932 are wired-OR-connected.

Latency set signals LAT1, LAT2, and LAT3 are generated from latency setting circuit 940 which is a command register, for example. Latency setting circuit 940 is supplied with external data in a special mode such as set command register mode SCR and latency data is set therein.

Figure 29:
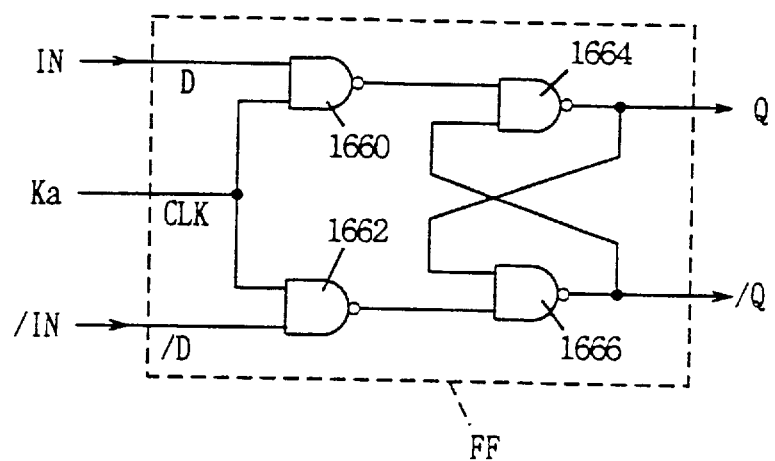
FIG. 29 is a diagram showing the specific structure of flipflop shown in FIG. 28.

FIG. 29 is a diagram showing in detail a configuration of a flipflop shown in FIG. 28. In FIG. 28, flipflop FF includes a 2-input NAND circuit 1660 receiving an input signal IN applied to input terminal D and internal clock signal Ka, a 2-input NAND circuit 1662 receiving an input signal /IN applied to input terminal /D and internal clock signal Ka, and NAND circuits 1164 and 1666 constituting a latch circuit.

Figure 30:
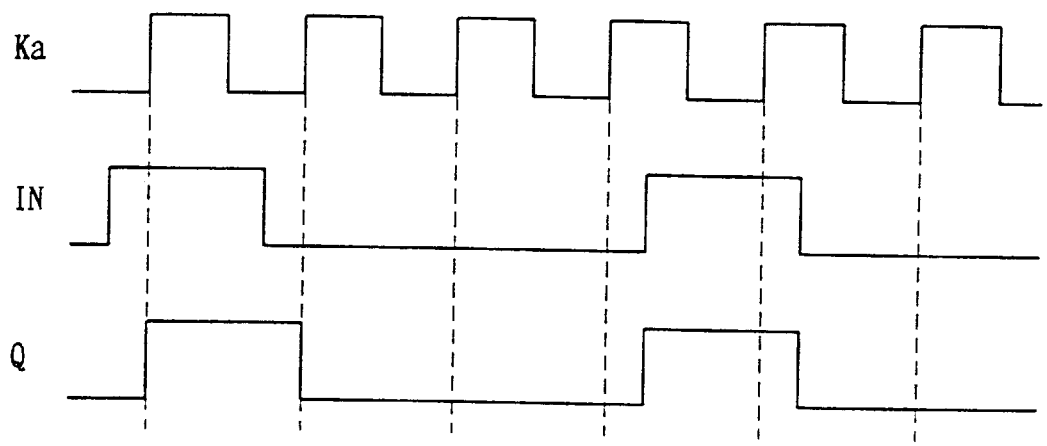
FIG. 30 is a signal waveform chart showing the operation of the flipflop shown in FIG. 29.

NAND circuit 1664 receives the output of NAND circuit 1660 and the output of NAND circuit 1666. NAND circuit 1666 receives the output of NAND circuit 1662 and the output of NAND circuit 1664. The output portion of NAND circuit 1664 is connected to a data output terminal Q and the output portion of NAND circuit 1666 is connected to a data output terminal /Q. The operation of the flipflop shown in FIG. 29 will be described in conjunction with FIG. 30 showing an operation waveform chart.

With internal clock signal Ka at a low level, the outputs of NAND circuits 1660 and 1662 are at a high level, and the outputs of NAND circuits 1664 and 1666 do not change. In other words, a latch state is accomplished.

When internal clock signal Ka attains a high level, NAND circuits 1660 and 1662 operate as an inverter buffer, and the outputs of NAND circuits 1664 and 1666 change in response to the states of input signals IN and /IN. Now, since input signal IN is at a high level, output Q attains a high level.

In response to a falling of clock signal Ka to a low level, flipflop FF attains a latch state.

When clock signal Ka attains a high level, and input signal IN is at a low level, the output of NAND circuit 1660 attains a high level, and the output of NAND circuit 1662 attains a low level. Thus, the output of NAND circuit 1666 attains a high level, and the output of NAND circuit 1664 attains a low level.

Flipflop FF has its output Q changed in response to input signal IN when clock signal Ka is at a high level, and maintains its output Q regardless of the state of input signal IN when clock signal Ka is at a low level. More specifically, flipflop FF attains a through state when clock signal Ka is at a high level, and attains a latch state when clock signal Ka is at a low level.

Figure 31:
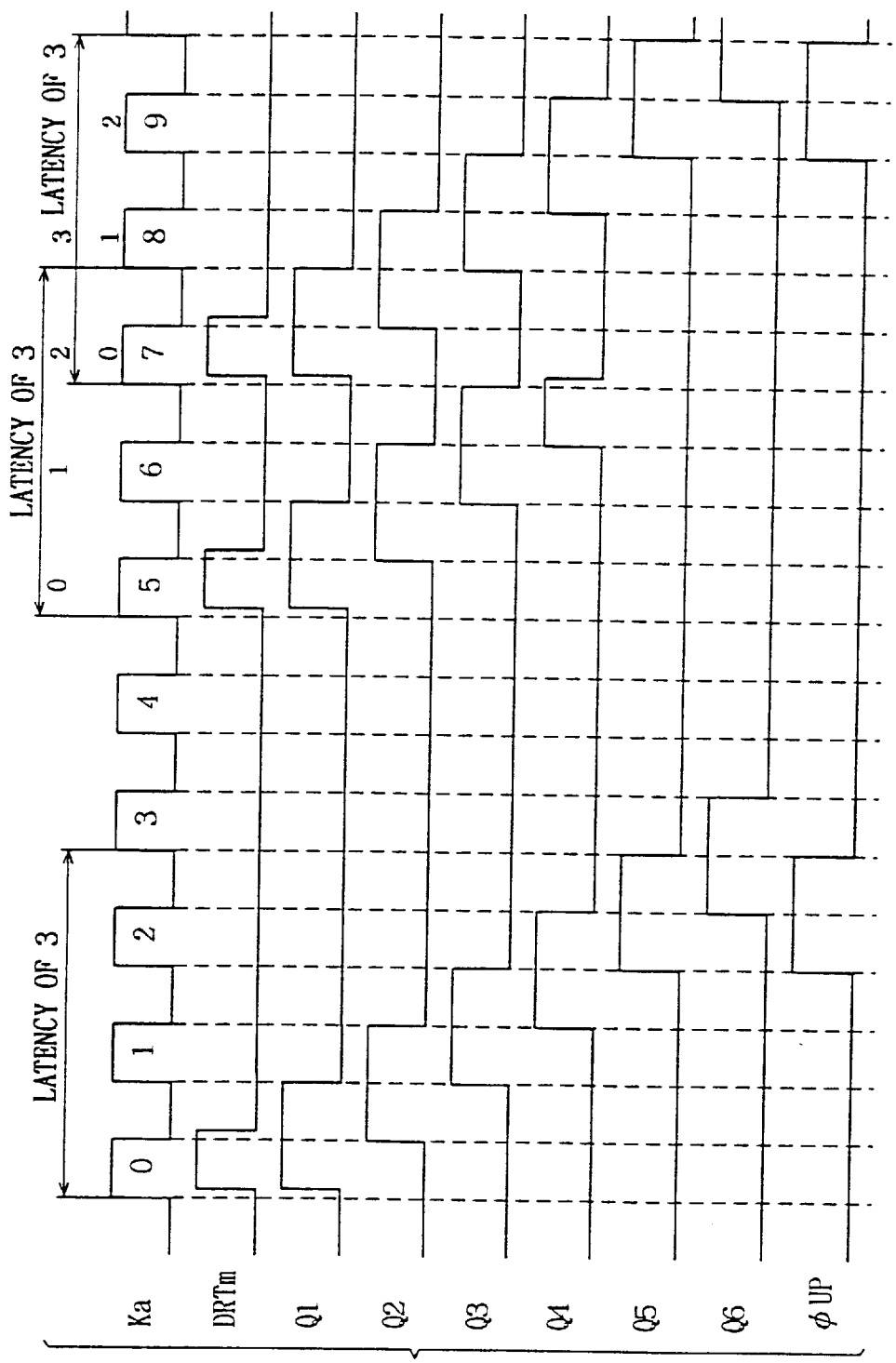
FIG. 31 is a signal waveform chart showing the operation of the latency counter shown in FIG. 28.

Now, the operation of latency counter 904 shown in FIG. 28 will be described in conjunction with the operation waveform chart thereof, FIG. 31.

In clock signal 0, DRAM read command detection signal DRTm attains an active state. In response to read command detection signal DRTm, flipflops 921 to 925 are reset, and their outputs Q2 to Q6 attain a low level.

Since flipflop 920 is in a through state with clock signal Ka at a high level, its output Q1 is raised to a high level based on read command detection signal DRTm (read command detection signal DRTm is not applied to the reset input of flipflop 920). Output Q1 is latched in response to a falling of clock signal Ka to a low level.

Flipflop 921 attains a through state in response to the falling of clock signal Ka to a low level, and raises its output Q2 to a high level based on the output Q1 of flipflop 920. This operation is repeated succeedingly, and the outputs Q3 to Q6 of flipflops 922 to 925 sequentially attain a high level during one clock cycle period every half the cycle of clock signal Ka.

Since the latency is specified as 3, tristate buffer 932 is in a conduction state. Accordingly, when the output Q5 of flipflop 924 attains a high level, in other words in clock cycle 2, a count up signal Φup rises to a high level during one clock cycle period.

As described above, by resetting flipflops 921 to 925 excluding first stage flipflop 920 in response to read command detection signal DRTm, the latency can be reliably counted based on thus newly applied read command detection signal DRTm.

Figure 32:
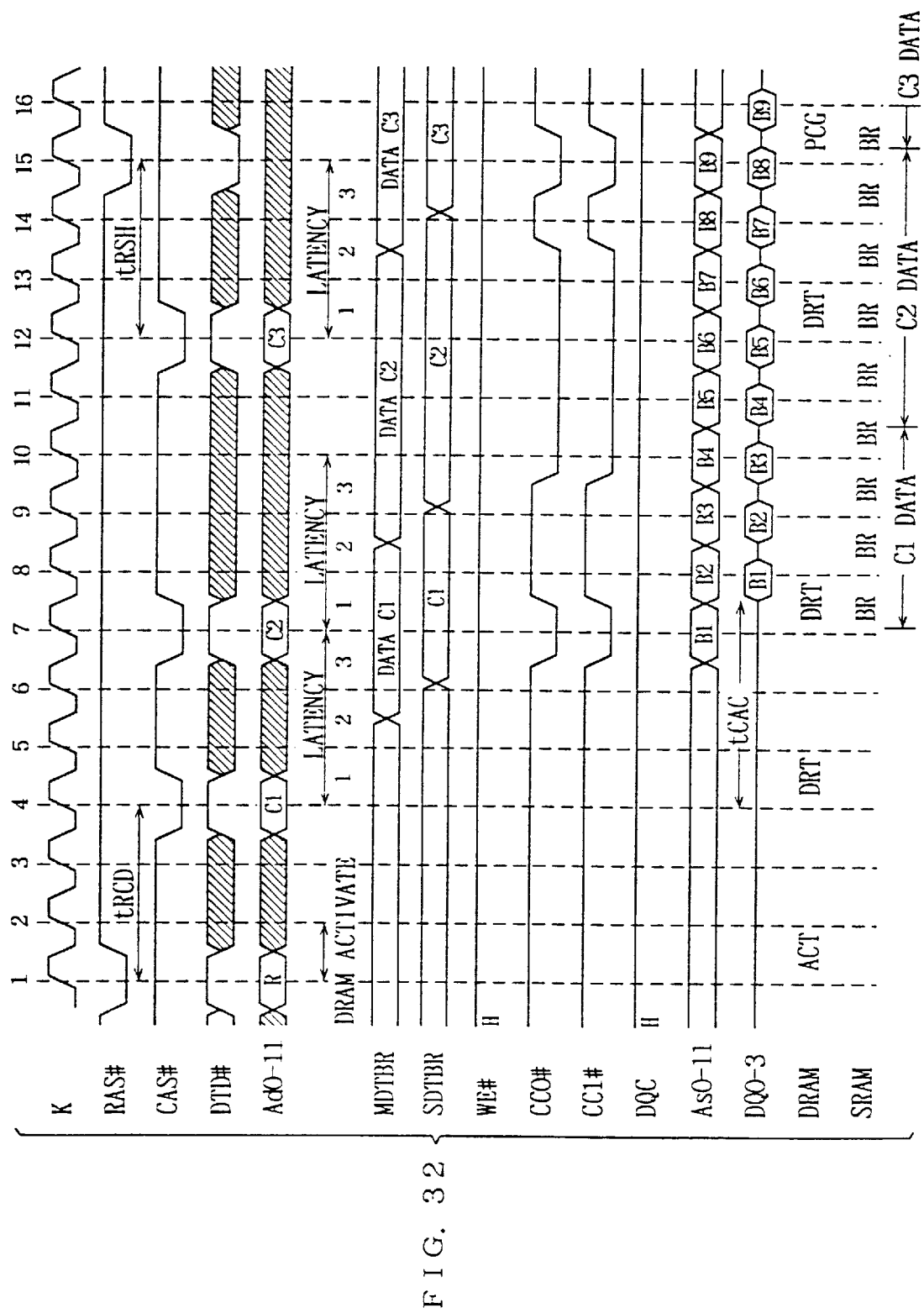
FIG. 32 is a chart showing an example of a data read operation sequence of CDRAM according to the present invention.

As in the foregoing, by eliminating the period in which data is unstable in the read data transfer buffer circuit, as illustrated in FIG. 32, the external processing unit can continuously access different column blocks in the DRAM array with no wait. Now, the continuous accessing operation will be described in conjunction with FIG. 32.

In FIG. 32, a reading operation of data with the latency of 3 is shown. In clock cycle 4, a DRAM read transfer mode DRT is specified. In clock cycle 7 after the elapse of latency periods 3, buffer read mode BR is specified, and in addition data transfer mode DRT is specified. Among data block C1 in DRAM array selected by the first data transfer mode DRT, data is read out based on SRAM address As0 to As11.

In clock cycle 9, the content of slave data register SDTBR is changed based on the mode DRT applied in clock cycle 7. Data B3 read out corresponding to address B3 applied in cycle 9 is data stored in slave data register SDTBR in cycle 8. If buffer read mode BR is specified in cycle 10, data read out from cycle 10 and on is data included in data block C2.

As illustrated in FIG. 32, in slave data register SDTBR, data transfer is executed only when its storage data is not used. Accordingly, wait time is not necessary as opposed to the operation waveform chart in FIG. 20, and data can be processed at a higher speed. Particularly in video applications, an address signal to be applied next is previously known in processing image data. Accordingly, if data transfer mode DRT is executed before data in a column block is all read out, the image data can be processed with no wait, and an image processing system operating at a high speed can be implemented.

[Specific Configuration of External Signal Input Buffer]

Figure 33:
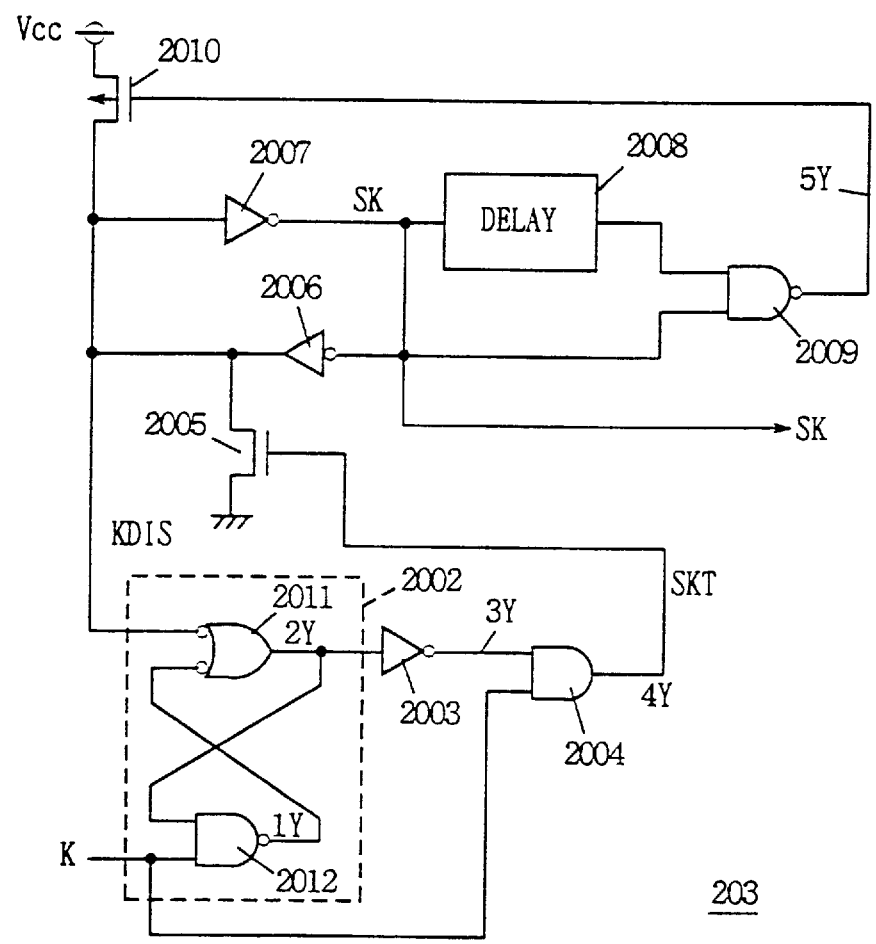
FIG. 33 is a block diagram schematically showing the structure of an internal clock generation circuit according to the present invention.

FIG. 33 is a diagram specifically showing the configuration of a K buffer shown in FIG. 6. In FIG. 33, K buffer 203 includes a flipflop 2002 which is set in response to a rising of external clock signal K and reset in response to a clock sampling disable signal KDIS, an inverter circuit 2003 for inverting a signal on the output node 2Y of flipflop 2002, and an AND circuit 2004 receiving external clock signal K and the output signal of inverter circuit 2003. A first internal clock signal SKT is generated from AND circuit 2004. Flipflop 2002 includes NAND circuits 2011 and 2012 which have each one input and output cross-coupled. NAND circuits 2011 and 2012 receive sampling disable signal KDIS and external clock signal K at respective other inputs.

K buffer 203 further includes an n channel MOS transistor 2005 for lowering clock sampling disable signal KDIS to a low level in response to first internal clock signal SKT, an inverter circuit 2007 for inverting clock sampling disable signal KDIS and generating a second internal clock signal SK, and an inverter circuit 2006 for inverting the second internal clock signal SK. Inverter circuits 2006 and 2007 constitute a latch circuit. Transistors 2005 falls clock sampling disable signal KDIS to a low level, the driving capability of the inverter circuit 2006 is reduced as a result, AND circuit 2004 has a relatively reduced size in order to drive only MOS transistor 2005, and in other words its current driving capability is kept small.

Figure 34:
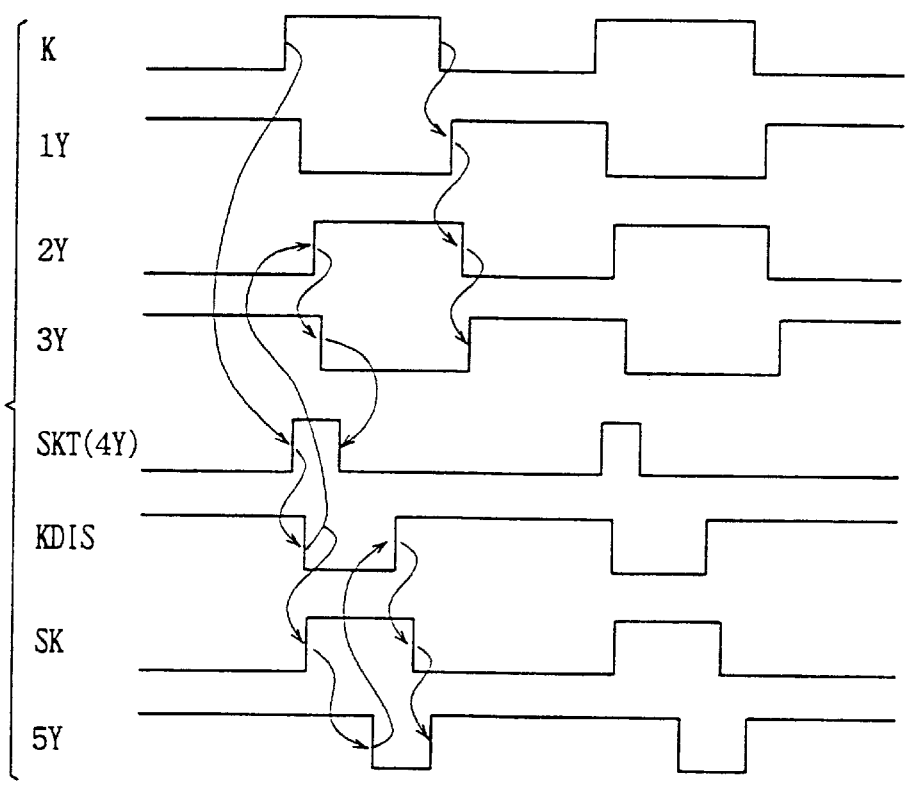
FIG. 34 is a signal waveform chart showing the operation of the circuit shown in FIG. 33.

K buffer 203 further includes a delay circuit 2008 for delaying second internal clock signal SK for a prescribed time period, an NAND circuit 2009 receiving the output of delay circuit 2008 and second internal clock signal SK, and a p channel MOS transistor 2010 for raising clock sampling disable signal KDIS to a power supply potential level in response to the output of NAND circuit 2009. Delay circuit 2008 and NAND circuit 2009 formed a one shot pulse generation circuit. The timing for generating the one shot pulse is determined based on the delay time of delay circuit 2008. Now, the operation of the K buffer shown in FIG. 33 will be described in conjunction with its operation waveform chart, FIG. 34.

With external clock signal K at "L", clock sampling disable signal KDIS attains "H", the output of NAND circuit 2012 is at "H", and the output signal of NAND circuit 2011 at "L". Inverter circuit 2003 receiving the output signal of NAND circuit 2011 outputs a signal at "H".

When external clock signal K is at "H", the output signal SKT of AND circuit 2004 is pulled to "H", MOS transistor 2005 is turned on, and clock sampling disable signal KDIS falls to "L". In response to clock sampling disable signal KDIS at "L", inverter circuit 2007 raises second internal clock signal SK to "H". After the elapse of delay time by delay circuit 200 after the rising of second internal clock signal SK to "H", the output signal of NAND circuit 209 is pulled to "L and MOS transistor 2010 is turned on. This pulls clock sampling disable signal KDIS to "H", and second internal clock signal SK is pulled to "L" by the function of inverter circuit 2007.

Meanwhile, in response to clock sampling disable signal KDIS at "L", the output signal (signal at node 2Y) of NAND circuit 2011 rises to "H" (external clock signal K is still at "H" at this time), the output signal of inverter circuit 2003 (signal at node 3Y) is pulled to "L" and first internal clock signal SKT on node 4 is brought to "L" through NAND circuit 2004.

Accordingly, time during which first internal clock signal SKT is at "H" is determined by time required for inverting the output state of flipflop 2002, and time delay by inverter circuit 2003 and NAND circuit 2004. In response to first internal clock signal SKT at "L", MOS transistor 2005 is turned off.

After MOS transistor 2005 is thus turned off, the output signal (signal on node 5Y) of NAND circuit 2009 is pulled to "L", and MOS transistor 2010 is turned on. When clock sampling disable signal KDIS is brought to "H" by function of transistor 2010, inverter circuit 2007 brings second internal clock signal SK to "L", and the output of NAND circuit 2009 is pulled to "H", in response, turning off MOS transistor 2010.

In response to a falling of clock signal K, the output (the signal on node 1Y) of NAND circuit 2012 is pulled to "H", and the output signal of NAND circuit 2011 is brought to "L".

As described above, second clock signal SK rises to "H" in response to a rising of external clock signal K, and falls to "L" based on time delay unique to the circuits (time delay given by delay circuit 2008, NAND circuit 2009, transistor 2010, and inverter circuits 2006 and 2007). The time period during which second internal clock signal SK is at "H" is therefore always constant regardless of the time period during which external clock signal K is at "H". In a synchronous semiconductor memory device, determination of various operation initiating timings for the internal circuitry and latching of external signals are made based on the internal clock signal SK. Accordingly, generating an internal clock SK signal having a constant pulse width in response to a rising of external signal K in the K buffer permits the operation timings for the internal circuitry to be always constant with respect to rising of external clock signal K, timing margins for any internal signal can be reduced, and a high speed operation can be implemented (because it is not necessary to determine timing margins considering distortion in the falling of external clock signal K).

First internal clock signal SKT also rises in response to a rising of internal clock signal K, and falls to "L" by internally applied constant delay time. Thus, the time period during which first internal clock signal SKT is at "H" can be always constant regardless of that of external clock signal K, and generation of stable second internal clock signal SK is secured. n channel MOS transistor 2005 needs only to raise second internal clock signal SK to "H", in other words to bring clock sampling disable signal KDIS to "L". Bringing second internal clock signal SK to "L" (raising clock sampling disable signal KDIS to "H") is executed by pull up p channel MOS transistor 2010, and the signal levels of second internal clock signal SK and clock sampling disable signal KDIS are maintained by the latch circuit formed by inverter circuits 2006 and 2007. Transistors 2005 and 2010 therefore do not require a large driving capability, and therefore current consumption can be kept small. AND circuit 2004 needs only to drive n channel MOS transistor 2005, the driving capability can be kept small, and the size can be reduced. This also applies to NAND circuit 2009. Accordingly, internal clock signal can be generated stably without increasing the circuit scale.

The number of stages of gates between external clock signal K and first internal clock signal SKT is one, i.e. AND circuit 2004. The output signals of flipflops 2002 and inverter circuit 2003 are reset when external clock signal K is at "L". Delay time for first internal clock signal SKT and external clock signal K therefore can be reduced, and internal clock signals can be generated at a high speed.

Clock signal SK must drive various internal circuits. The use of a plurality of series-connected inverter circuits increases delay time. A large driving capability will be required for an inverter circuit in the final output stage, and in order to drive the inverter circuit having the large driving capability with reduce delay time, the inverter circuits have to be connected in series with their driving capabilities being progressively increased. In such a configuration, however, a large number of stages of inverter circuit will be necessary, resulting in increase in circuit scale, and delay time for external clock signal K increases. Meanwhile, if the K buffer as shown in FIG. 33 is used, only inverter circuit 2007 needs a large driving capability. Accordingly, without increasing the circuit scale, internal clock signal SK can be generated by reduced delay time (delay time by transistor 2005 and inverter circuit 2007).

Figure 35:
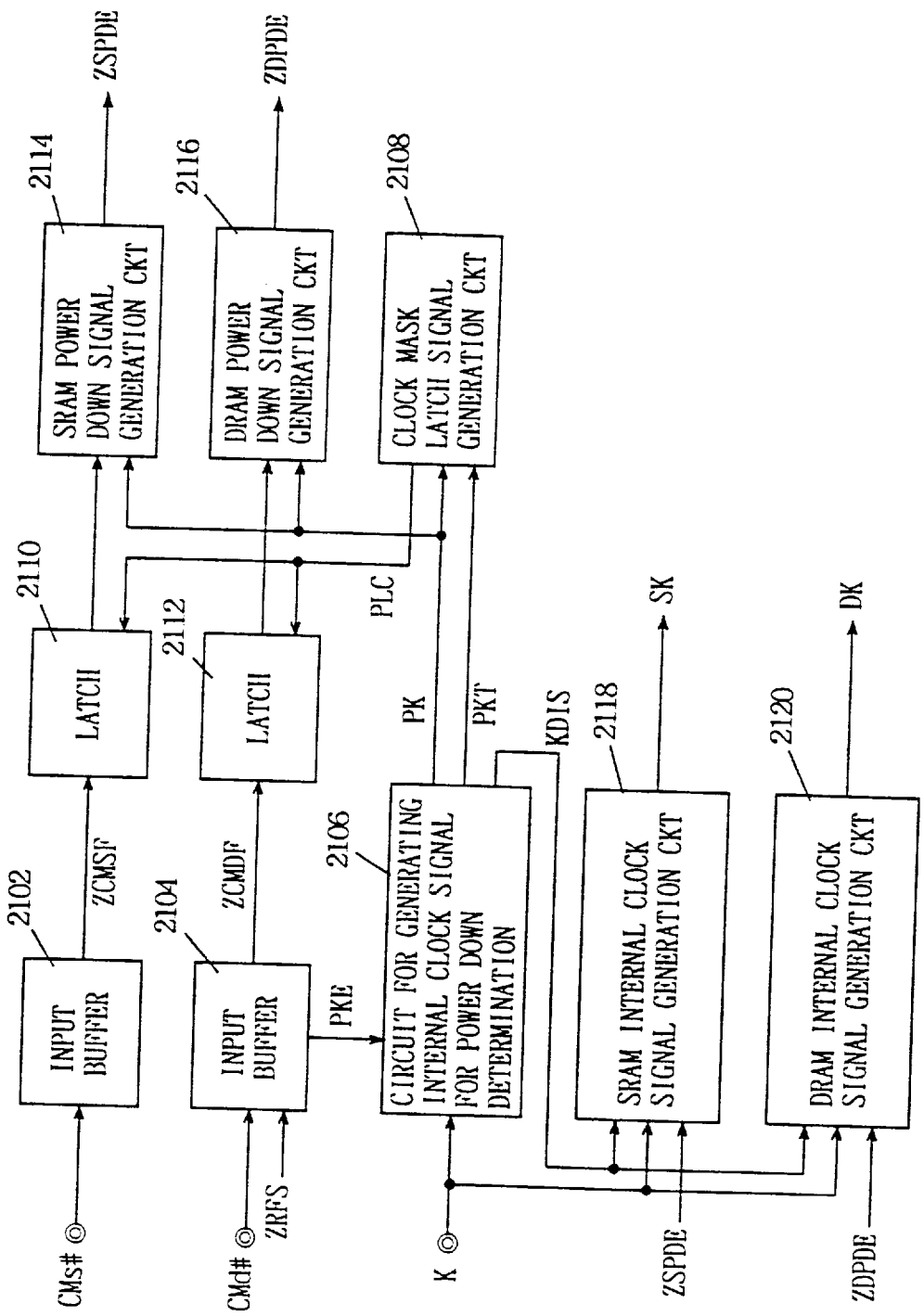
FIG. 35 is a block diagram showing the specific structure of an internal clock generation circuit according to the present invention.

FIG. 35 is a block diagram showing in detail the configuration of an internal clock signal generation portion. The internal clock signal generation portion shown in FIG. 35 corresponds to the configuration of both K buffer/timing circuit and mask circuit shown in FIGS. 5 and 6.

In FIG. 35, the internal clock signal generation portion includes an input buffer 2102 receiving an external SRAM clock mask signal CMs# for outputting an internal mask signal ZCMSF, an input buffer 2104 receiving an external DRAM clock mask signal CMd# and an internally generated refresh mode detection signal ZRFS, for generating an internal clock mask signal ZCMDF and a power down determination activation signal PKE, and an internal clock signal generation circuit for power down determination 2106 activated in response to a power down determination activation signal PKE for generating power down mode determination clock signals PK and PKT, and an external clock sampling disable signal KDIS. Refresh mode detection signal ZRFS is applied to input buffer 2104 in order to mask an external signal during execution of a self refresh operation in the DRAM array and to prohibit any new operation mode from entering. The letter "Z" attached to the head of signal name indicates that the signal attains an active state in a low level ("L").

The internal clock signal generation portion further includes a clock mask latch signal generation circuit 2108 for generating a clock mask latch signal PLC based on power down mode determination internal clock signals PK and PKT, latch circuits 2110 and 2112 for latching internal clock mask signals ZCMSF and ZCMDF in response to clock mask latch signal PLC, an SRAM power down signal generation circuit 2114 and a DRAM power down signal generation circuit 2116 for generating power down mode detection signals ZSPDE and ZDPDE based on power down mode determination clock signal PK and the signals latched by latch circuits 2110 and 2112, respectively, an SRAM internal clock signal generation circuit 2118 for generating an SRAM internal clock signal SK based on external clock sampling disable signal KDIS and power down mode detection signal ZSPDE as well as external clock signal K, and a DRAM internal clock signal generation circuit 2120 for generating a DRAM internal clock signal DK based on power down mode detection signal SDPDE and external clock sampling disable signal KDIS as well as external clock signal K.

In the configuration shown in FIG. 35, SRAM internal clock signal generation circuit 2118 and DRAM internal clock signal generation circuit 2120 correspond to gates circuits 204 and 164 for clock transfer and K buffer 203 shown in FIGS. 5 and 6. The remaining circuit elements correspond to the shift register portion shown in FIGS. 5 and 6.

Power down determination internal clock signal generation circuit 2106 needs only to drive clock mask latch signal generation circuit 2108 and therefore its current consumption is small. Meanwhile, internal clock signal generation circuits 2118 and 2120 must drive a number of circuits, and therefore its power consumption is large. Accordingly, by determining the presence/absence of generation of internal clock in the circuit 2106 with small power consumption and by disabling the operation of the circuit portion with the large power consumption, the entire power consumption can be reduced. When refresh mode detection signal ZRFS is in an active state at "L", signal PKT is brought to an inactive state and excess power consumption in power down determination internal clock signal generation circuit 2106 is reduced.

Figure 36:
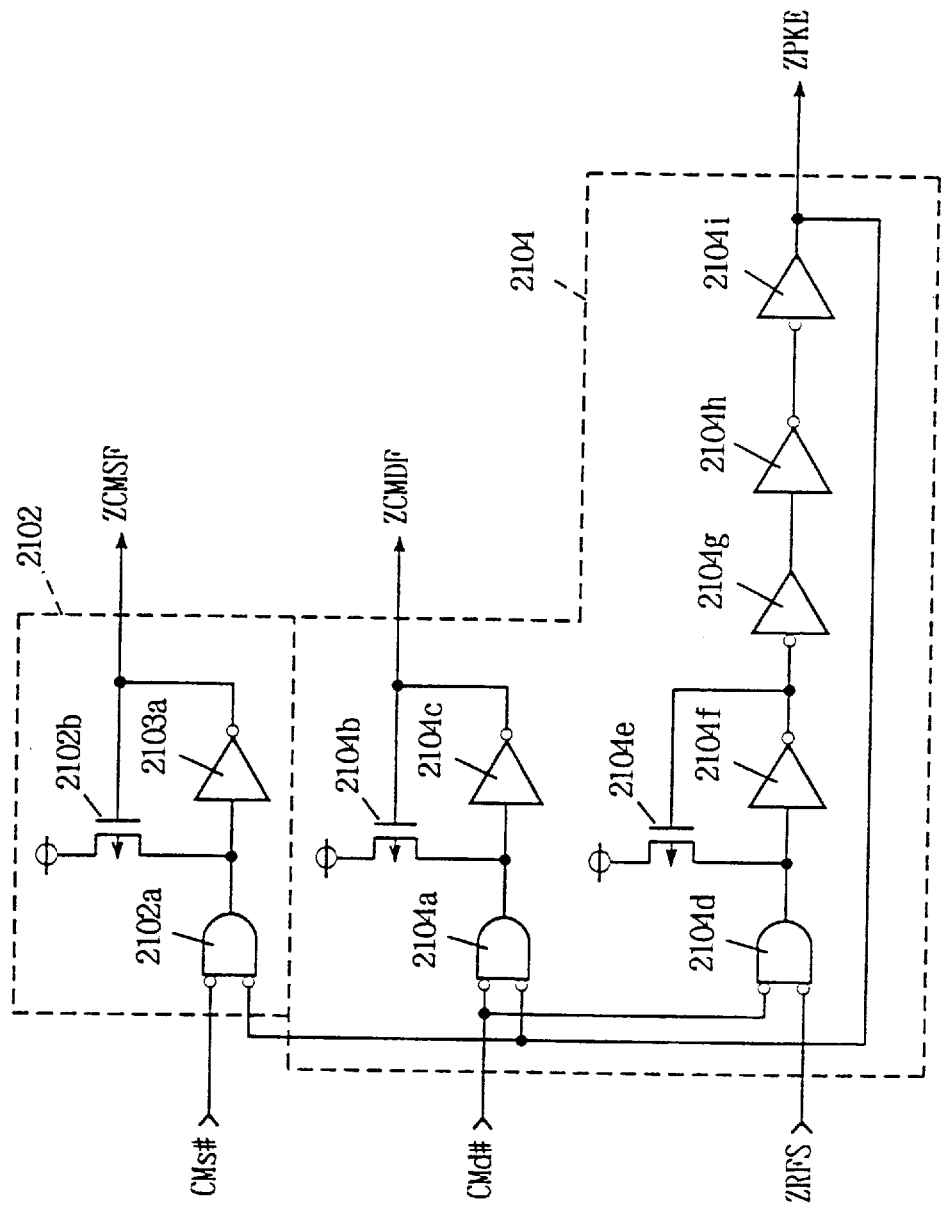
FIG. 36 is a diagram showing the specific structure of the clock mask signal input buffer shown in FIG. 35.

FIG. 36 is a diagram specifically showing the configuration of the input buffer shown in FIG. 35. In FIG. 36, input buffer 2102 includes a 2-input NOR circuit 2102a receiving a power down mode determination activation signal ZPKE and an external clock mask signal CMs#, an inverter circuit 2103a inverting the output of NOR circuit 2102a, and a p channel MOS transistor 2102b for stabilizing the output of inverter circuit 2103a. p channel MOS transistor 2102b conducts when the output of inverter circuit 2103a is at "L", and charges the input of inverter circuit 2103a to a power supply potential level. Inverter circuit 2103a generates an internal clock mask signal ZCMSF.

Input buffer 2104 includes an NOR circuit 2104a receiving signal ZPKE and an external clock mask signal CMd#, an inverter circuit 2104c receiving the output signal of NOR circuit 2104a and a p channel MOS transistor 2104b conducting in response to the output signal ZCMDF of inverter circuit 2104c being at "L" for charging the input of inverter circuit 2104c to the power supply potential level.

The configuration for generating internal clock mask signal ZCMDF is the same as that of input buffer 2102.

Input buffer 2102 further includes an NOR circuit 2104d receiving external clock mask signal CMd# and refresh mode detection signal ZRFS, an inverter circuit 2104f inverting the output of NOR circuit 2104d, and a p channel MOS transistor 2104e conducting in response to the output of inverter circuit 2104s for charging the input of inverter circuit 2104f to the power supply potential level. The output of inverter circuit 2104f is further provided with three stage, cascade-connected inverter circuits 2104g, 2104h and 2104i.

When external clock mask signal CMs# or CMd# is at "L", and a power down mode is specified, internal clock mask signal ZCMSF or ZCMDF is brought to "L".

When refresh mode detection signal ZRFS is at "L", and a refresh operation is executed at the DRAM portion, power down mode determination activation signal ZPKE is at "L". In this case, regardless of the states of external clock mask signal CMs# and CMd#, internal clock mask signals ZCMDF and ZCMSF is brought to "L". At the time of a self refresh operation, designation of a new operation mode next is securely disabled.

Figure 37:
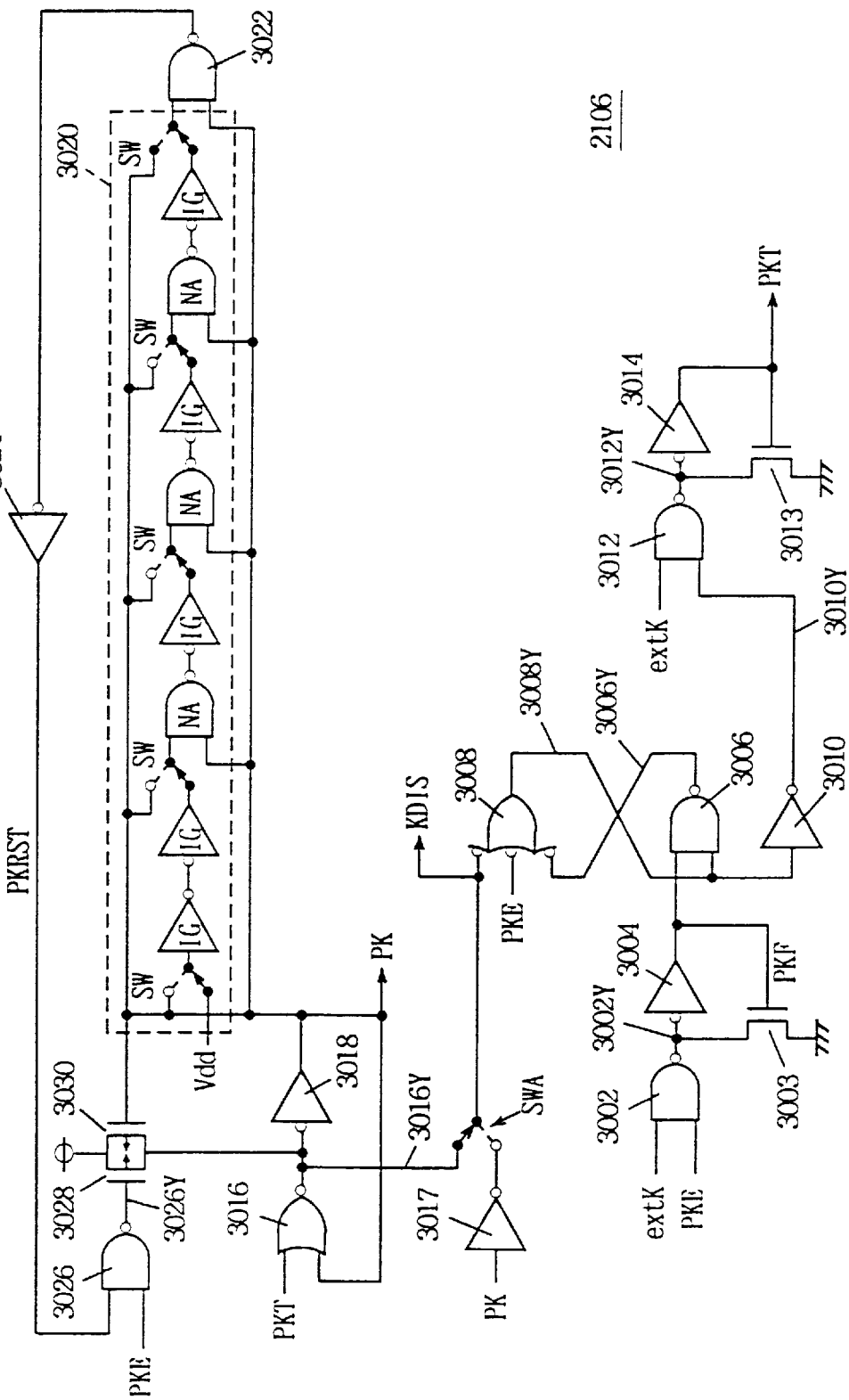
FIG. 37 is a diagram specifically showing the configuration of the internal clock signal generation circuit for power down mode determination shown in FIG. 35.

FIG. 37 is a diagram showing specifically showing the configuration of the power down determination internal clock signal generation circuit shown in FIG. 35. In FIG. 37, power down determination internal clock signal generation circuit 2106 includes an NAND circuit 3002 receiving external clock signal extK and activation signal PKE, an inverter inverting the output signal of AND circuit 3002, and an n channel MOS transistor 3003 for discharging the input of inverter circuit 3004 to the ground potential level in response to the output signal of inverter circuit 3004. Activation signal PKE is generated by passing signal ZPKE shown in FIG. 36 through an inverter circuit. Herein, external clock signal K will be denoted with the reference character extK in the following description, in order to distinguish signal internally generated from signal externally applied.

Power down determination internal clock signal generation circuit 2104 further includes NAND circuits 3006 and 3008 constituting a flipflop, an inverter circuit 3010 inverting the output of NAND circuit 3008, an NAND circuit 3012 receiving the output signal of inverter circuit 3010 and external clock signal extK, and an inverter circuit 3014 receiving the output signal of NAND circuit 3012. Inverter circuit 3014 generates internal clock signal PKT. n channel MOS transistor 3013 conducts when the output of inverter circuit 3014 is at "H", and maintains the output of inverter circuit 3014 at the ground level.

NAND circuit 30087 receives external clock sampling disable signal KDIS, activation signal PKE, and the output signal of NAND circuit 3006. NAND circuit 3006 receives the output signal of NAND circuit 3008 and the output signal of inverter circuit 3004.

Power down determination internal clock signal generation circuit 2106 further includes an NOR circuit 3016 receiving internal clock signal PKT generated from inverter circuit 3014 and internal clock signal PK generated from inverter circuit 3018, an inverter circuit 3018 for inverting the output signal of NOR circuit 3016 and generating an internal clock signal PK, a delay circuit 3020 for delaying the output signal of inverter circuit 3018 for a prescribed time period, an NAND circuit 3022 receiving the output signal (signal PK) of inverter circuit 3018, an inverter circuit 3024 for inverting the output signal of NAND circuit 3022, an NAND circuit 3026 receiving the output signal of inverter circuit 3024 and activation signal PKE, a p channel MOS transistor 3028 conducting in response to the output of NAND for charging the input of inverter circuit 3018 to the power supply potential level, and a p channel MOS transistor 3030 conducting in response to the output signal of inverter circuit 3018 for charging the input of inverter circuit 3018 to the power supply potential level.

p channel MOS transistor 3028 has a function of pulling up the input of inverter circuit 3018, and corresponds to p channel MOS transistor 2010 in FIG. 33. p channel MOS transistor 3030 has a function of maintaining the level of signal PK at "H", thus implementing the function of inverter circuit 2006 in the configuration shown in FIG. 33. NOR circuit 3016 implements the function of n channel MOS transistor 2005 in the configuration shown in FIG. 33.

The delay circuit 3020 is formed by an inverter circuit IG and a 2-input NAND circuit NA. In delay circuit 3020, NAND circuit NA has a switch circuit SW provided at its one input, and it is determined which the one input receives either the output signal PK of inverter circuit 3018 or the output signal of inverter circuit IG in a preceding stage. The connection of switch circuit SW is determined by mask interconnection in a manufacturing step. NAND circuit NA function as an inverter circuit if the same signal is applied on both inputs, and therefore the number of stages of inverter circuits in delay circuit 3020 can be optimally set by determining the connection state of switch circuit SW.

NOR circuit 3016 generates clock sampling disable signal KDIS. NAND circuit 3008 may be provided with internal clock signal PK, in place of the output signal of NOR circuit 3016, through the inverter circuit 3017 and switch circuit SWA. Clock sampling disable signal KDIS and clock signal PK is different in logic by the function of inverter circuit 3018. Accordingly, applying this internal clock signal PK to NAND circuit 3008 through inverter circuit 3017 and switch circuit SWA can optimally set delay time between clock sampling disable signal KDIS and internal clock signal PK.

Figure 38:
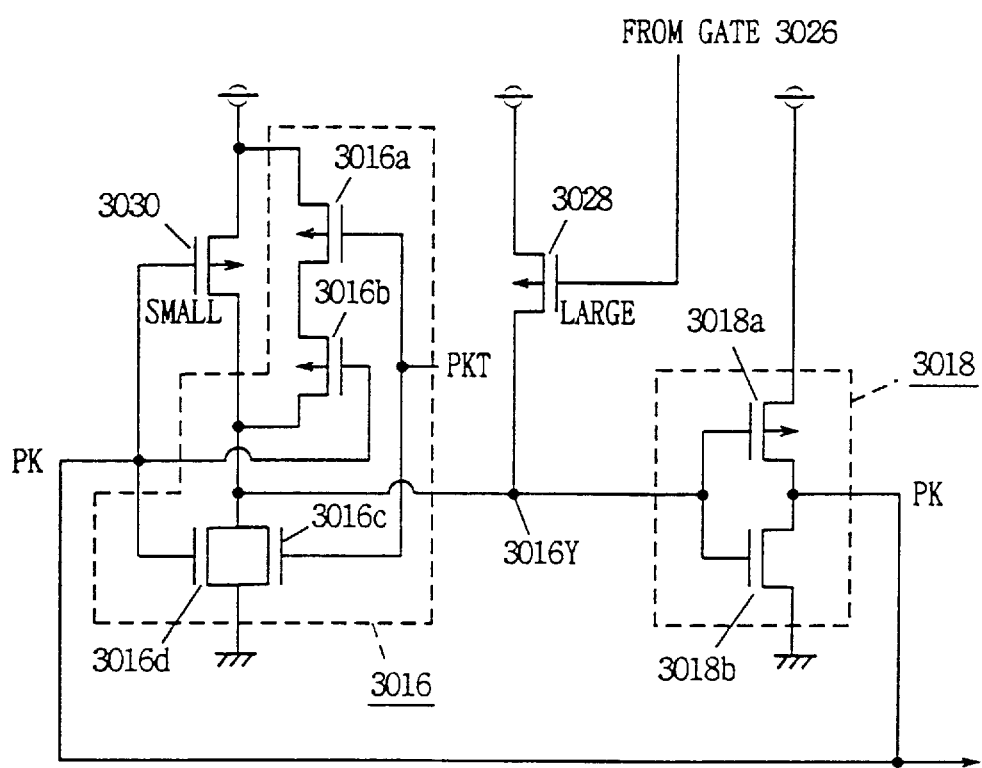
FIG. 38 is a diagram specifically showing the configuration of the NOR circuit shown in FIG. 37.

FIG. 38 is a diagram specifically showing the configuration of NOR circuit 3016, inverter circuit 3018, and transistors 3028 and 3030 shown in FIG. 37. In FIG. 38, NOR circuit 3016 includes p channel MOS transistors 3016a and 3016b connected in series between the power supply node and output node 3016Y and receiving clock signals PKE and PK, respectively at their gates, and n channel MOS transistors 3010c and 3016d provided in parallel to each other between output node 3016Y and the ground potential node and receiving clock signals PKT and PK, respectively at their gates. p channel MOS transistor 3030 has a size or gate width, or a ratio of gate width/gate length reduced and its current driving capability is kept small. Meanwhile, p channel MOS transistor 3028 receiving the output of gate (NAND circuit 3026 shown in FIG. 37) has a relatively large size, gate width or ratio of gate width/gate length and therefore the current driving capability is large in order to charge output node 3016Y.

Inverter circuit 3018 includes a p channel MOS transistor 3018a and an n channel MOS transistor 3018b connected in a complementary manner between the power supply potential node and the ground potential node. The operation of the circuit shown in FIGS. 37 and 38 will be described in conjunction with the operation waveform chart thereof, FIG. 39.

Assume that activation signal PKE is at "H" now. In response to a rising of external clock extK to "H", the output 3002Y of NAND circuit 3002 is brought to "L" and the output signal PKF of inverter circuit 3004 is brought to "H".

Meanwhile, in response to the rising of external clock signal extK, the potential of output 3010 of inverter circuit 3010 is still at "H", and the potential of output 3012Y of NAND circuit 3012 falls to "L".

Accordingly, the output signal PKT of inverter circuit 3014 rises to "H". Based on signal PKT at "H", the output 3016Y of NOR circuit 3016 is brought to "L" (transistor 3016a in FIG. 38 is turned off, and transistor 3016c is turned on). Thus, clock sampling disable signal KDIS is brought to "L". The potential of output node 3016 is pulled to "H", clock signal PK rises to "H" by the function of inverter circuit 3018.

Meanwhile, when signal KDIS applied from output node 3016Y or inverter circuit 3017 is brought to "L", the potential of output 3008Y of NAND circuit 3008 is pulled to "H", and the output 3010Y of inverter circuit 3010 is pulled to "L". Accordingly, regardless of the state of external clock signal extK the output 3012Y of NAND circuit 3012 is pulled to "H", and internal clock signal PKT is brought to "L".

After the elapse of delay time by delay circuit 3020, the output of NAND circuit 3022 is brought to "L", signal PKRST output from inverter circuit 3024 is brought to "H", and the output 3026Y of NAND circuit is brought to "L". Thus, transistor 3028 is turned on, output node 3016Y and clock sampling disable signal KDIS are both at "H", and clock signal PK is brought to "L". The output of NAND circuit 3002 is brought to "H", signal PKRST to "L", the output 3026Y of NAND circuit 3026 is brought to "H", and transistor 3028 is turned off.

When external clock signal extK is brought to "L", output 3002Y is brought to "H", in response, signal PKF is brought to "L", and then sequentially output 3006Y is brought to "H", output 3038Y to "L", and output 3010Y to "H".

Figure 39:
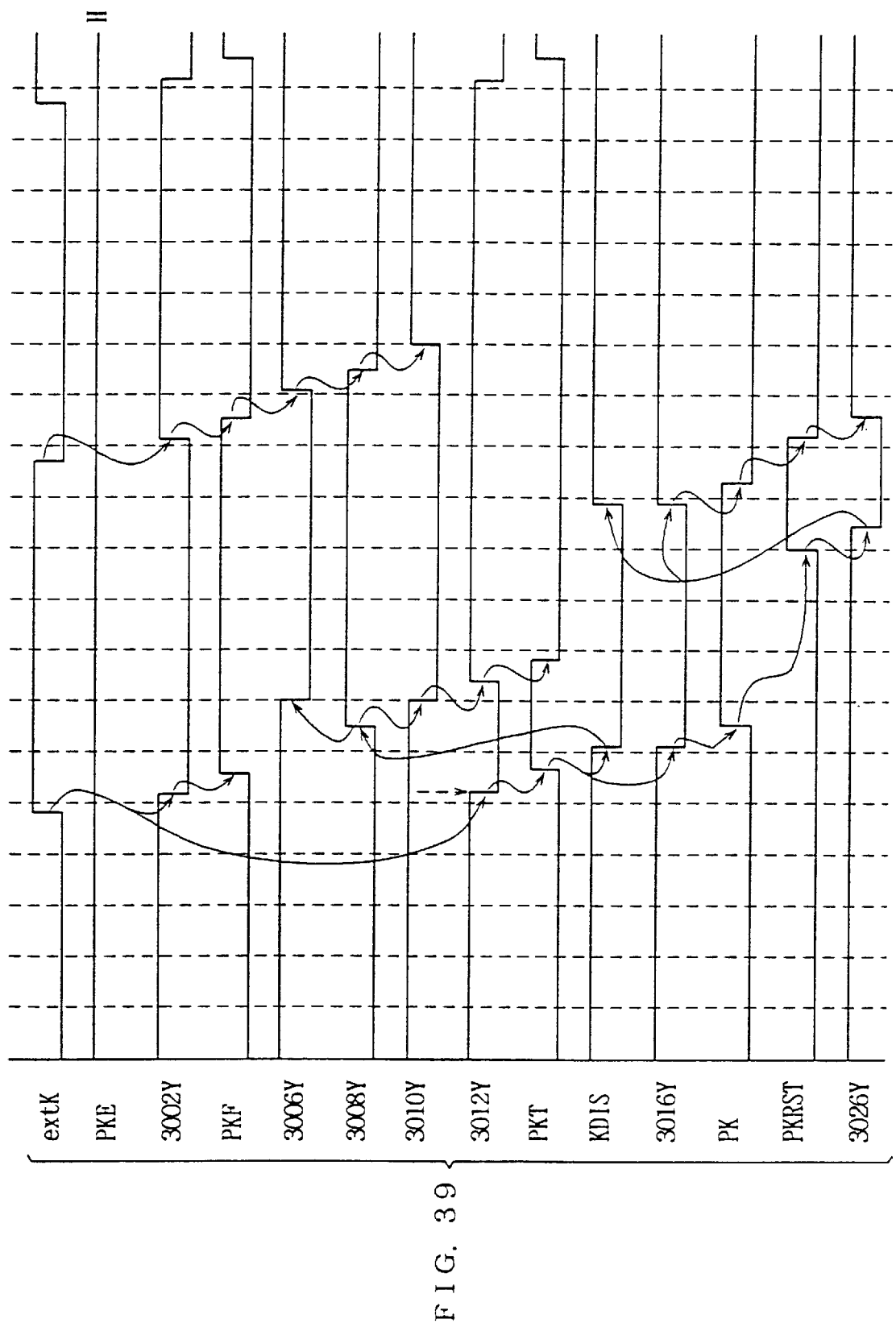
FIG. 39 is a signal waveform chart showing the operation of the circuit shown in FIG. 37.

As can be clearly seen from the operation waveform chart of FIG. 39, in response to a rising edge of external clock signal extK, internal clock signals PKT and PK are generated, which are at "H" in a time period uniquely determined by each parameter of the circuit. During the operation time period, if external clock signal extK falls to "L", the output 3012Y of NAND circuit 3012 is fixed at "H" by the function of the inverter circuit 3010, therefore the state of internal clock signal PKT does not change, and therefore the following of internal clock signal PK is not affected in any way by the falling of external clock signal extk. Thus, internal clock signals PK and PKT can be generated stably and securely.

Figure 40:
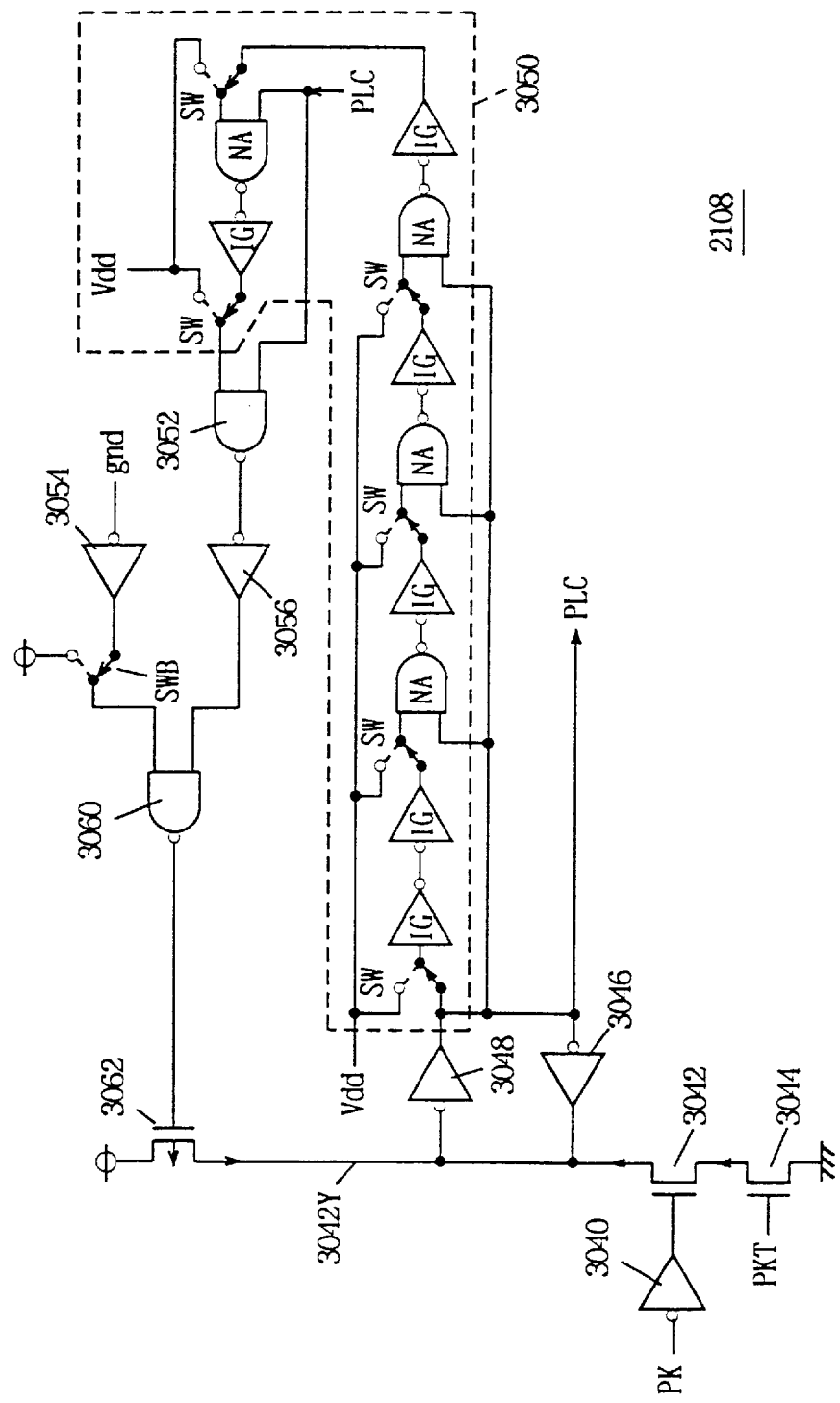
FIG. 40 is a diagram specifically showing the configuration of the clock mask latch signal generation circuit shown in FIG. 35.

FIG. 40 is a diagram specifically showing the configuration of a clock mask latch signal generation circuit shown in FIG. 35. In FIG. 40, clock mask latch signal generation circuit 2108 includes an inverter circuit 3040 inverting internal clock signal PK, n channel MOS transistors 3042 and 3044 connected in series between node 3042Y and the ground potential node and provided with the output of inverter circuit 3040 and the clock signal PKT, respectively at their gates. An inverter circuit 3048 for inverting the signal on node 3042Y and generating a clock mask latch signal PLC, an inverter circuit 3046 for inverting latch signal PLC for transfer onto node 3042Y, a delay circuit 3052 for delaying the output signal PLC of inverter circuit 3048 for a prescribed time period, an NAND circuit 3052 receiving the output signal of delay circuit 3050 and latch circuit PLC, an inverter circuit 3050 for inverting the output signal of inverter circuit 3052, an NAND circuit 3060 functioning as an inverter and inverting the output signal of inverter 3056, and a p channel MOS transistor 3062 conducting in response to the output signal of NAND circuit 3060 for charging node 3042Y to the power supply potential level.

Delay circuit 3050 is formed by inverter circuit IG and NAND circuit NA as it is case with the configuration shown in FIG. 37. One input of NAND circuit NA is provided with a switch receiving the output of inverter circuit IG in a preceding stage or power supply potential Vdd. By switching the contacts of switch circuit SW, optimum delay time is accomplished. One input of NAND circuit 3060 is provided with power supply potential Vdd through a switch circuit SWB or with ground potential GND through inverter circuit 3054. The contacts of switch circuit SWB are determined considering balance in the input capacitance of NAND circuit 3060.

Also in the configuration shown in FIG. 40, transistors 3042 and 3044 need only to discharge the input node 3042Y of inverter circuit 3048 to the ground potential level, and have small current driving capabilities. Meanwhile, transistor 3062 must charge node 3042Y to the power supply potential level and needs a relatively large current driving capability. In a circuit configuration shown in FIG. 40, when clock signal PK is at "L" and lock signal PKT is at "H", nodes 3042Y is discharged to the ground potential level, and latch signal PLC is brought to "H". After the elapse of a prescribed time period, transistor 3062 conducts, and latch signal PLC is pulled to "L". As can be clearly seen from the operation waveform chart in FIG. 39, clock signal PKT is brought to "H", and then clock signal PK is brought to "H". Accordingly, latch signal PLC can be raised to "H" at a high speed in response to internal clock signal PKT. When clock signal PK is brought to "H", transistor 3042 is turned off, and latch signal PLC is latched to "H" by inverter circuits 3048 and 3046. In a prescribed time period, the potential of node 3042Y is brought to "H" by the function of transistor 3062, and latch signal PLC falls to "L". In this case, latch signal PLC having a constant pulse width can securely be generated at a high speed with reduced power consumption and with reduced occupied area.

Figure 41:
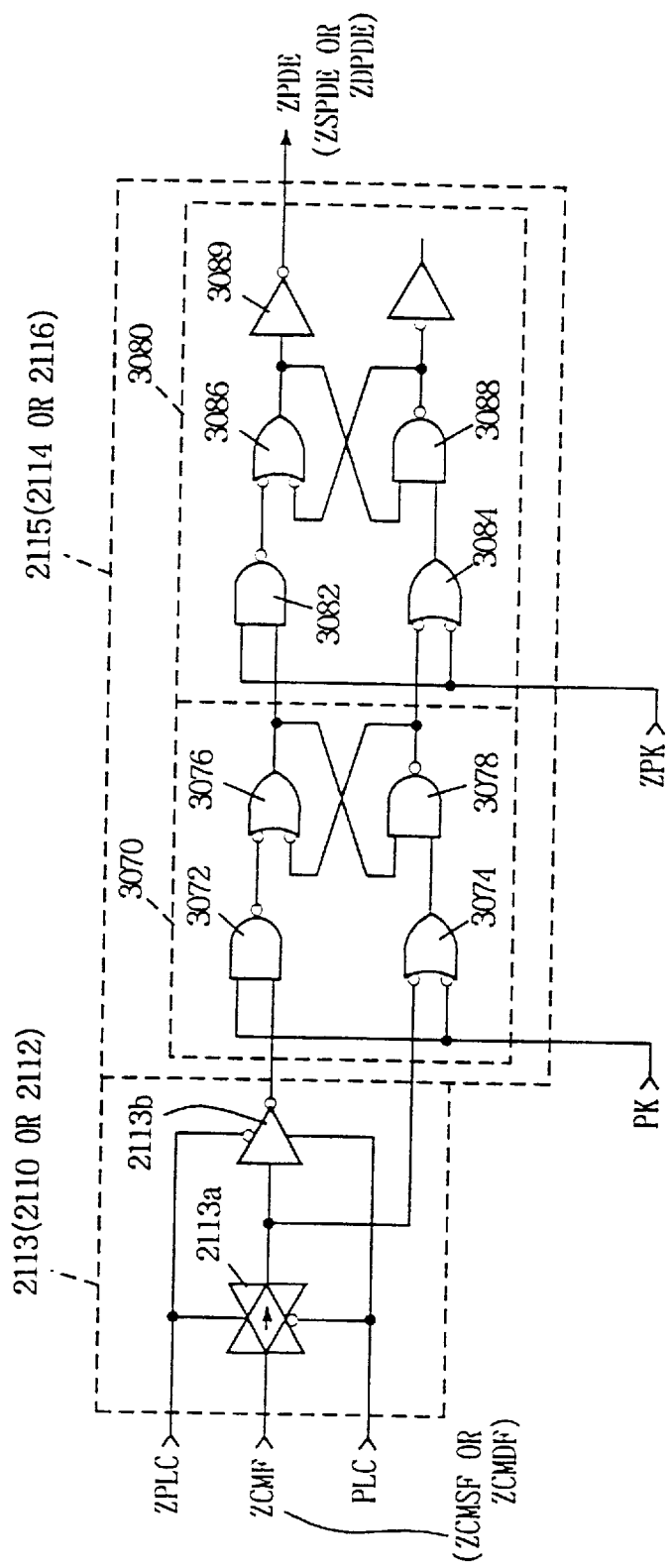
FIG. 41 is a diagram specifically showing the configuration of the power down signal generation circuit shown in FIG. 35.

FIG. 41 is a diagram showing the configuration latch circuit 2110 and 2212, and power down signal generation circuits 2114 and 2116 shown in FIG. 35. In FIG. 41, SRAM power down mode detection signal ZSPDE and DRAM power down mode detection signal ZDPDE are generated by the same circuit configuration, and therefore signals ZSPDE and ZDPDE are generally denoted as signal ZPDE. Similarly, internal clock signals ZCMSF and ZCMDF are denoted with reference character ZCMF.

In FIG. 41, latch circuit 2113 (corresponding to latch circuit 2110 or 2112) includes a bidirectional transmission gate 2113a turned on/off in response to latch signals PLC and ZPLC, and a clock inverter 2113b operating in response to latch signals PLC and ZPLC for inverting a signal transmitted from transmission gate 2113a. Transmission gate 2113a attains a non-conduction state when latch signal PLC is at "H", and a conduction state when latch signal PLC is at "L". Clock inverter 2113b attains an operative state when latch signal PLC is at "H", and a non-operative state, in other words attains an output high impedance state when latch signal PLC is at "L".

Latch circuit 2113 attains a state to latch clock mask signal ZCMF when latch signal PLC is at "H". Latch circuit 2113 attains an output high impedance state when latch signal PLC is at "L", and maintains a previously latched state.

A power down signal generation circuit 2115 (corresponding to power down signal generation circuit 2114 or 2116) include a master latch 3070 latching the output of latch circuit 2113 in response to power down mode determination clock signal PK (see FIG. 37), and a slave latch 3080 latching the output signal of master latch 3070 in response to clock signal ZPK. Master latch 3070 includes an NAND circuit 3072 receiving clock signal PK and the output signal of clock inverter 2213b included in latch circuit 2113, an NAND circuit 3074 receiving clock signal PK and the output signal of transmission gate 2113a, and NAND circuits 3076 and 3078 which have one inputs and outputs cross-coupled with each other.

NAND circuit 3078 receives the output signal of NAND circuit 3072 at the other input, and NAND circuit 3078 receives the output signal of NAND circuit at its other input. With clock signal PK at "L", the output signals of NAND circuits 3072 and 3074 are both at "H", and the states of the output signals of NAND circuit 3076 and 3078 do not change. When clock signal PK rises to "H", NAND circuits 3072 and 3074 function as an inverter, and inverts the respective applied signals. The states of the output signals of NAND circuits 3076 and 3078 change in response to signals applied from NAND circuits 3072 and 3074. More specifically, master latch 3070 accepts, latches and outputs a signal applied when clock signal PK is at "H", and maintains a potential of the latch signal when clock signal PK is at "L".

Slave latch 3080 includes NAND circuits 3082, 3084, 3086 and 3088 configured similarly to master latch 3070. NAND circuits 3082 and 3084 at the input stage receive clock signal ZPK at their one inputs. The states of the output signals of NAND circuits 3086 and 3088 which are cross-coupled to constitute a flipflop depend on the states of the output signals of NAND circuits 3082 and 3084. Power down mode detection signal ZPDE (ZSPDE or ZDPDE) is generated from NAND circuit 3086 through inverter circuit 3089. An inverter circuit is provided at the output portion of NAND circuit 3088 in order to equalize the output loads of NAND circuits 3086 and 3088, and to improve the response characteristics of flipflops 3086 and 3088.

Slave latch 3080 as is the case with master latch 3070 accepts the output signal of master latch 3070 when clock signal ZPK is at "H", and attains a signal latching state when clock signal ZPK is at "L". Now, the operation of the circuit shown in FIG. 41 will be briefly described.

If clock mask signal ZCMF is at "H", signal ZCMF is latched with latch signal PLC being at "H" in latch circuit 2113, and the output of inverter circuit 2013b is brought to "L". In response to a rising of clock signal PK, in master latch 3070, the outputs of NAND circuits 3076 and 3078 are brought to "L" and "H", respectively. In slave latch 3080, in response to a rising of clock signal ZPK, the output of NAND circuits 3086 and 3088 are brought to "L" and "H", respectively. Thus, power down mode detection signal ZPDE at "H" is generated from inverter circuit 3080. In this state, a power down mode is not specified. If clock mask signal ZCMF is at "L" and a power down mode is specified, power down mode detection signal ZPDE is at "L".

FIG. 42 is a diagram specifically showing the configuration of SRAM internal clock signal generation circuit shown in FIG. 35. The configuration of internal clock signal generation circuit 2118 shown in FIG. 42 is substantially identical to the configuration of power down determination internal clock signal generation circuit 2106 shown in FIG. 37. The circuit configuration shown in FIG. 37 differs from the circuit configuration shown in FIG. 42 in that power down detection signal ZSPDE is applied instead of activation signal PKE in SRAM internal clock signal generation circuit 2118, and that an increased number of stages of inverters are provided for generating reset signal SKRST. In addition, the elements are denoted with different reference characters. Accordingly, SRAM internal clock signal generation circuit 2118 shown in FIG. 42 will not be described in detail. The operation waveform chart for the SRAM internal clock signal generation circuit shown in FIG. 42 is set forth in FIG. 43.

Figure 43:
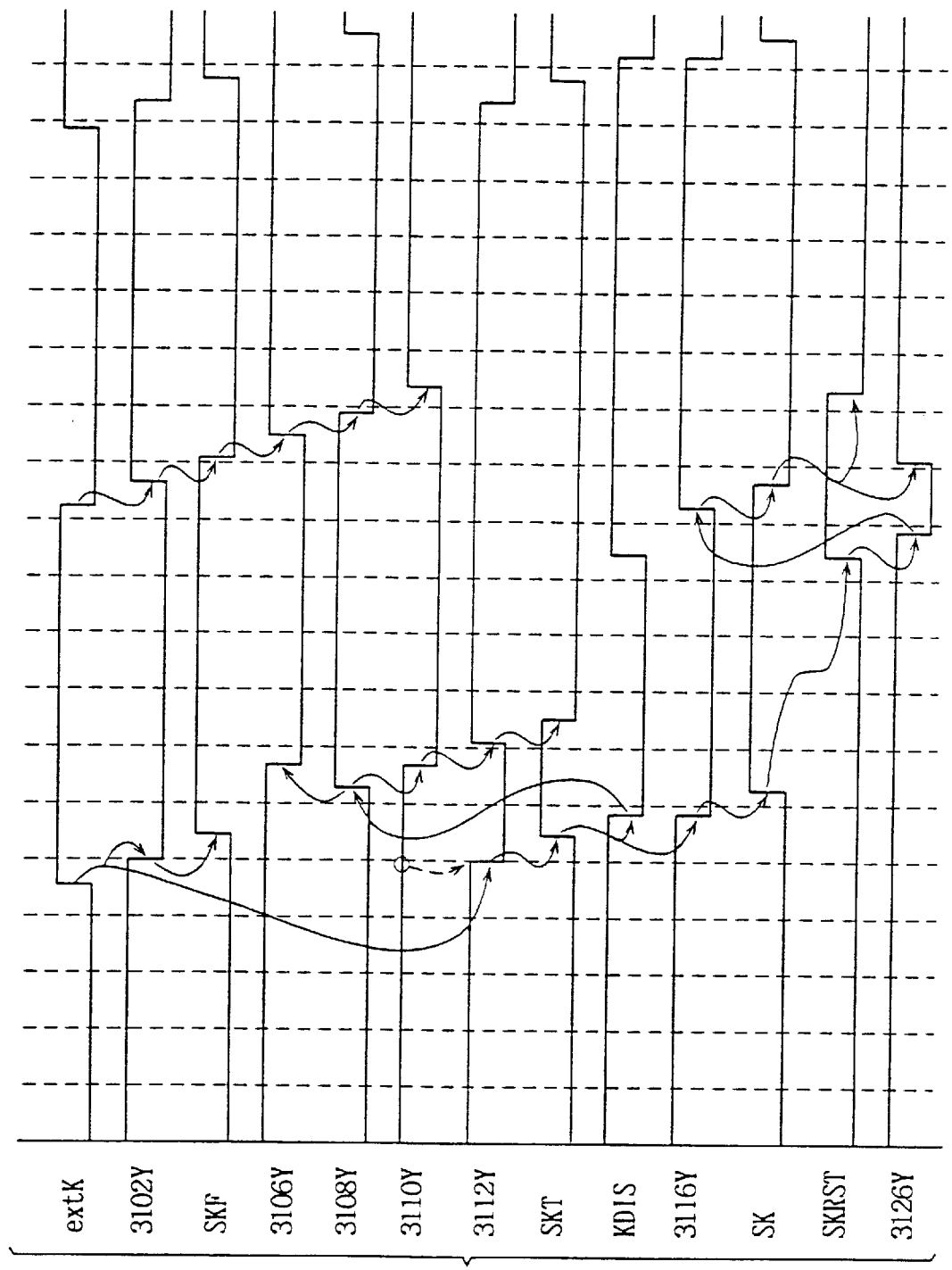
FIG. 43 is a signal waveform chart showing the operation of the internal clock signal generation circuit shown in FIG. 42.

As can be seen from the operation waveform chart in FIG. 43, internal clock signal SK is generated in response to a rising of external clock signal extK, and automatically falls to "L", by time delay given by the circuit itself. Accordingly, internal clock signal SK having a constant pulse width free from the influence of falling of external clock signal extK can be always generated. Herein, in the configuration shown in FIG. 42, clock sampling disable signal KDIS is provided from power down mode determination internal clock signal generation circuit 2106.

For the size of transistor size 3128, the gate width is sufficiently large, for example, about six times as large as that of transistor size 3130. The size of p channel MOS transistor for output charge of NOR circuit 3116 is made smaller enough than the size of a transistor for discharge inside. The ratio of gate width/gate length is small as well. The size of the discharge transistor in NOR circuit 3116 is smaller than the size of an MOS transistor forming inverter circuit 3118. Accordingly, inverter circuit 3114 generating clock signal SKT is not required of any large driving capability, and can generate internal clock signal SK at a high speed. After the elapse of a prescribed time period since generation of clock signal SK, p channel MOS transistor size 28 conducts by the function of NAND circuit. The current supply of transistor 3128 is made larger than the discharge transistor in NOR circuit 3116, and therefore node 311Y can be charged to "H" level at a high speed. When internal clock signal SK falls to "L after charging node 3111Y, the output signal of NAND circuit 3126 is pulled to "H" after the elapse of prescribed time, and transistor 3128 is turned off. At the time, the potential of node 3116Y is held by transistor 3130. The size of transistor size 3130 is small enough, and the size of the discharge transistor in NOR circuit 3116 is smaller than transistor 3130, so that current consumption at this "L" holding operation of clock signal SK is very small.

DRAM internal clock signal generation circuit 2120 is similarly configured as SRAM internal clock signal generation circuit 2118, and therefore the configuration is not described here.

Figure 44:
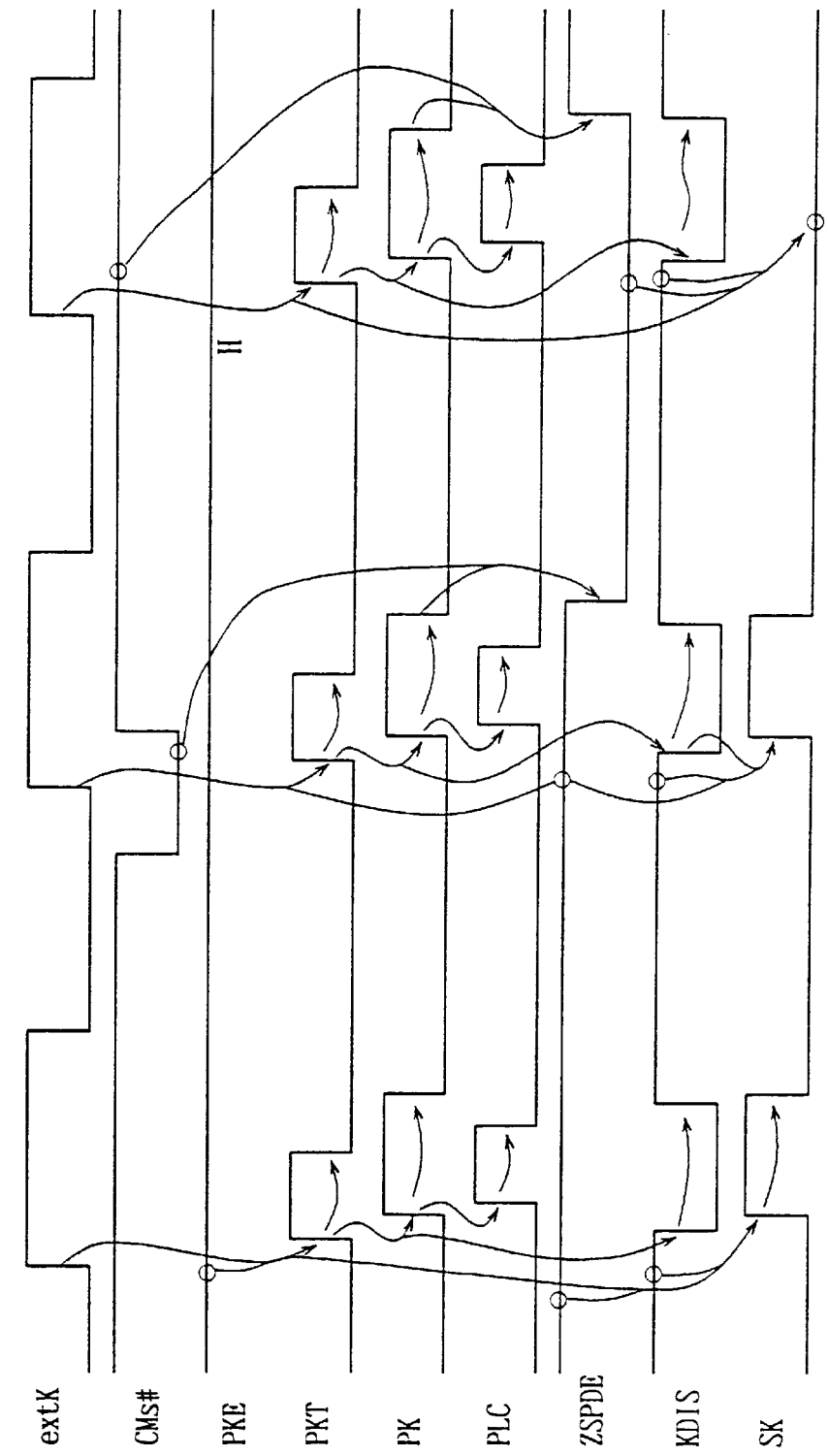
FIG. 44 is an operation waveform chart for use in schematic illustration of the overall operation of the circuit shown in FIG. 35.

FIG. 44 is an operation waveform chart showing the entire operation of the circuit shown in FIG. 35. In the foregoing, the operation with clock mask signal CMs# CMd# is at "H" is described. If clock mask signal CMs# is set to "L" at a rising edge of external clock signal extK, the following operation will be executed. In the clock cycle, activation signal PKE attains an "H" level. Clock signals PKT, PK and PLC are therefore sequentially generated. In response to a falling of clock signal PK, power down mode detection signal ZSPDE is brought to "L". However, since a sampling of external clock signal extK has been conducted in response to a rising of clock signal PKT and clock sampling signal KDIS is at "H", internal clock signal SK is generated for a prescribed time period in this clock cycle. In the next clock cycle, clock mask signal CMs# is set to "H". At the time, clock signals PKT, PK and PLC are sequentially generated. The latch state of the latch circuit changes with latch signal PLC, and power down mode detection signal ZPDE rise to the "H" in response to a falling of clock signal PK. However, on a rising edge of external clock signal extK, power down mode detection signal ZPDE is brought to "L", and therefore when clock sampling disable signal KDIS at "H", external clock signal extK is not sampled and therefore internal clock signal SK is not generated. Signal KDIS which is an external clock signal sampling disable signal and therefore with this signal KDIS at "L", sampling of external clock signal extk is disabled. The state of external clock signal extK during this period does not affect internal clock signal SK.

As described above, when clock mask signal CMs# is set to "L" and a power down mode is specified, generation of internal clock signal SK is interrupted in the next clock cycle.

The same operation is executed in DRAM internal clock signal generation circuit 2120. In this case, in response to a falling of clock mask signals CMs#, signal PKE falls to "L" after a prescribed time period. Also in this case, internal clock signals PKT, PK and PLC are sequentially generated, and based on clock mask signal CMd#, generation of internal clock signal PK is disabled in the next cycle (note that signal PKE changes later than internal clock mask signal changes: see FIG. 36). If a refresh mode is specified, signal ZRFS is brought to "L", single PKE to "L", and clock mask signals ZCMSF and ZCMDF attain an active state to be masked with "L". Thus, power down mode detection signals ZSPDE and ZDPDE are brought to "L", generation of internal clock signals SK and DK is stopped, and a refresh operation for the DRAM array with a self timer inside is executed.

[Another Configuration of Internal Clock Generation Scheme]

Figure 45A:
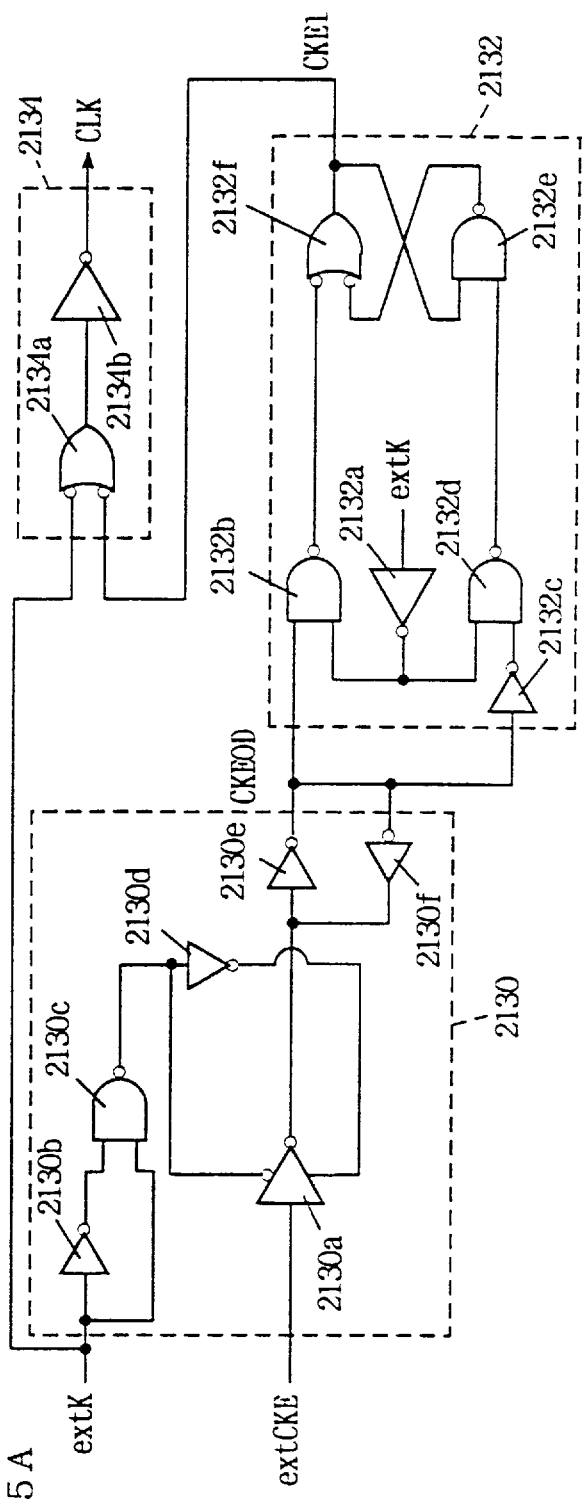
FIGS. 45A and 45B are diagrams showing another configuration of the internal clock signal generation circuit according to the present invention, wherein FIG. 45A schematically illustrates the configuration and FIG. 45B the operation waveforms.

FIG. 45A is a diagram showing another configuration of an internal clock generation scheme. In FIG. 45A, since the same configurations are used for both SRAM and DRAM portions, CLK is used to denote an internal clock signal, and external clock enable signal extCKE is used to denote a clock mask signal. External clock enable signal ext CKE at "H" generates internal clock signal CLK. Accordingly, the signal extCKE has the same logic as internal clock mask signals CMs# and CMd# described above.

Figure 45B:
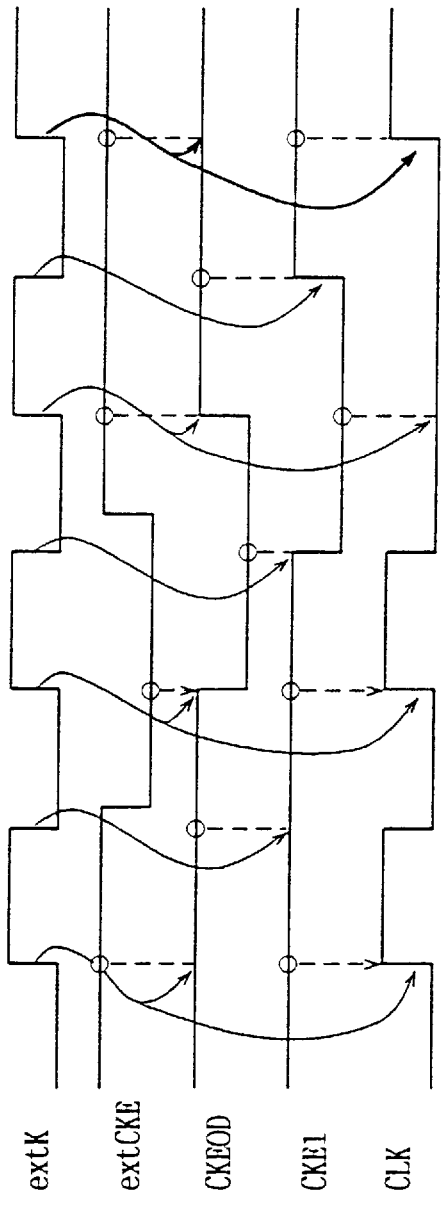

In FIG. 45B, the internal clock signal generation system includes a first internal clock generation circuit 2130 for generating a first internal clock signal CKOD based on external clock signal extk and external clock signal enable signal extCKE, a second internal clock signal generation circuit 2132 for generating a second internal clock enable signal CKE1 based on first internal clock enable signal CKE0D and external clock signal extK from first internal clock generation circuit 2130, and a third internal clock generation circuit 2134 for generating internal clock signal CLK based on external clock signal extK and second internal clock enable signal CKE.

First internal clock generation circuit 2130 includes an inverter circuit 2130b receiving external clock signal extK, an AND circuit 2130c receiving external clock signal extK and the output of inverter circuit 2130b, an inverter circuit 2130d receiving the output of NAND circuit 2130c, a clocked inverter circuit 2130a activated in response to the output signal of AND circuit 2130c and the output signal of inverter circuit 2130d for inverting internal clock enable signal extCKE, and inverter circuits 2130e and 2130f for latching the output of inverter circuit 2130a.

Inverter circuit 2130b delays external clock signal extK for a prescribed time period and inverts its logic. NAND circuit 2130c therefore generates a one shot pulse signal which is brought to "L" only during a prescribed time period since a rising of external clock signal extK. Clock inverter 2130a attains an operative state when the output signal of NAND circuit 2130c is at "L", and inverts external clock enable signal extCKE. With the output of NAND circuit 2130c at "H", clocked inverter 2130a attains an output high impedance state. Inverter circuit 2130e inverts the output of clock inverter 2130a and generates first internal clock enable signal CKE0D. Inverter circuit 2130f inverts first internal clock enable signal CKE0D for transfer to the input of inverter circuit 2130e. First internal clock generation circuit 2130 therefore samples and latches external clock enable signal extCKE in response to a rising of external clock signal extK, and generates first internal clock enable signal CKE0D.

Second internal clock generation circuit 2132 includes an inverter circuit 2132a receiving external clock signal extK, an inverter circuit 2132c receiving first internal clock enable signal CKE0D, an NAND circuit 2132b receiving the output signals of inverter circuits 2132a and 2130e, an NAND circuit 2132d receiving the output signals of inverter circuits 2132a and 2132c, and a flipflop set/reset based on the output signals of NAND circuits 2132b and 2132d. The flipflop includes cross-coupled NAND circuits 2132f and 2132e. NAND circuit 2132f is provided with the output signal of NAND circuit 2132b, and NAND circuit 2132e is provided with the output signal of NAND circuit 2132d. NAND circuit 2132f generates second internal clock enable signal CKE. Second internal clock generation circuit 2132 has a function of delaying first internal clock enable signal CKE0D for half the clock cycle of clock signal extK for transfer.

Third internal clock generation circuit 2134 includes an NAND circuit 2134a receiving second internal clock enable signal CKE1 and external clock signal extK, and an inverter circuit 2134b for inverting the output signal of NAND circuit 2134a and generating internal clock signal CLK. The operation of the internal clock generation system shown in FIG. 45 will be now described in conjunction with its operation waveform chart, FIG. 45B.

In response to a rising of external clock signal extK, a one shot pulse signal is generated from NAND circuit 2130c, and clock inverter 2130a attains an operative state. If external clock enable signal extCKE is at "H", first internal clock enable signal CKE0D generated from inverter circuit 2130e is at "H". With first internal clock enable signal CKE0D at "H", NAND circuits 2132b and 2132d operate as an inverter circuit, the output signal of NAND circuit 2132b falls to "L" in response to a rising of external clock signal extK, which in response causes the output signal of NAND circuit 2132f, in other words second internal clock enable signal CKE1 to be at "H", and internal clock signal CLK rising to "H" in response to a rising of external clock signal extK is generated from third internal clock generation circuit 2134.

If external clock enable signal extCKE is at "L" at the time of the rising of external clock signal extK, first internal clock enable signal CKE0D falls to "L" in response to a rising of external clock signal extK. First internal clock enable signal CKE0D at "H" is latched by first internal clock generation circuit 2130 until the next rising of external clock signal extK. This is because clock inverter 2130a samples external clock enable signal extPKE, and then attains an output high impedance state.

If internal clock enable signal CKE0D falls to "L", the output signal of inverter circuit 2132a falls to "L" in response to a rising of external clock signal extK, the output signals of NAND circuits 2132b and 2132d are at "H", and second internal clock enable signal CKE1 does not change its state and remains at "H". Internal clock signal CLK is therefore generated from third internal clock generation circuit 2134 in response to a rising of external clock signal extK.

In response to a falling of external clock signal extK to "L", the output signal of inverter circuit 2132a rises to "H", and NAND circuits 2132b and 2132d function as an inverter circuit. The output signal of NAND circuit 2132d falls to "L" and the output signal of NAND circuit 2132e rises to "H". Since the output signal of NAND circuit 2132b is at "H", second internal clock enable signal CKE1 generated from NAND circuit 2132f falls to "L". This state is maintained until external clock signal extK falls next. Therefore, even if external clock signal extK rises to "H" next, internal clock signal CLK maintains "L", because second internal clock enable signal CKE1 is at "L".

By the configuration shown in FIG. 45A, generation of internal clock CLK can be interrupted in the next clock cycle based on external clock enable signal extCKE without any complex logic. In addition, since each internal clock enable signal is generated in synchronization with external clock signal extK, internal clock signal CLK can be generated based on external clock signal extK at a high speed.

[Example of Specific Configuration]

FIG. 46 is a diagram showing in detail the specific configuration of internal clock generation circuit in FIG. 45A. In FIG. 46, first internal clock generation circuit 2130 includes two stages of inverter circuits 3202 and 3204 receiving external clock signal extK, an inversion delay circuit 3204 for delaying the output signal of inverter circuit 3204 for a prescribed time period and inverting the output signal, an NAND circuit 3210 receiving the outputs of inverter circuits 3204 and inversion delay circuit 3208, and an inverter circuit 3212 receiving the output signal of NAND circuit 3210. Inversion delay circuit 3208 is formed of a plurality (9 in the illustrated example) of cascade-connected inverter circuits. Inverter circuits 3212 generates a clock enable signal CLKE.

First internal clock signal generation circuit 2130 further includes a register 3214 activated in response to internal clock enable signal CLKE for latching external clock enable signal extCKE, inverter circuits 3215 and 3216 for inverting, respectively complementary output signal ZCKE0 and CKE0 from register 3214, and a flipflop set/reset by the outputs of inverter circuits 3215 and 3216. The flipflop includes an NAND circuit 3217 receiving the output of inverter circuit 3215, and an NAND circuit 3218 receiving the output signal of inverter circuit 3216. First internal clock enable signal CKE0D is generated from NAND circuit 3218, and a complementary internal clock enable signal ZCKE0D is generated from NAND circuit 3217. The configuration of register 3214 is shown in FIG. 47.

Figure 47:
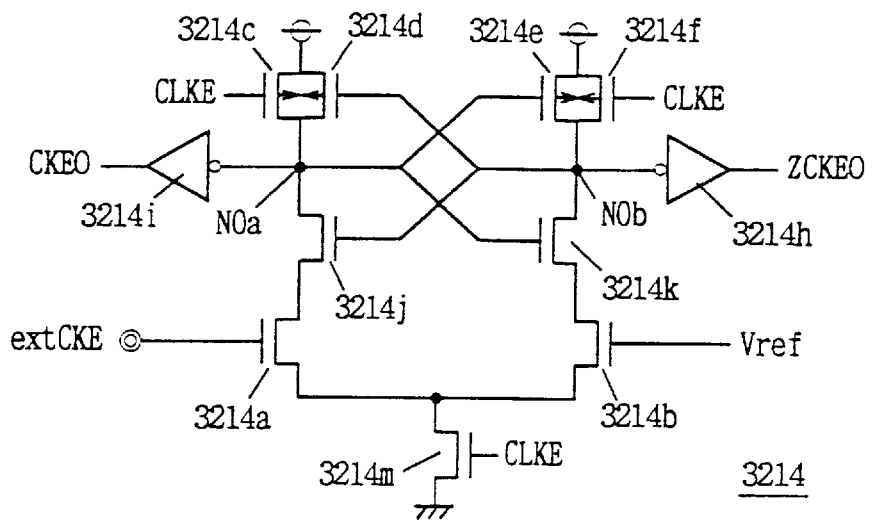
FIG. 47 is a diagram specifically showing the configuration of the register circuit shown in FIG. 46.

Referring to FIG. 47, register 3241 includes an n channel MOS transistor 3214a receiving clock enable signal extCKE at its gate an n channel MOS transistor 3214b receiving reference voltage Vref at its gate an n channel MOS transistor 3214 provided between transistors 3214a and 3214b and a ground potential node and receiving clock enable signal CLKE at its gate, an n channel MOS transistor 3214j provided an output node NOa and MOS transistor 3214a and receiving the potential of a signal on the other output node NOb at its gate, an n channel MOS transistor 3214k provided between output node NOb and MOS transistor 3214b and receiving a potential on output node NOa at its gate. A p channel MOS transistor 3214c provided between the power supply potential node and output node NOa and receiving clock enable signal CLKE at its gate, a p channel MOS transistor 3214d provided between the power supply potential node and the output node NOa and receiving the potential of a signal on output node NOb at its gate, a p channel MOS transistor 3214e provided between the power supply potential node an output node NOb and receiving the potential of a signal on output node NOa at its gate, a p channel MOS transistor 3214f provided between the power supply potential node and output node NOb and receiving clock enable signal CLKE at its gate, and inverter circuits 3214i and 3214h for inverting signals on output nodes NOa and NOb.

Register 3214 shown in FIG. 47 attains an operative state with clock enable signal CLKE at "H", compares external clock enable signal extCKE and reference voltage Vref, and generates signals to output node NOa and NOb based on the result of comparison. If clock enable signal CLK is at "L", MOS transistors 3214m is turned off, no such comparison operation is conducted, output nodes NOa and NOb are both charge to the power supply potential level through MOS transistors 3214c and 3214f, and signals CKE0 and ZKE0 output from inverter circuit 3214a and 3214h are brought to "L". The configuration is usually called "dynamic latch".

Referring to FIG. 46, second internal clock generation circuit 2132 includes an NAND circuit 3220 receiving output signals ZCLKE and ZCKE0D from first internal clock generation circuit 2130, an NAND circuit 3221 receiving output signals ZCLKE and CLKE0D, and a flipflop set/reset based on the output signals of NAND circuits 3220 and 3221. The flipflop includes NAND circuits 3222 and 3223 which have output and one input cross-coupled with each other. NAND circuit 3222 receives the output signal of NAND circuit 3220 at the other input, and NAND circuit 3223 receives the output signal of NAND circuit 3221 at the other input. Second internal clock generation circuit 2132 further includes an inverter circuit 3224 receiving the output signal of NAND circuit 3222, and an inverter circuit 3225 receiving the output of NAND circuit 3223. Second internal clock enable signal CKE1 is generated from inverter circuit 3224.

Figure 48:
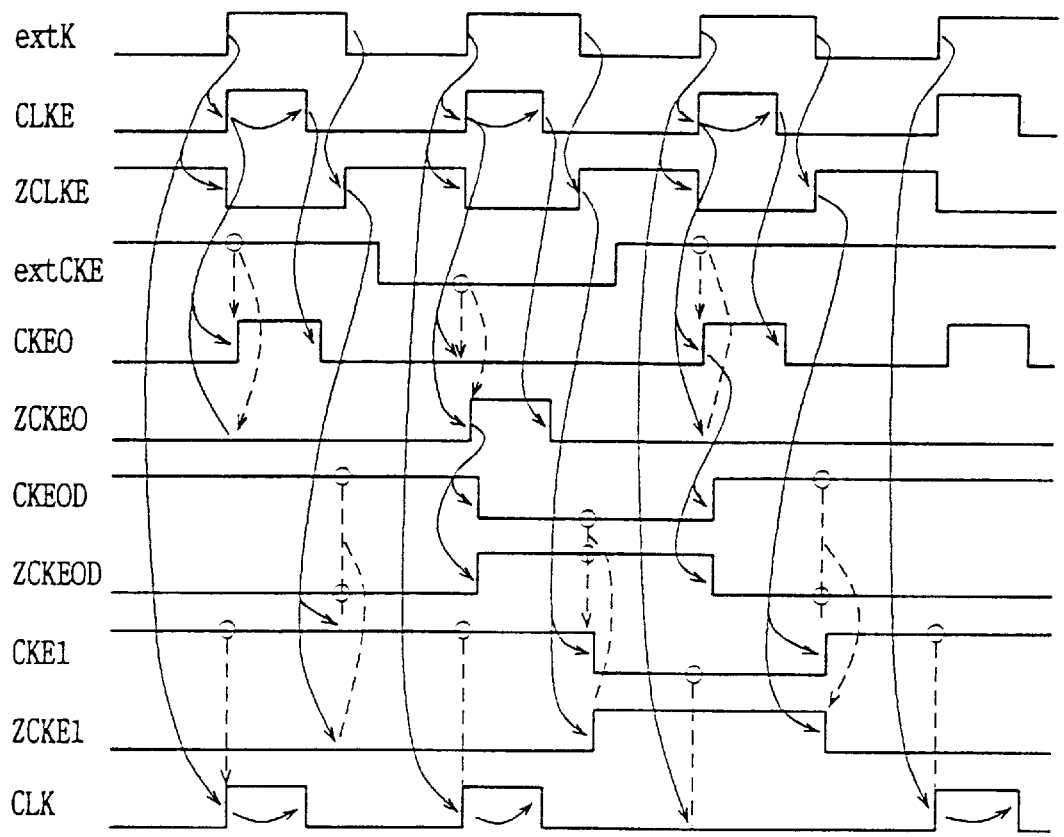
FIG. 48 is a signal waveform chart showing the operation of the internal clock signal generation circuit shown in FIG. 46.

Third internal clock generation circuit 2134 includes an NAND circuit 3220 receiving external signal extk and second internal clock enable signal CKE1, an inverter circuit 3232 for inverting the output signal of NAND circuit 3230, an inversion/delay circuit 3224 for inverting and delaying for a prescribed time period the output signal of inverter circuit 3232, an NAND circuit 3236 receiving the output signal of inverter circuit 3232 and the output signal of inversion/delay circuit 3234, an inverter circuit 3238 receiving the output signal of NAND circuit 3236, and an inverter circuit 3239 receiving the output signal of inverter circuit 3238. Internal clock signals CLK and ZCLK are generated from inverter circuits 3238 and 3238, respectively. Inversion/delay circuit 3234 is formed of a plurality of (9 in the illustrated configuration) cascaded-connected inverters. The operation of the internal clock signal generation circuitry shown in FIGS. 46 and 47 will be described in conjunction with the operation of the waveform chart thereof, FIG. 48.

In response to a rising of external clock signal extK to "H", clock enable signal CLKE from inverter circuit 3232 rises to "H" for a prescribed time period. The period during which internal clock enable signal CLKE is at "H" is determined by a delay time given by inversion/delay circuit 3208. Clock enable signal ZCLKE from inverter circuit 3206 falls to "L" in response to the rising of external clock signal extK. Thus, in second internal clock generation circuit 2132, the output signals of NAND circuits 3220 and 3221 are fixed at "H", and the states of clock signals CK1 and ZCK1 do not change during this period.

When internal clock enable signal CLKE is at "H", register 3214 attains an operative state, accepts and latches external clock enable signal extCKE. If external clock enable signal ext CKE is at "H", output node NOa is discharged through transistors 3214a and 3214b, and the potential thereat drops. In response, MOS transistors 3214k is turned off, and the output node Nob is charged to the power supply potential level through MOS transistor 3214e. Thus, clock enable signals CKE0 and ZCKE0 output from register 3214 are brought to "H" and "L". Though not shown, the circuit to be provided with clock enable signals CKE0 and ZCKE0 is a circuit for decoding a command to specify self refresh included in the DRAM control circuit. This is for determining whether or not a refresh operation is specified in an advanced timing. Clock enable signal CKE0 at "H" and clock enable signal ZCKE0 at "L" are latched by the flipflop form of NAND circuits 3217 and 3218 through inverter circuits 3216 and 3215. Accordingly, in this state, internal clock enable signal CKE0D is at "H", and complementary internal clock enable signal ZCKE0D is at "L".

In a prescribed time period, clock enable signal CLKE is brought to "L", and the output signals ZCKE0 and CKE0 of register 3214 are brought to "L". In response, the output signals of inverter circuits 3215 and 3216 are both brought to "H", and the states of the output signals ZCKE0D of NAND circuits 3217 and 3218 do not change.

In response to a falling of external clock signal extK, internal clock signal ZCLKE rises from "L" to "H" and NAND circuits 3220 and 3221 function as an inverter. Thus, the output signal of NAND circuit 3220 is brought to "H", and the output of NAND circuit 3221 is brought to "L", second internal clock enable signal CKE1 to "H", and first internal clock enable signal ZCKE1 to "L".

If first internal clock enable signal CKE1 is at "H", in third internal clock generation circuit 2134, internal clock signals CLK and ZCLK are generated from NAND circuit 3230 and inverter circuit 3232 based on external clock signal extK. The time period during which the output signal of NAND circuit 3236 is at "H" is determined by a time delay given by inversion/delay circuit 3234. Internal clock signal CLK generated from inverter circuit 3238 therefore rises to "H" in response to a rising of external clock signal extK, and remains at "H" during the time period determined by the time delay given by inversion/delay circuit 3234, and then falls to "L". Also in this configuration, internal clock signal CLK always have a constant pulse width irrespective of the timing of falling of external clock signal extK.

If external clock enable signal extCKE is set to "L" on a rising of external clock signal extk, clock enable signals CKE0 and ZCKE0 generated from register circuit 3214 are brought to "L" and "H", respectively, and in response, first internal clock enable signals ZCKE0D and CKE0D are brought to "H" and "L", respectively. The states of the output signals of NAND circuits 3217 and 3218 are maintained until the next rising of external clock signal extK. When external clock signal extk rises again, at which time second internal clock enable signal CKE1 is still at "H", internal clock signal CLK having a prescribed time width is generated from third internal clock generation circuit 2134.

When external clock signal extk falls to "L", in second internal clock generation circuit 2132, the states of the output signals of NAND circuits 3222 and 3223 are inverted, and second internal clock enable signal CKE1 is brought to "L". This state is maintained until the next falling of external clock signal extK. Accordingly, even if external clock signal extCLK rises to "H" in the next cycle, internal clock signal CLX is not generated from third internal clock generation circuit 2134.

[Another Configuration of Internal Clock Generation Circuit]

FIG. 49 is a diagram showing another configuration of an internal clock signal generation system. In FIG. 49, the internal clock signal generation system includes a buffer circuit 2138 for buffering external clock signal extK, a buffer circuit 2137 for buffering external clock enable signal extCKE, a first internal clock generation circuit 2131 for generating clock enable signal CLKE based on a clock signal KO from buffer circuit 2138 and power down detection signal ZPDE from second internal clock generation circuit 2133, a second internal clock generation circuit 2133 for generating internal clock enable signals CKE0, CKE1 and power down mode detection signal ZPDE based on clock enable signal CLKE and a refresh mode detection signal RFS and clock enable signal CKE received from buffer circuit 2137, and a third internal clock generation circuit 2134 for generating internal clock signal CLK based on internal clock enable signal CKE1 from second internal clock generation circuit and clock signal KO. Clock enable signal CKE0 from second internal clock generation circuit is applied to a refresh command decoder 2138 included in the control circuit. Refresh command decoder 2139 is activated in response to clock enable signal CKE0, and generates refresh mode detection signal RFS indicating whether or not a refresh mode is specified based on a determination of the states of the external control signals.

In the configuration shown in FIG. 49, power down mode detection signal ZPDE is used. Internal clock signal CLK, is however generated at "H" for a prescribed time period based on external clock signal extK (KO). Therefore also in the configuration shown in FIG. 49, internal clock signal CLK having a prescribed pulse width can be securely generated irrespective of the influence of change in the following of external clock signal extK. The configuration of each circuit will now be specifically described.

Buffer circuits 2137 and 2138 shown in FIG. 49 are each formed of two stage cascade-connected inverter circuits. The configuration therefore not be specifically described.

Figure 50:
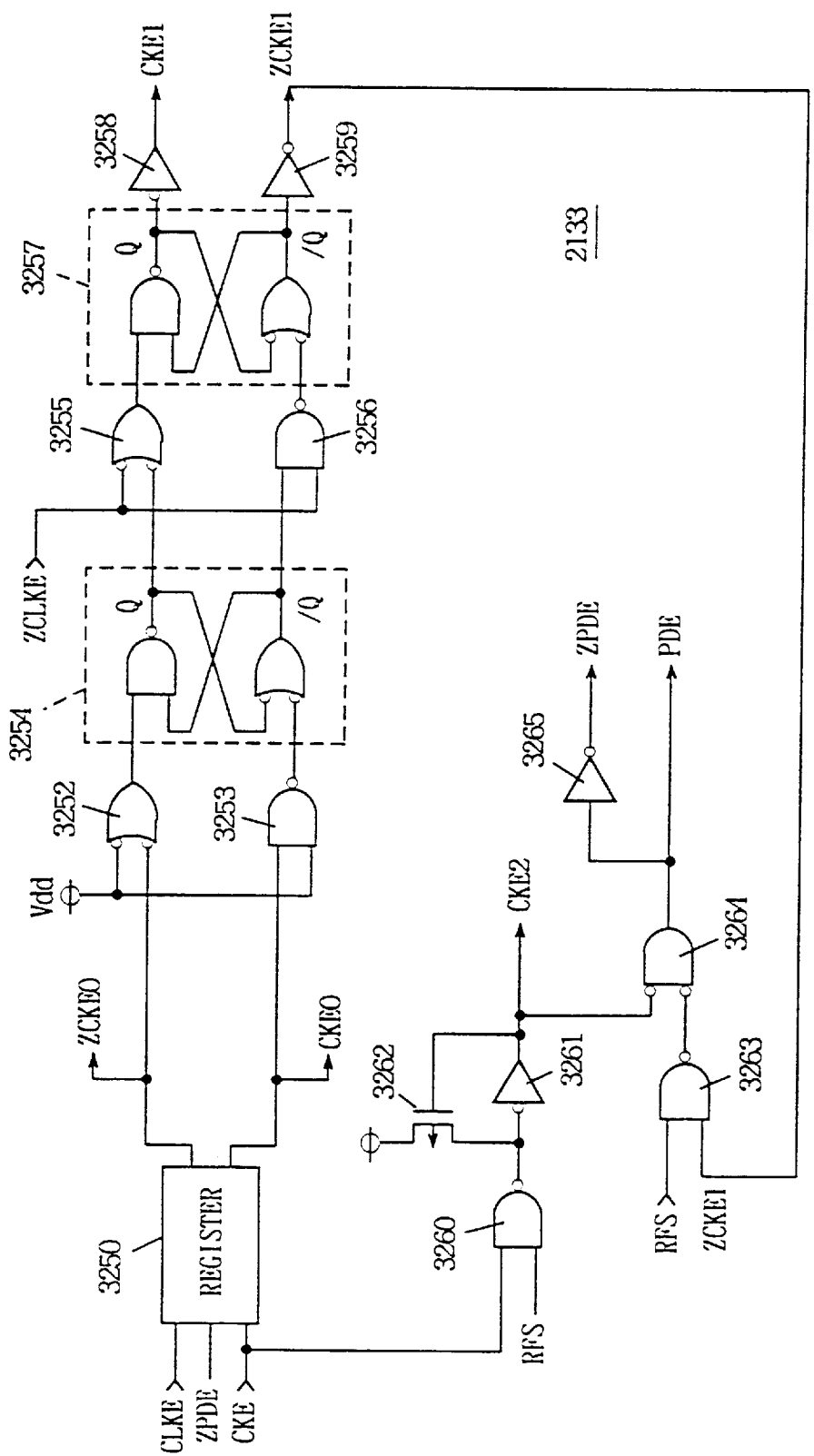
FIG. 50 is a diagram specifically showing the configuration of the second internal clock signal generation circuit shown in FIG. 49.

FIG. 50 is a diagram showing in detail the configuration of second internal clock generation circuit 2133 shown in FIG. 49. Referring to FIG. 50, second internal clock generation circuit 2133 includes a register 3250 receiving clock enable signal CLKE from first internal clock generation circuit 2132 and power down detection signal ZPDE which generates an internal clock enable signal CKE for generating first internal clock enable signal ZCKE0. Register 3250 attains an operative state, accept and outputs clock enable signal CKE (CKE0, ZCKE0) only when signal CLKE and ZPDE are both at "H". If at least one of signals CLK and ZPDE is at "L", output signals CKE0 and ZCKE0 from register 3250 are both at "L". Specific configuration of register 3250 is shown in FIG. 51.

Figure 51:
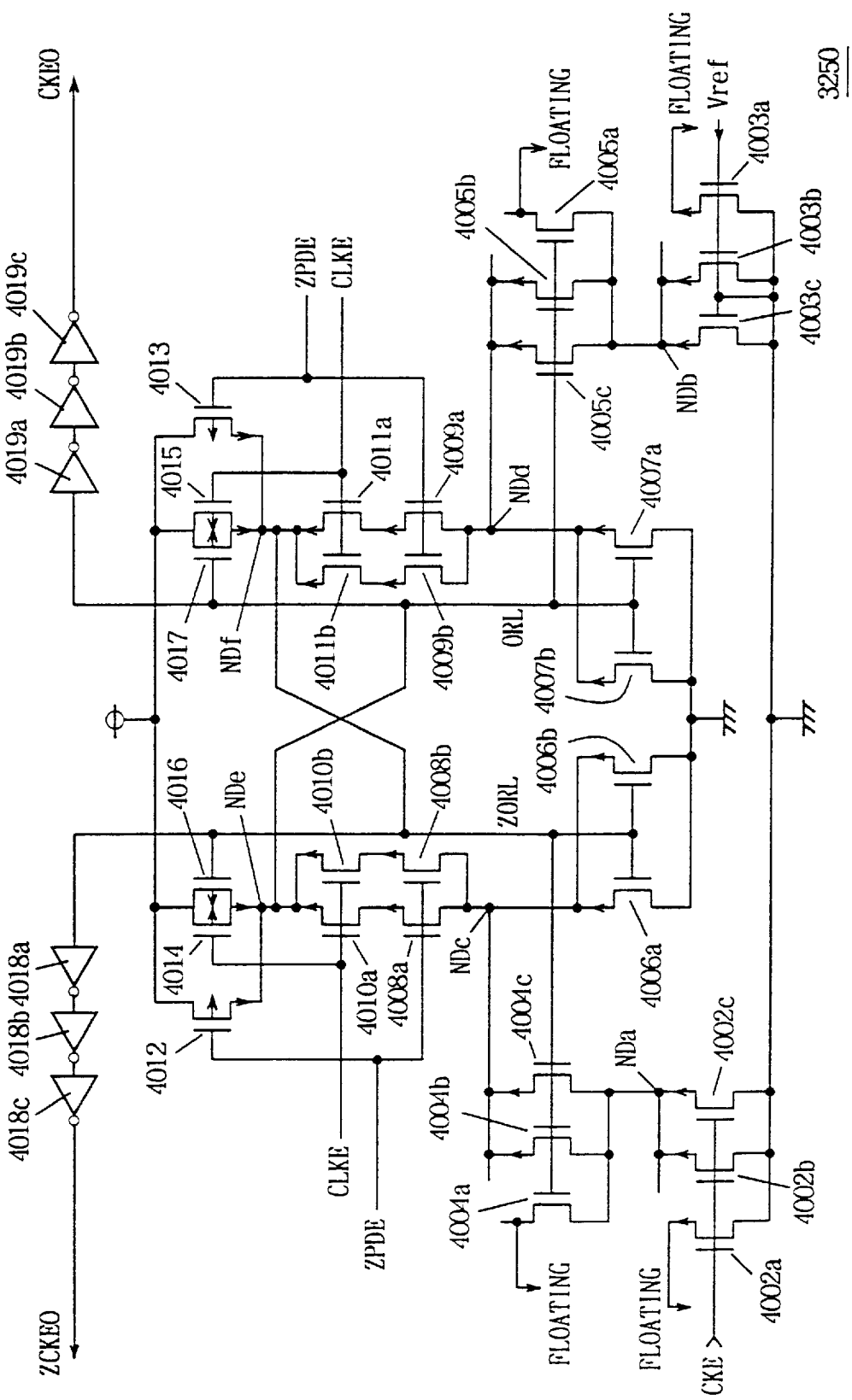
FIG. 51 is a diagram specifically showing the configuration of the register circuit shown in FIG. 50.

Referring to FIG. 51, register 3250 includes three stage, cascade-connected inverter circuits 4019a, 4019b, and 4019c for inverting signals on an output node ORL, three stage, cascade-connected inverter circuits 4018a, 4018b, 4018c receiving the potential of a signal on an output node ZORL, p channel MOS transistors 4012, 4014, and 4016 provided in parallel between the power supply potential node and a node NDe, n channel MOS transistors 4010a, 4010b, 4008a, and 4008b connected between node NDe and node NDc, and n channel MOS transistors 4011a, 4011b, 4009a, and 4009b provided between a node NDf and a node NDb.

MOS transistors 4012 conducts in response to signal ZPDE at "L", and transfers voltages from the power supply potential node to node NDe. p channel MOS transistor 4014 conducts in response to signal CLKE at "L", and supplies current from the power supply potential node to node NDe. p channel MOS transistor 4016 conducts for output node ZORL at "L", and transfers voltage/current from the power supply potential node to node NDe.

MOS transistors 4010a and 4010b receive signal CLKE at their gates, and MOS transistors 4008a and 4008b receive signal ZPDE at their gates. Transistors 4018a and 4008a are connected in series, and transistors 4010b and 4008b are connected in series. Two transistors receiving signal CLKE are provided in parallel and two transistors receiving signal ZPDE at their gates are provided in parallel, because node NDe is sometimes charged through both transistors 4012 and 4014 and therefore discharge current at node NDe should accommodate the charge current.

p channel MOS transistor 4013 receives power down mode detection signal ZPDE at its gate, MOS transistor 4015 receives clock enable signal CLKE at its gate, and MOS transistor 4017 has its gate connected to output node ORL. MOS transistors 4011a and 4011b received clock enable signal CLKE at their gates. MOS transistors 4009a and 4009b receive signal ZPDE at their gates.

Register 3250 further includes n channel MOS transistors 4004a, 4004b, and 4004c receiving the potential of a signal on output node ZORL at their gates. n channel MOS transistors 4005a, 4005b, and 4005c receiving a signal on output node NORL at their gates, n channel MOS transistors 4006a and 4006b conducting with the signal potential on output node ZORL at "H" and discharging node NDc to the ground potential level, and n channel MOS transistors 4007a and 4007b conducting with the signal potential on output node ORL at "H" and discharging node NDd to the ground potential level. MOS transistors 4004b and 4004c are provided in parallel between node NDc and node NDa. MOS transistors 4005 and 4005c are provided in parallel between node NDb and node NDd. MOS transistors 4004a and 4005a have their one conductive terminals connected to nodes NDa and NDb, respectively, and the other conducting terminals brought into a floating state. This is for the purpose of adjusting a gate capacitance associated with output node ORL and ZORL and reducing the size of each transistor.

Register 3250 further includes n channel MOS transistors 4002a, 4002b, and 4002c receiving clock enable signal CKE at their gates, and n channel MOS transistors 4003a, 4003b, and 4003c receiving reference voltages Vref at their gates. MOS transistors 4002b and 4002c are provided in parallel between node NDa and the ground potential node, and MOS transistors 4003b and 4003c are provided in parallel between node NDb and the ground potential node. MOS transistors 4002a and 4002a have their one conduction terminals connected to receive the ground potential, and the other conduction terminals brought into a floating state. The load capacities of signals CKE, CLKE and ZPDE are made equal for an optimum value, so that the discharge speed at node ND with signal CKE at "H" is equal to the discharge speed at node NDc when output node ZORL is at "H" and signal CKE is at "L".

In the register shown in FIG. 51, when signals CLKE and ZPDE are both at "L", nodes NDe and NDf are charged by transistors 4012 and 4014, respectively to the power supply potential level, and output nodes ORL and ZORL are brought to "H". In this state, signals CKE0 and ZKE0 are both at "L". At that time, nodes NDc and NDd are discharged to the ground potential by transistors 4006a, 4006b and 4007a and 4007b. If signal CKE is at a potential higher than reference potential Vref, node NDc is discharged by transistors 4004b, 4004c, 4002b, and 4002c.

When signals CLKE and ZPDE are both at "H", MOS transistors 4012, 4014, 4013 and 4015 are turned off, and transistors 4010a, 4010b, 4008a, 4008b, 4009a, 4009b, 4011a, and 4011b are turned on. If signal CKE is at "H" at the time, transistors 4002c and 4002b conduct to discharge node NDc to the ground potential level. This lowers the potential of node NDe, and output node ZORL continues to be charged through MOS transistor 4017 to maintain the power supply potential level, while output node ORL is discharged to the ground potential level, and signal CKE0 is brought to "H" and signal ZCKE0 to "L". With signal CKE at "L", signal CKE0 is at "L", and signal ZCKE0 is at "H".

As described above, register 3250 generates signals CKE0 and ZCKE0 based on signal CKE only when signals CLKE and ZPDE are both at "H".

Referring back to FIG. 50, second internal clock generation circuit 2113 includes NAND circuits 3252 and 3253 receiving power supply potential Vdd at one input node and signals ZCKE0 and CKE0 at the other input, a flipflop 3254 set/reset based on the output signals of NAND circuits 3252 and 3253, NAND circuits 3255 and 3256 activated by signal ZCLKE and inverting the output signals Q and /Q of flipflop 3254 for passage, a flipflop 3257 which is set and reset based on the output signals of NAND circuits 3255 and 3256 and inverter circuits 3258 and 3259 for inverting the outputs Q and /Q of flipflop 3257, respectively. Clock enable signal CKE1 is generated from inverter circuit 3258, and complementary clock enable signal ZCKE1 is generated from inverter circuit 3259.

Signal ZCLKE applied to NAND circuits 3255 and 3256 is the inverse of signal CLKE applied to register 3250. Accordingly, when signal CLKE is at "H", and the output of resister 3250 is established, then the output signal of flipflop 3254 is transferred to flipflop 3257 in response to a falling of signal CLKE.

Figure 52:
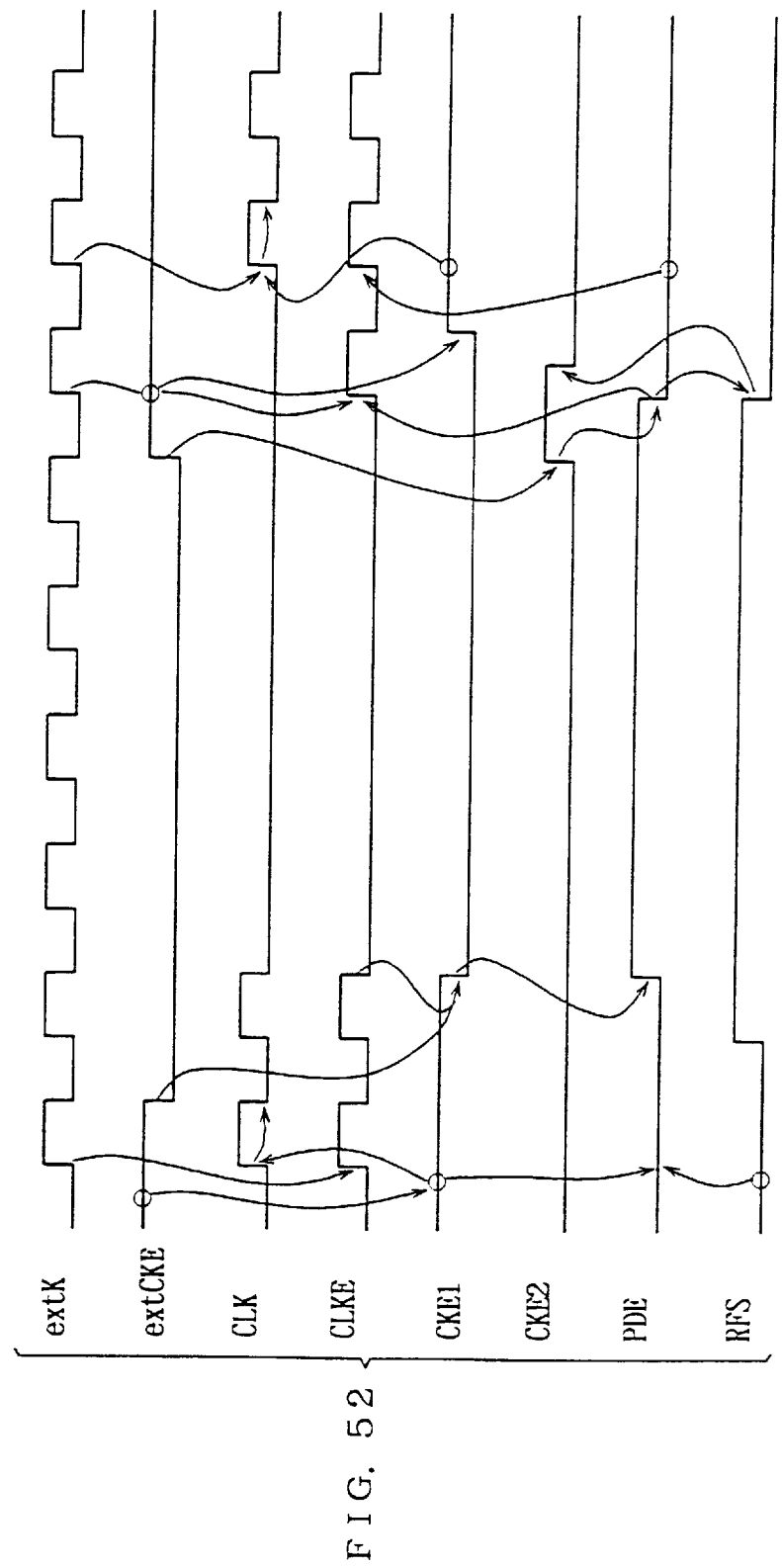
FIG. 52 is a signal waveform chart showing the operation of the second internal clock signal generation circuit shown in FIG. 50.

Second internal clock generation circuit 2133 further includes a NAND circuit 3260 receiving clock enable signal CKE and refresh mode detection signal RFS, and inverter circuit 326 which receiving the output signal of NAND circuit 3260, a p channel MOS transistor 3262 for holding the signal at "L" of inverter circuit 3261, an NAND circuit receiving signal ZCKE1 and refresh mode detection signal RFS, an NOR circuit 3264 receiving the output signal CKE2 of inverter circuit 3261 and the output signal of NAND circuit 3263, and an inverter circuit 3265 inverting the output signal of NOR circuit 3264. Signal PDE is generated from NOR circuit 3264, and signal ZPDE is generated from inverter circuit 3265. Now, the operation of second internal clock signal generation circuit shown in FIG. 50 will be described in conjunction with the operation waveform chart thereof, FIG. 52.

Internal clock signals CKE1 and ZCKE1 maintain a state of the previous clock cycle at a rising of clock enable signal CLKE (change in the states of signals CKE 1 and ZCKE1 is implemented by signal ZCLKE). When refresh mode detection signal RFS is at "L", and clock enable signal CKE1 in the previous cycle is at "H", the output signal of inverter circuit 3261 is at "L" irrespective of the state of signal CKE, the output signal of NAND circuit 3263 is at "H", and therefore signal PDE is brought to "L", and signal ZPDE to "H".

Now, assume that signal CKE is set to "L". Signal ZPDE is still at "H" at the time (signal ZCKE1 is set to "L" in the previous cycle). Register 3250 therefore executes a latch operation, and brings signals CK0 to "L". This state is latched by flipflop 3 in response to a rising of signal ZCLKE. In response, signals ZCKE1 attains an "H" level. If refresh mode detection signal RFS is at "L", however, signal PDE maintains "L". If refresh mode detection signal RFS is at "H", signal CKE1 falls to "L" in response to a falling of signal CKE. Responsively, signal PDE rises to "H", and maintains "H" during the period in which signal CKE is at "L".

If signal CKE is raised to "H" with self refresh detection signal RFS at "H", a signal CKE2 rises to "H", then signal PDE rises to "H" through NOR circuit 3264. The rising of signal PDE is executed asynchronously with external clock signal K. At the next rising edge of clock signal K, a precharge mode is specified, and refresh mode detection signal RFS falls to "L" (since signal PDE is at "L", signals CKE0 and ZCKE0 are generated in synchronization with internal clock signal K). When signal RFS falls to "L", signal CKE2 falls to "L", and signal PDE output from NAND circuit 3264 is maintained at "L" based on refresh mode detection signal RFS.

If external clock signal K rises to "H", signal CLKE is generated, and in response signal CKE1 rises to "H". Hereinafter, during the period in which signal CKE1 is at "H", internal clock signal CLK is generated based on external clock signal K.

Figures 53A, 53B:
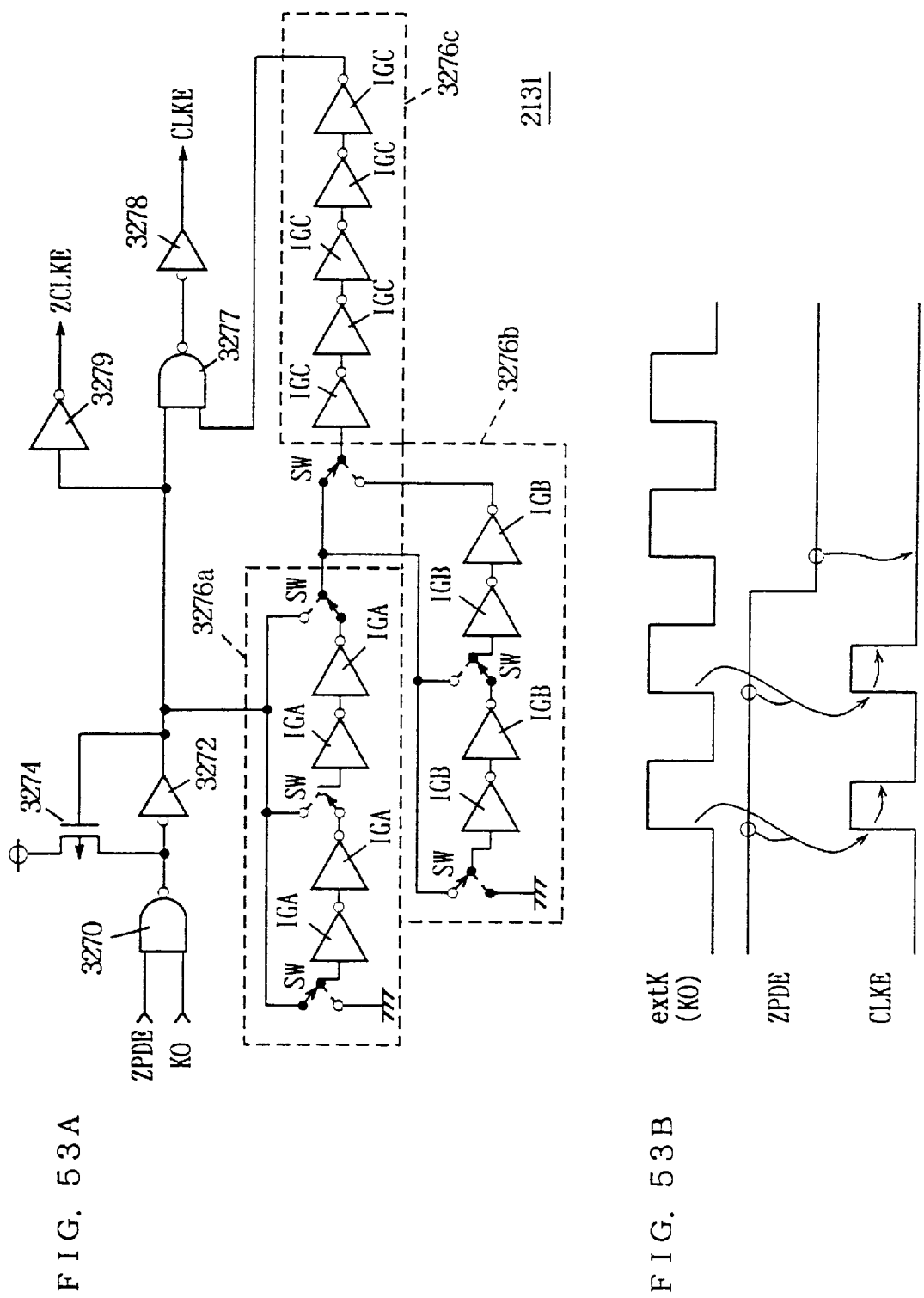
FIGS. 53A and 53B show the specific configuration of the first internal clock signal generation circuit shown in FIG. 49 and signal waveforms showing its schematic operation, respectively.

FIG. 53A is a diagram specifically showing the configuration of first internal clock generation circuit shown in FIG. 49. Referring to FIG. 53A, first internal clock generation circuit 2131 includes an NAND circuit 3270 receiving signal ZPDE and clock signal K0 (or extK), an inverter circuit 3272 for inverting the output of NAND circuit 3270, delay circuits 3276a, 3276b, and 3276c delaying the output of inverter circuit 3272, an NAND circuit 3277 receiving the output signal of inverter circuit 3272 and the output signal of delay circuit 3276c, and an inverter circuit 3278 receiving the output signal of NAND circuit 3277. Clock enable signal CLKE is generated from inverter circuit 3278, and complementary clock enable signal ZCLKE is generated from inverter circuit 3279. p channel MOS transistor 3274 receiving the output signal of inverter circuit 3272 at its gate charges the input of inverter circuit 3272 to the power supply potential level when the output signal of inverter circuit 3272 is at "L", and stably maintains the "L" signal from inverter circuit 3272.

Delay circuit 3276a includes an even number of inverter circuits IGA having relatively large delay time, which in turn set to an appropriate value by switching of switch circuits SW. Delay circuit 3276b includes an even number of inverter circuits IGB, the delay time of which is set to an appropriate value by switching of the contacts of switch circuits SW. Delay circuit 3262b has a relatively small time delay, and use for fine adjustment of delay time. Delay circuit 3276c includes an odd number of stages of inverter circuits ICG, delays signals applied from delay circuits 3276a and 3276b for a prescribed time period and inverts a logic received signal for output. The operation of first internal clock signal generation circuit shown in FIG. 53A will be described in conjunction with the operation waveform chart, FIG. 53B.

With signal ZPDE at "H", NAND circuit 3270 functions as an inverter. Accordingly, a clock signal is generated from inverter 3272 based on external clock signal extK (KO). NAND circuit 3277 outputs a signal at "L" in response to signals at "H" applied on both inputs. Delay circuits 3276a and 3276b have their delay times set with two inverter circuits as a unit. Delay circuits 3276a and 3276b delays the output signal of inverter circuits 3272 for a prescribed time period. Delay circuit 3276c inverts and delays for a prescribed time period the signal of delay circuit 3276a or 3276b. Therefore, a signal generated from NAND circuit 3277 in response to a rising of clock signal KO is at "L" during delay time applied by delay circuits 3276a to 3276c. More specifically, signal CLKE from inverter circuit 3278 generated in response to a rising of external clock signal extK (K0) is at "H" for a prescribed time period. The pulse width of signal CLKE is determined by delay circuits 3276a and 3276c, and sampling and latching of external clock enable signal ext CKE in register 3250 shown in FIG. 50 is executed using signal CLKE.

With signal ZPDE at "L", the output of NAND circuit 3270 is at "H", and the output signal of inverter circuit 3272 is at "L". The output signal of NAND circuit 3277 is therefore at "H", and signal CLKE from inverter circuit 3278 is at "L". In this state, clock enable signal CKE is not sampled.

Figures 54A, 54B:
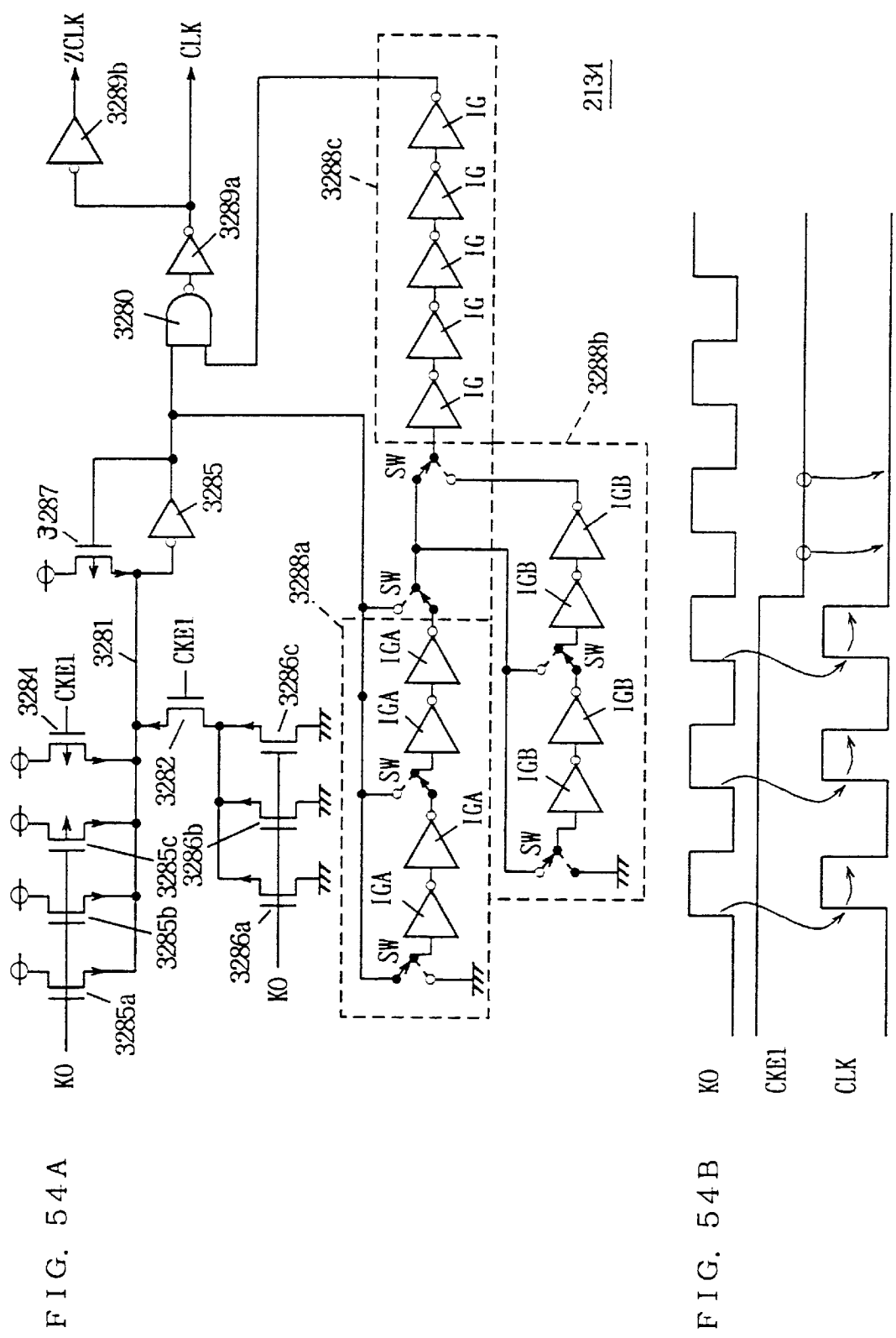
FIGS. 54A and 54B are representation specifically showing the configuration of a third internal clock signal generation circuit shown in FIG. 49 and operation waveforms, respectively.

FIG. 54A is a diagram specifically showing the configuration of the third internal clock generation circuit shown in FIG. 49. Referring to FIG. 54A, third internal clock generation circuit 2134 includes an n channel MOS transistor 3282 having its one conduction terminal connected to an output node 3281 and receiving clock enable signal CKE1 at its gate, a p channel MOS transistor 3284 provided between the power supply potential node and output node 3281 and receiving clock enable signal CKE1 at its gate, p channel MOS transistors 3285a, 3285b, and 3285c provided in parallel between output node 3281 and the power supply potential node and receiving clock signal K0 at their gates, n channel MOS transistors 3286a, 3286b, and 3286c provided in parallel between MOS transistor 3282 and the ground potential node and receiving clock signal KO at their gates, an inverter circuit 3285 receiving the signal on node 3281, delay circuit 3281a, 3281b and 3281c for delaying the output signal of inverter circuit 3285 for a prescribed time period, an NAND circuit 3280 receiving the outputs of inverter circuit 3285 and delay circuit 3288c, an inverter circuit 3289a receiving the output signal of NAND circuit 3280, and an inverter circuit 3289b receiving the output signal of inverter circuit 3289a.

Clock signal CLK is generated from inverter circuit 3289a and complementary internal clock signal ZCLK is generated from inverter circuit 3289b. The three transistors receiving clock signal K0 are provided in parallel in order to drive inverter circuits 3285 having a relatively large driving capability at a high speed. Signal CKE1 needs only be at "H" or "L" on a rising of clock signal K, and responsibility thereto at a high speed is not required. Accordingly, only one transistor for receiving CKE1 is provided. The current supply capability of n channel MOS transistor 3282 receiving signal CKE1 at its gate is sufficiently larger than MOS transistors 3286a, 3286b and 3286c. Delay circuit 3288a is formed with inverter circuits IGA each having a relatively small driving capability, and its delay time is relatively large. The delay time is adjusted to an appropriate value by switching of the contacts of switch circuits SW therein. Delay circuit 3288b is formed of inverter circuits IGB having relatively large driving capability, and its delay time can be set more finely. Delay circuit 3288c formed of an odd number of stages of inverter circuits IG, delays a delay signal from delay circuit 3288a or 3288b for a prescribed time period and inverts the logic of a received signal for output. The operation of the circuit shown in FIG. 54A will be described in conjunction with the operation waveform chart thereof FIG. 54B.

With signal CKE1 at "H", transistor 3284 attains an off state and transistor 3282 attains an on state. In this state, the inverse of clock signal K0 appears on output node 3281, and the output of inverter circuit 3285 is a potential corresponding to clock signal K0. Therefore, a signal at "L" having a time width corresponding to the delay time given by delay circuit 3288a to 3288c is output from inverter circuit 3289a, and internal clock signal CLK having a constant time width and rising to "H" at a high speed in response to clock signal K0 is generated from inverter circuit 3289a.

With signal CKE1 at "L", transistor 3282 attains an off state, and transistor 3284 attains an on state. Accordingly, in this state, output node 3281 is at "H" regardless of the state of clock signal K0, and in response internal clock signal CLK is fixed at "L".

[Another Configuration of Internal Clock Generation Circuit]

FIG. 55 is a clock diagram schematically showing another configuration of an internal clock generation circuitry having a clock mask function. In FIG. 55, the internal clock generation circuitry includes a DRAM power down mode determination blocks 2150 for determining whether or not a DRAM power down mode is specified based on internal clock mask signal CMd# and external clock signal extK, a DRAM internal clock generation circuit 2160 for generating DRAM internal clock signals DK and DKT based on power down mode detection signal ZPDE from DRAM power down mode determination block 2150 and external clock signal extK, an SRAM power down mode determination block 2170 for determining whether or not an SRAM power down mode is specified based on external clock mask signal CMs# and external clock signal extK, and an SRAM internal clock generation circuit 2184 for generating SRAM internal clock signals SK and SKT based on power down mode detection signal ZSPDE from SRAM power down mode determination block 2170 and external clock signal extK.

DRAM power down mode determination block 2150 includes a DRAM clock mask signal generation circuit 2152 for generating internal clock mask signal SRFPD and ZSRFPD based on external clock mask signal CMd# refresh mode detection signal RFS and power down mode detection signal DPDE, a first timing signal generation circuit 2154 for generating first timing signals CLK2 and CLK2F based on external clock signal extK and internal clock mask signal SRFPD a second timing signal generation circuit 2156 for generating internal clock enable signals CKE0 and ZCKE0 based on clock mask signal ZSRFPD timing signals CLK2 and CLK2F and external clock mask signal CMd#, and a DRAM power down signal generation circuit 2158 for generating DRAM power down mode detection signals DPDE and ZDPDE based on internal clock enable signals CKE0 and ZCKE0 internal timing signals CLK2 and CLK2F and SRAM power down mode detection signal ZSPDE.

DRAM clock mask signal generation circuit 2152 generates internal clock mask signals SRFPD and ZSRFPD based on external clock mask signal CMd# when power down mode detection signal DPDE and refresh mode detection signal RFS are inactive. First timing signal generation circuit 2154 generates timing signals CLK2 and CLK2F having prescribed time widths based on external clock signal extk if clock mask signal SRFPD does not indicate a clock mask. Second timing signal generation circuit 2156 latches and holds signals CMd# and ZSRFPD based on timing signal CLK2 and generates internal clock enable signals CKE0 and ZCKE0. DRAM power down signal generation circuit 2158 latches clock enable signals CKE0 and ZCKE0 based on clock signal ZCLK2 and generates power down mode detection signals ZDPDE and DPDE.

SRAM power down mode determination blocks 2170 includes an SRAM clock mask signal generation circuit 2172 for generating internal clock mask signals CMSF and ZCMSF based on turning signal CLK2 refresh mode detection signal ZRFS and external clock mask signal CMs#, and an SRAM power down signal generation circuit 2174 for latching SRAM internal clock mask signals CMSF and ZCMSF based on timing signal CLK2 and generating SRAM power down mode detection signals ZSPDE and SPDE.

Refresh mode detection signals RFS and ZRFS are generated from a not shown refresh command decoder included in the control circuit, and refresh mode detection signal RFS is generated based on refresh mode detection signal ZRFS. Although their timings and logics are different, it is assumed here that signals RFS and ZRFSF are generated (activated) in timing substantially equal and complementary in logic to each other.

In the configuration shown in FIG. 55, the power down mode detection signal in the previous cycle is produced based on timing signals CLK2 and CLK2F produced from external clock signal extK, and an internal clock signal DK or SK is generated by taking the logic of the power down mode detection signal ZDPDF or ZSPDE and the external clock signal extK, and therefore accurate masking to the internal clock signal DK or SK is secured. Since timing signal CLK2 has a constant pulse width free from the influence of the pulse width of external clock signal extK, the power down mode detection signal can be generated in an accurate timing.

Figure 56:
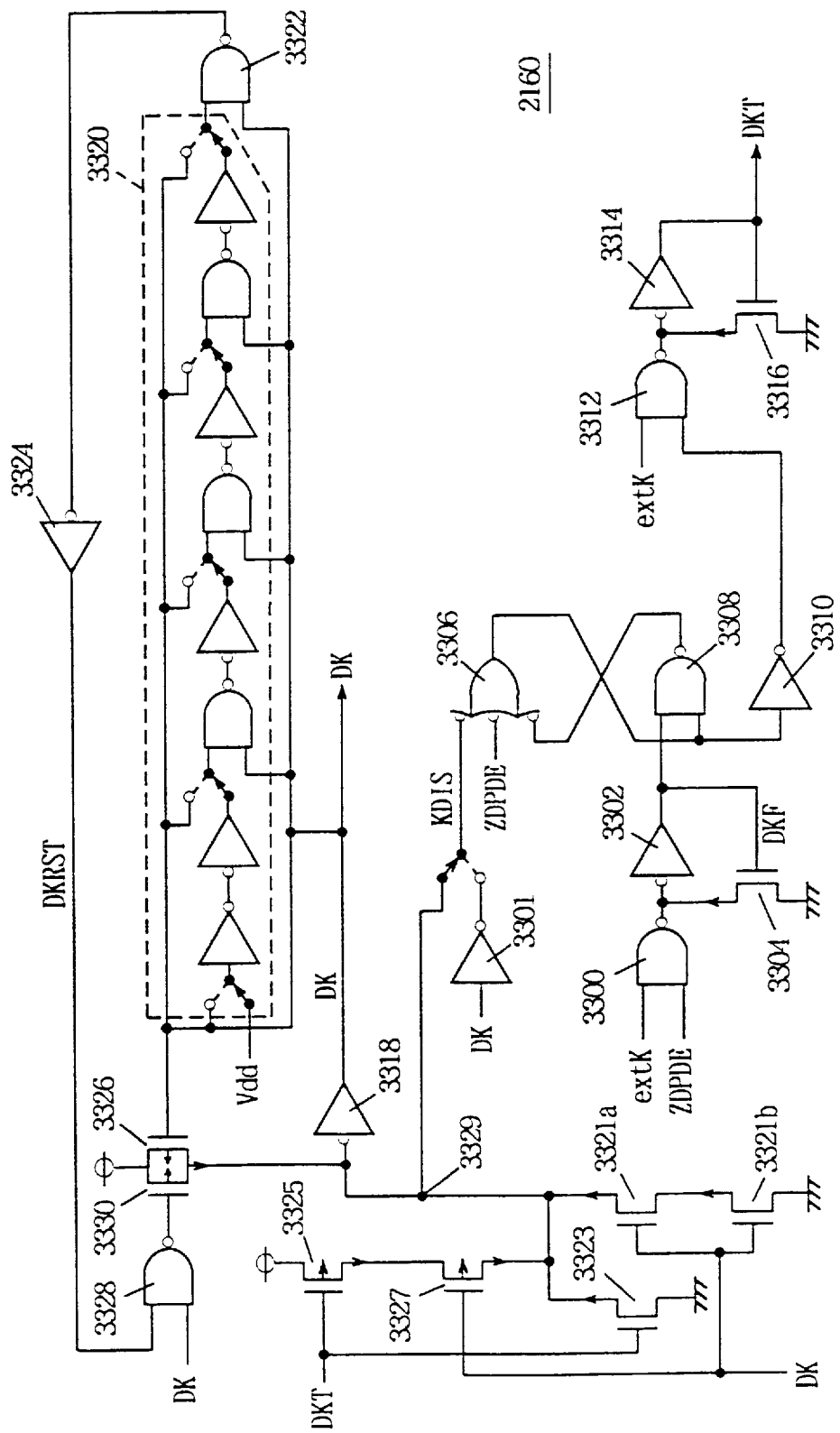
FIG. 56 is a diagram specifically showing the configuration of the clock signal generation circuit in the DRAM shown in FIG. 55.

FIG. 56 is a diagram specifically showing the configuration of DRAM internal clock generation circuit 2160 shown in FIG. 55. In FIG. 56, DRAM internal clock generation circuit 2150 includes an NAND circuit 3300 receiving external clock signal extK and power down mode detection signal ZDPDE, an inverter circuit 3320 receiving the output of NAND circuit 3300, an n channel MOS transistor 3304 provided between the input node of inverter circuit 3302 and a ground potential node and receiving the output of inverter circuit 3302 at its gate, and NAND circuits 3306 and 3008 forming a flipflop. MOS transistor 3304 conducts when the output signal DKF of inverter circuit 3302 is at "H", to discharge the input node of inverter circuit 3302 to the ground potential level. NAND circuit 3306 receives clock sampling disable signal KDIS, power down mode detection signal ZDPDE, and the output signal of NAND circuit 3308. NAND circuit 3308 receives the output signal of inverter circuit 3302 and the output signal of NAND circuit 3006. When the output signal of NAND circuit 3006 is at "H", generation of an internal clock signal is disabled.

DRAM internal clock generation circuit 2160 further includes an inverter circuit 3310 receiving the output signal of NAND circuit 3306, an NAND circuit 3312 receiving external clock signal extK and the output signal of inverter circuit 3310, an inverter circuit 3314 for generating clock signal DKT in response to an output signal received from NAND circuit 3312, and an n channel MOS transistor 3316 provided between the ground potential node and the input node of inverter circuit 3314 and receiving at its gate the output signal DKT of inverter circuit 3314. MOS transistor 3316 conducts when clock signal DKT is at "H", to discharge the input node of inverter circuit 3314 to the ground potential level. MOS transistor 3316 has a function of raising clock signal DKT at a high speed and stably maintaining the "H" level of the signal DKT. When the output signal of inverter circuit 3310 is at "L", clock signal DKT is fixed at "L" regardless of the state of external clock signal extK. If the output signal of inverter circuit 3310 is at "H", clock signal DKT rises to "H" based on external clock signal extK.

DRAM internal clock generation circuit 2160 further includes an inverter circuit 3318 for inverting a signal on a node 3329 and generating internal clock signal DK, a delay circuit 3320 for delaying internal clock signal DK for a prescribed time period, an NAND circuit 3322 receiving the output signal of delay circuit 3320 and internal clock signal DK, an inverter circuit 3324 receiving the output signal of NAND circuit 3322, an NAND circuit 3328 receiving the output signal of inverter circuit 3324 and internal clock signal DK, a p channel MOS transistor 3330 provided between a power supply potential node and node 3329 and receiving the output signal of NAND circuit 3328 at its gate, and a p channel MOS transistor 3326 provided between the power supply potential node and node 3329 and receiving internal clock signal DK at its gate. Delay circuit 3320 which includes an NAND circuit and an inverter circuit can have its delay time set by switching the contacts of switches included therein. MOS transistor 3326 charges node 3329 to the power supply potential level when internal clock signal DK is at "L". The current supply capability of MOS transistor 3326 is large. MOS transistor 3330 holds node 3329 at the power supply potential level when internal clock signal DK is at "H". MOS transistors 3330 simply has a function of holding the potentials of node 3329 at "H", and its current supply capability is small.

DRAM internal clock generating circuit 2160 further includes p channel MOS transistors 3325 and 3327 provided in series between node 3329 and the power supply potential node and receiving clock signals DKT and DK at their respective gates, a p channel MOS transistor 3323 provided between node 3329 and the ground potential node and receiving internal clock signal DK at its gate, and n channel MOS transistors 3321a and 3321b provided in series between node 3329 and the ground potential node and receiving internal clock signal DK at its gate. MOS transistors 3321a, 3321b, 3323, 3325 and 3327 form a 2-input NOR circuit. n channel MOS transistors 3321a and 3321b are provided in series between nodes 3329 and the ground potential node. Because after MOS transistor 3323 having large current driving capability conducts, it is only necessary to bring the potential of node 3329 to the ground potential level, therefore the current supply capability of each of transistors 3321a and 3321b is small, and capacitance is balanced (charge and discharge current is balanced) for node 3329 between the case of signals DKT and DT at "L" and the case of signal DK at - "H". Node 3329 is charged through transistors 3325 and 3327 while it is discharged through transistors 3321a and 3321b.

The output signal of inverter circuit 3301 receiving internal clock signal DK or the signal on node 3329 is applied to NAND circuit 3309 through a switch circuit in order to set delay time for clock sampling disable signal KDIS to an appropriate value for NAND circuit 3306.

The configuration of the DRAM internal clock generation circuit shown in FIG. 55 is substantially identical to that of internal clock generation circuit 2188 shown in FIG. 42. Therefore, a detailed description will not be provided here and only the operation will be briefly described. When signal ZPDE is at "H" and external clock signal extK rises to "H", the flipflop (formed of NAND circuits 3306 and 3008) is set to bring the output signal of inverter circuit 3310 to "H", and internal clock signal DKT rises to "H". Thus, node 3329 is discharged through MOS transistor 3328 at a high speed, and internal clock signal DK is raised to "H" by the function of inverter circuit 3318. When the potential of node 3329 is discharged to the ground potential level, signal KDIS falls to "L", the output signal of inverter circuit 3310 rises to "L, and clock signal DKT falls to "L". In this state, node 3329 is maintained at the ground potential level by the function of MOS transistors 3321*a* and 3321*b*.

In a prescribed time period, output signal DKRST from inverter circuit 3324 rises to "H", MOS transistor 3330 conducts through NAND circuit 3328, and node 2239 has its potential raised at a high speed due to the current supply capability of transistor 3330 as well as the current supply amounts of transistors 3321*a* and 3321*b* are sufficiently large. Thus, internal clock signal DK output from inverter circuit 3318 falls to "L", MOS transistors 3321*a* and 3321*b* are both turned off, and node 3329 is again charged through transistors 3325 and 3327. Since the output signal of inverter circuit 3310 is set to "L" when power down mode detection signal ZPDE is at "L", internal clock signals DK and DKT remains at "L". More specifically, the internal clock signals DK and DKT attain a masked state. In DRAM internal clock generation circuit 2160 shown in FIG. 56, internal clock signal DK having a fixed pulse width can be generated at a high speed in response to a rising of external clock signal extK.

Figure 57:
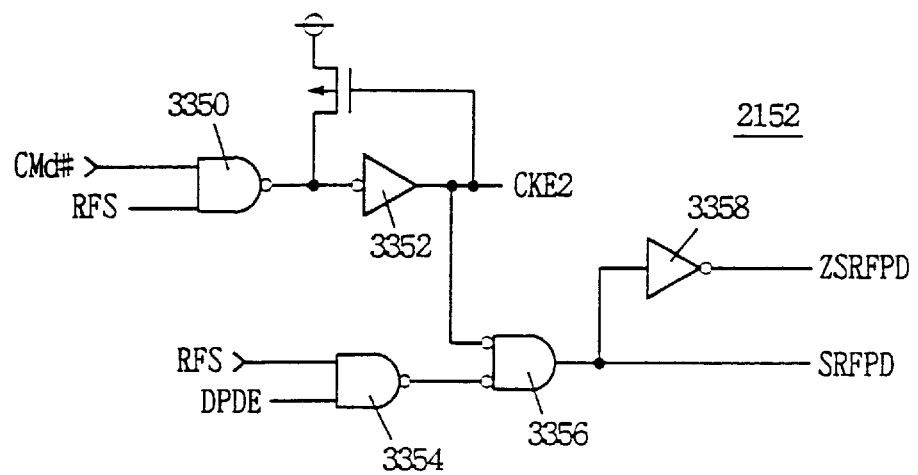
FIG. 57 is a diagram specifically showing the configuration of the DRAM clock mask signal generation circuit shown in FIG. 55.
Figure 58:
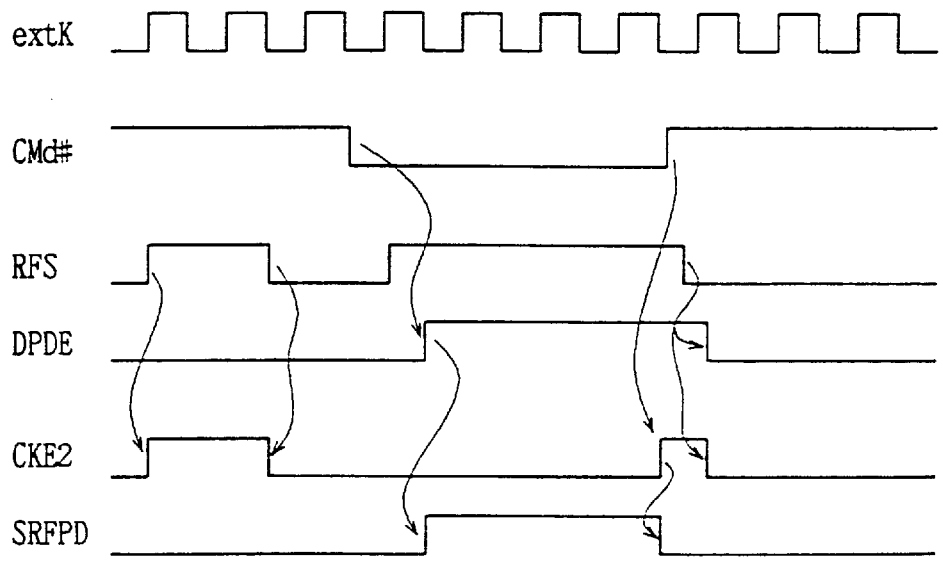
FIG. 58 is a signal waveform chart showing the operation of the circuit shown in FIG. 57.

FIG. 57 is a diagram specifically showing the configuration of DRAM clock mask signal generation circuit, 2152 shown in FIG. 56. Referring to FIG. 57, DRAM clock mask generation circuit 2152 includes an NAND circuit 3350 receiving external clock mask signal CMd# and refresh mode detection signal RFS, an inverter circuit 3352 receiving the output signal of NAND circuit 3350, an NAND circuit 3354 receiving refresh mode detection signal RFS and power down mode detection signal DPDE, an NOR circuit 3356 receiving the output signal of inverter circuit 3352 and the output signal of NAND circuit 3354, and an inverter circuit 3358 receiving the output signal of NOR circuit 3356. Clock mask signal SRFPD is generated from NOR circuit 3356, and complementary clock mask signal ZRFDP is generated from inverter circuit 3358. The operation will now be briefly described in conjunction with FIG. 58.

When refresh mode detection signal RFS is at "L", the output of NAND circuit 3354 is at "H", and signal SRFPD output from NOR circuit 3356 is at "L". Accordingly, if a refresh mode operation is executed, signal SRFPD is fixed at "L", regardless of the state of clock mask signal CMd#. Signal CKE2 is also at "L". With refresh mode detection signal RFS at "H", NAND circuits 3350 and 3354 function as an inverter circuit. If external clock mask signal CMd# is at "H", the output signal of NAND circuit 3350 is at "L", signal CKE2 from inverter circuit 3352 is brought to "H", and signal SRFPD is at "L".

In response to a falling of signal CMd# to "L", signal CKE2 is pulled to "L". When internal power down mode disable signal DPDE rises to "H" according to external mask signal CMd#, output signal SRFPD from NOR circuit 3356 rises to "H". In this state, in response to a rising of clock mask signal CMd# to "H", signal CKE2 is pulled to "H", and signal SRFPD to "L".

More specifically, signal SRFPD is generated or activated only when clock mask signal CMd# is externally applied in an active state in a refresh mode operation.

Figure 59:
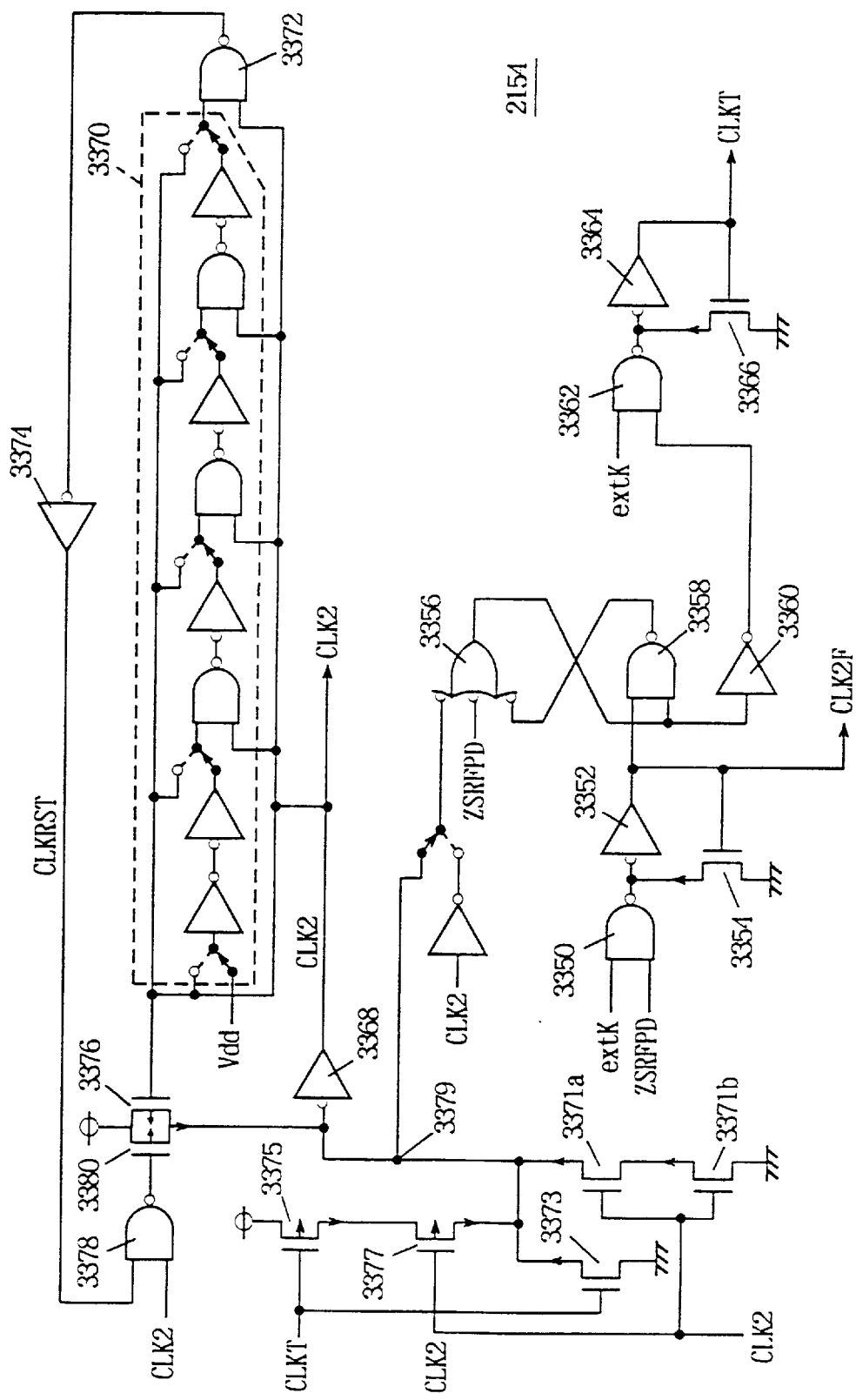
FIG. 59 is a diagram specifically showing the configuration of the first timing signal generation circuit shown in FIG. 55.

FIG. 59 is a diagram showing the configuration of first timing signal generation circuit shown in FIG. 55. The configuration of first timing signal generation circuit 2154 shown in FIG. 59 is identical to the configuration of DRAM internal clock generation circuit 2160 shown in FIG. 56. The first timing signal generation circuit shown in FIG. 59 only differs from the configuration shown in FIG. 56 in that signals ZSRFPD is provided in place of signal ZDPDE, and that signals CKE2 and CKE2F are generated. The configuration and operation thereof will not be described in detail therefore.

In the first timing signal generation circuit shown in FIG. 59, with signal ZSRFPD at "L", internal clock signals CLK2 and CLK2F are not generated. Internal clock signals CLK2 and CLK2F are generated based on external clock signal extK only when signal ZSRFPD is at "H". Clock signal CLK2 has a constant pulse width, and clock signal CLK2F has its pulse width determined based on internal clock signal extK. More specifically, generation of clock signals CLK2 and CLK2F is prohibited when an active clock mask signal CMd# is applied in a refresh mode.

Figure 60:
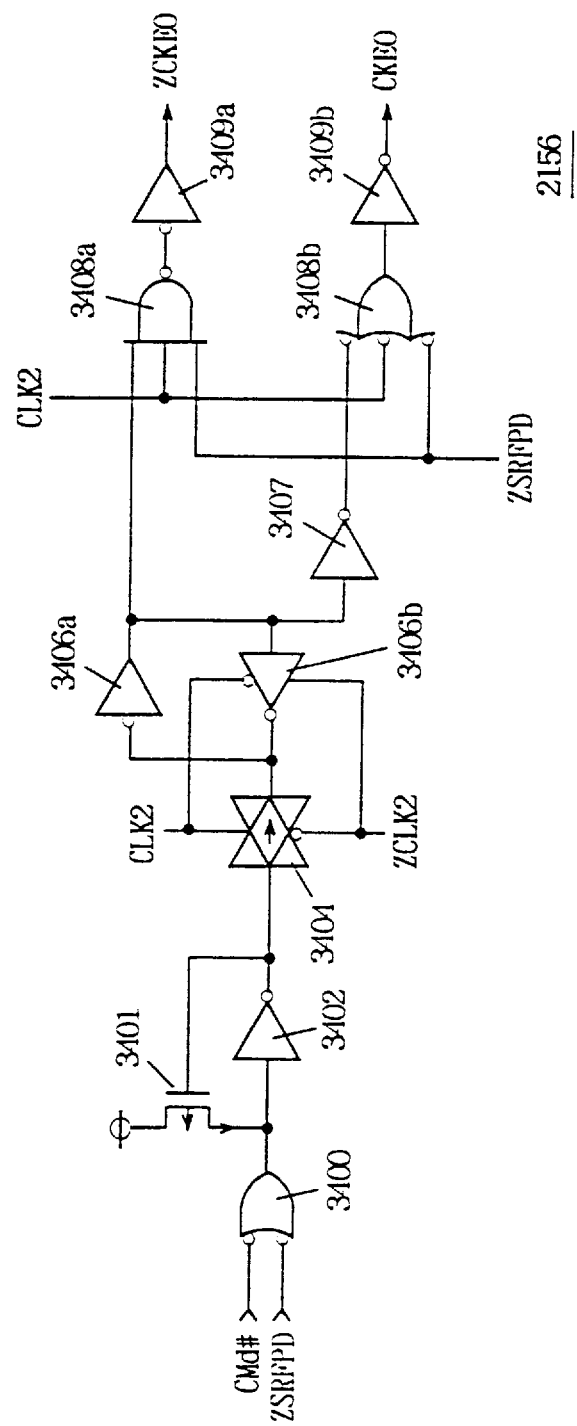
FIG. 60 is a diagram specifically showing the configuration of the second timing signal generation circuit shown in FIG. 55.

FIG. 60 is a diagram specifically showing the configuration of the second timing signal generation circuit shown in FIG. 55. Referring to FIG. 60, second timing signal generation circuit 2156 includes an NAND circuit 3400 receiving external clock mask signal CMd# and signal ZSRFPD, an inverter circuit 3402 receiving the output signal of NAND circuit 3400, a bidirectional transmission gate 3404 passing the output of inverter circuit 3404 based on clock signals CLK2 and ZCLK2 and inverter circuit 3406*a* and 3406*b* for latching the signal passed by transmission gate 3404. Provided between the input node of inverter circuit 3402 and the power supply potential node is a p channel MOS transistor 3401 which conducts when the output signal of inverter circuit 3402 is at "L". Transmission gate 3404 conducts when clock signal CLK2 is at "H". Accordingly, birectional transmission gate 3404, and inverter circuit 3406*a* and 3406*b* constitute a latch circuit for accepting and latching a signal applied when clock signal CLK2 is at "H", and maintaining the latching state during the period in which clock signal CLK2 is at "L".

Second timing signal generation circuit 2156 further includes an inverter circuit 3407 receiving the output of inverter circuit 3406*a*, an NAND circuit 3408*a* receiving the output signal of inverter circuit 3406*a*, clock signal CLK2, and signal ZSRFPD, an inverter circuit 3409*a* receiving the output signal of NAND circuit 3408*a*, an NAND circuit 3408 receiving clock signal CLK2, signal ZSRFPD, and the output signal of inverter circuit 3407, and an inverter 3409*b* receiving the output signal of NAND circuit 3408*b*. Signals ZCKE0 is generated from inverter circuit 3409*a*, and signal CKE0 is generated from inverter circuit 3409*b*.

If signal ZSRFPD is at "H" and a self refresh mode is not specified, clock signal CLK2 is generated based on external clock signal extK. Accordingly, in response to a rising of clock signal CLK2, birectional transmission gate 3404 conducts, and a signal applied from transmission gate 3404 by the function of inverter circuit 3406*a* and 3406*b* is latched. With signal CMd# at "H", the output signal of inverter circuit 3402 is at "H". The output signal of inverter circuit 3406*a* is therefore at "L", and signal ZCKE0 is at "L". The state of signal ZCKE0 is held regardless of the state of clock signal CKE2. Meanwhile, the output signal of inverter circuit 3407 is at "H", and in response to rising of clock signal CLK2 to "H", the output signal of NAND circuit 3408b is pulled to "L", and signal CKE rises to "H". If clock mask signal CMd# is at "L", signal ZCKE0 is at "H", and signal CKE0 is at "L". For signal ZSRFPD at "L", signals CKE0 and ZCKE0 ar both at "L". More specifically, if an operation of masking an internal clock mask signal in a refresh mode operation is necessary, signals CKE0 and ZCKE0 are both pulled to "L". The states of signals CKE0 and ZCKE0 are maintained for one clock cycle period by transmission gate 3404 (with signal ZSRFPD at "H"). Accordingly, if external clocks mask signal CMd# is set to "L", signals CKE0 and ZCKE0 during the clock cycle period are brought to "L" and "H", respectively (during the period in which clock signal CLK2 is at "H".

Figure 61:
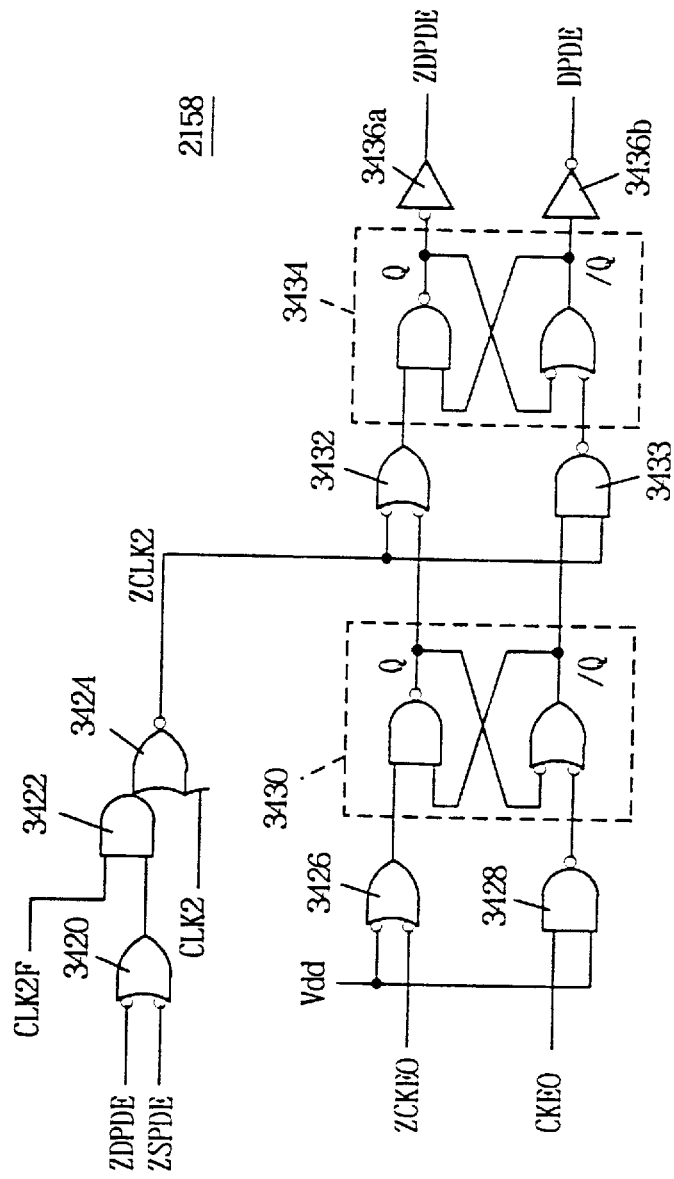
FIG. 61 is a diagram specifically showing the configuration of the DRAM power down signal generation circuit shown in FIG. 55.

FIG. 61 is a diagram specifically showing the configuration of the DRAM power down signal generation circuit 2158 shown in FIG. 55. In FIG. 61, DRAM power down signal generation circuit 3158 includes an NAND circuit 3424 receiving power down enable signals ZDPDE and ZSPDE, an NAND circuit 3422 receiving the output signal of NAND circuit 3420 and clock signal CLK2F, and an NOR circuit 3424 receiving the output signal of NAND circuit 3422 and clock signal CLK2. Clock signal ZCLK2 is generated from NOR circuit 3424. When signal ZSRFPD is at "H", in other words in a normal operation, clock signal CLK2 and CLK2F are generated based on external clock signal extK. If at least one of signals ZDPDE and ZSPDE is at "L" at the time, the output signal of NAND circuit 3420 is brought to "H", and AND circuit 3422 passes clock signal CLK2F therethrough. The output signal ZCLK2 of NOR circuit 3424 is brought to "H", if the output signal of AND circuit 3422 and clock signal CLK2 are both at "L". If signals ZDPDE and ZSDPDE are both at "H", the output signal of NAND circuit 3420 attains an "L" state, and the output signal of AND circuit 3422 is brought to "L". In this case, NOR circuit 3424 functions as an inverter and inverts clock signal CLK2. Accordingly, in a power down mode operation, clock signal ZCLK2 has a different active signal width.

When signal ZSRFPD is at "L", clock signals CLK2F and CLK2 are both at "L" and signal ZCLK2 is at "H".

DRAM power down signal generation circuit 2158 further includes NAND circuits 3426 and 3428 receiving power supply potential Vdd at respective one-input and signals ZCKE0 and CK0 at the respective other inputs, a flipflop 3430 which is set/reset based on the output signals of NAND circuits 3426 and 3428, NAND circuits 3432 and 3433 for inverting the outputs of Q and /Q of flipflop 3430 for passage when clock signal ZCLK2 is at "H", a flipflop 3437 which is set/reset in response to the output signals of NAND circuits 3432 and 3422, and inverter circuits 3436a and 3436b inverting the output signals Q and /Q of flipflop circuits 3434. Signal ZDPDE is output from inverter circuit 3436a, and signal DPDE is generated from inverter circuit 3436b.

Signals CKE0 and ZCKE0 are, as illustrated in FIG. 60, set to "L" with clock signal CLK2 at "L". NAND circuits 3426 and 3428 function as an inverter circuit under this situation and each transmit a signal at "H" to flipflop 3430. In this state, the state of the output signal of flipflop 3430 does not change. During this period, signal ZCLK2 is at "H", NAND circuit 3432 and 3433 function as an inverter circuit, and the states of the output signals Q and /Q of flipflop 3434 are determined based on the output signals Q and /Q of flipflop 3430.

In response to a rising of signal CLK2 to "H", signals ZCKE0 and CKE0 have their states determined based on the states of signals CMd# and ZSRFPD and are transferred to flipflop 3430. At this time, signal ZCLK2 is at "L", and the output signals of flipflop 3430 are not transferred to flipflop 3434.

If signal ZRFPD is at "H" and the clock mask signal CMd# is at "H", in response to a rising of clock signal CLK2, signal CKE0 is pulled to "H", and signal ZCKE0 is to "L". The Q output and /Q output of flipflop 3430 are pulled to "L" and "H", respectively. If clock signal CLK falls to "L" and clock signal ZCLK2 rises to "H", the outputs /Q and /Q of flipflop 3434 are set to "L" and "H". In this state, signal DPDE is at "L", and signal ZDPDE is at "H".

In response to a falling of external clock mask signal CMd# to "L", signals ZCKE0 and CKE0 are brought to "H" and "L" in response to a rising of clock signal CLK2. In response to a subsequent rising of signal ZCLK2 to "H", the Q output and /Q output of flipflop 3434 are brought to "H and "L", respectively, and signals DPDE and ZDPDE are brought to "H" and "L". When signal ZDPDE falls to "L" signal ZCLK2 is generated based on clock signal CLK2F from the next clock cycle. As a result, signal DPDE is applied to DRAM internal clock generation circuit 2160 to disable generation of internal clock signal DK in the next clock cycle.

When signal ZSRFPD is set to "L" in a self refresh mode, signals CKE0 and ZCKE0 ar set to "L". In this state, the signal latching state of flipflop 3430 do not change, and internal clock signals CLK2, CLK2F and ZCLK2 are prohibited from being generated. Clock signal ZCLK2 therefore remains at "H", and signals DPDE and ZDPDE maintains their previous states. Signal ZSRFPD falls to "L" only after external mask signal CMd# is set to "L" in a self refresh mode and after signal DPDE rises to "H" (see FIG. 58). Accordingly, with a refresh mode being instructed, if external clock mask signal CMd# attains an active state, generation of internal clock signal DK can be securely prevented. As result, in this configuration upon a refresh mode instruction, applying an external clock mask signal prohibits an internal clock signal from being generated.

Figure 62:
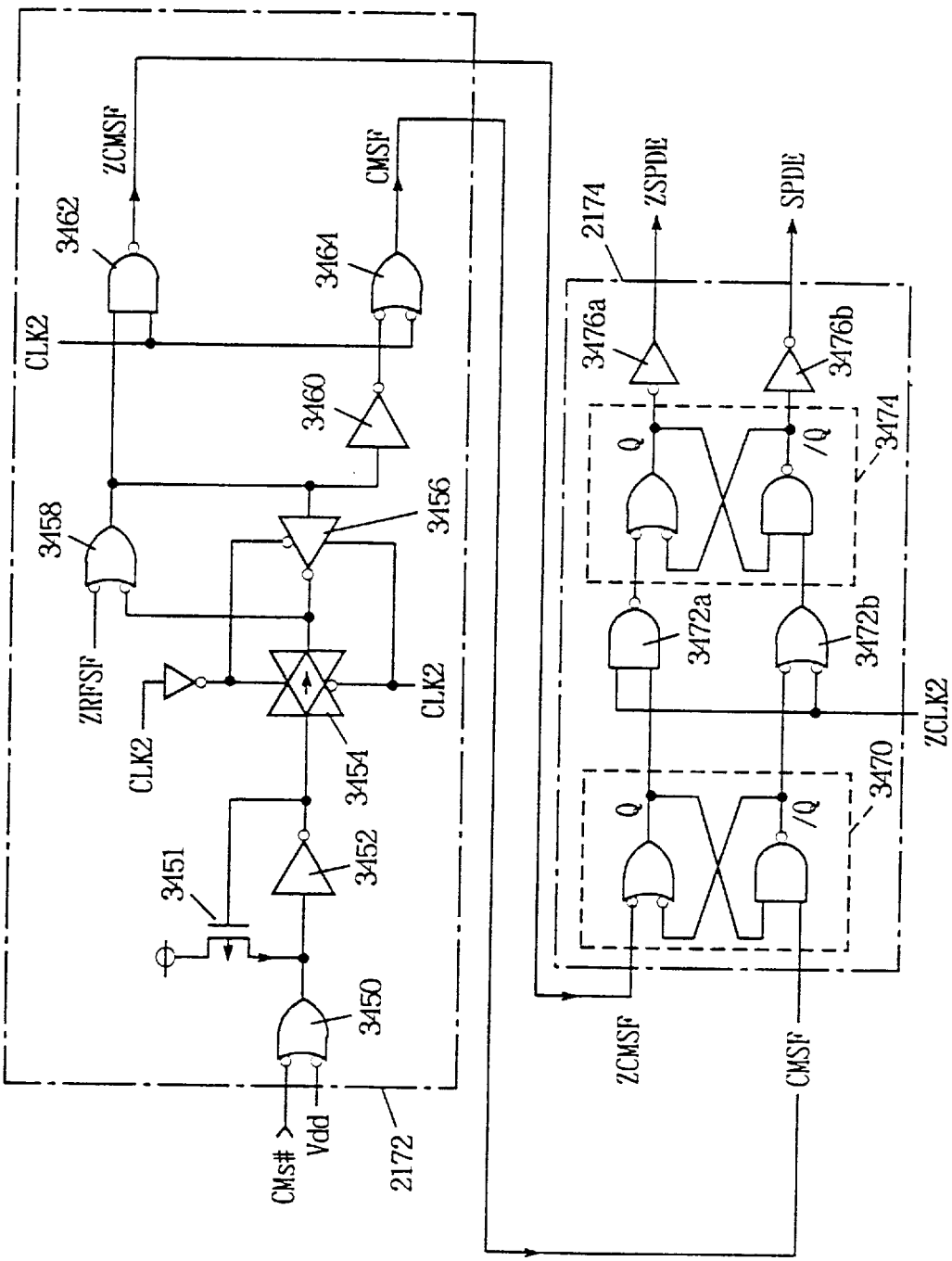
FIG. 62 is a diagram specifically showing the configuration of SRAM clock mask signal generation circuit and SRAM power down signal generation circuit shown in FIG. 55.

FIG. 62 is a diagram specifically showing the configuration of the SRAM clock mask generation circuit and the SRAM power down signal generation circuit shown in FIG. 55. In FIG. 62, SRAM clock mask signal generation circuit 2172 includes an NAND circuit 3450 receiving power supply potential Vdd at its input and external clock mask signal CMs# at its other input, an inverter circuit 3452 receiving the output signal of NAND circuit 3450, a bidirectional transmission gate 3454 passing the output of inverter circuit 3452 based on clock signals CLK2 and ZCLK2, and an NAND circuit 3458 receiving refresh mode detection signal ZRFSF and a signal transmitted by transmission gate 3454. Provided between the input node of inverter circuit 3452 and a power supply potential node is a p channel MOS transistor 3451 conducting in response to the output signal of inverter circuit 3452 at "L". Bidirectional transmission gate 3454 conducts when clock signal CLK2 is at "L". The output signal of NAND circuit 3458 is fedback to its one input through inverter circuit 3456.

SRAM clock mask signal generation circuit 2174 further includes an inverter circuit 3460 receiving the output signal of NAND circuit 3458, an NAND circuit 3462 receiving the output signal of NAND circuit 3458 and clock signal CLK2, and an NAND circuit 3464 receiving clock signal CLK2 and the output signal of inverter circuit 3460. NAND circuits 3462 and 3464 each function as an inverter circuit when clock signal CLK2 attains an "H" level.

Bidirectional transmission gate 3454 attains a non-conduction state when clock signal CLK2 rises to "H". More specifically, the state of external clock mask signal CMs# at a rising of external clock signal extK is latched by the latch circuit constituted by NAND circuit 3458 nd inverter circuit 3456. When signal ZRFSF is at "H", and external clock mask signal CMs# is set to "L" at a rising of external clock signal extK, the output signal of NAND circuit 3458 rises to "H", signal ZCMSF falls to "L", and signal CMSF rises to "H" (in response to a rising of clock signal CLK2). When clock signal CLK2 is at "L", signals ZCMSF and CMSF are both at "H". In a refresh mode, signal ZRFSF is set to "L". In this state, similarly to this state in which external clock mask signal CMS# is set to "L", clock mask signal CMSF rises to "H", and signal ZCMFS falls to "L".

Therefore, when refresh mode detection signal ZRFSF is generated, the internal clock signal attains a masked state as is the case with external clock mask signal CMs# attains an active state.

SRAM power down signal generation circuit 2174 includes a flipflop 3470 receiving signals ZCMSF and CMSF, NAND circuits 3472a and 3472b inverting the outputs Q and /Q of flipflop 3470 for passage therethrough when clock signal ZCLK2 is at "H", a flipflop 3474 which is set /reset in response to the output signals of NAND circuits 3472a and 3472b, inverter circuits 3476a and 3476b receiving the outputs Q and /Q of flipflop 3474. Signal ZSPDE is generated from inverter circuit 3476a, and signal SPDE is generated from inverter circuit 3476b.

If signal ZCMSF is at "L", signal ZSPDE falls to "L", and when signal CMSF is at "L", signal SPDE falls to "L". More specifically, signals ZCMSF and CMSF are transferred based on a rising of clock signal ZCLK2 and become signals ZSPDE and SPDE.

Clock signal CLK2 is generated in response to a rising of external clock signal extK as shown in FIG. 59. Thus, flipflop 3470 first latches the state of external clock mask signal CMs#. When clock signal CLK2 falls and clock signal ZCLK2 rises, signals ZSPDE and SPDE change based on the states of signals ZCMSF and CMSF. Flipflop 3470 and 3474 hold their respective states during one cycle of clock signals CLK2 and ZCLK2. Therefore, when clock mask signal CMs# is activated ("L"), signal SPDE rises to "H", in response to a falling of the internal clock signal CLK2 in the clock cycle, and signal ZSPDE falls to "L". Accordingly, on a rising of external clock signal extK in the next clock cycle, generation of the internal clock signal is disabled (because signal SPDE is at "H"). As described above, the state of external clock mask signal CMs# is transferred using clock signals CLK2 and ZCLK2, pulse widths of clock signals CLK2 and ZCLK2 are kept constant irrespective of that of external clock signal extK, therefore signals SPDE and ZSPDE can be surely generated in pre-scribed timings and internal signals can be masked.

Figure 63:
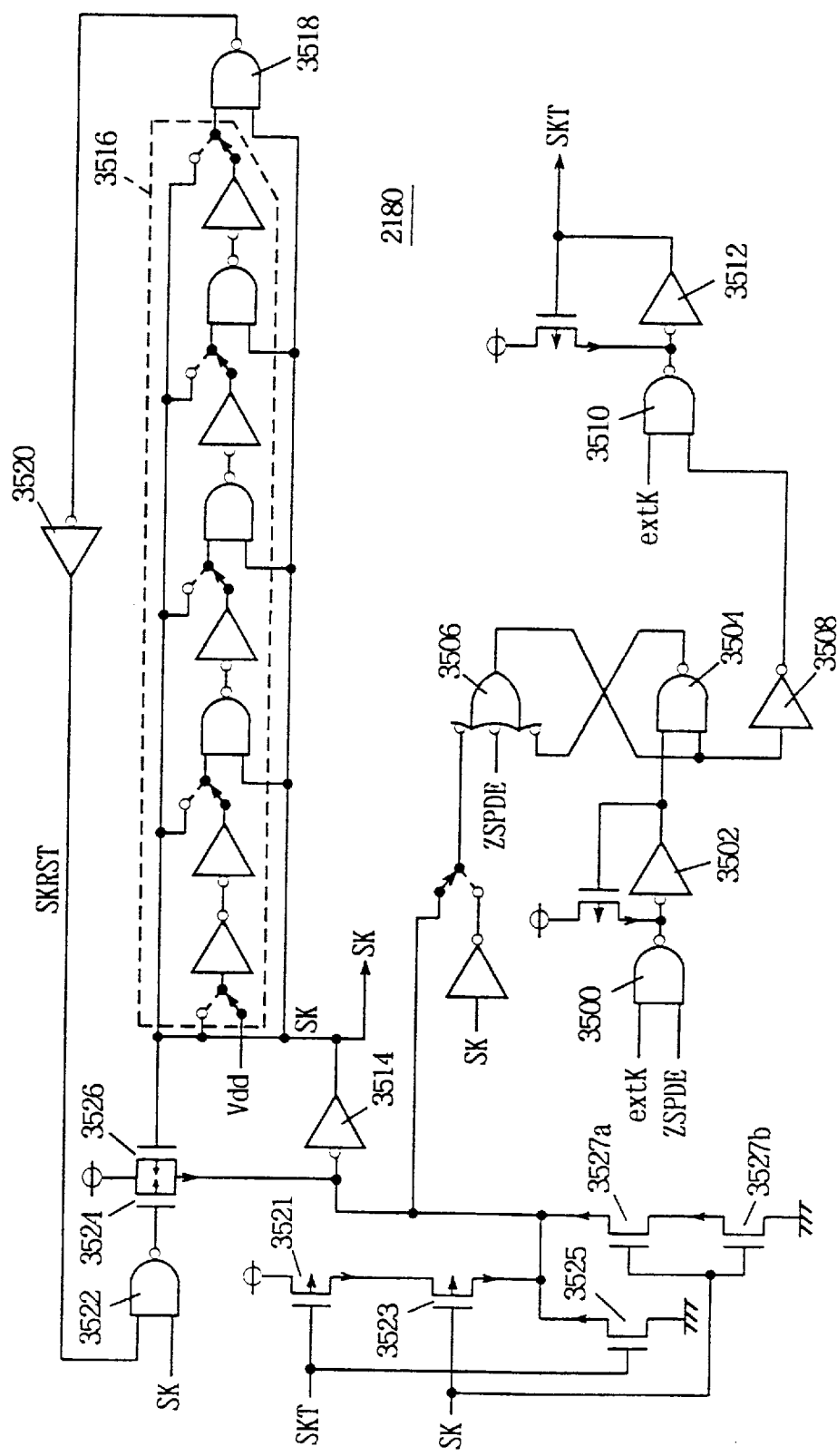
FIG. 63 is a diagram specifically showing the configuration of the SRAM internal clock signal generation circuit shown in FIG. 55.

FIG. 63 is a diagram specifically showing the configuration of the SRAM internal clock generation circuit 2180 shown in FIG. 55. The configuration of SRAM internal clock generation circuit 2180 in FIG. 63 is substantially identical to the configuration of the DRAM internal clock generation circuit shown in FIG. 56. The configuration shown in FIG. 63 is different in reference characters and names for power down mode detection signal and clock signals from the configuration shown in FIG. 56. In a configuration shown in FIG. 63, internal clock signals SK and SKT are generated based on power down mode detection signal ZSPDE and external clock signal extK. The configuration shown in FIG. 63 is the same as the circuit shown in FIG. 56, and therefore the structure and operation will not be described detail here. In the configuration shown in FIG. 63, for power down mode detection signal ZSPDE at "L", generation of internal clock signal SK is stopped, and for signal ZSPDE at "H", internal clock signal SK having a constant pulse width is generated based on external clock signal extK.

[External Signal Sampling Pulse Generation Circuit]

In the configurations shown in FIGS. 5 and 6, the input buffers such as address buffer and WE buffer are shown as accepting external signals based on internal clock SK or DK. Chip select signal CS is applied to the control signal generation circuit, and enable/disable thereof is determined. In this case, however, generating an external control signal sampling pulse according to signal CS prohibits unnecessary sampling operations in the input buffers, and therefore power consumption can be reduced. The configuration will now be described.

Figure 64A:
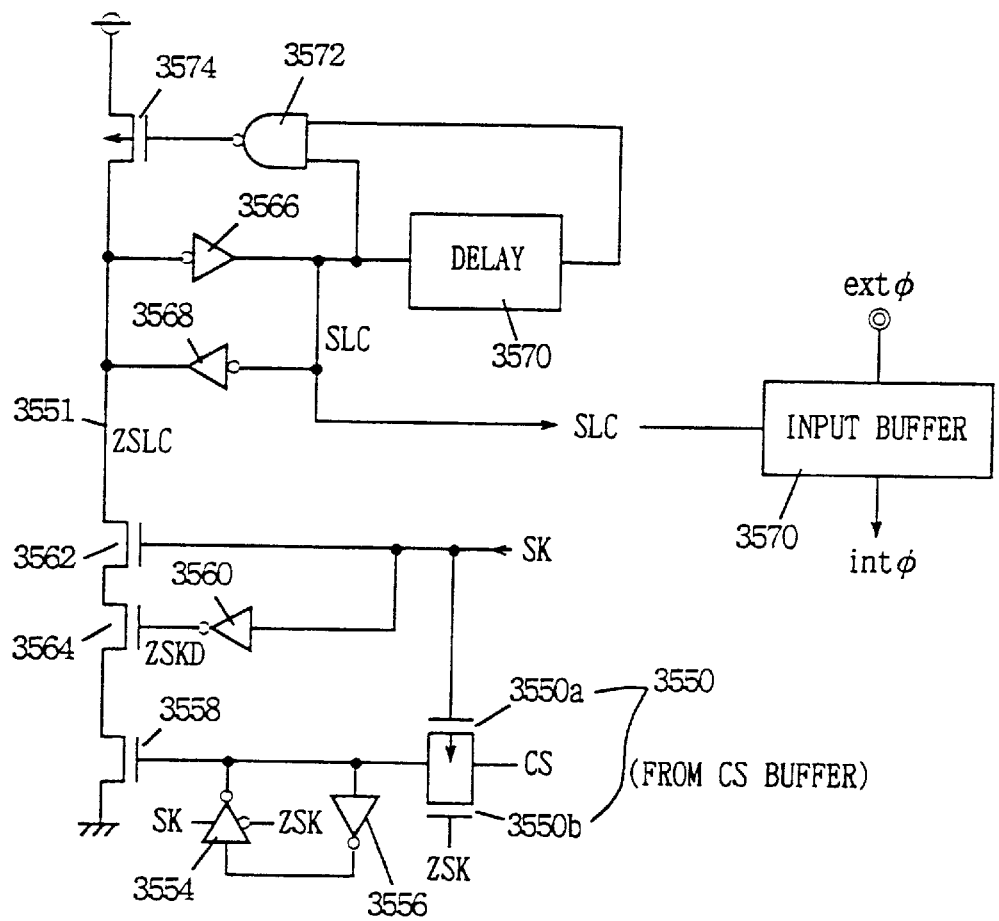
FIGS. 64A and 64B are representation showing the schematic configuration of a sampling pulse generation circuit according to the present invention and operation waveforms thereof, respectively.

FIG. 64A is a diagram schematically showing the configuration of a sampling pulse generation portion. In FIG. 64A, the sampling pulse generation portion includes a transmission gate 3550 passing internal chip select signal CS from a CS buffer (not shown) according to internal clock signals SK and ZSK, an n channel MOS transistor 3558 conducting in response to the output of transmission gate 3350, a delay inverter circuit 3560 for inverting and delaying for a prescribed time period internal clock signal SK, an n channel MOS transistor 3546 conducting in response to output signal from ZSKD from delay inverter circuit 3560, an n channel MOS transistor 3562 conducting in response to internal clock signal SK and inverter circuits 3554 and 3556 for latching the gate potential of transistor 3558. Transistors 3558, 3564 and 3568 are connected in series between a node 3551 and a ground potential node. Transmission gate 3550 includes an n channel MOS transistor 3550a receiving internal clock signal SK at a gate, and an n channel MOS transistor 3550b receiving inverted internal clock signal ZSK at a gate. Inverter circuit 3556 has its input connected to the gate of transistor 3558. Inverter circuit 3554 attains an operation enable state, in response to internal clock signal SK at "H", and inverts the output signal of inverter circuit 3556 for transfer to the gate of transistor 3558. Inverter circuit 3554 attains an output high impedance state when internal clock signal SK is at "L". Transistor 3562 is connected to node 3551 in order to discharge node 3551 at a high speed in response to a rising of internal clock signal SK.

Figure 64B:
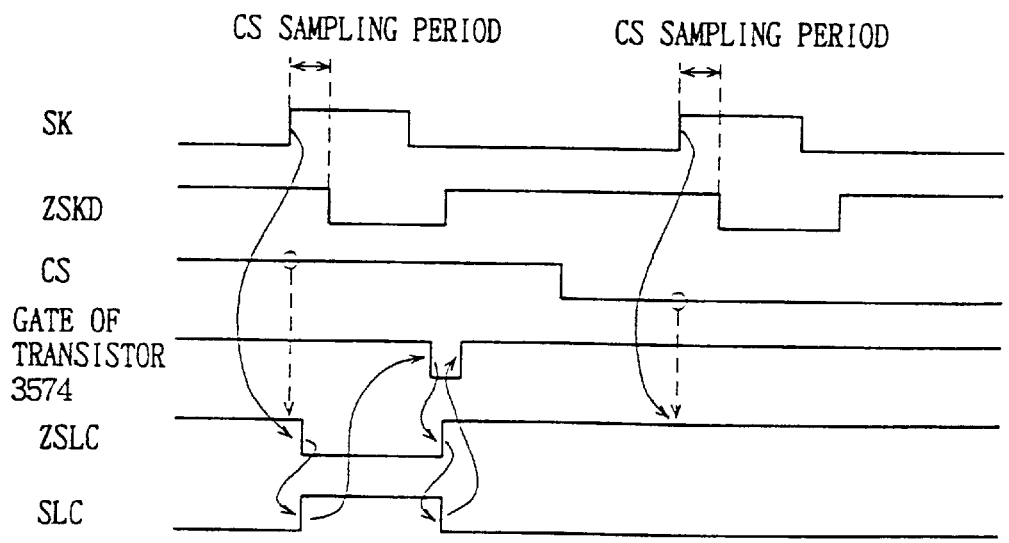

The sampling pulse generation system further includes an inverter circuit 3566 receiving signal ZSLC on node 3551, a delay circuit 3570 for delaying the output of inverter 3566 for a prescribed time period, a NAND circuit 3572 receiving the output signal of inverter circuit 3566 and the output signal of delay circuit 570, a p channel MOS transistor 3574 provided between the power supply potential node and the node 3551 to receive the output signal of NAND circuit 3572 at a gate, and an inverter circuit 3568 for inverting the output signal SLC of inverter circuit 3566 for transfer to node 3551. Inverter circuit 3566 has sufficiently large driving capability, and inverter circuit 3568 has relatively small capability. Inverter circuit 3568 only functions to maintain signal SLC at "H". Transistors 3562, 3564 and 3558 have relatively large driving capabilities, and p channel MOS transistors 3574 also has relatively large driving capability. Now, the operation of the circuit shown in FIG. 64A will be described in conjunction with the operation waveform chart thereof, FIG. 64B.

An operation with output signal CS from the CS buffer being at "H" will be described. In response to a rising of internal clock signal SK to "H", transmission gate 3350 attains a non-conduction state, and chip select signal CS is held at the gate of transistor 3558. When internal clock signal SK rises to "H", clock inverter 3554 is enabled, and latches the gate of MOS transistor 3358. Since signal CS is at "H", MOS transistor 3358 is turned on. Also, in response to the rising of signal SK to "H", MOS transistor 3562 is turned on. Inverter circuit 3560 provides a relatively large time delay, and signal ZSKD is still at "H" when signal SK rises to "H". MOS transistors 3562, 3564, and 3558 are therefore all turned on, and discharge node 3551 to the ground potential. As the level of signal ZSLC on node 3551 decreases, inverter circuit 3566 raises latch signal SLC to "H" at a high speed. In a prescribed time period, the output signal of NAND circuit 3572 falls to "L, and MOS transistor 3574 is turned on, charging node 3551 to the power supply potential level. At the time of charging through transistor 3574, since signal ZSKD is already at "L", no discharge path is present for node 3551. Thus, inverter circuits 3556 drives signal SLC to "L".

Clock signal SK from the internal clock generation circuit as shown in FIG. 63 drives only MOS transistor 3562 and generates sampling pulse signal SLC. The internal clock generation circuit needs relative small driving capability, and therefore the circuit scale of the internal clock generation circuit can be reduced. MOS transistors 3562, 3564 and 3558 need only the ability to lower the potential of node 3551. The signal potential on node 3551 is amplified by inverter 3556 which has large driving capability. Therefore, transistors 3562, 3560 and 3554 need only relatively small current driving capability. In addition, sampling pulse signal SLC is generated according to internal clock signal SK by one stage of MOS transistor, and therefore the sampling pulse signal can be generated at a high speed. The period during which sampling pulse signal SLC is at "H" is determined by the delay time given by delay circuit 3570, and a sampling pulse having a constant pulse width can always be generated. The sampling period herein means time formed by setup time and falls time usually required for the chip select signal, and reducing the sampling time period can change the signal at a high speed, resulting in high speed operation.

With chip select signal CS at "L", MOS transistor 3558 is in an off state, node 3551 is not discharged, and sampling pulse signal SLC maintains "L". In response to a falling of sampling pulse signal SLC to "L, the output signal of NAND circuit 3572 rises to "H", and therefore MOS transistor 3574 is turned off, thus significantly reducing current consumption in this path.

Sampling pulse signal SLC is applied to an input buffer 3570 shown in FIG. 64A. Input buffer 3570 latches external signal extΦ and generates an internal signal into based on sampling pulse signal SLC. Therefore, sampling pulse signal SLC is always generated based on the external clock signal (internal clock signal SK) at the same timing for a prescribed time period, the timing for establishing internal signal into is always kept fixed, and internal operation can be stably conducted. Since sampling pulse signal SLC is generated at a high speed based on internal clock signal SK, the timing for initiating the internal operation can be advanced, and therefore high speed operation is implemented.

[Specific Configuration of Sampling Pulse Generation Circuit]

Figure 65:
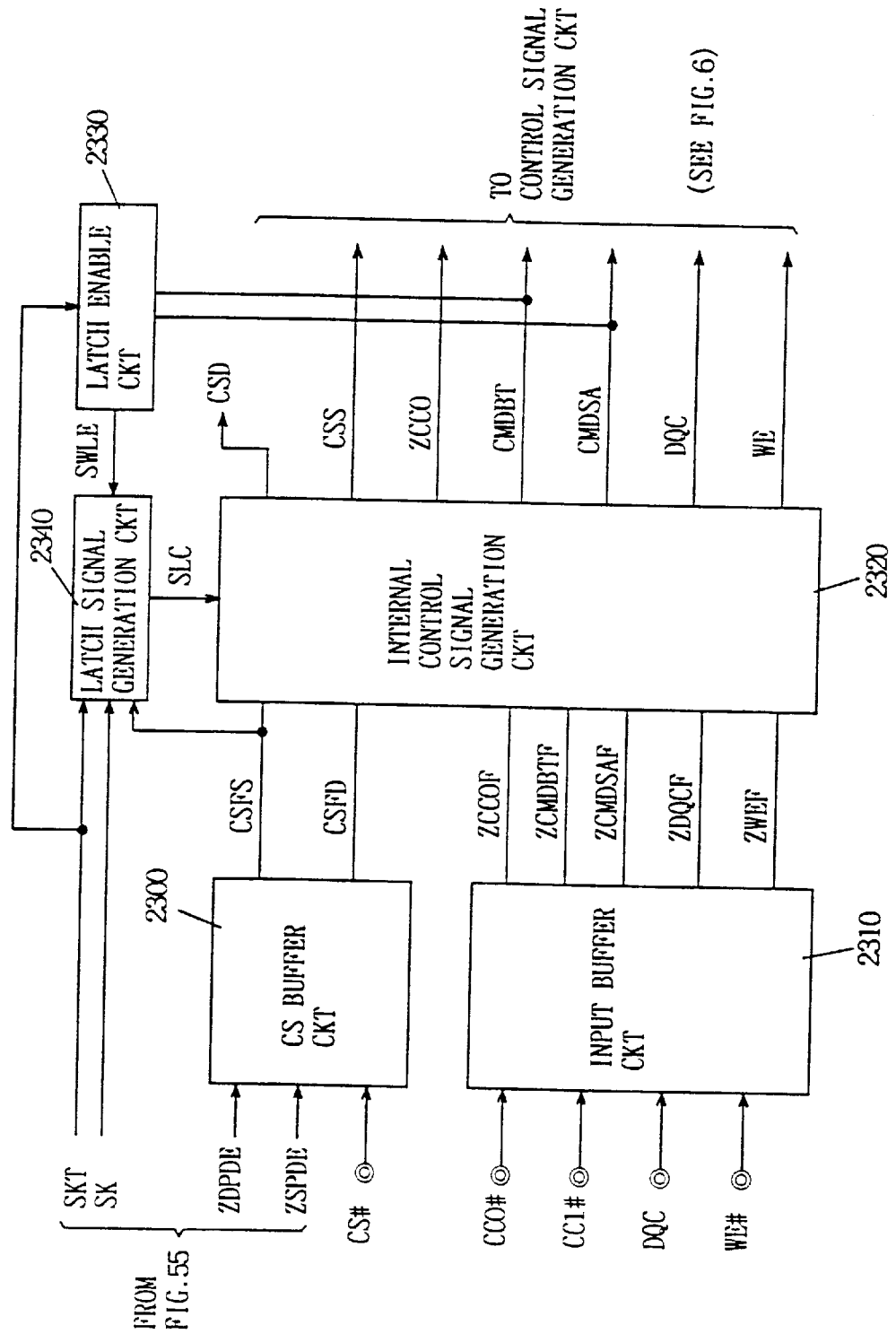
FIG. 65 is a block diagram specifically showing the configuration of a sampling pulse generation circuit according to the present invention.

FIG. 65 is a block diagram schematically showing the configuration of a buffer circuit for generating an internal control signal from an external control signal. In FIG. 65, the internal control signal generation circuitry includes a CS buffer circuit 2300 for taking in an externally applied chip select signal CS# based on power down mode detection signals ZDPDE and ZSPDE generated from the circuit shown in FIG. 55, external control signals CC0#, CC1#, DQC and WE# and generating internal control signals ZCC0F, ZCMBTF, ZCMDSAF, ZDQCF and ZWEF. A signal CSFS from CS buffer circuit 2300 indicates a chip select signal for the SRAM array, and a signal CSFD indicates a chip select signal for the DRAM array portion. Signals ZCC0F, ZDQCF, and ZWEF are signals produced by buffering the corresponding external control signals. Signals ZCMDBTF and ZCMDSAF are internal control signals indicating a buffer transfer mode and an SRA array access.

The internal control signal generation circuit further includes a latch signal generation circuit 2340 for generating a latch signal SLC based on internal clock signals SK and SKT from the SRAM internal clock generation circuit shown in FIG. 55 and internal chip select signal CSFS from CS buffer circuit 2300, an internal control signal generation circuit 2320 for latching signals from CS buffer circuit 2300 and input buffer circuit 2310 based on latch signal SLC from latch signal generation circuit 2340 for application to the control signal generation circuit shown in FIG. 6, and a latch enable circuit 2330 for sampling internal clock signals ZCMDBT and ZCMDSA based on clock signal SKT and generating a latch enable signal SWLE. Internal control signals CSD, CSS, ZCC0, ZCMDBT, ZCMDSA, ZDQC and ZWE from control signal generation circuit 2320 are applied to the control signal generation circuit shown in FIG. 6.

Figure 66:
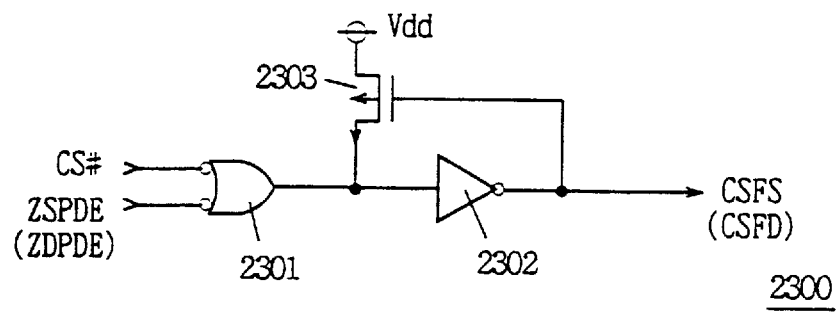
FIG. 66 is a diagram specifically showing the configuration of the CS buffer circuit shown in FIG. 65.

FIG. 66 is a diagram specifically showing an example of the configuration of the CS buffer circuit shown in FIG. 65. The configuration shown in FIG. 66 is for generating chip select signal CSFS for the SRAM portion. Note that chip select signal CSFD for the DRAM portion is generated by a similar configuration. In FIG. 66, CS buffer circuit 2300 includes an NAND circuit 2301 receiving externally applied chip select signal CS# and power down mode detection signal ZSPDE from the SRAM power down signal generation circuit shown in FIG. 55, for example, and an inverter circuit 2302 for inverting the output of NAND circuit 2301 and generating internal chip select signal CSFS. The input portion of inverter circuit 2302 is provided with a p channel MOS transistor which conducts in response to the output of inverter circuit 2302 being at "L", and charges the input portion of inverter circuit 2302 to the level of power supply potential Vdd.

If power down mode detection signal ZSPDE is at "L", and a power down mode is designated, the output signal of NAND circuit 2301 is at "H", and internal chip select signal CSFS is at "L".

If power down mode detection signal ZSPDE is at "H", and chip select signal CS# is at "L", internal chip select signal CSFS attains an "L" level.

In the circuit for generating chip select signal CSFD for DRAM as configured in FIG. 66, power down mode detection signal ZDPDE is applied in place of power down mode detection signal ZSPDE.

In the input buffer circuit shown in FIG. 60, the same configuration as that shown in FIG. 66 is employed for a buffer circuit for generating internal signals ZCC0F, ZDQCF, and ZWEF. Corresponding external control signals are applied in place of chip select signal CS#.

Figure 67:
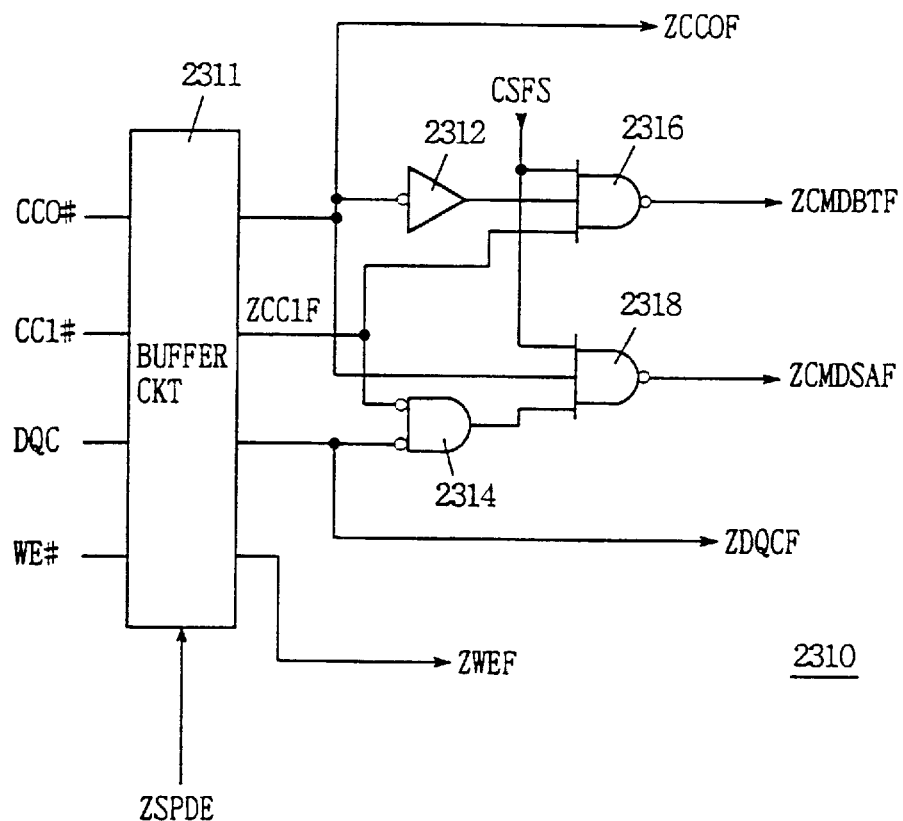
FIG. 67 is a diagram specifically showing the configuration of the input buffer circuit shown in FIG. 65.

FIG. 67 is a diagram showing the configuration of the input buffer circuit shown in FIG. 65. In FIG. 67, input buffer circuit 2310 includes a buffer circuit 2311 for generating internal clock signals ZCC0F, ZCC1F, ZDQCF and ZWEF based on external control signals CC0#, CC1#, DQC#, and WE#, and internal power down mode detection signal ZSPDE, an inverter circuit 2312 receiving signal ZCC0F from buffer circuit 2311, an NOR circuit 2314 receiving signals ZCC1F and ZDQCF from buffer circuit 2311, an NAND circuit 2316 receiving the output signal of inverter circuit 2312, internal chip select signal CSFS from CS buffer circuit 2300, and internal signal ZCC1F from buffer circuit 2311, and an NAND circuit 2318 receiving signals ZCC0F and CSFS, and the output signal of NOR circuit 2314. A signal ZCMDBTF indicating a buffer transfer mode is generated from NAND circuit 2316, and a signal ZCMDSAF indicating an access to the SRAM array is generated from NAND circuit 2318. The operations indicated by signals ZCMDBTF and ZCMDSAF are clearly seen from the table of signal logics in FIG. 3. More specifically, signal ZCMDBTF attains an "L", active state when signals CSFS and ZCC1F are at "H", and signal ZCC0F is at "L". In this state, as can be seen from the table showing the states of signals in FIG. 3, data transfer is conducted between the birectional transfer circuit and the SRAM array.

Signal ZCMDSAF is brought to "L" when signal ZCC0F is at "H" and signals ZCC1F and DQC are both at "L". This state corresponds to an operation mode for accessing to the SRAM array. Signals ZCMDBTF and ZCMDSAF are generated when signal CSFS is at "H" and semiconductor memory device is to be accessed.

Buffer circuit 2311 has a configuration identical to the circuit shown in FIG. 66 for each external control signal.

Figure 68:
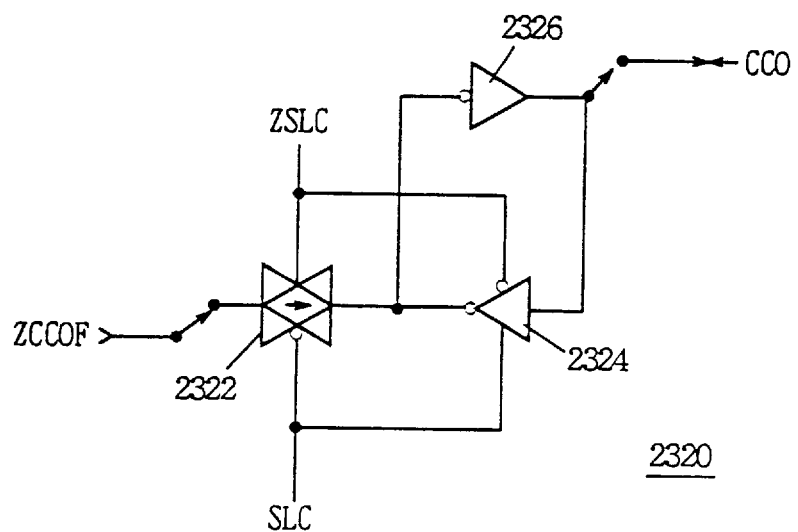
FIG. 68 is a diagram specifically showing the configuration of the internal control signal generation circuit shown in FIG. 65.

FIG. 68 is a diagram specifically showing the configuration of the internal control signal generation circuit shown in FIG. 65. In FIG. 68, only a configuration for one internal control signal in internal control signal generation circuit 2302 is shown. A circuit configuration shown in FIG. 68 is provided for each internal control signal.

In FIG. 68, the internal control signal generation circuit includes a bidirectional transmission gate 2322 conducting in response to latch instruction signals SLC and ZSLC for passing internal control signal ZCC0F, and inverter circuits 2324 and 2326 for latching the signal transferred by transmission gate 2322. Bidirectional transmission gate 2322 attains a non-conduction state for latch instruction signal SLC at "H", and a conduction state for latch instruction signal SLC at "L". Inverter circuit 2306 generates a control signal CCO by inverting the signal pass through transmission gate 2322. Inverter circuit 2324 inverts the output signal from inverter circuit 2326 for transfer to an input portion of inverter circuit 2326. In the circuit configuration shown in FIG. 68, a latch state is accomplished when latch instruction signal SLC is at "H", and the state of signal CCO at the rising of latch instruction signal SLC is maintained irrespective of the state of internal control signal ZCC0F.

Figure 69A:
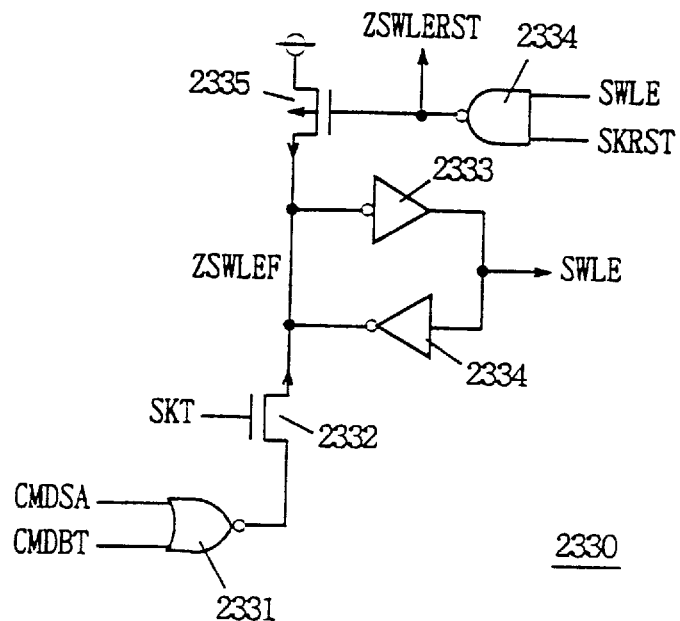
FIGS. 69A and 69B are representation showing the specific configuration of the latch enable circuit shown in FIG. 65 and signal waveform showing the schematic operation thereof, respectively.

FIG. 69A is a diagram specifically showing the configuration of latch enable circuit 2330 in FIG. 65. In FIG. 69A, latch enable circuit 2330 includes an NOR circuit 2331 receiving internal control signals CMDSA and CMDBT, an n channel MOS transistor 2332 for sampling the output signal of NOR circuit 2331 based on internal clock signal SKT, an inverter circuit 2333 for inverting signal ZSWLEF sampled by n channel MOS transistor 2332, an NAND circuit 2334 receiving an enable signal (SRAM word line selection enable signal) SWLE output from inverter circuit 2333 and an internal clock reset signal SKRST, and a p channel MOS transistor 2335 for charging signal ZSWLEF to the power supply potential level in response to the output of NAND circuit 2334. Inverter circuit 2334 is provided for latching signal SWLE. In the configuration shown in FIG. 69A, the circuit for generating internal clock SKT needs only drive n channel MOS transistor 2332. MOS transistor 2332 needs only a current driving capability to lower the potential of the input node of inverter circuit 2333. MOS transistor 2335 needs only charge signal ZSWLEF to the power supply potential. Inverter circuit 2334 needs only a capability to maintain the state of signal SWLE. Accordingly, the circuit can also be implemented in substantially small size. The operation of the latch enable signal generation circuit shown in FIG. 69A will now be described in conjunction with the operation waveform chart thereof, FIG. 69B.

Signals CMDSA and CMDBT indicate an access to the SRAM array and data transfer between the bidirectional transmission circuit and the SRAM array, respectively. Therefore, if one of signals CMDSA and CMDBT is brought to an "H", active state, a word line is selected in the SRAM array. At the time, the output signal of NOR circuit 2331 attains an "L" level.

Figure 69B:
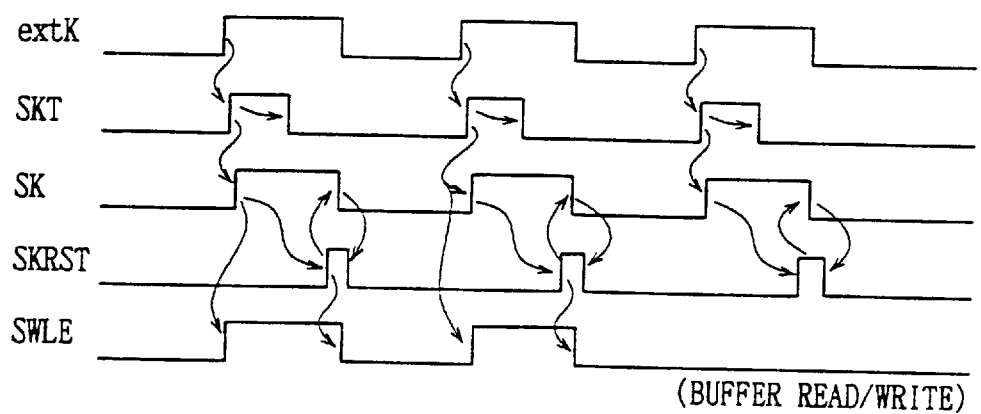

In response to a rising of external clock signal extK, internal clock signal SKT rises to "H" in a prescribed time period, the output signal of NOR circuit 2331 is sampled and signal ZSWLEF is generated. For the output signal of NOR circuit 2331 at "L", inverter circuit 2333 raises signal SWLE to "H" at a high speed. In a prescribed time period after a rising of internal clock signal SKT to "H", internal clock reset signal SKRST rises to "H". Thus, the output signal of NAND circuit 2334 attains an "L" level, MOS transistor 2335 is turned on, and signal SWLE falls to "L". In FIG. 69B, internal clock signal SK is shown for the purpose of clarifying the meaning of internal clock reset signal SKRST.

When the bidirectional transfer circuit is directly and externally accessed, a word line selection in the SRAM array is not conducted. In this case, the output signal of NOR circuit 2331 is brought to "H", in which case signal SWLE maintains the state of "L".

Figure 70:
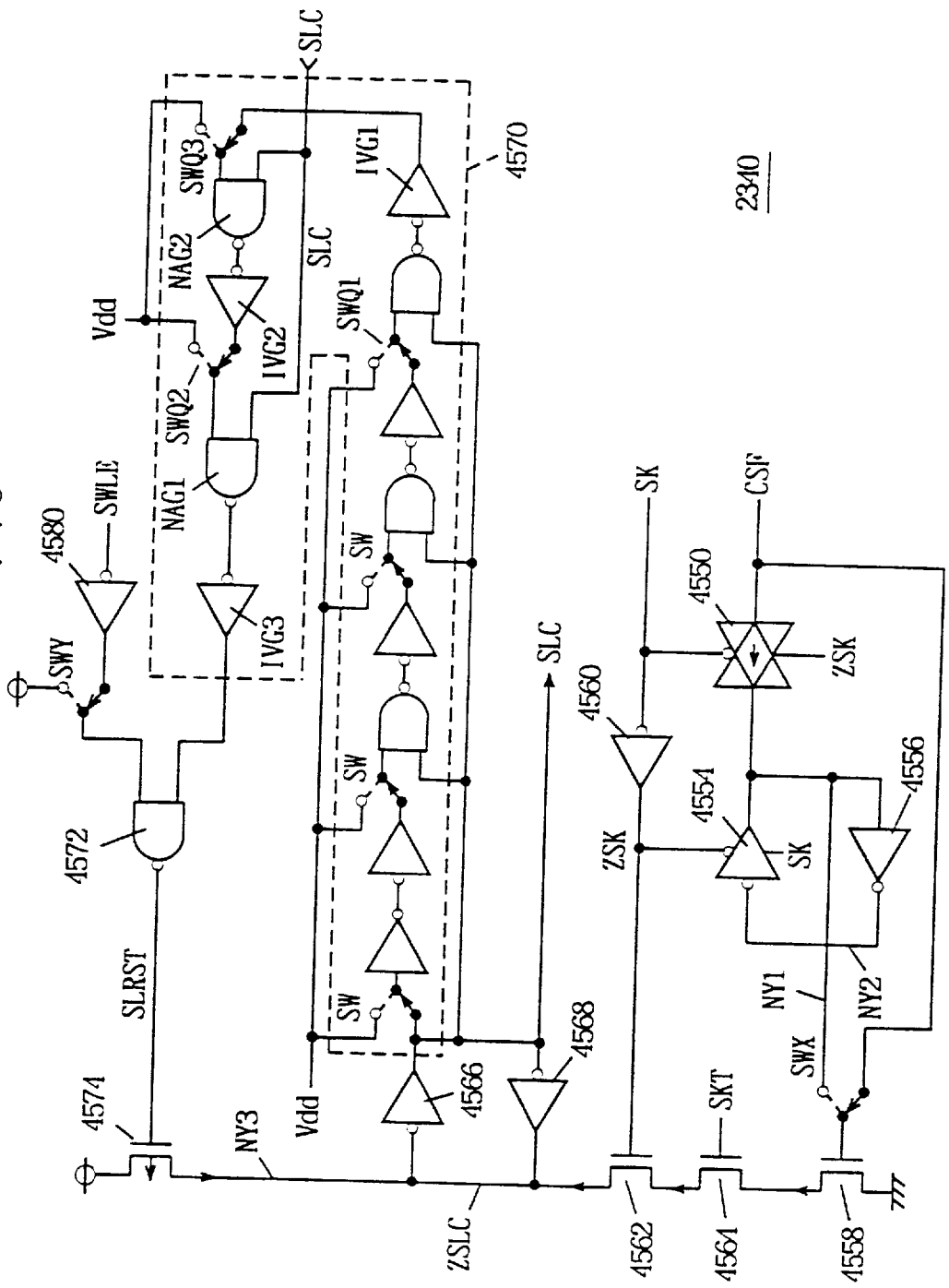
FIG. 70 is a diagram showing in detail the configuration of the latch signal generation circuit shown in FIG. 65.

FIG. 70 is a diagram specifically showing the configuration of the latch signal generation circuit shown in FIG. 65. The configuration shown in FIG. 70 corresponds to the configuration of the CS sampling circuit which has been described in conjunction with FIG. 64. In FIG. 70, latch signal generation circuit 2340 includes an inverter circuit 4560 receiving internal clock signal SK, a bidirectional transmission gate 4550 for passing internal chip select signal CSF based on internal clock signal SK and a complementary internal clock signal ZSK output from inverter circuit 4560, and an inverter 4556 and a clocked inverter 4554 activated in response to bidirectional transmission gate 4550 and internal clock signals SK and ZSK for latching a signal from transmission gate 4550. Bidirectional transmission gate 4550 attains a conduction state when internal clock signal ZSK is at "L", and a non-conduction state when internal clock signal SK is at "H". Clocked inverter 4554 attains an operative state for internal clock signal SK at "H", and an output high impedance state for internal clock signal SK at "L".

Latch signal generation circuit 2340 further includes an n channel MOS transistor 4558 receiving a signal applied through a switch circuit SWX at its gate, an n channel MOS transistor 4564 receiving internal clock signal SKT at its gate, and an n channel MOS transistor 4562 receiving internal clock signal ZSK from inverter circuit 4560 at its gate. MOS transistors 4558, 4564 and 4562 are connected in series between node NY3 and the ground potential node. Switch circuit SWX applies either a signal transferred from transmission gate 4550 or chip select signal CSF provided from CS buffer circuit 2300 shown in FIG. 6 to the gate of MOS transistor 4558. The connection state of switch circuit SWX is determined by metal mask wirings. This switch SWX is provided for the purpose of providing proper delay time. MOS transistor 4562 is connected to node NY3 for the following reason. When clock signal ZSK is at "H", MOS transistor 4562 is on, and internal signal SKT rises to "H" during this period. MOS transistor 4564 is therefore turned on/off while preventing the fluctuation of the load of node NY3.

Latch signal generation circuit 2340 further includes an inverter circuit 4566 for inverting a signal on node NY3 and generating latch signal SLC and a delay circuit 4570 for delaying signal SLC for a prescribed time period. Delay circuit 4570 includes a series-connection of an inverter circuit and an NAND circuit. The output of inverter circuit and the input of NAND circuit are switched by a switch circuit SW. This provides a pulse signal having proper delay time and a proper pulse width.

Figure 71:
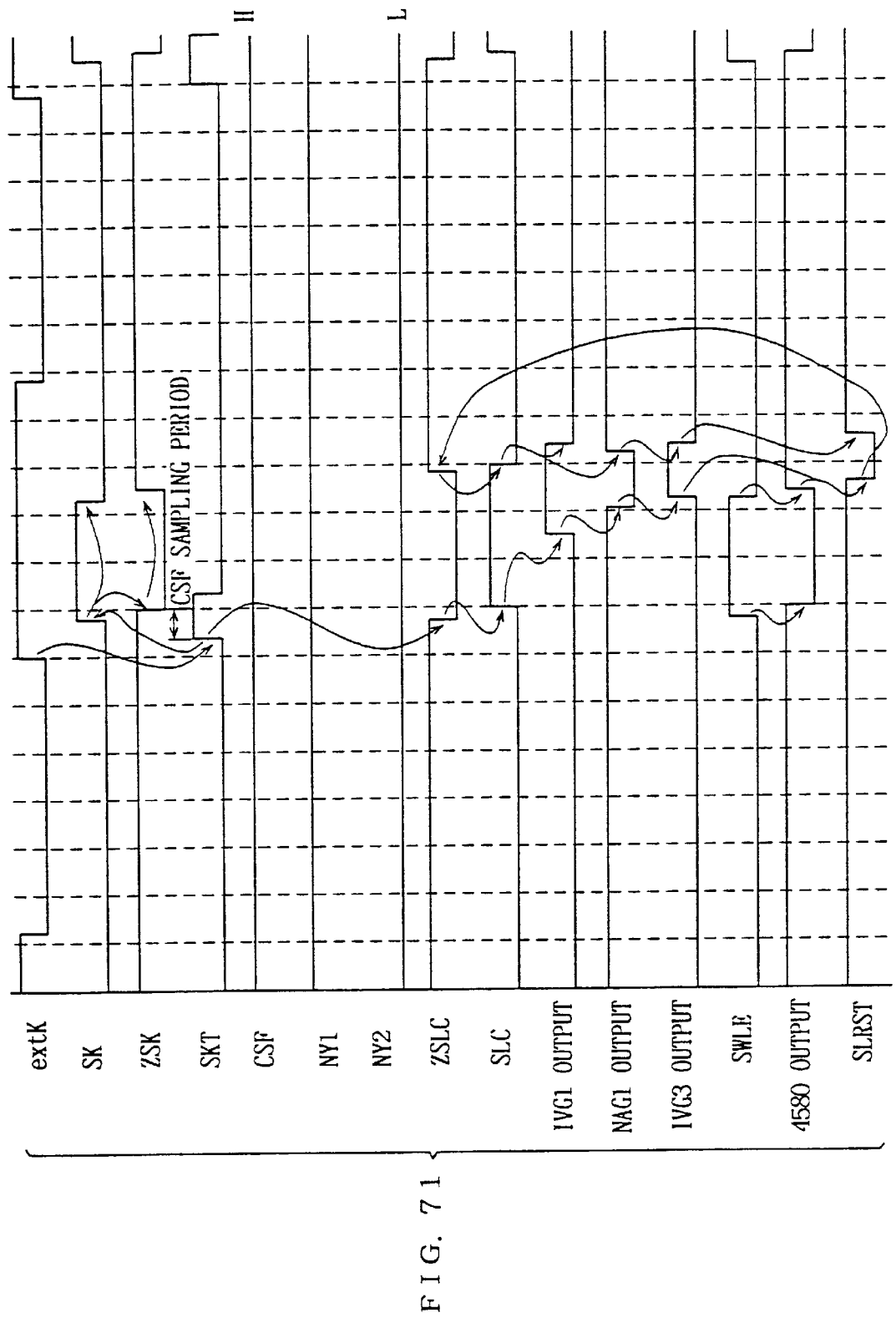
FIG. 71 is a signal waveform chart for use in illustration of the operation of the latch signal generation circuit shown in FIG. 70.

Latch signal generation circuit 2340 further includes an NAND circuit 4572 receiving the output signal of delay circuit 4570 and a signal applied through a switch circuit SWY, and a p channel MOS transistor 4574 for charging node NY3 to the power supply potential level in response to reset signal SLRST from NAND circuit 4572. Switch circuit SWY selects either power supply potential Vdd or the output signal of inverter circuit 4580 for application to NAND circuit 4572. Inverter circuit 4580 receives enable signal SWLE. The provision of switch circuit SWY provides for internal operation timing margins. If switch circuit SWY selects the output signal of inverter circuit 4580, reset signal SLRST is generated after a falling of signal SWLE to "L", and latch signal SLC can be brought to an inactive state. The operation of the circuit shown in FIG. 70 will be now described in conjunction with the operation waveform chart thereof, FIG. 71.

In the following description, assume that switch circuits SWQ1, SWQ2 and SWQ3 included in delay circuit 4570 are all set to a state to select the output signal of a preceding stage circuit. In this state, an inverter IVG1 generates a signal which rises to "H" in a prescribed time period after a rising of latch signal SLC to "H". An inverter circuit IVG2 generates a pulse signal at "L" having a pulse width shorter than the pulse width of a pulse signal generated by inverter circuit IVG1. Switch circuit SWX selects a signal from bidirectional transmission gate 4550 for application to the gate of MOS transistor 4558. Switch circuit SWY selects the output signal of inverter circuit 4580 for application to NAND circuit 4572. In response to a rising of external clock signal extK to "H", internal clock signal SKT rises to "H" first. In this state, internal clock signal ZSK from inverter circuit 4560 is at "H", and MOS transistor 4562 is on. In response to a rising of internal clock signal SK, bidirectional transmission gate 4550 attains a non-conduction state, and the signal potential on node NY1 is fixed. Assuming that chip select signal CSF is set to "H", MOS transistor 4558 is turned on.

Now, in response to a rising of internal clock signal SK, internal clock signal ZSK falls to "L". Internal clock signal SKT is at "H", and MOS transistors 4562 and 4564 are both in an on state until internal clock signal ZSK falls to "L", during which period node NY3 is discharged to the ground potential level and signal ZSLC falls to "L". The period during which signals ZSK and SKT have different logics is a CSF sampling period once the potential of node NY3 is discharged by transistors 4562, 4564 and 4558, latch signal SLC generated from inverter circuit 4560 having a large current driving capability rises to "H" at a high speed. In a prescribed time period, the output signal of inverter circuit IVG1 rises to "H", and the output signal of inverter circuit IVG2 rises to "H". In response, the output signal of AND circuit NAG1 attains an "L" level, and the output signal of inverter circuit IVG3 attains an "H" level.

Inverter circuit 4580 which receives signal SWLE raises its output signal to "H" in response to a falling of signal SWLE to "L". NAND circuit 4572 outputs a signal at "L" when the output signal of inverter circuit 4580 is at "H" and the output signal of inverter circuit IVG3 is at "H". In response to signal SLRST at "L", MOS transistor 4574 is turned on, charges node NY3 and raises signal ZSLC to "H". In response, signal SLC output from inverter circuit 4566 is brought to "L". In a prescribed time period, after a signal in each circuit component is reset, signal SLRST rises to "H". This returns the circuit to the initial state.

With the above-described configuration the sampling period for signal CSF can be greatly shortened. Inside the circuit, latch circuit SLC is generated only by charging/discharging the node. Accordingly, latch signal SLC can be generated at a high speed, and a sampling pulse generation circuit with improved external response characteristic is implemented for the short sampling period.

Resetting signal SLC by applying the inverse of signal SWLC to NAND circuit 4570 can securely set internal control signal generation circuit 2320 (see FIG. 65) to a state to accept the next signal after one memory cycle is completed, and therefore thus internal circuit can be operated stably.

As in the foregoing, according to the present invention an internal clock signal is generated at a high speed in response to a rising of external clock signal extK and for a prescribed time period, and its internal control signal is generated using the internal clock signal having a constant pulse width. Accordingly, the latch signal generation timing and the power down mode detection signal generation timing can be always be kept constant, and a synchronous type semiconductor memory device which operates at a high speed stably and securely is provided. Note that the internal clock generation circuit and the method of generating the sampling pulse are applicable not only to general clock synchronous type semiconductor devices but also to synchronous semiconductor devices which operate in synchronization with clock signals.

The significant effects brought about by the present invention are summarized as follows.

(1) Data is transferred from a first data register (master register) to a second data register while data in the second data register (slave data register) is not in use. Therefore, a data transmission operation formed the DRAM array to the read data transfer buffer circuit does not adversely affect accessing to the semiconductor memory device, and a high speed operation is implemented. Particularly the second data register, slave register does not have a cycle in which storage data is unestablished, and therefore the slave data register is accessible in any cycle, and therefore the external processing unit can access the semiconductor memory device in no wait state, and a high speed data processing system is thus provided.

(2) Until a next data transmission instruction is given, the first data register (master register) and the second data register (slave register) are electrically connected, therefore adjustment of data transmission timing from the master register to the slave register is made easier, a data transmission instruction signal having a sufficient pulse width is obtained, and data transfer from the master data register to the slave data register is secured.

(3) According to a read command detection signal, counters (flipflops) excluding the count in the first stage of latency counter are reset. Therefore, even if a new read command detection signal is given, a prescribed number of counting operations can be securely conducted from the clock cycle in which the read command is given, and therefore the number of latency periods can be securely counted.

(4) The control signal input buffer is brought to a through state when the clock signal is at an inactive level and a latch state when the clock signal is at an active level, an internal control signal can be generated even for the clock signal at an inactive level, internal operations can be initiated using the setup time of the control signal, and therefore, a semiconductor memory device which operates at a high speed can be obtained.

(5) The address signal input buffer attains a through state when the external clock signal is at an inactive state, and a latch state when the external clock signal is in an active state, an internal address signal can be generated in an advanced timing. The decode circuit generating a select signal by decoding the internal address signal is activated in response to an operation control signal which is established when the external clock signal is activated, and the decoder can be operated synchronously with the external clock signal and the operation timing for the internal circuit can be accurately set.

(6) Since the input buffer attains a latch state in an activated level of a clock signal and a conductive state, in other word a through state in an inactive level of the external clock signal, an internal control signal can be generated in the setup time of the external signal, the internal signal can be generated in an advanced timing, and therefore a semiconductor memory device which operates at a high speed can be provided.

(7) Control circuitry for accepting a control signal in synchronization with an external clock signal and generating an address hold instruction signal according to the accepted control signal, hold circuitry for holding and outputting the applied address signal and latch circuitry for latching the address signal held by the hold circuitry in response to the address hold instruction signal and generating an internal address signal are provided. Therefore, the setup time and hold time for the external control signal and for the address signal can be made equal, a high speed operation is achieved, and control signals and address signals can be readily generated without any complex timing adjustment by an external device.

(8) Clock generation circuitry for generating an internal clock signal in synchronization with a clock signal, circuitry receiving the internal clock signal from the clock generation circuitry for delaying activation of the received clock signal for a prescribed time period and generating a control signal in an active state, and a reset element bringing the internal clock signal into an inactive state based on the control signal are provided. Therefore, the internal clock signal can be always constant irrespective of the pulse width of the internal clock signal and the operation timing for the internal circuit can always be kept constant.

(9) Circuitry for generating first and second internal clock signals out of phase from each other in response to an external clock signal, circuitry for sampling a device activation signal when the first and second internal clock signals are in the same level, circuitry for generating a pulse signal having a prescribed time width in response to signal sampled by the sampling circuitry and circuitry for latching a control signal applied in response to the pulse signal and generating an internal control signal are provided. Therefore, the sampling period for the device activation signal corresponds to the time width in which the first and second internal clock signals are in the same logic level, which can be short, therefore the sampling period for the device activation signal can be short, therefore great improvement in the high speed operation and external response characteristic of the device results. Furthermore, the pulse width of the pulse signal for latching is always constant regardless of the pulse width of the external clock signal, and therefore the applied signal can be stably latched.

(10) First and second internal clock signals out of phase from each other is generated in response to an external clock signal and these first and second internal clock signals and the device activation signal are subjected to a logical product operation to generate a sampling pulse. Therefore, the sampling period can be as short as the period in which the first and second internal clock signals are at the same logic level, and a sampling pulse generation circuit having an improved external response characteristic is provided. Since the sampling period corresponds to the setup and hold time of the external signal, time required for accessing is reduced as well. Since the sampling pulse signal is generated by gate circuit for conducting the logical product operation, the circuit for generating the first and second internal clock signals is not required of large driving capability, and therefore, a sampling pulse can be generated at a high speed with reduced power consumption.

(11) First latch for latching and outputting a clock mask signal, second latch for latching and outputting the output signal of the first latch according to the second edge of the clock signal and circuitry for generating an internal clock signal in response to the output signal of the second latch and the clock signal are provided. Therefore, generation of an internal clock signal in a clock cycle can be surely and stably determined based on the state of the clock mask signal in the previous cycle and the internal clock signal can be accurately masked.

(12) An internal clock signal is generated by driving a transistor element, and therefore the internal clock signal can be generated in response to an external clock signal at a high speed in a small scale circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
an input buffer configured to receive an external control signal for generating an internal control signal corresponding to said external control signal; and
a control signal generator configured to:
receive said internal control signal, determine an operation mode to be executed, generate a mode instructing signal indicating said operation mode in an inactive state of an external clock signal, and continuously supply said mode instructing signal in an active state of said external clock signal.

2. The semiconductor memory device as recited in claim 1, wherein said control signal generator comprises
mode determination means responsive to the internal control signal from said input buffer for determining the operation mode to be executed and generating said mode instructing signal; and
latch means for passing therethrough said mode instructing signal from said mode determination means in the inactive state of the external clock signal and for holding said mode instructing signal while isolating the output of said mode determination means therefrom in the active state of said external clock signal.

3. The semiconductor memory device as recited in claim 2, further comprising generation means activated in response to the active state of said external clock signal for generating an operation control signal corresponding to said mode instructing signal from said mode determination means.

4. The semiconductor memory device as recited in claim 3, further comprising an address input buffer passing therethrough an external address signal in the inactive state of said external clock signal and attaining a latch state in the active state of said external clock signal, and address decode means activated in response to said operation control signal for decoding an output signal of said address input buffer and generating a select signal to select a memory cell addressed by said external address signal.

5. The semiconductor memory device as recited in claim 4, wherein said address decode means comprises, a predecoder for predecoding the output signal from said address input buffer to generate a predecode signal, and a decoder activated in response to said operation control signal for decoding said predecode signal to generate said select signal.

6. The semiconductor memory device as recited in claim 4, wherein said address decode means comprises a predecoder responsive to said operation control signal for being activated to predecode the output signal from said address input buffer to generate a predecode signal, and a decoder for decoding said predecode signal to generate said select signal.

7. The semiconductor memory device as recited in claim 1, wherein said control signal generator comprises latch means for passing therethrough said internal control signal in the inactive state of said external clock signal and for holding said internal control signal while isolating an output of said input buffer therefrom in the active state of said external clock signal, and mode determination means receiving and decoding an output of said latch means to determine an operation to be executed and generating said mode instructing signal.

8. The semiconductor memory device as recited in claim 7, further comprising means activated in response to the active state of said external clock signal for generating an operation control signal corresponding to said mode instructing signal.

9. The semiconductor memory device as recited in claim 8, further comprising, an address input buffer passing therethrough an external address signal to generate an internal address signal in the inactive state of said external clock signal and attaining a latch state to hold the internal address signal while isolating said internal address signal from said external address signal, an address latch passing therethrough said internal address signal in an inactive state of said operation control signal and attaining the latch state in an active state of said operation control signal, and a decode circuit activated in response to the active state of said operation control signal for decoding the internal address signal from said address latch to generate a select signal for selecting a memory cell addressed by said external address signal.

10. The semiconductor memory device as recited in claim 9, wherein said decode circuit includes a predecoder for predecoding the internal address signal from said address latch to generate a predecode signal, and a decoder activated in response to the active state of said operation control signal for decoding the predecode signal to generate said select signal.

11. The semiconductor memory device according to claim 3, wherein said generation means is configured to receive said mode instructing signal through said latch means.

12. The semiconductor memory device according to claim 1, further comprising:

means activated in response to the active state of said external clock signal for generating an operation control signal corresponding to said mode instructing signal from said control signal generator, an address input buffer passing therethrough an external address signal in the inactive state of said external clock signal and attaining a latch state in the active state of said external clock signal, and address decode means activated in response to said operation control signal for decoding an output signal of said address input buffer and generating a select signal to select a memory cell addressed by the external address signal.

13. The semiconductor memory device according to claim 12, wherein said address decode means comprises, a predecoder for predecoding the output signal from said address input buffer to generate a predecode signal, and a decoder activated in response to said operation control signal for decoding said predecode signal to generate said select signal.

14. The semiconductor memory device according to claim 12, wherein said address decode means comprises, a predecoder responsive to said operation control signal for being activated to predecode the output signal from said address input buffer to generate a predecode signal, and a decoder for decoding said predecode signal to generate said select signal.

15. The semiconductor memory device according to claim 1, further comprising:

means activated in response to the active state of said external clock signal for generating an operation control signal corresponding to said mode instructing signal, an address input buffer passing therethrough an external address signal to generate an internal address signal in the inactive state of said external clock signal and attaining a latch state while isolating said internal address signal from said external address signal, an address latch passing therethrough said internal address signal in an inactive state of said operation control signal and attaining the latch state in an active state of said operation control signal, and decode circuitry activated in response to the active state of said operation control signal for decoding the internal address signal from said address latch to generate a select signal for selecting a memory cell addressed by said external address signal.

16. The semiconductor memory device as recited in claim 15, wherein said decode circuitry comprises a predecoder for predecoding the internal address signal from said address latch to generate a predecode signal, and a decoder activated in response to the active state of said operation control signal for decoding the predecode signal to generate said select signal.

17. The semiconductor memory device as recited in claim 1, wherein said external clock signal is applied repetitively regardless of whether an access is made to said semiconductor memory device.

* * * * *